(12) United States Patent
Yoon et al.

(10) Patent No.: US 12,161,046 B2
(45) Date of Patent: Dec. 3, 2024

(54) ORGANIC LIGHT EMITTING DIODE AND ORGANIC LIGHT EMITTING DEVICE HAVING THEREOF

(71) Applicant: LG DISPLAY CO., LTD., Seoul (KR)

(72) Inventors: Seung Hee Yoon, Paju-si (KR); In Bum Song, Paju-si (KR); Jin Ho Park, Paju-si (KR); Dong Hyeok Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 551 days.

(21) Appl. No.: 17/260,826

(22) PCT Filed: Dec. 21, 2019

(86) PCT No.: PCT/KR2019/018266
§ 371 (c)(1),
(2) Date: Jan. 15, 2021

(87) PCT Pub. No.: WO2020/138875
PCT Pub. Date: Jul. 2, 2020

(65) Prior Publication Data
US 2021/0305513 A1 Sep. 30, 2021

(30) Foreign Application Priority Data
Dec. 28, 2018 (KR) .......... 10-2018-0172054

(51) Int. Cl.
*H01L 51/50* (2006.01)
*C09K 11/06* (2006.01)
(Continued)

(52) U.S. Cl.
CPC ............ *H10K 85/631* (2023.02); *C09K 11/06* (2013.01); *H10K 85/626* (2023.02);
(Continued)

(58) Field of Classification Search
None
See application file for complete search history.

(56) References Cited

U.S. PATENT DOCUMENTS

| 2003/0137239 A1* | 7/2003 | Matsuura | ............... H10K 50/11 313/503 |
| 2003/0170491 A1* | 9/2003 | Liao | ....................... H05B 45/60 257/88 |

(Continued)

FOREIGN PATENT DOCUMENTS

| KR | 10-2003-0038441 A | 5/2003 |
| KR | 10-2016-0069468 A | 6/2016 |

(Continued)

*Primary Examiner* — Gregory D Clark
(74) *Attorney, Agent, or Firm* — Birch, Stewart, Kolasch & Birch, LLP

(57) ABSTRACT

The present disclosure relates to an organic light emitting diode that includes at least one emitting material layer including an anthracene-based host and a boron-based dopant, at least one electron blocking layer including an amine-based compound substituted with at least one fused aromatic or hetero aromatic ring, and optionally at least one hole blocking layer including an azine-based compound or a benzimidazole-based compound. The organic light emitting diode has enhanced luminous efficiency as well as excellent luminous lifetime.

38 Claims, 4 Drawing Sheets

(51) Int. Cl.
  *H10K 85/60* (2023.01)
  *H10K 50/13* (2023.01)
  *H10K 50/18* (2023.01)
  *H10K 59/12* (2023.01)
  *H10K 59/38* (2023.01)

(52) U.S. Cl.
  CPC ....... *H10K 85/654* (2023.02); *H10K 85/6572* (2023.02); *H10K 85/6574* (2023.02); *C09K 2211/1007* (2013.01); *H10K 50/131* (2023.02); *H10K 50/18* (2023.02); *H10K 59/12* (2023.02); *H10K 59/38* (2023.02)

(56) References Cited

U.S. PATENT DOCUMENTS

| | | | | |
|---|---|---|---|---|
| 2006/0273713 | A1* | 12/2006 | Mehta | H10K 71/16 |
| | | | | 428/917 |
| 2014/0319472 | A1* | 10/2014 | Cho | H10K 85/657 |
| | | | | 257/40 |
| 2017/0288147 | A1* | 10/2017 | Fujita | H10K 85/631 |
| 2018/0076418 | A1 | 3/2018 | Cho et al. | |
| 2018/0301629 | A1* | 10/2018 | Hatakeyama | C09K 11/06 |
| 2019/0207112 | A1 | 7/2019 | Hatakeyama et al. | |
| 2019/0312207 | A1 | 10/2019 | Hatakeyama et al. | |

FOREIGN PATENT DOCUMENTS

| | | | |
|---|---|---|---|
| KR | 10-2017-0130434 A | 11/2017 | |
| KR | 10-2018-0103352 A | 9/2018 | |
| WO | WO 2017/188111 A1 | 11/2017 | |
| WO | WO 2018/150832 A1 | 8/2018 | |

* cited by examiner

[Fig. 1]
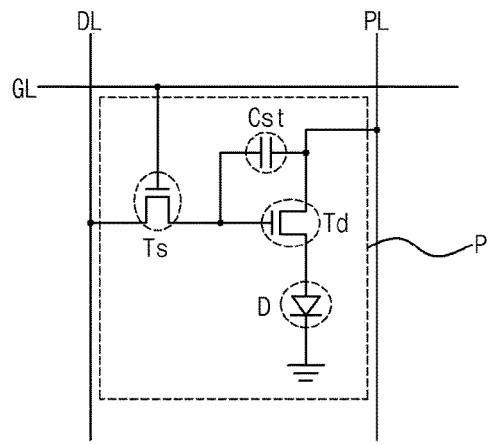
[Fig. 2]
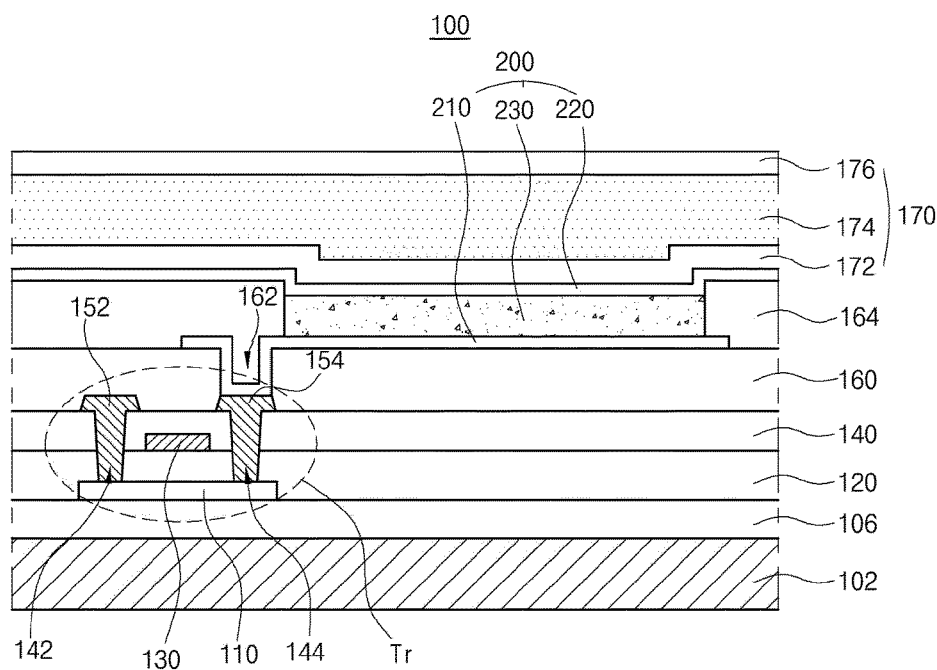
[Fig. 3]
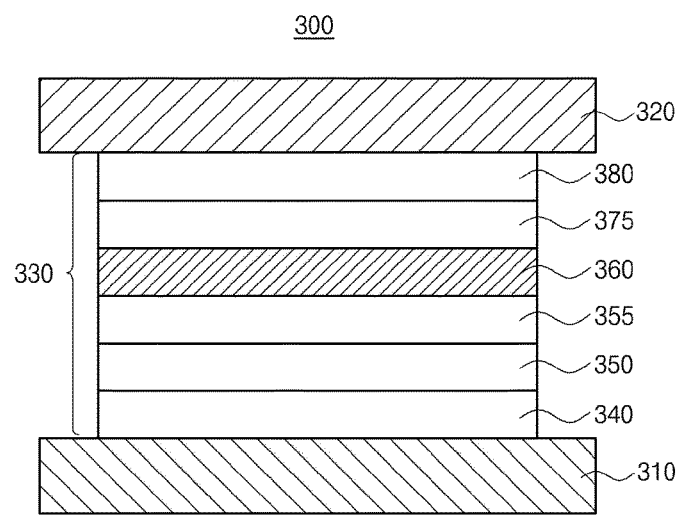

[Fig. 4]
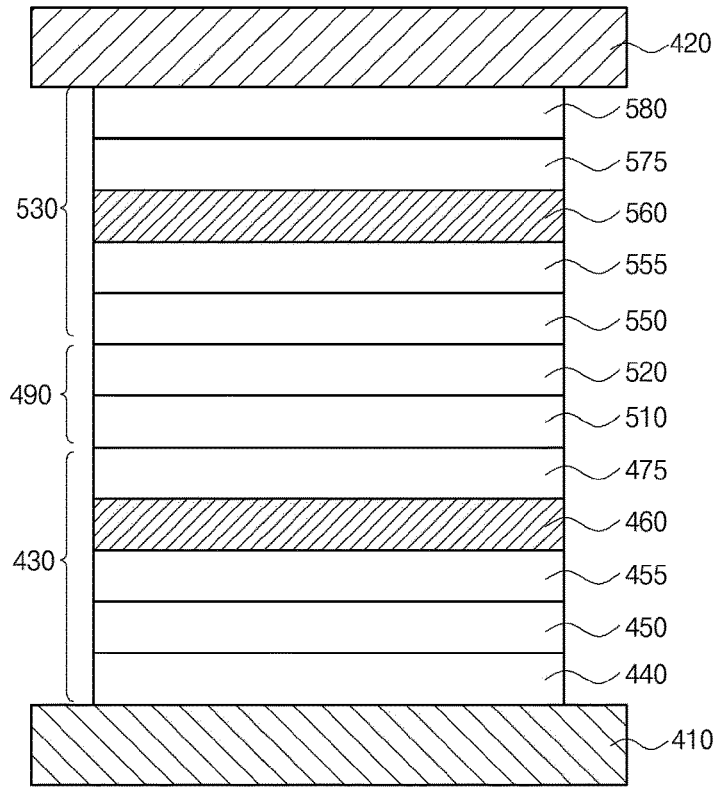
[Fig. 5]
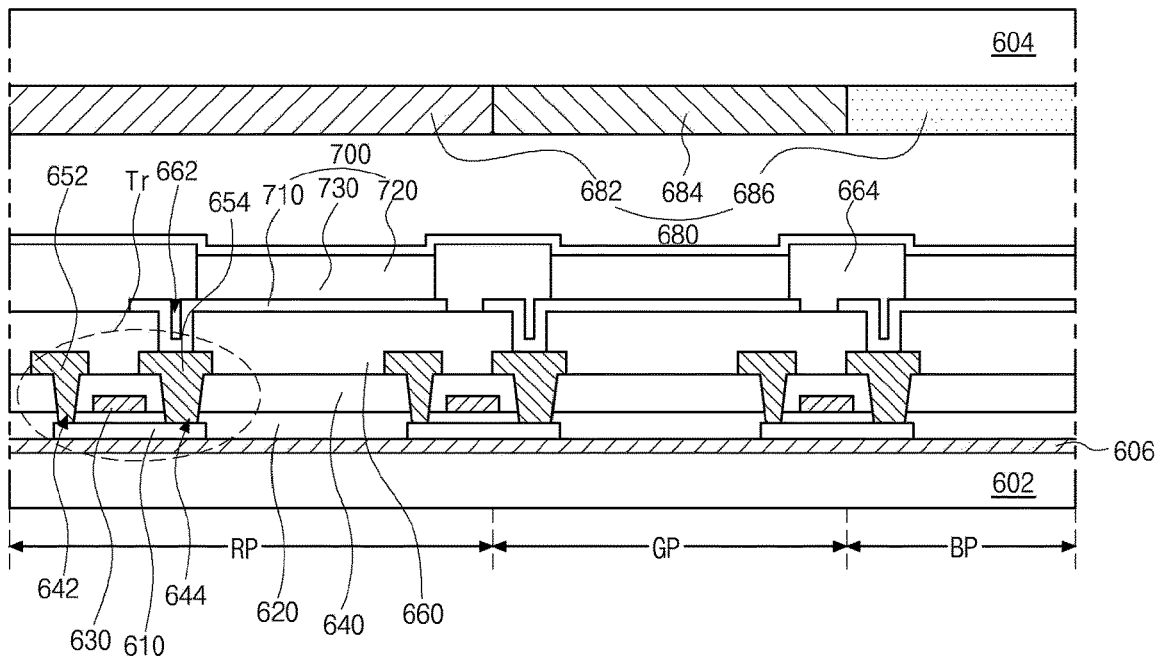

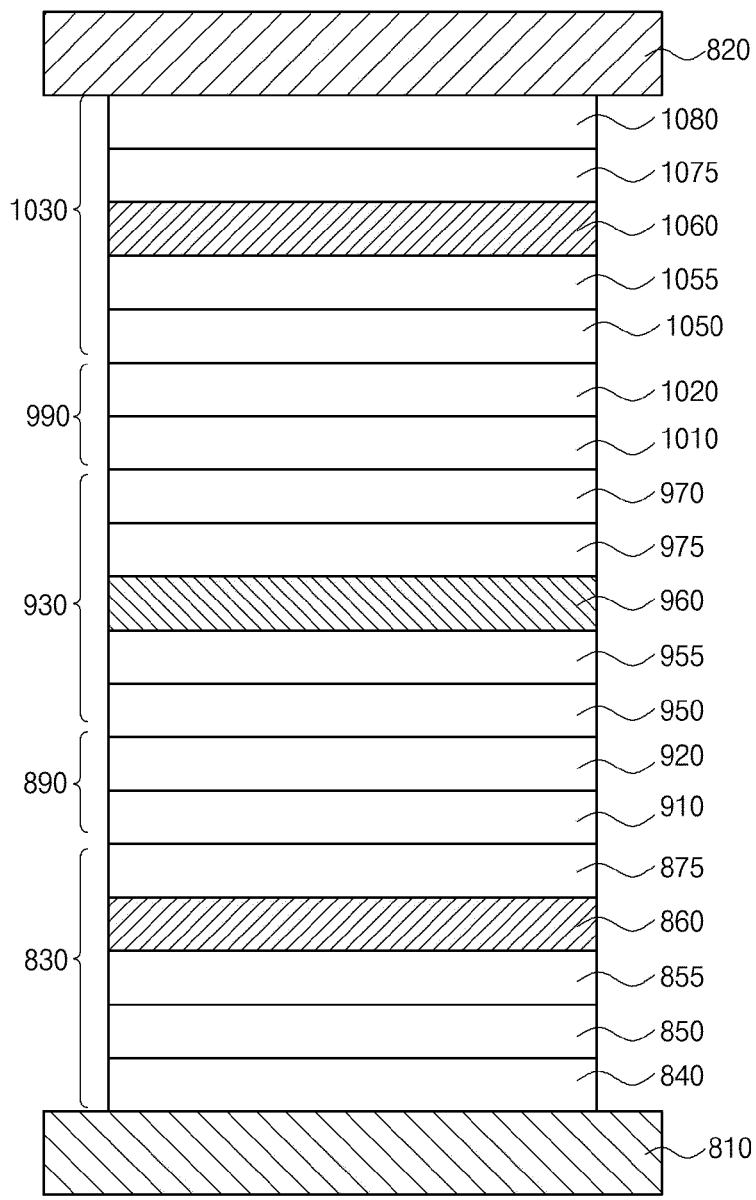
[Fig. 6]

[Fig. 7]
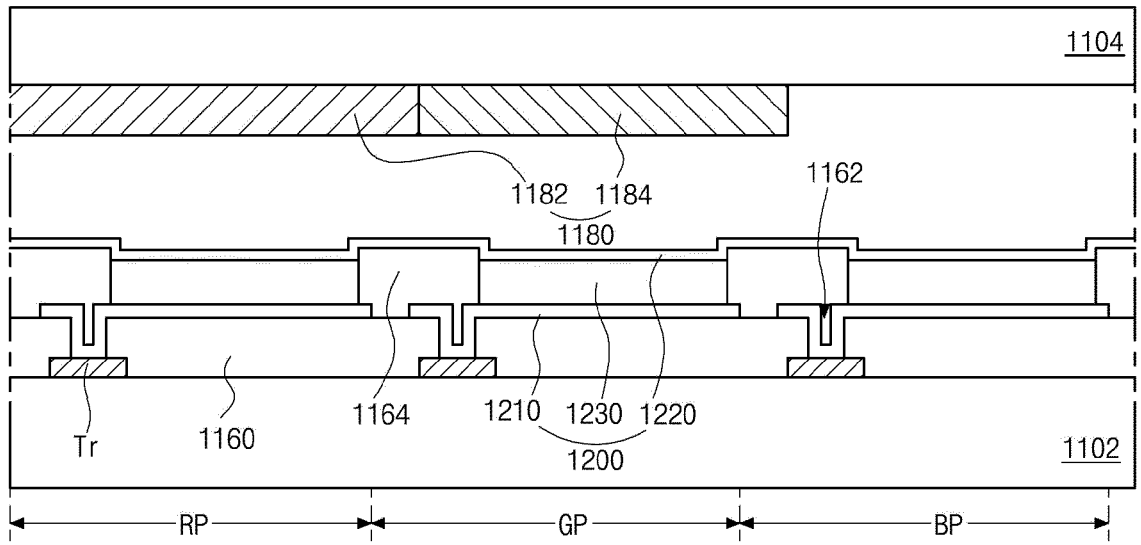

ORGANIC LIGHT EMITTING DIODE AND ORGANIC LIGHT EMITTING DEVICE HAVING THEREOF

CROSS REFERENCE TO RELATED APPLICATIONS

This Application is the National Phase of PCT International Application No. PCT/KR2019/018266, filed on Dec. 21, 2019, which claims priority under 35 U.S.C. § 119(a) to Korean Patent Application No. 10-2018-0172054, filed in the Republic of Korea on Dec. 28, 2018, all of these applications are hereby expressly incorporated by reference into the present application.

BACKGROUND OF THE INVENTION

Field of the Invention

The present disclosure relates to an organic light emitting diode, and more specifically, to an organic light emitting diode that can enhance luminous efficiency and luminous lifetime and an organic light emitting device having the diode.

Description of Related Art

An organic light emitting diode (OLED) among a flat display device used widely has come into the spotlight as a display device replacing rapidly a liquid crystal display device (LCD). In the OLED, when electrical charges are injected into an emission layer between an electron injection electrode (i.e., cathode) and a hole injection electrode (i.e., anode), electrical charges are combined to be paired, and then emit light as the combined electrical charges are disappeared.

The OLED can be formed as a thin organic film less than 2000 Å and can implement unidirectional or bidirectional images by electrode configurations. Also, the OLED can be formed even on a flexible transparent substrate such as a plastic substrate so that a flexible or a foldable display device can be realized with ease using the OLED. In addition, the OLED can be driven at a lower voltage of 10 V or less so that the OLED has relatively lower power consumption for driving, and the OLED has excellent high color purity compared to the LCD.

Since fluorescent material uses only singlet exciton energy in the luminous process, the related art fluorescent material shows lower luminous efficiency than phosphorescent material. Metal complex, representative phosphorescent material, has short luminous lifetime for commercial use. Particularly, blue luminous materials has not showed satisfactory luminous efficiency and luminous lifetime compared to other color luminous materials. Therefore, there is a need to develop a new compound or a device structure that can enhance luminous efficiency and luminous lifetime of the organic light emitting diode.

SUMMARY OF THE INVENTION

Accordingly, the present disclosure is directed to an organic light emitting diode and a light emitting device including the organic compounds that substantially obviate one or more of the problems due to the limitations and disadvantages of the related art.

An object of the present disclosure is to provide an organic light emitting diode enhancing its luminous efficiency and its luminous lifetime and an organic light emitting device including the diode.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

According to an aspect, the present disclosure provides an organic light emitting diode that includes an emitting material layer and at least one hole transport layer or electron blocking layer, wherein the emitting material layer includes an anthracene-based host and a boron-based dopant and the at least one hole transport layer or electron blocking layer includes an amine-based compound substituted with at least one fused aromatic ring.

As an example, the organic light emitting diode may further comprise at least one electron transport layer or hole blocking layer including an azine-based compound and/or a benzimidazole-based compound.

The organic light emitting diode may consist of a single emitting unit or may have a tandem structure of a multiple emitting units.

The tandem-structured organic light emitting diode may emit blue color or white color.

According to another aspect, the present disclosure provides an organic light emitting device comprising the organic light emitting diode, as described above.

For example, the organic light emitting device may comprise an organic light emitting display device or an organic light emitting illumination device.

It is to be understood that both the foregoing general description and the following detailed description are examples and are explanatory and are intended to provide further explanation of the disclosure as claimed.

It is possible to improve luminous properties of an organic light emitting diode and an organic light emitting device by using luminous materials and charge transfer control materials in the present disclosure. Especially, the luminous efficiency and luminous lifetime in blue light emission which has been regarded as a weak point in the related art light emitting diode can be greatly enhanced.

It is possible to implement an organic light emitting device that improves with great its luminous efficiency and luminous lifetime by using the organic light emitting diode of the present disclosure.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

FIG. 1 is a schematic circuit diagram illustrating an organic light emitting display device of the present disclosure.

FIG. 2 is a schematic cross-sectional view illustrating an organic light emitting display device in accordance with an exemplary embodiment of the present disclosure.

FIG. 3 is a schematic cross-sectional view illustrating an organic light emitting diode having a single emitting unit in accordance with an exemplary embodiment of the present disclosure.

FIG. 4 is a schematic cross-sectional view illustrating an organic light emitting diode having a tandem structure of two emitting units in accordance with another exemplary embodiment of the present disclosure.

FIG. 5 is a schematic cross-sectional view illustrating an organic light emitting display device in accordance with another exemplary embodiment of the present disclosure.

FIG. 6 is a schematic cross-sectional view illustrating an organic light emitting diode having a tandem structure of three emitting units in accordance with still another exemplary embodiment of the present disclosure.

FIG. 7 is a schematic cross-sectional view illustrating an organic light emitting display device in still another exemplary embodiment of the present disclosure.

DETAILED DESCRIPTION OF THE PREFERRED EMBODIMENTS

Reference will now be made in detail to aspects of the disclosure, examples of which are illustrated in the accompanying drawings.

The organic light emitting diode of the present disclosure can enhance its luminous efficiency and its luminous lifetime by applying particular organic compounds into at least one emitting unit. The organic light emitting diode can be applied into an organic light emitting device such as an organic light emitting display device or an organic light emitting illumination device.

FIG. 1 is a schematic circuit diagram illustrating an organic light emitting display device of the present disclosure. As illustrated in FIG. 1, a gate line GL, a data line DL and power line PL, each of which cross each other to define a pixel region P, in the organic light display device. A switching thin film transistor Ts, a driving thin film transistor Td, a storage capacitor Cst and an organic light emitting diode D are formed within the pixel region P. The pixel region P may include a red (R) pixel region, a green (G) pixel region and a blue (B) pixel region.

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the organic light emitting diode D through the driving thin film transistor Td. And the organic light emitting diode D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

FIG. 2 is a schematic cross-sectional view illustrating an organic light emitting display device in accordance with an exemplary embodiment of the present disclosure. As illustrated in FIG. 2, the organic light emitting display device 100 comprises a substrate 102, a thin-film transistor Tr over the substrate 102, and an organic light emitting diode 200 connected to the thin film transistor Tr. As an example, the substrate 102 defines a red pixel, a green pixel and a blue pixel and the organic light emitting diode 200 is located in each pixel. In other words, the organic light emitting diode 200, each of which emits red, green or blue light, is located correspondingly in the red pixel, the green pixel and the blue pixel.

The substrate 102 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 102, over which the thin film transistor Tr and the organic light emitting diode 200 are arranged, forms an array substrate.

A buffer layer 106 may be disposed over the substrate 102, and the thin film transistor Tr is disposed over the buffer layer 106. The buffer layer 106 may be omitted.

A semiconductor layer 110 is disposed over the buffer layer 106. In one exemplary embodiment, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$) or silicon nitride ($SiN_x$).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 2, the gate insulating layer 120 may be patterned identically as the gate electrode 130.

An interlayer insulating layer 140 including an insulating material is disposed on the gate electrode 130 with covering over an entire surface of the substrate 102. The interlayer insulating layer 140 may include an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 with spacing apart from the gate electrode 130. The first and second semiconductor layer contact holes 142 and 144 are formed within the gate insulating layer 120 in FIG. 2. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are made of a conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may include amorphous silicon.

Although not shown in FIG. 2, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 160 is disposed on the source and drain electrodes 152 and 154 with covering the thin film transistor Tr over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The organic light emitting diode (OLED) 200 includes a first electrode 210 that is disposed on the passivation layer 160 and connected to the drain electrode 154 of the thin film transistor Tr. The organic light emitting diode 200 further includes an emitting unit 230 and a second electrode 220 each of which is disposed sequentially on the first electrode 210.

The first electrode 210 is disposed in each pixel region. The first electrode 210 may be an anode and include a conductive material having relatively high work function value. For example, the first electrode 210 may include, but is not limited to, a transparent conductive material such as indium tin oxide (ITO), indium zinc oxide (IZO), indium tin zinc oxide (ITZO), SnO, ZnO, indium cerium oxide (ICO), aluminum doped zinc oxide (AZO), and the like.

In one exemplary embodiment, when the organic light emitting display device 100 is a top-emission type, a reflective electrode or a reflective layer may be disposed under the first electrode 210. For example, the reflective electrode or the reflective layer may include, but is not limited to, aluminum-palladium-copper (APC) alloy.

In addition, a bank layer 164 is disposed on the passivation layer 160 in order to cover edges of the first electrode 210. The bank layer 164 exposes a center of the first electrode 210. The bank layer 164 may be omitted.

An emitting unit 230 is disposed on the first electrode 210. In one exemplary embodiment, the emitting unit 230 as an emission layer may have a mono-layered structure of an emitting material layer. Alternatively, the emitting unit 230 may have a multiple-layered structure of a hole injection layer, a hole transport layer, an electron blocking layer, an emitting material layer, a hole blocking layer, an electron transport layer and/or an electron injection layer (See, FIGS. 3, 4 and 6). The emitting unit 230 may have a single unit or may have multiple units to form a tandem structure.

The emitting unit 230 may include at least one emitting material layer that includes an anthracene-based host and a boron-based dopant and at least one electron blocking layer that includes an aryl amine-based compound. Alternatively, the emitting unit 230 may further include at least one hole blocking layer that includes an azine-based compound and/or a benzimidazole-based compound. The organic light emitting diode 200 and the organic light emitting device 100 can enhance their luminous efficiency and their luminous life time by introducing such emitting unit 230.

The second electrode 220 is disposed over the substrate 102 above which the emitting unit 230 is disposed. The second electrode 220 may be disposed over a whole display area, and may include a conductive material with a relatively low work function value compared to the first electrode 210, and may be a cathode. For example, the second electrode 220 may include, but is not limited to, aluminum (Al), magnesium (Mg), calcium (Ca), silver (Ag), alloy thereof or combination thereof such as aluminum-magnesium alloy (Al—Mg).

In addition, an encapsulation film 170 may be disposed over the second electrode 220 in order to prevent outer moisture from penetrating into the organic light emitting diode 200. The encapsulation film 170 may have, but is not limited to, a laminated structure of a first inorganic insulating film 172, an organic insulating film 174 and a second inorganic insulating film 176. The encapsulation film 170 may be omitted.

A polarizing plate may be attached onto the encapsulation film to reduce reflection of external light. For example, the polarizing plate may be a circular polarizing plate. Further, a cover window may be attached onto the encapsulation film 170 or the polarizing plate. In this case, the substrate 102 and the cover window have flexible properties so that a flexible display device can be constructed.

As described above, the emitting unit 230 in the organic light emitting diode 200 includes particular compound so that the organic light emitting diode 200 can enhance its luminous efficiency and its luminous life time. FIG. 3 is a schematic cross-sectional view illustrating an organic light emitting diode having a single emitting unit in accordance with an exemplary embodiment of the present disclosure.

As illustrated in FIG. 3, the organic light emitting diode (OLED) 300 in accordance with the first embodiment of the present disclosure includes first and second electrodes 310 and 320 facing each other and an emitting unit 330 disposed between the first and second electrodes 310 and 320. In an exemplary embodiment, the emitting unit 330 includes an emitting material layer (EML) 360 disposed between the first and second electrodes 310 and 320 and an electron blocking layer (EBL) 355 as a first exciton blocking layer disposed between the first electrode 310 and the EML 360. Alternatively, the emitting unit 330 may further include a hole blocking layer (HBL) 375 as a second exciton blocking layer disposed between the EML 360 and the second electrode 320.

In addition, the emitting unit 330 may further include a hole injection layer (HIL) 340 disposed between the first electrode 310 and the EBL 355 and a hole transport layer (HTL) 350 disposed between the HIL 340 and the EBL 355. In addition, the emitting unit 330 may further include an electron injection layer (HIL) 380 disposed between the HBL 375 and the second electrode 320. In an alternative embodiment, the emitting unit 330 may further include an electron transport layer (ETL, not shown) disposed between the HBL 375 and the HIL 380.

The first electrode 310 may be an anode that provides a hole into the EML 360. The first electrode 310 may include a conductive material having a relatively high work function value, for example, a transparent conductive oxide (TCO). In an exemplary embodiment, the first electrode 310 may include, but is not limited to, indium tin oxide (ITO), indium zinc oxide (IZO), indium tin zinc oxide (ITZO), SnO, ZnO, indium cerium oxide (ICO), aluminum doped zinc oxide (AZO), and the like.

The second electrode 320 may be a cathode that provides an electron into the EML 360. The second electrode 320 may include a conductive material having a relatively low work function values, i.e., a highly reflective material such as aluminum (Al), magnesium (Mg), calcium (Ca), silver (Ag), alloy thereof or combination thereof such as aluminum-magnesium alloy (Al—Mg). For example, each of the first and second electrodes 310 and 320 may be laminated with a thickness of, but is not limited to, about 30 nm to about 300 nm.

The EML 360 includes a first host, an anthracene-based derivative, and a first dopant, a boron-based derivative so that the EML 360 emits blue color light. As an example, the first host has the following structure of Chemical Formula 1:

Chemical Formula 1

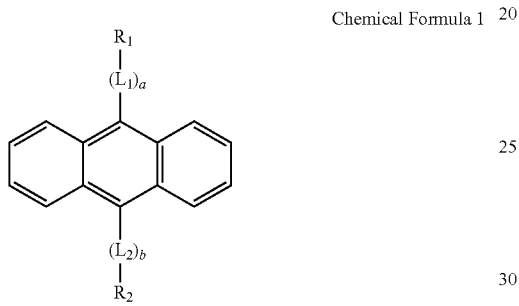

In Chemical Formula 1, each of $R_1$ and $R_2$ is independently a $C_6$~$C_{30}$ aryl group or a $C_5$~$C_{30}$ hetero aryl group. Each of $L_1$ and $L_2$ is independently a $C_6$~$C_{30}$ arylene group. Each of a and b is an integer of 0 (zero) or 1.

As an example, $R_1$ in Chemical Formula 1 may comprise phenyl or naphthyl, $R_2$ in Chemical Formula 1 may comprise naphthyl, dibenzofuranyl or fused dibenzofuranyl, and each of $L_1$ and $L_2$ in Chemical Formula 1 may independently comprise phenylene. Alternatively, at least one of hydrogen atoms in the anthracene moiety may be substituted with deuterium.

In an exemplary embodiment, the first host may comprise any compound having the following structure of Chemical Formula 2:

Chemical Formula 2

Host 1

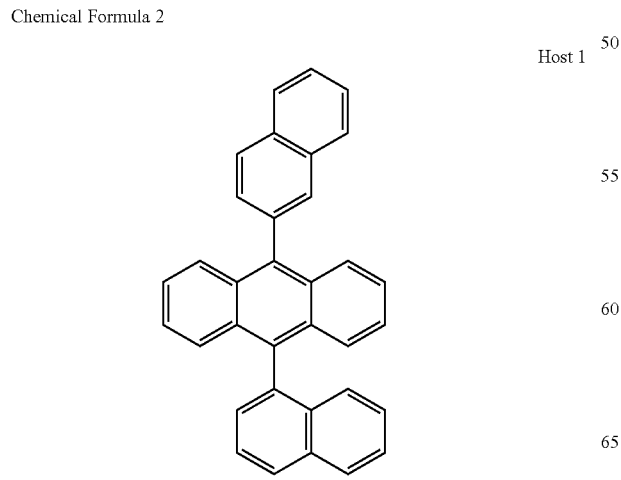

Host 2

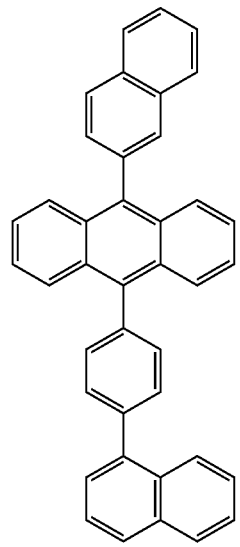

Host 3

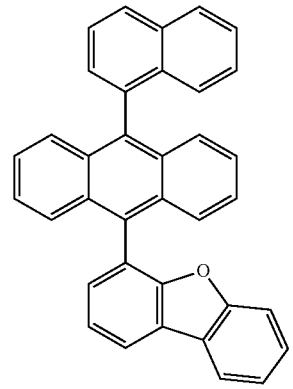

Host 4

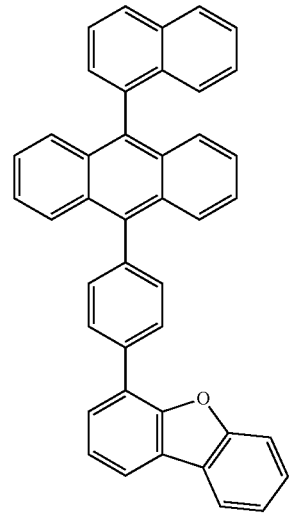

Host 5
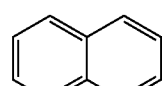
Host 6
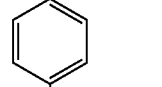
Host 7
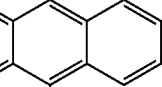
Host 8
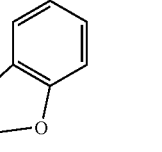
Host 9
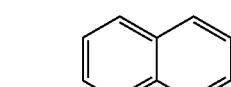
Host 10
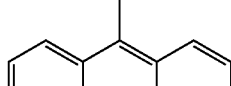

Host 11
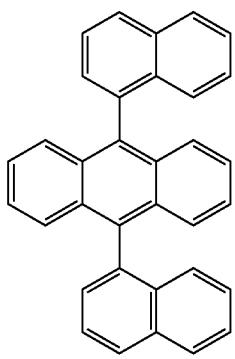
Host 12
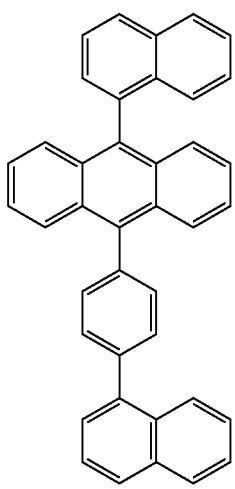
Host 13
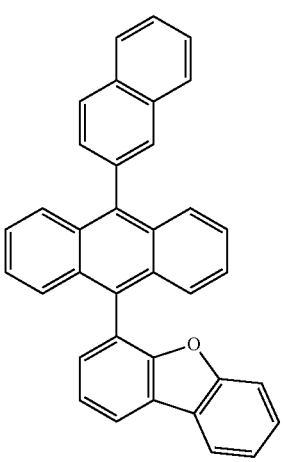
Host 14
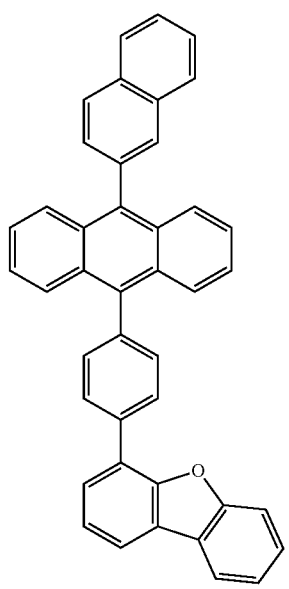
Host 15
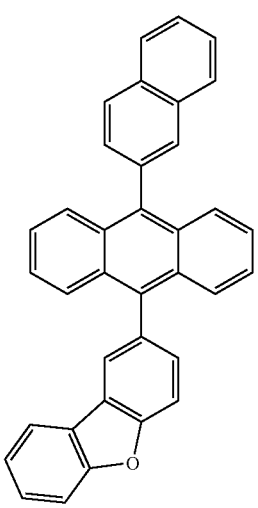

Host 16
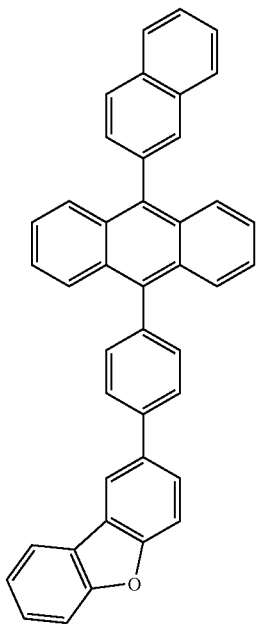
Host 17
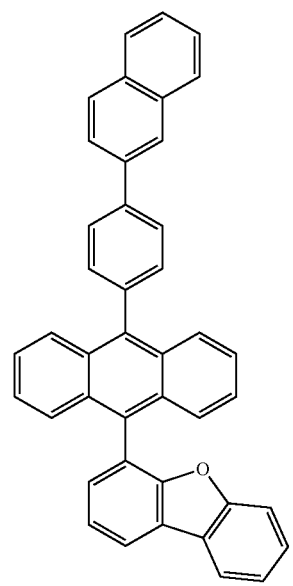
Host 18
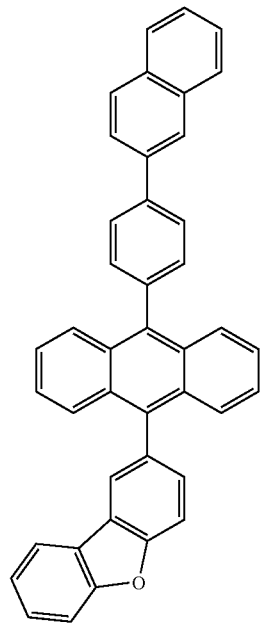
Host 19
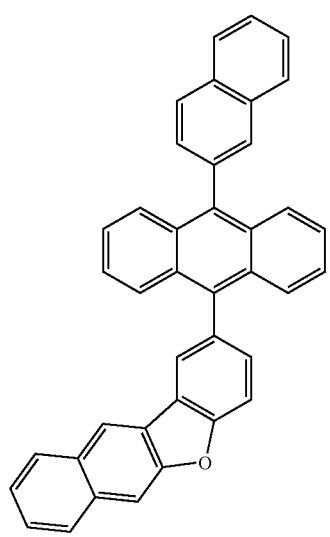

Host 20
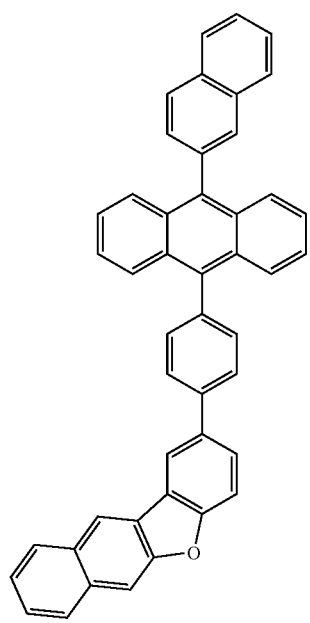
Host 21
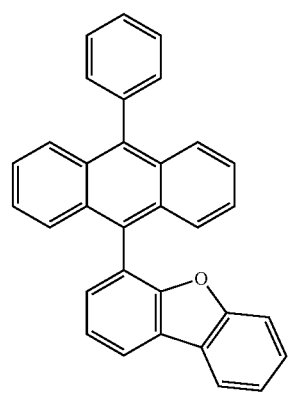
Host 22
Host 23
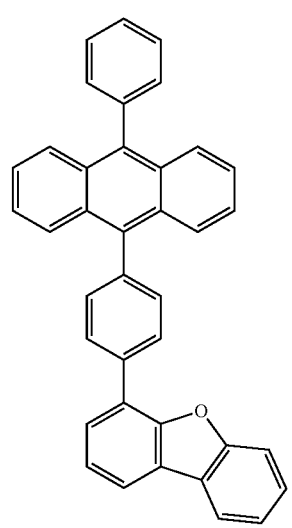
Host 24
Host 25
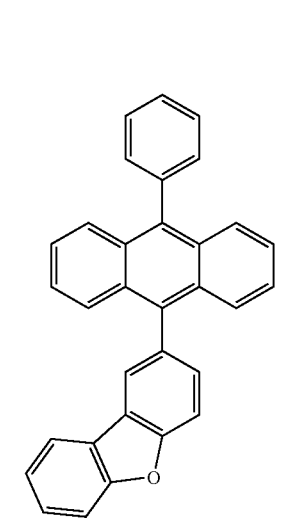

Host 26

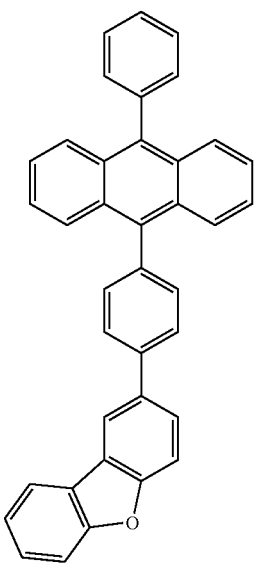

Host 27

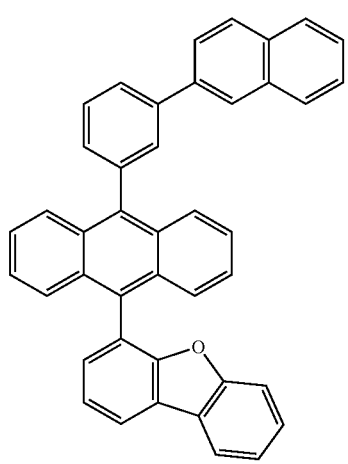

Host 28

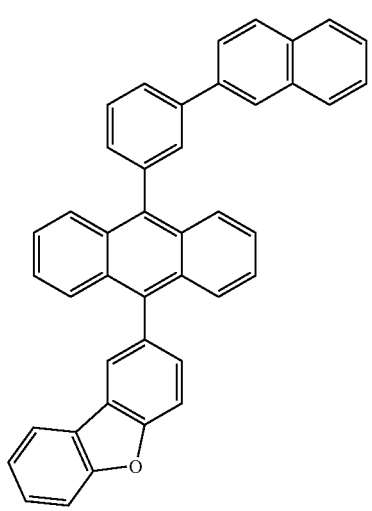

Host 29

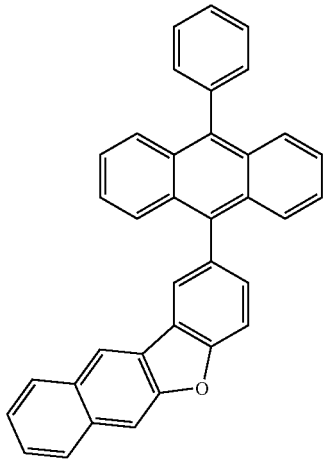

Host 30

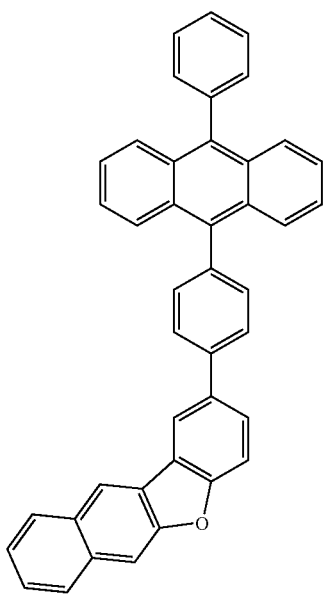

The first dopant, which emits blue color light, may include a boron-based compound having the following structure of Chemical Formula 3:

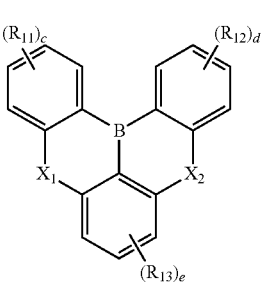

Chemical Formula 3

In Chemical Formula 3, each of R11 and R12 is independently a C1~C20 alkyl group, a C6~C30 aryl group, a C5~C30 hetero aryl group or a C6~C30 aryl amino group, or two adjacent groups among R11 or two adjacent groups among R12 form a fused aromatic or hetero aromatic ring. Each of c and d is independently an integer of 0 (zero) to 4.

R13 is a C1~C10 alkyl group, a C6~C30 aryl group, a C5~C30 hetero aryl group or a C5~C30 aromatic amino group; e is an integer of 0 (zero) to 3; each of X1 and X2 is independently oxygen (O) or $NR_{14}$, wherein $R_{14}$ is a $C_6$~$C_{30}$ aryl group.

Alternatively, each of the aryl group, the hetero aryl group and/or the aryl amino group constituting $R_{11}$ to $R_{14}$ in Chemical Formula 3 may be further substituted with at least one of a $C_1$~C10 alkyl group, preferably $C_1$~$C_5$ alkyl group, an unsubstituted or $C_1$~$C_{10}$ alkyl substituted $C_6$~$C_{30}$ aryl group and an unsubstituted or $C_1$~$C_{10}$ alkyl substituted C5 $C_{30}$ hetero aryl group, but is not limited thereto.

As an example, the first dopant may include any compound having the following structure of Chemical Formula 4:

Chemical Formula 4

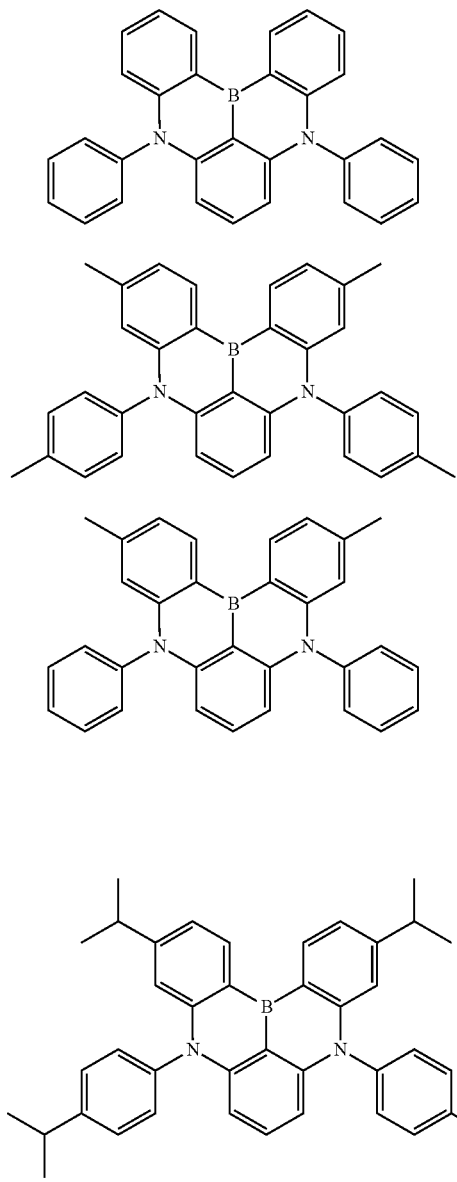

Dopant 1

Dopant 2

Dopant 3

Dopant 4

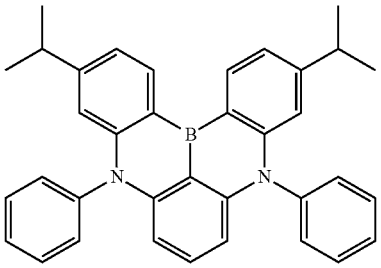

Dopant 5

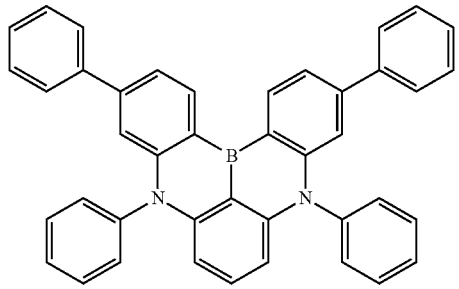

Dopant 6

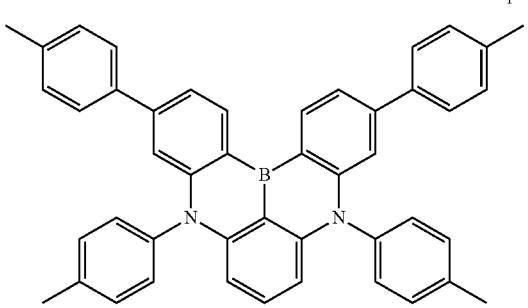

Dopant 7

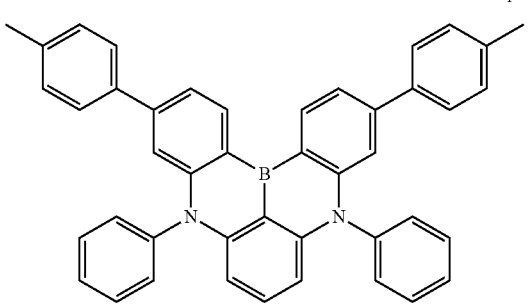

Dopant 8

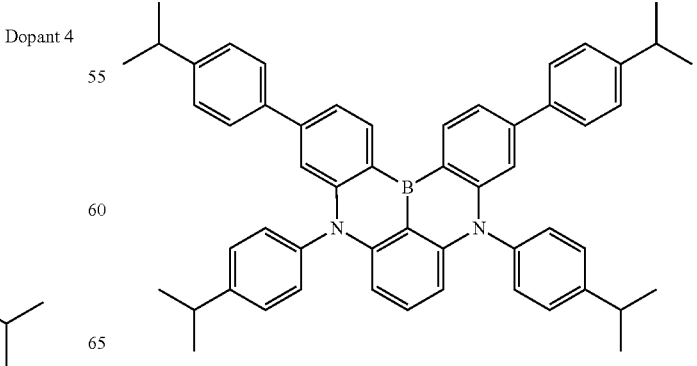

Dopant 9

-continued
Dopant 10
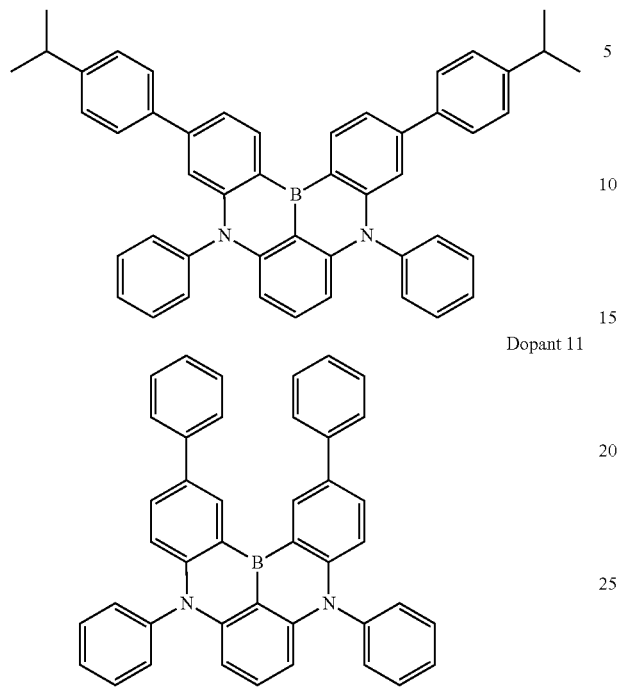
Dopant 11
Dopant 12
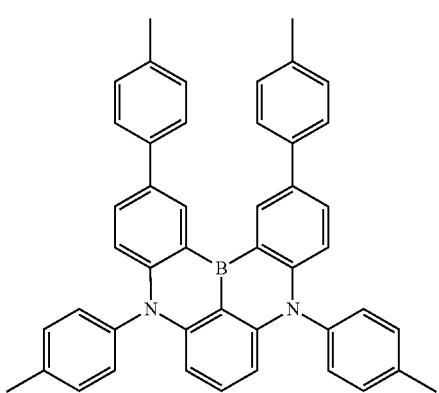
Dopant 13
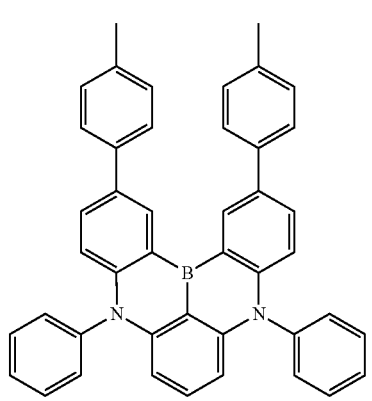
-continued
Dopant 14
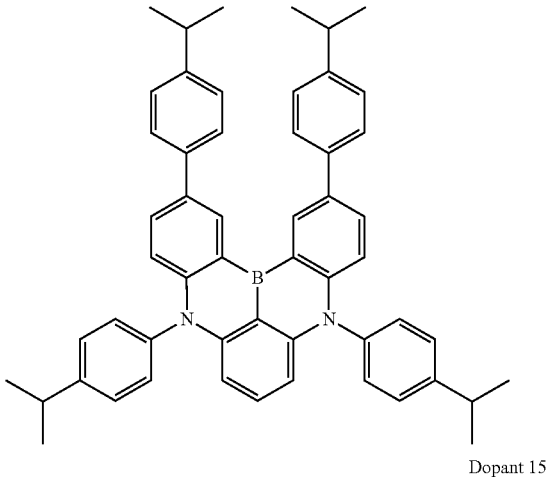
Dopant 15
Dopant 16
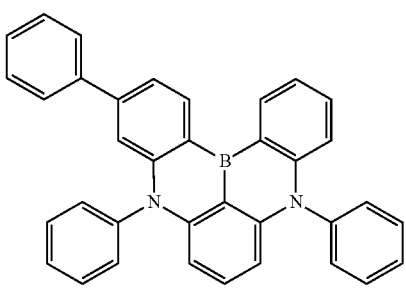
Dopant 17
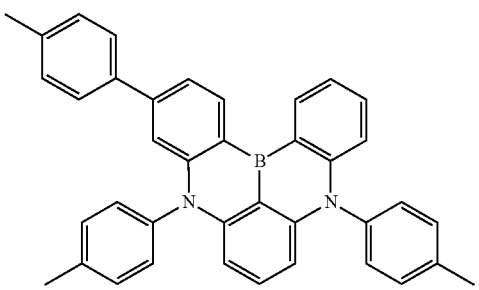

-continued
Dopant 18
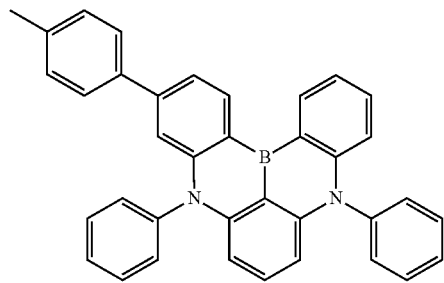
Dopant 19
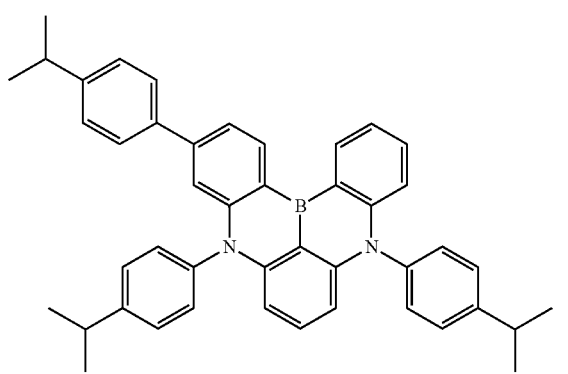
Dopant 20
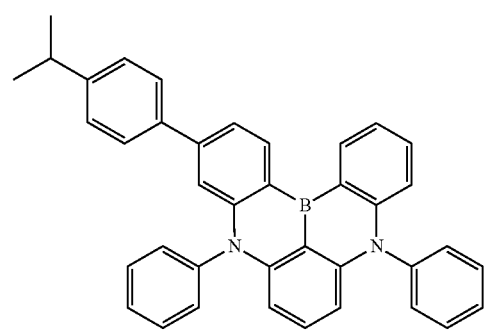
Dopant 21
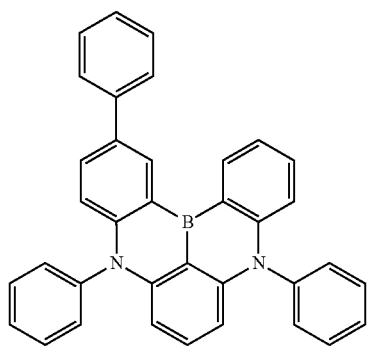
-continued
Dopant 22
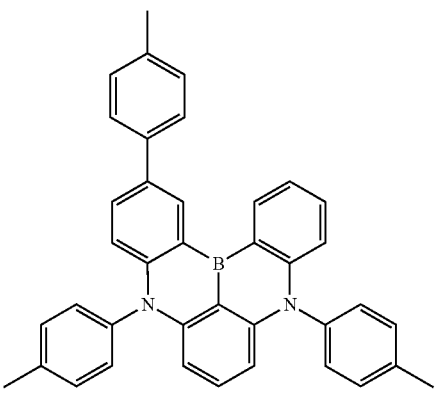
Dopant 23
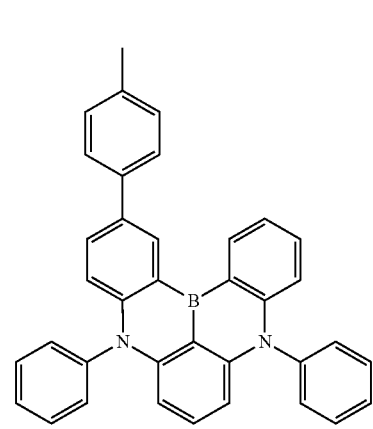
Dopant 24
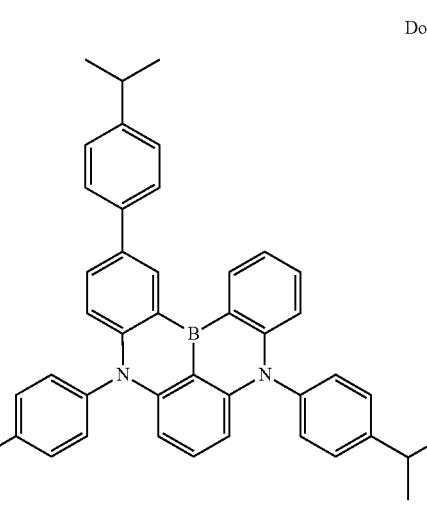

-continued
Dopant 25
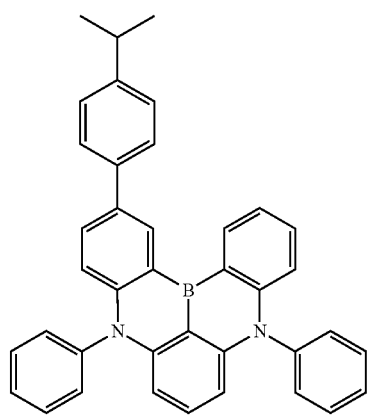
Dopant 26
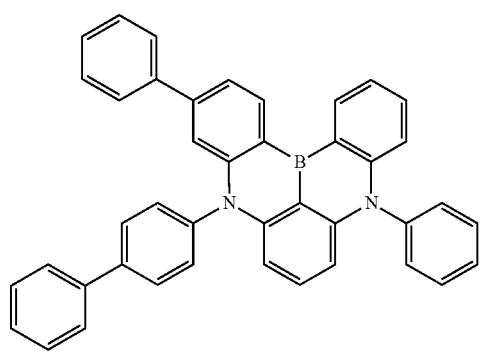
Dopant 27
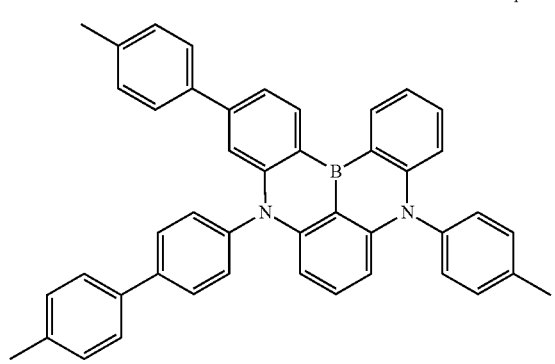
Dopant 28
Dopant 29
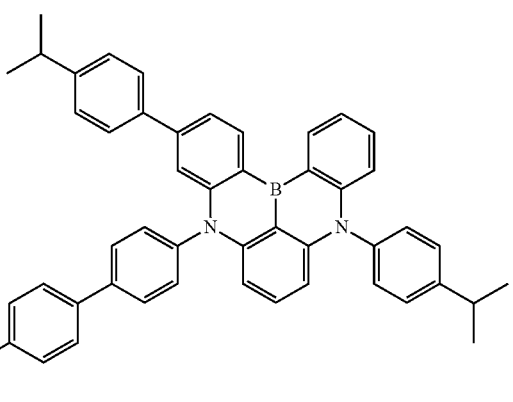
Dopant 30
Dopant 31
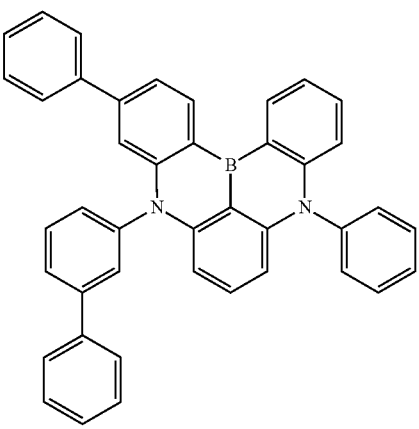

Dopant 32
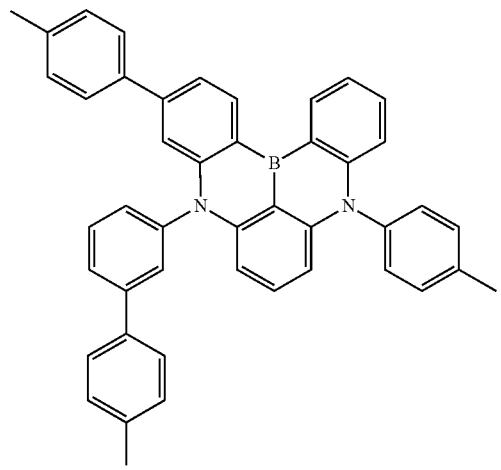
Dopant 33
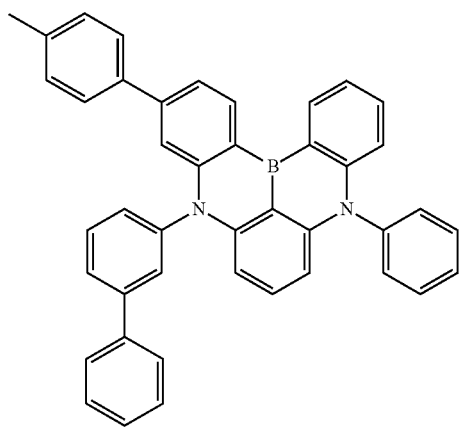
Dopant 34
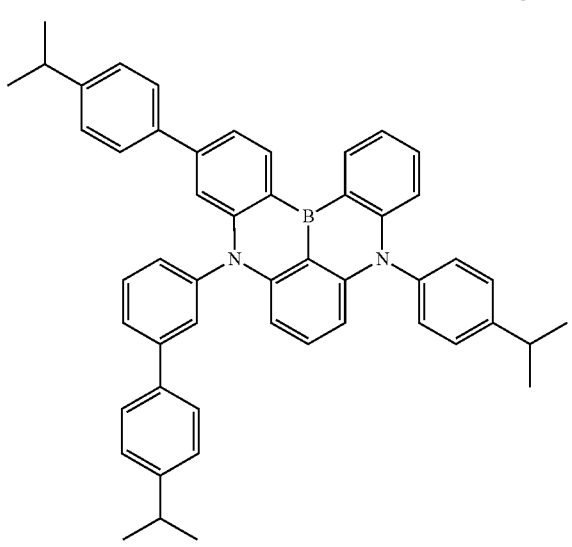
Dopant 35
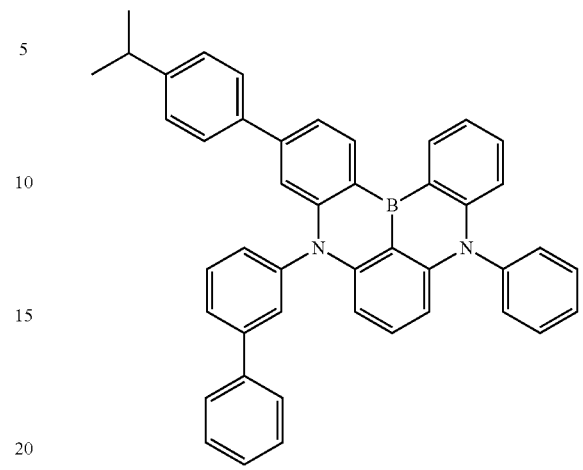
Dopant 36
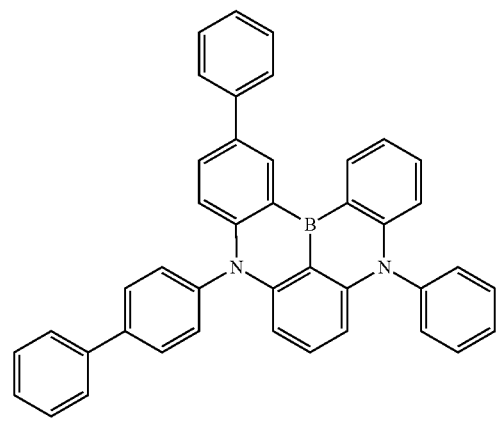
Dopant 37
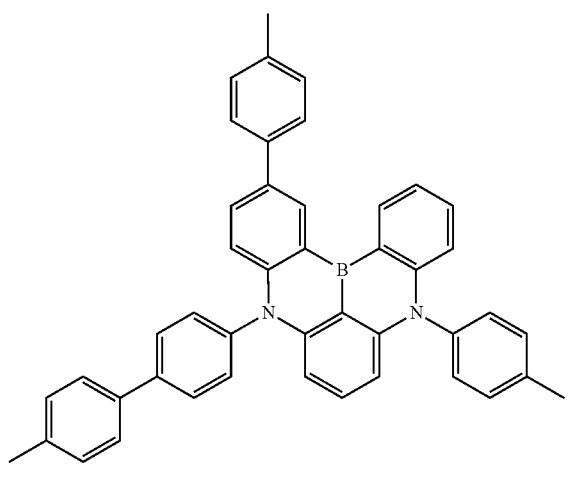

Dopant 38
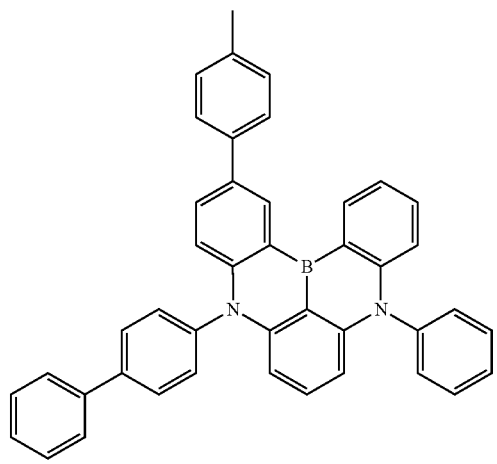
Dopant 39
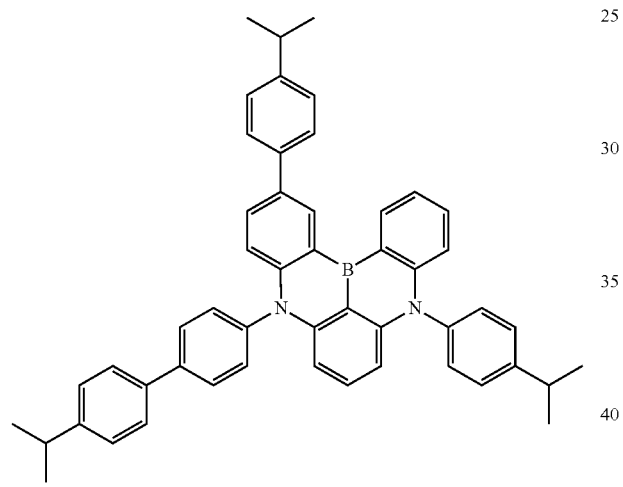
Dopant 40
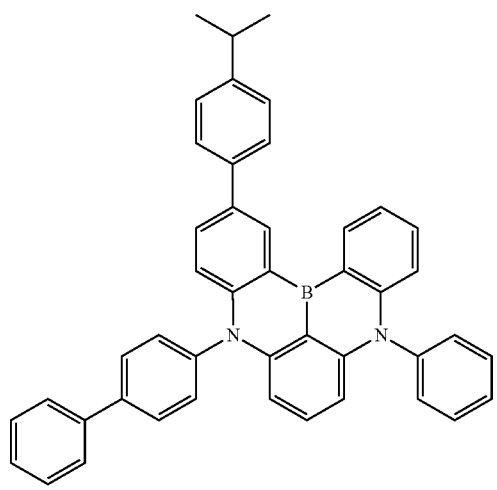
Dopant 41
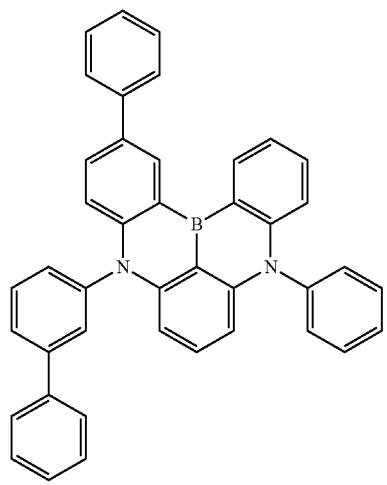
Dopant 42
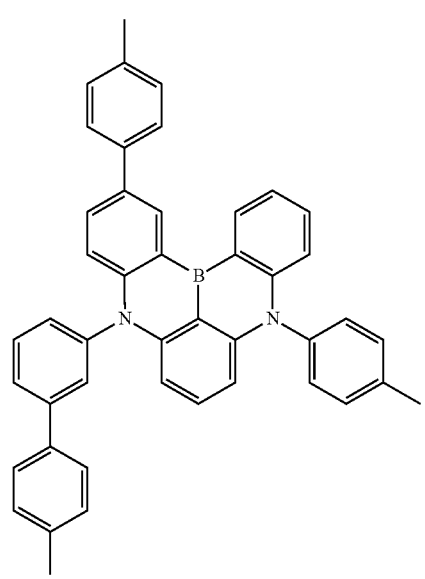
Dopant 43
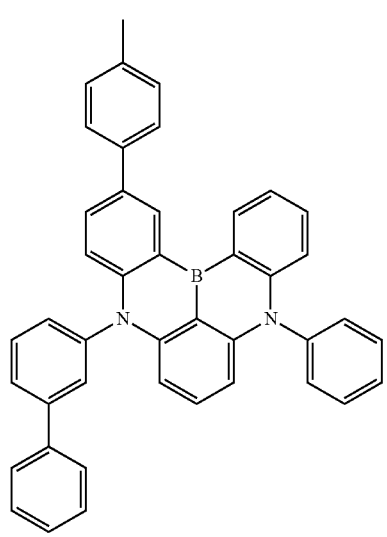

Dopant 44
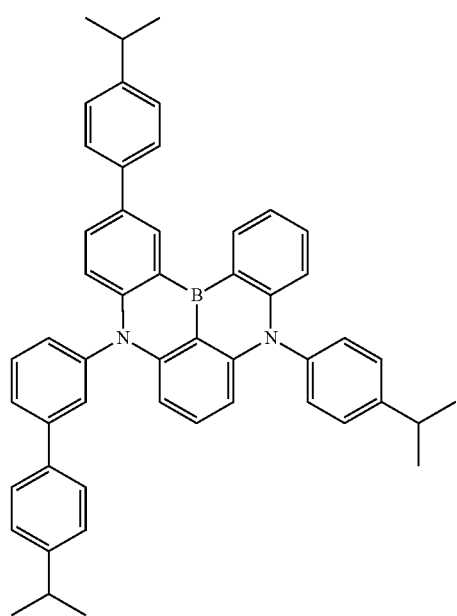
Dopant 45
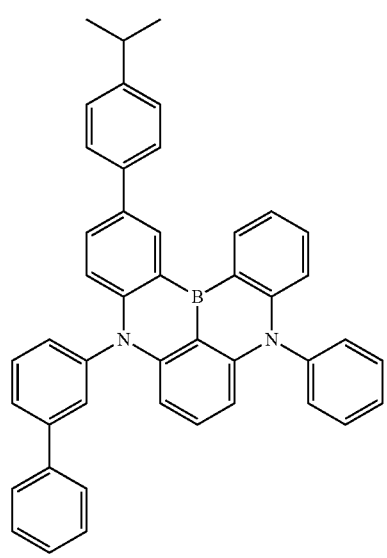
Dopant 46
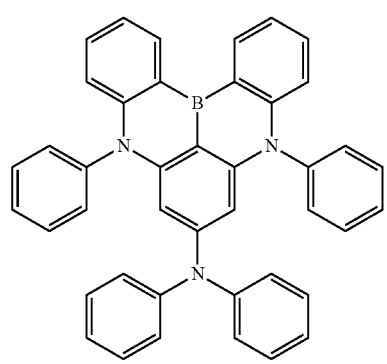
Dopant 47
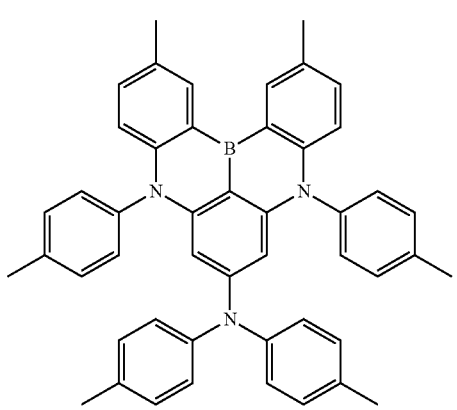
Dopant 48
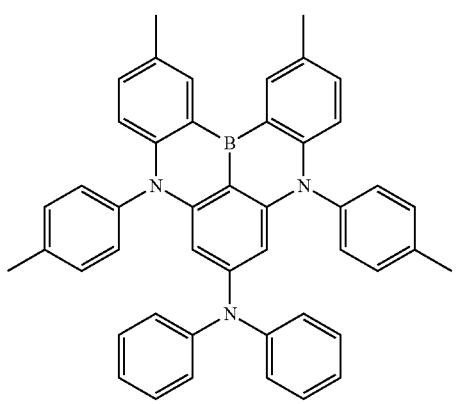
Dopant 49
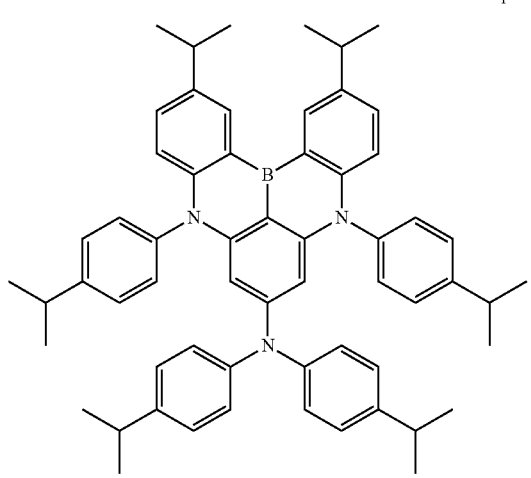

Dopant 50
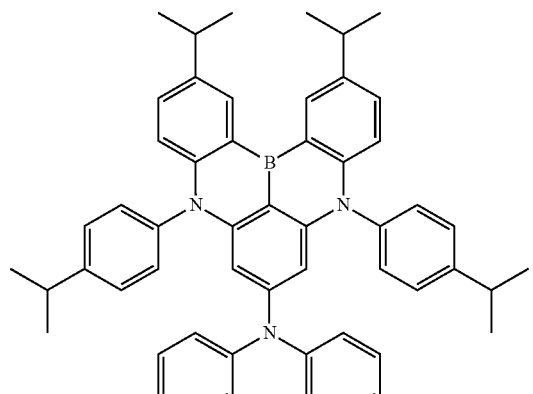
Dopant 51
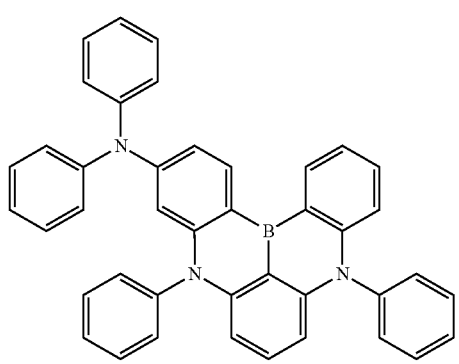
Dopant 52
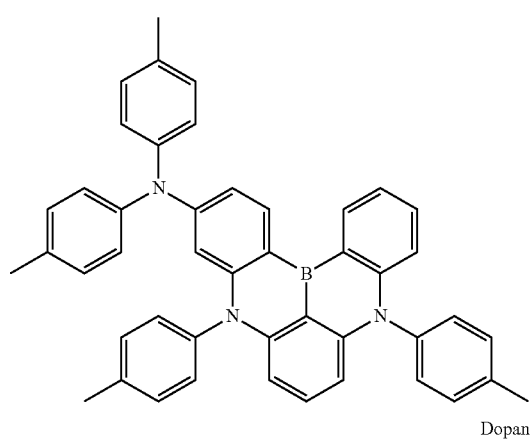
Dopant 53
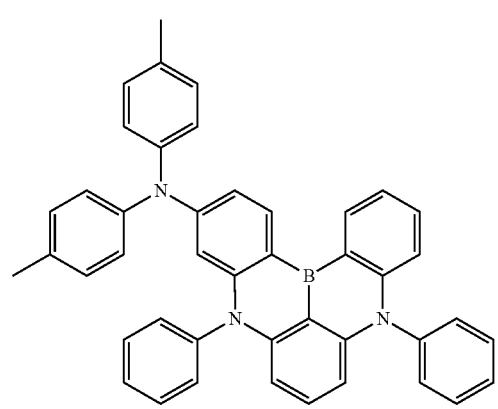
Dopant 54
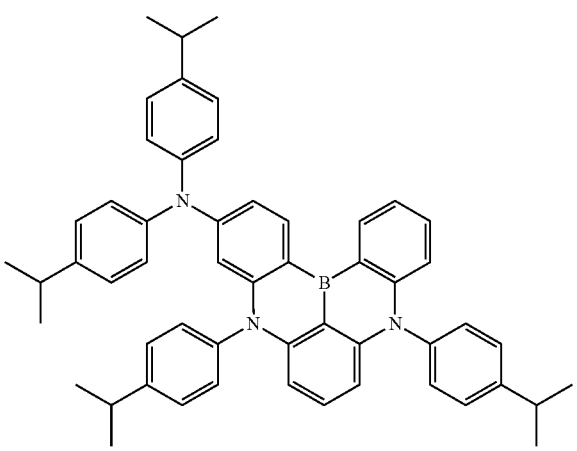
Dopant 55
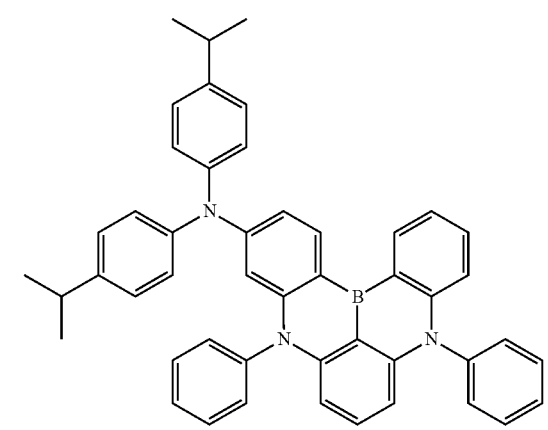
Dopant 56
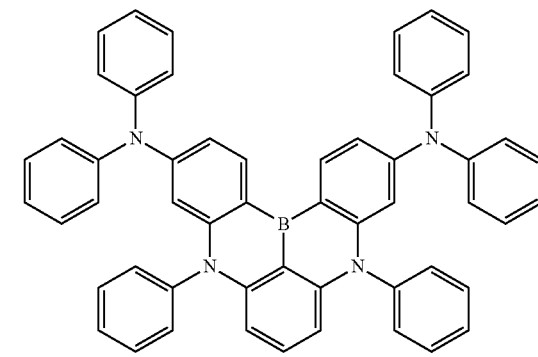

Dopant 57
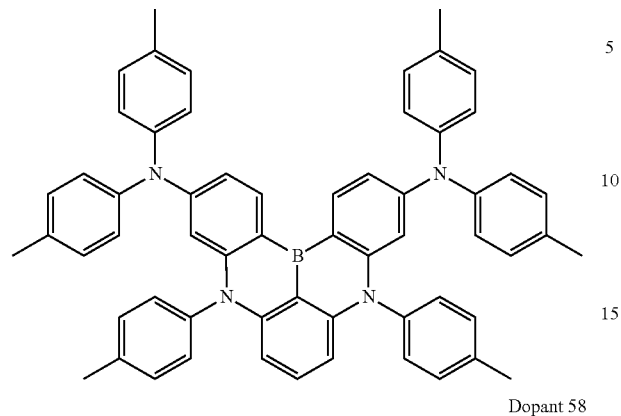
Dopant 58
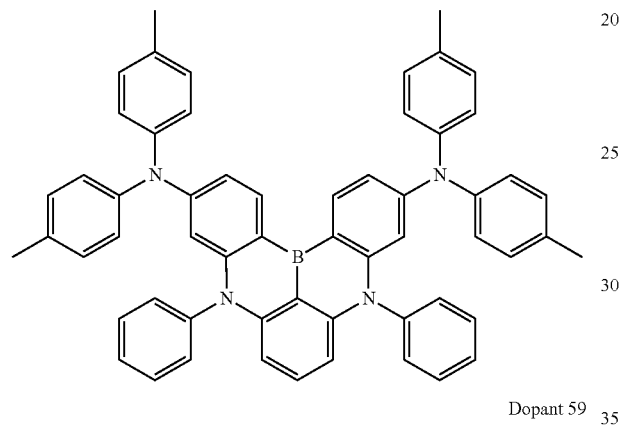
Dopant 59
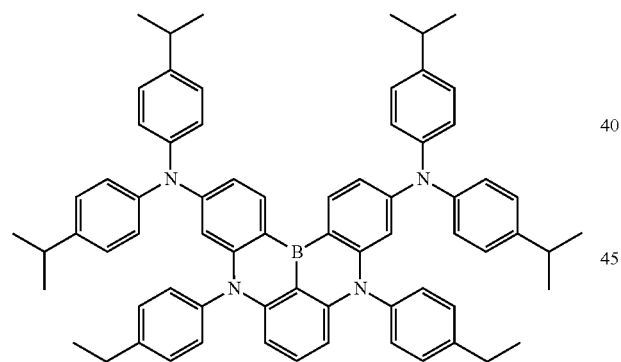
Dopant 60
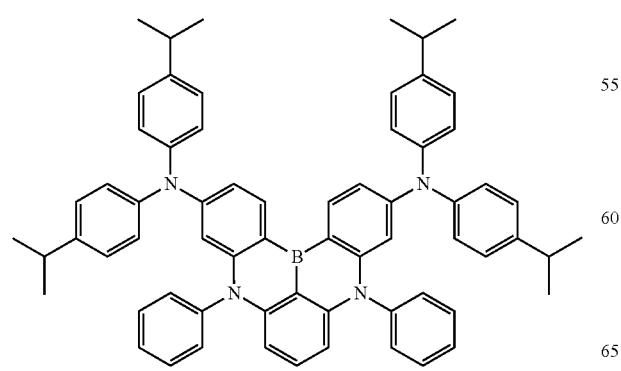
Dopant 61
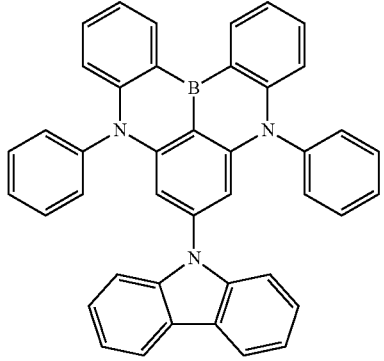
Dopant 62
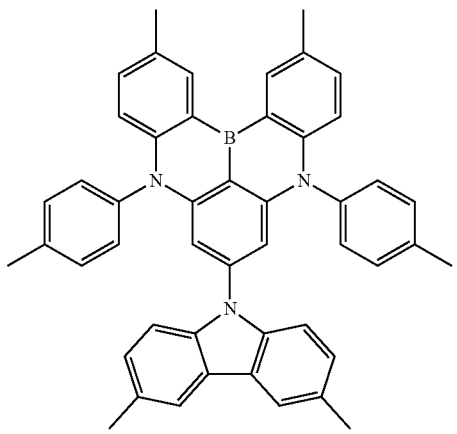
Dopant 63
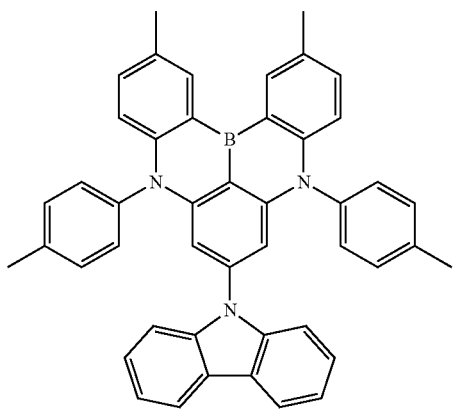

Dopant 64
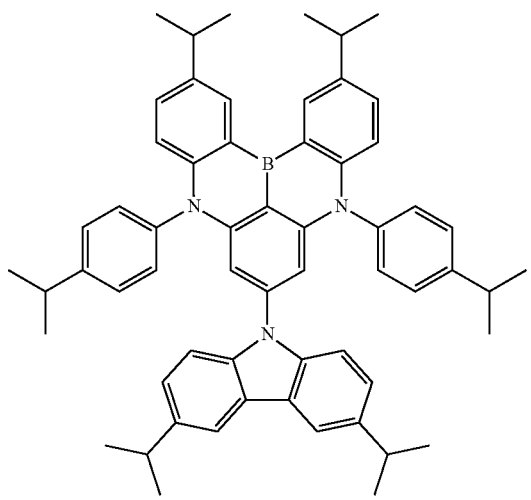
Dopant 65
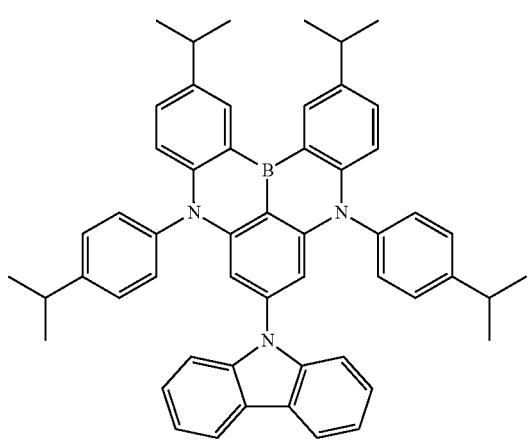
Dopant 66
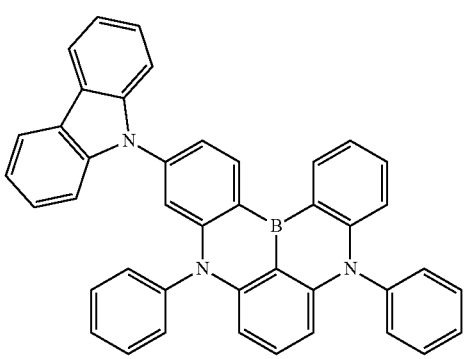
Dopant 67
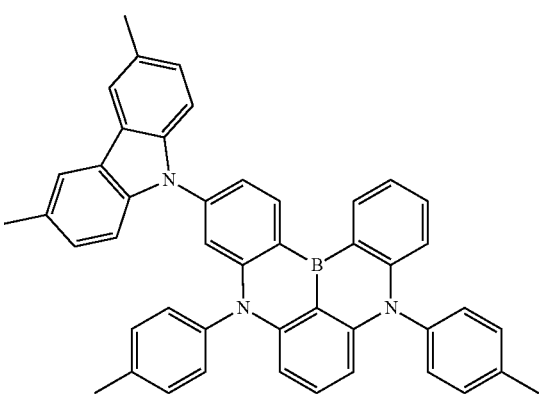
Dopant 68
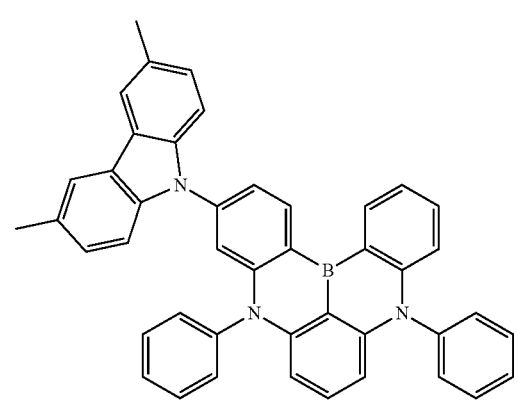
Dopant 69
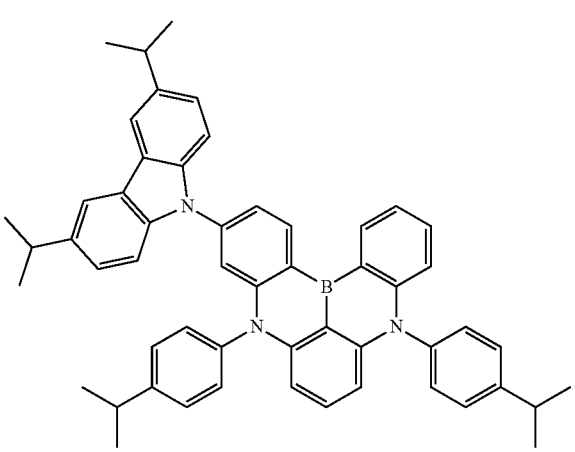

Dopant 70
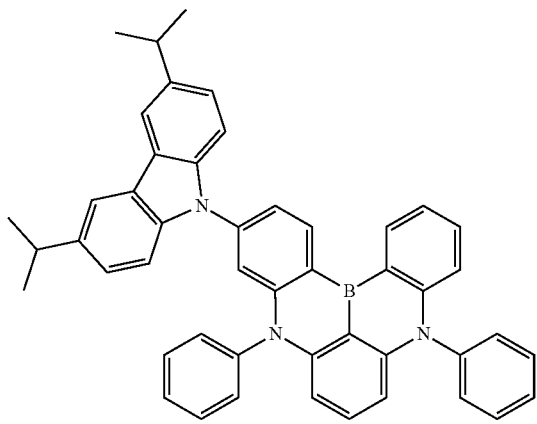
Dopant 71
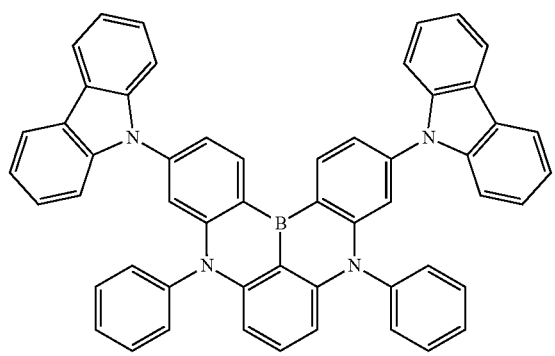
Dopant 72
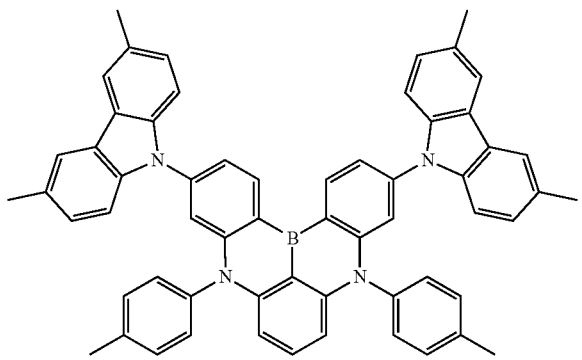
Dopant 73
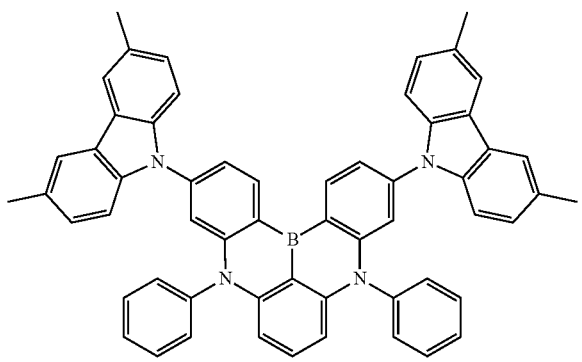
Dopant 74
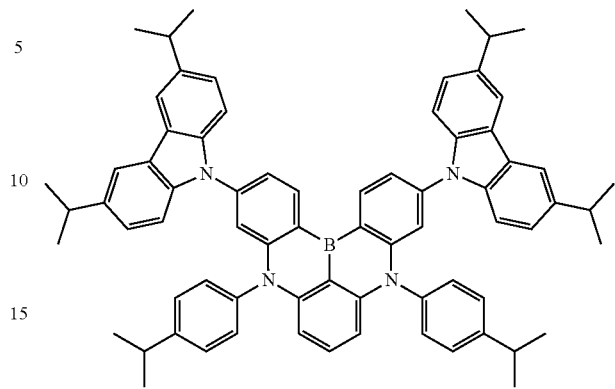
Dopant 75
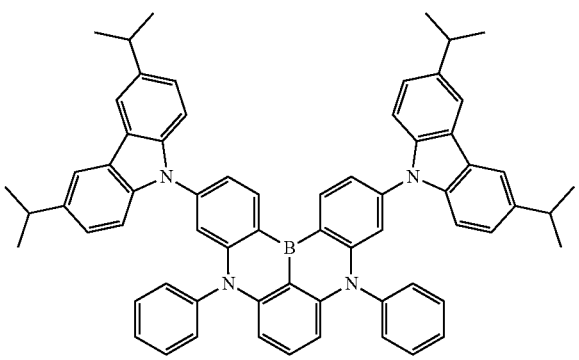
Dopant 76
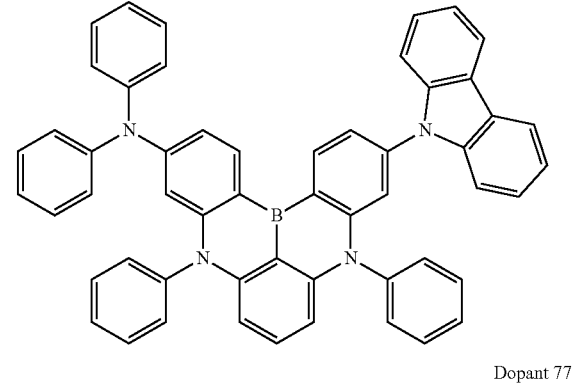
Dopant 77
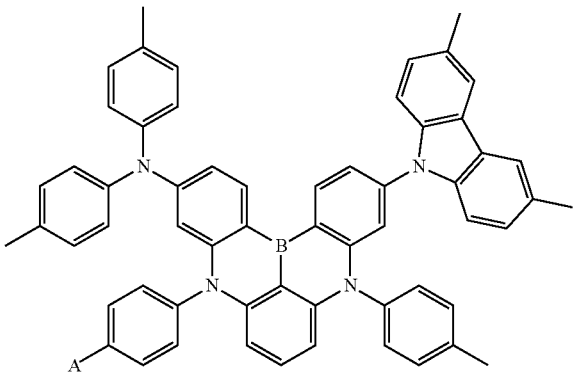

Dopant 78
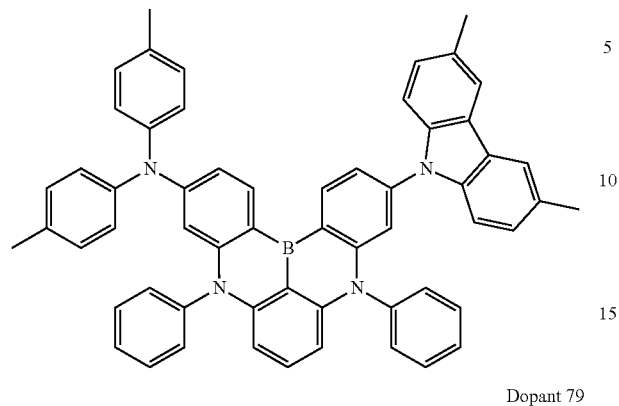
Dopant 79
Dopant 80
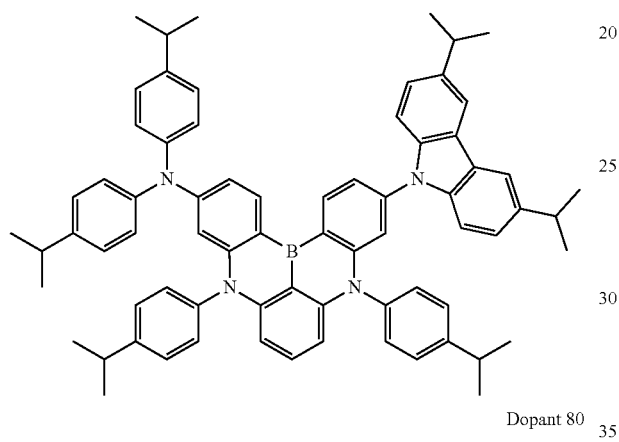
Dopant 81
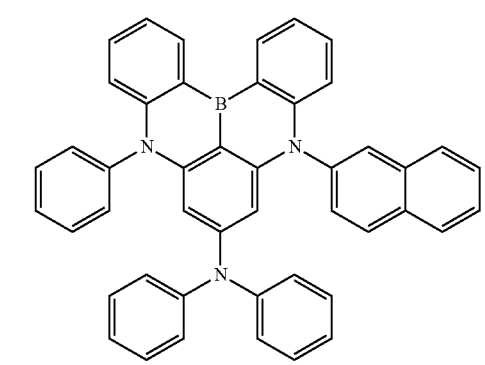
Dopant 82
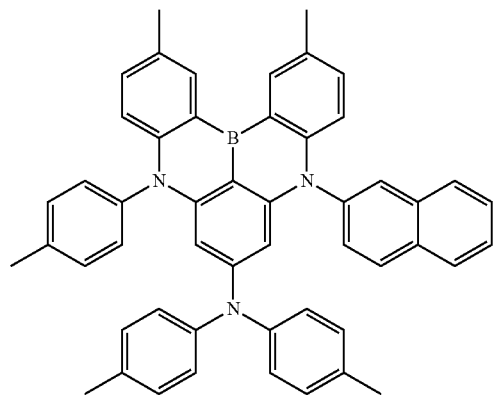
Dopant 83
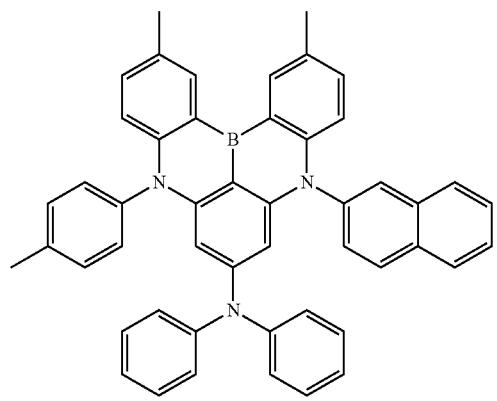
Dopant 84
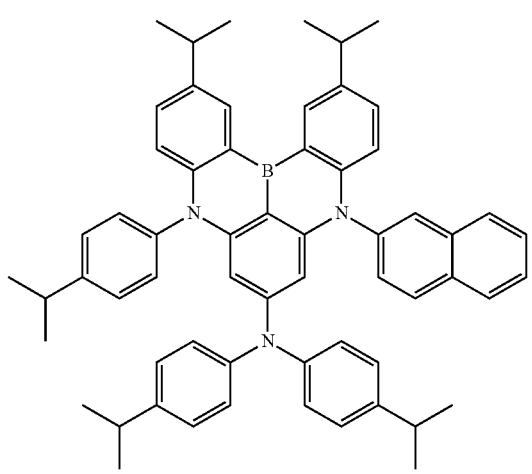

Dopant 85
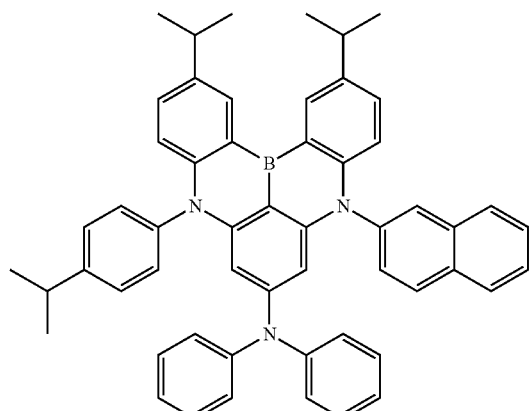
Dopant 86
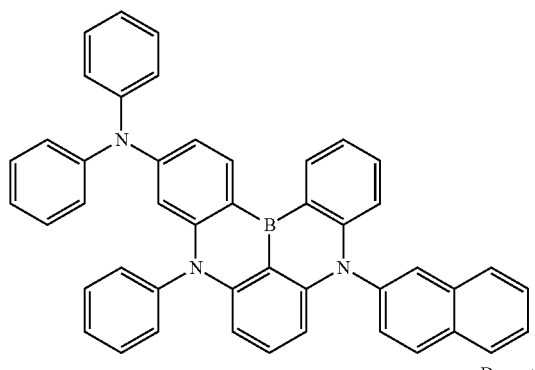
Dopant 87
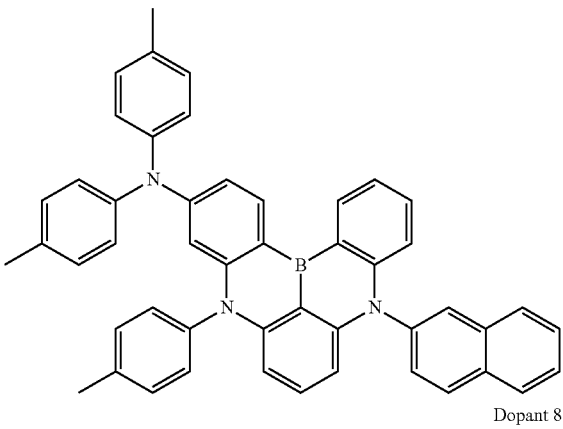
Dopant 89
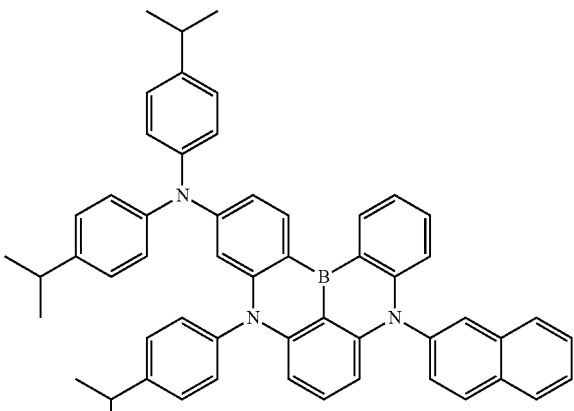
Dopant 90
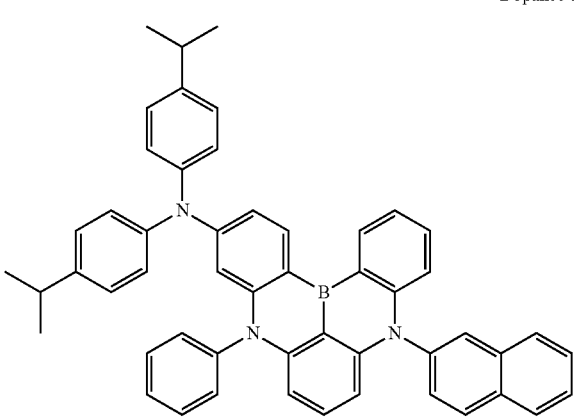
Dopant 91
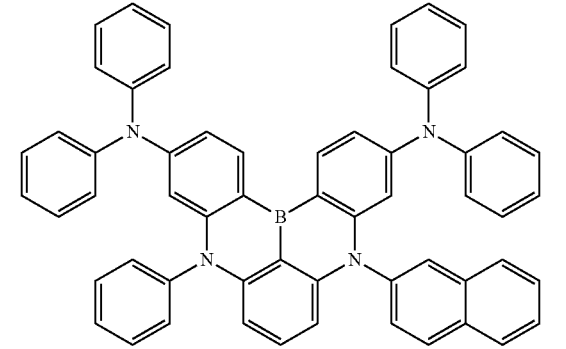
Dopant 92
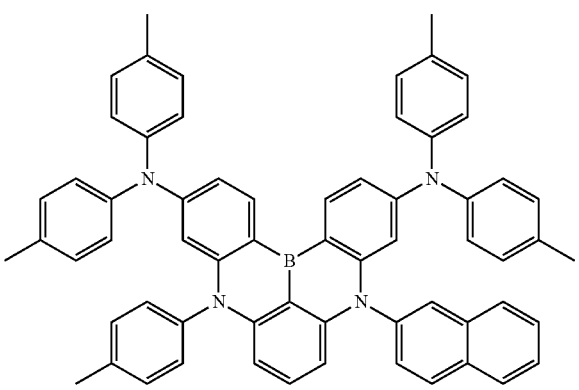

Dopant 93
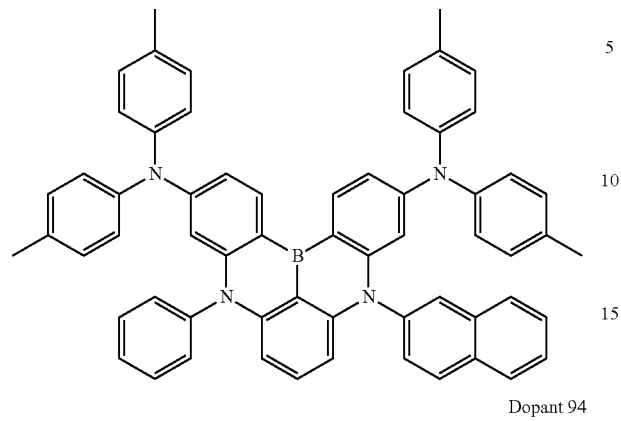
Dopant 94
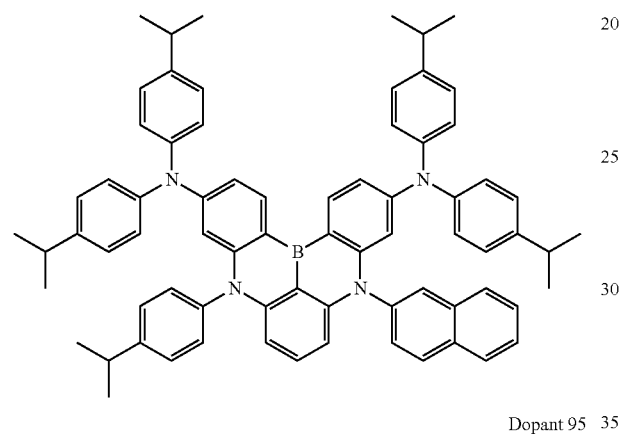
Dopant 95
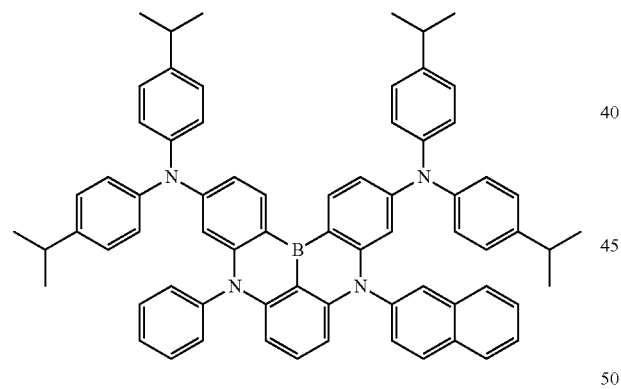
Dopant 96
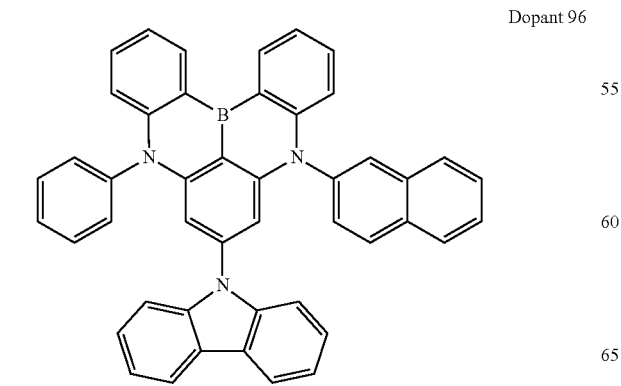
Dopant 97
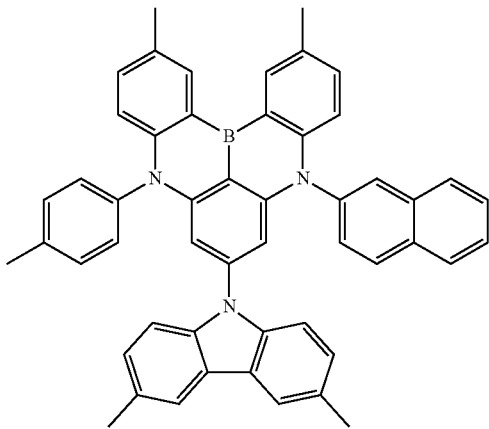
Dopant 98
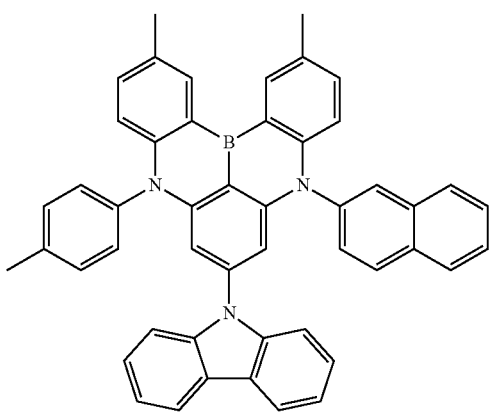
Dopant 99
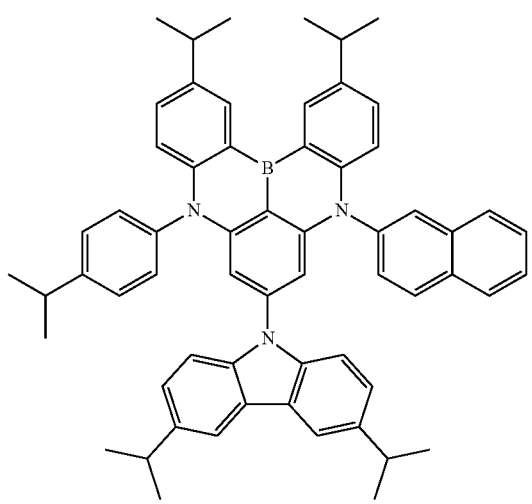

Dopant 100
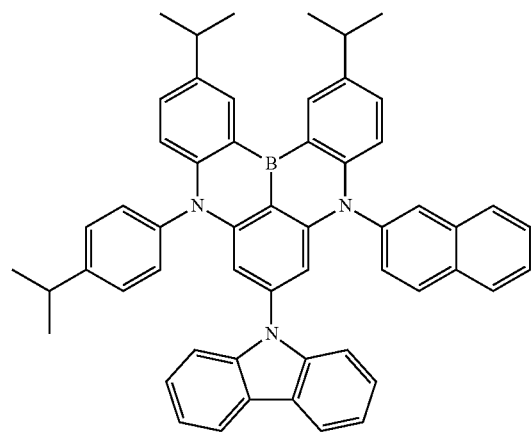
Dopant 101
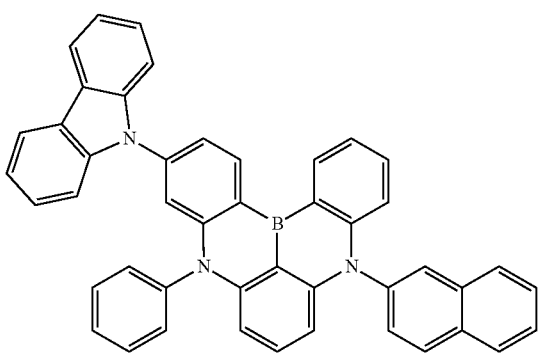
Dopant 102
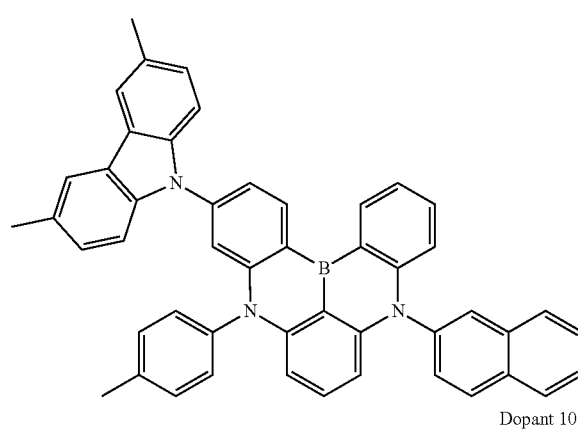
Dopant 103
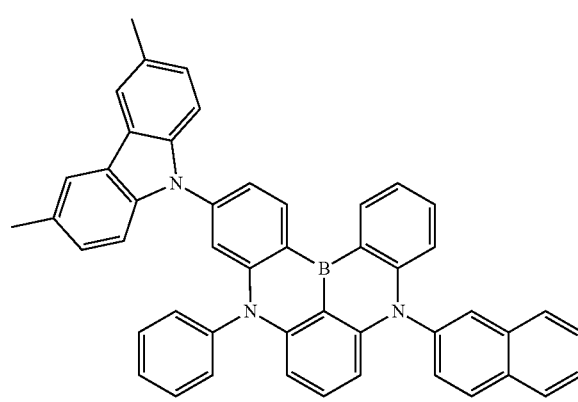
Dopant 104
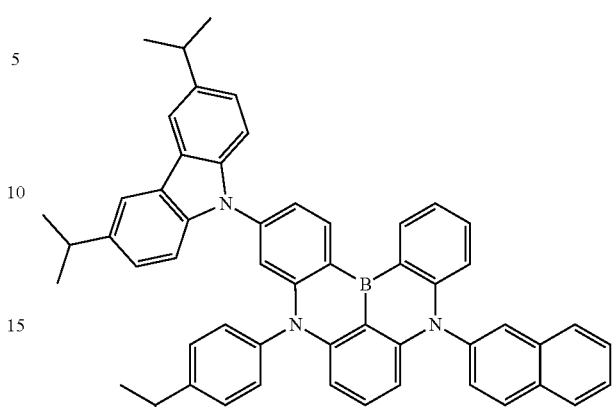
Dopant 105
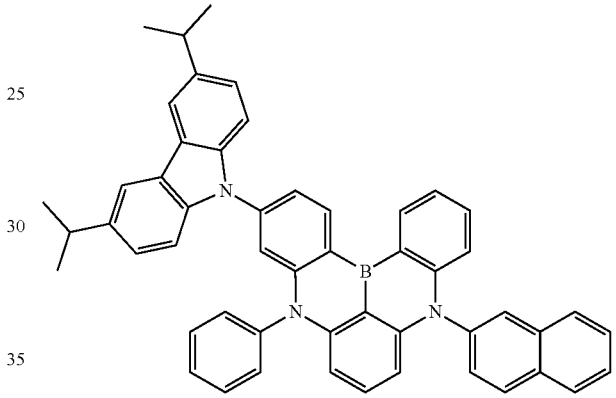
Dopant 106
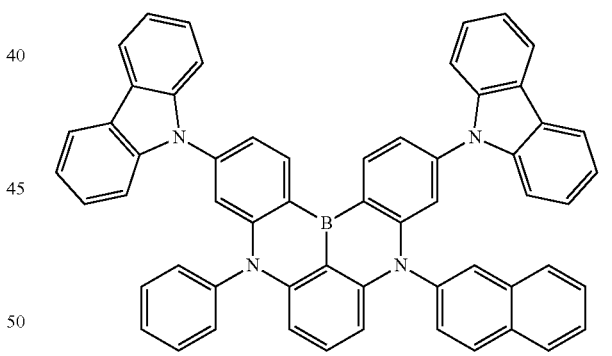
Dopant 107
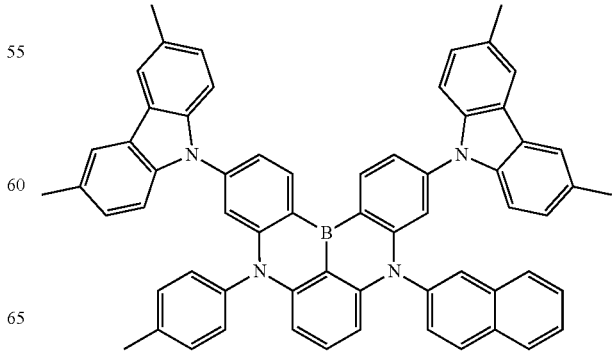

-continued
Dopant 108
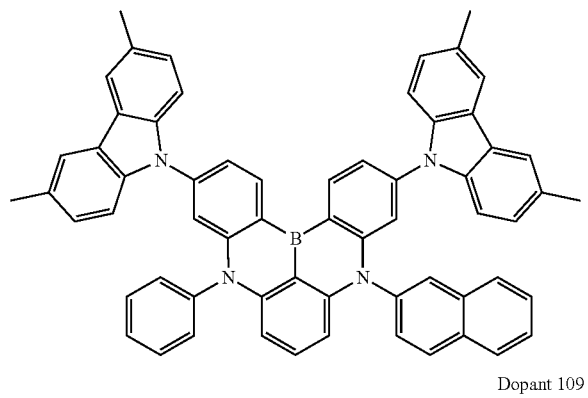
Dopant 109
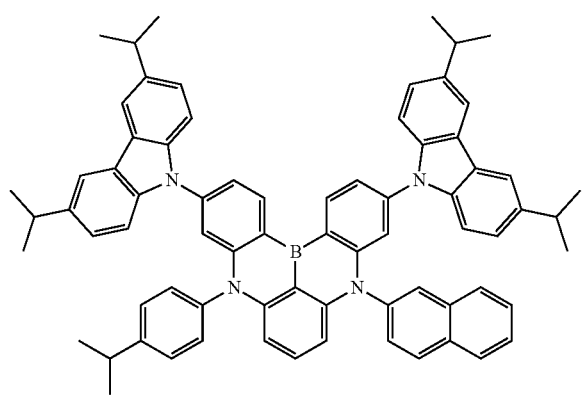
Dopant 110
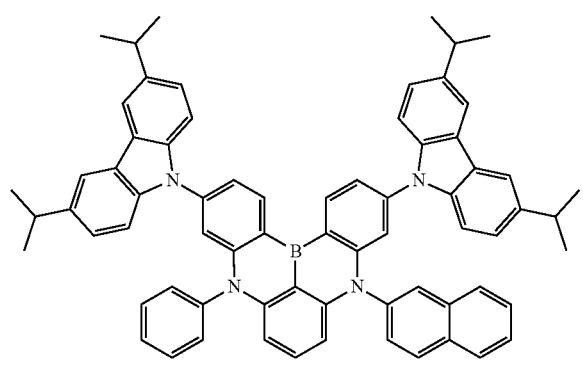
Dopant 111
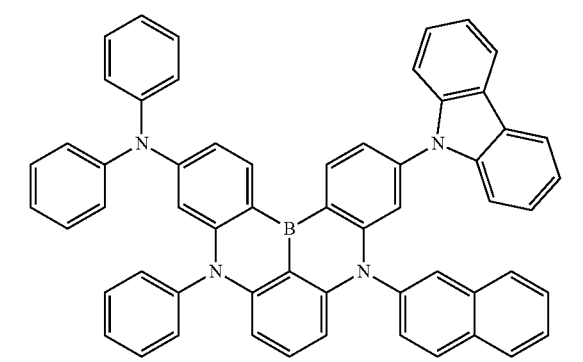
-continued
Dopant 112
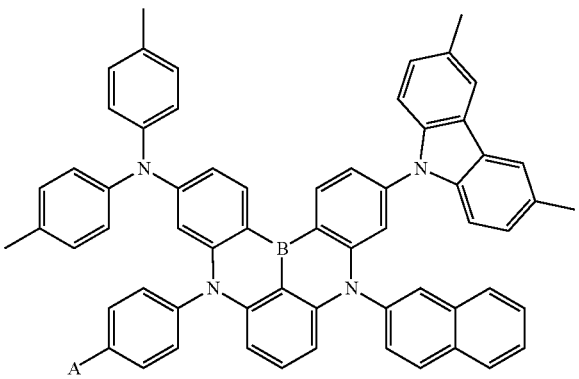
Dopant 113
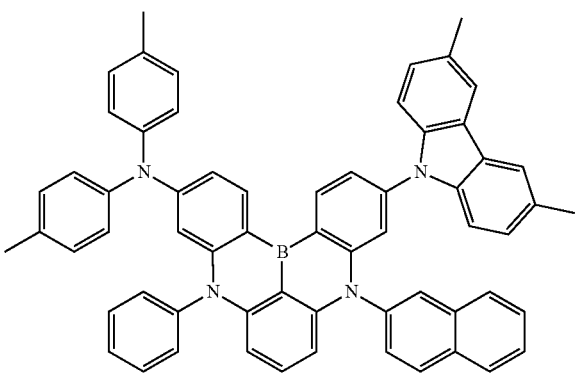
Dopant 114
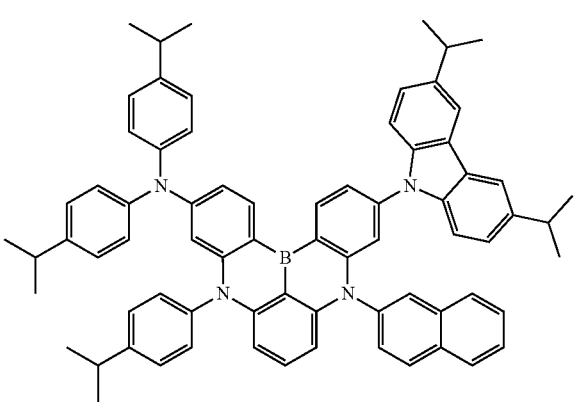
Dopant 115
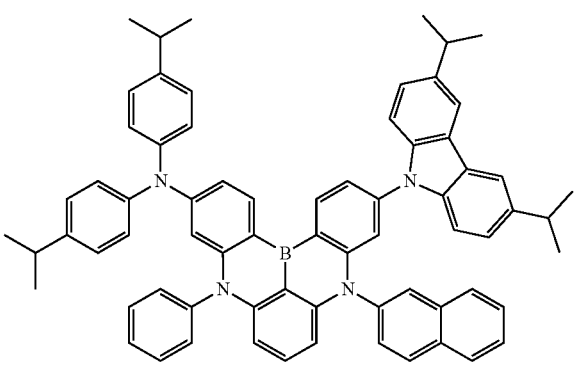

Dopant 116
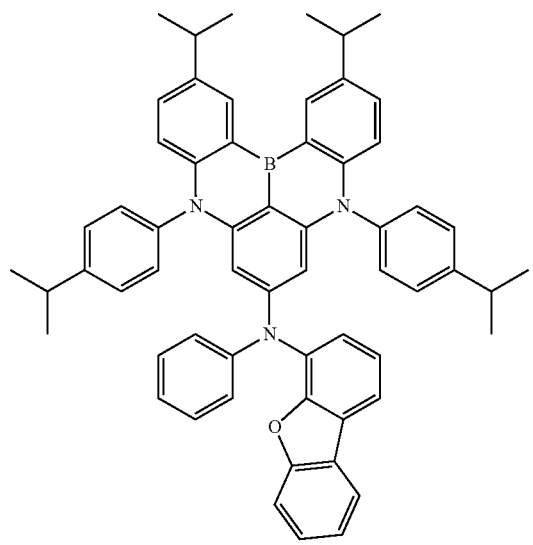
Dopant 117
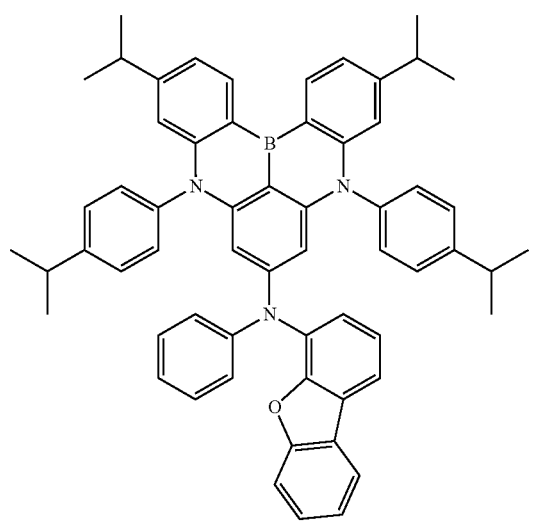
Dopant 118
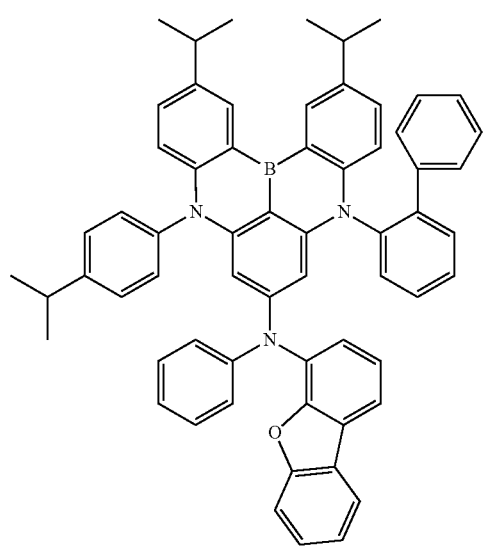
Dopant 119
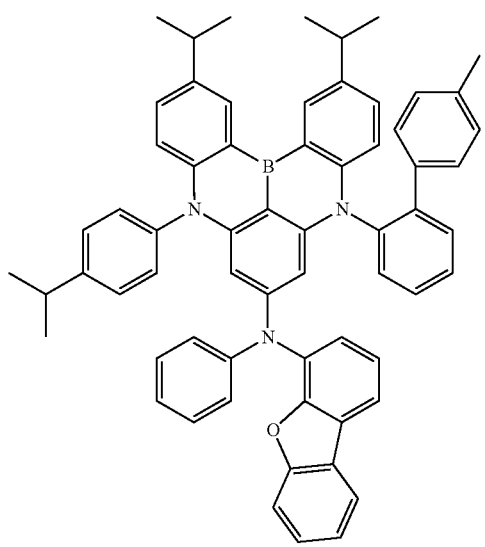
Dopant 120
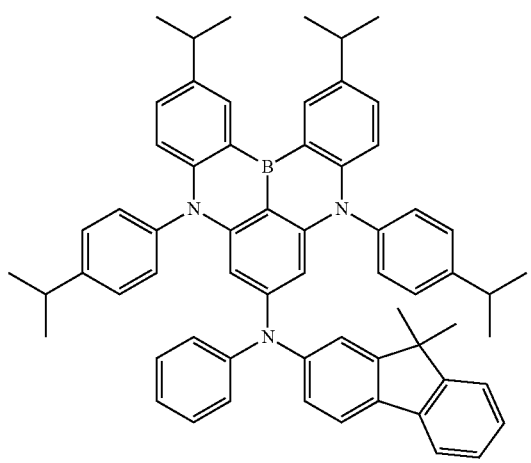
Dopant 121
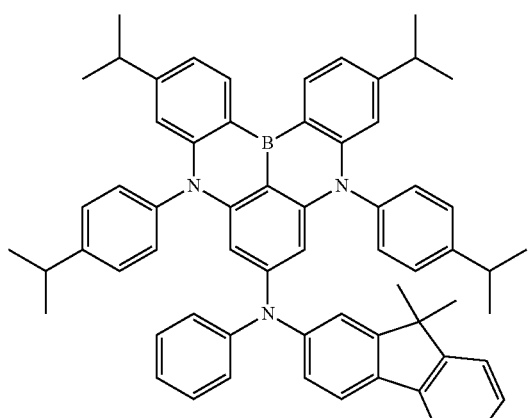

Dopant 122
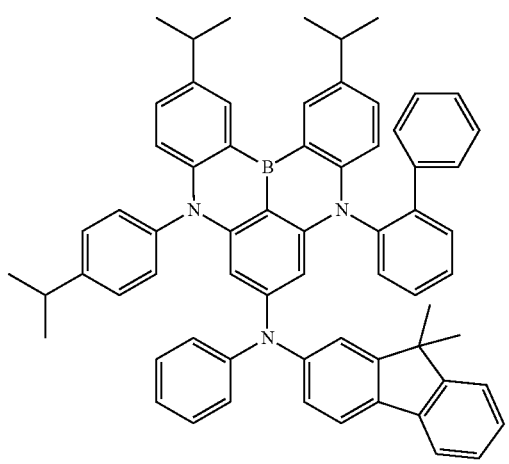
Dopant 123
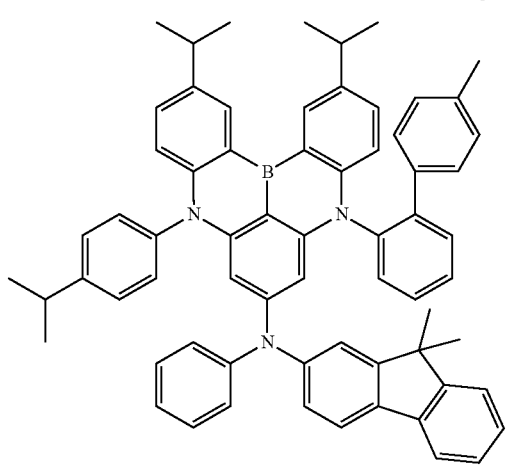
Dopant 124
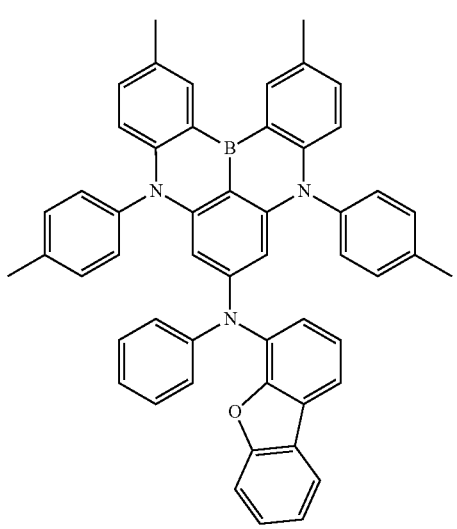
Dopant 125
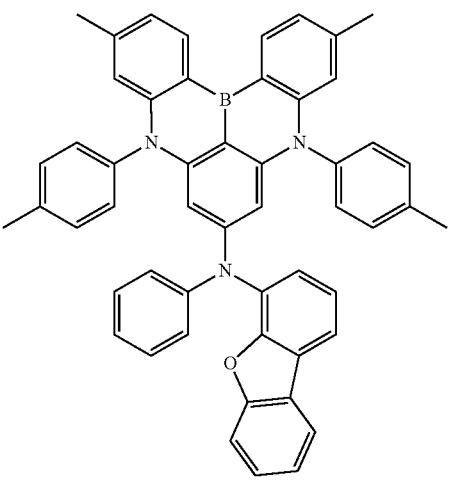
Dopant 126
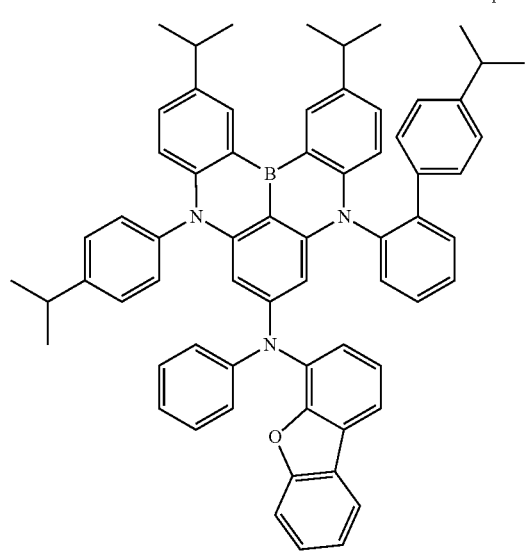
Dopant 127
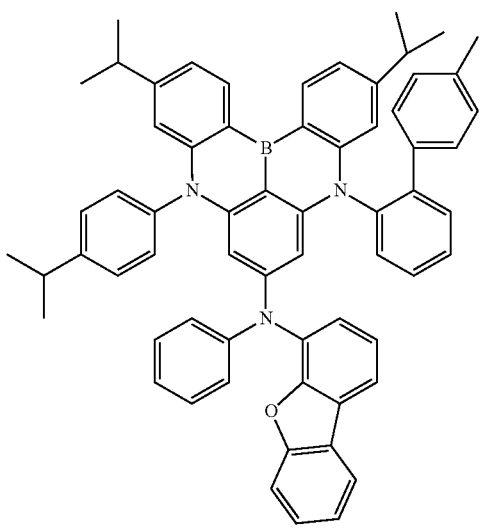

Dopant 128
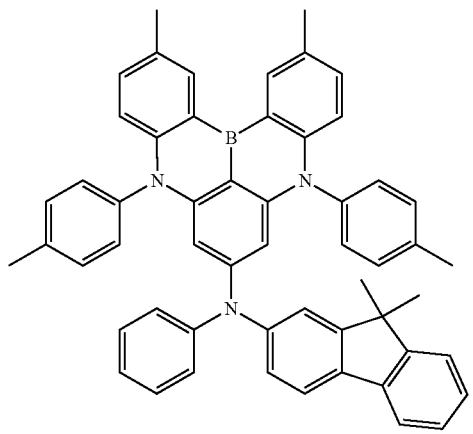
Dopant 129
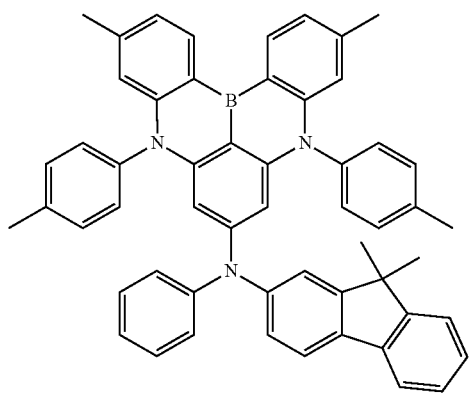
Dopant 130
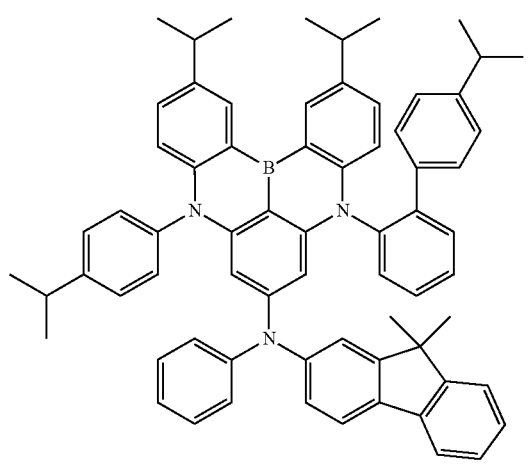
Dopant 131
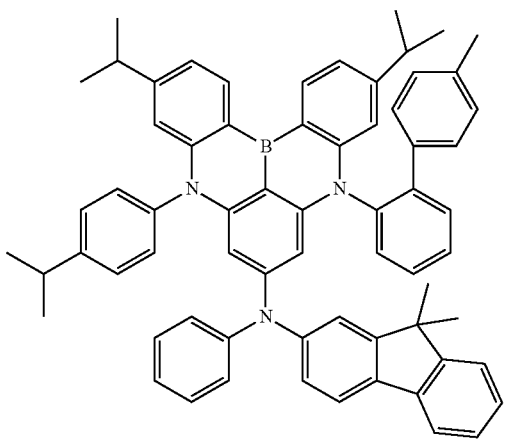
Dopant 132
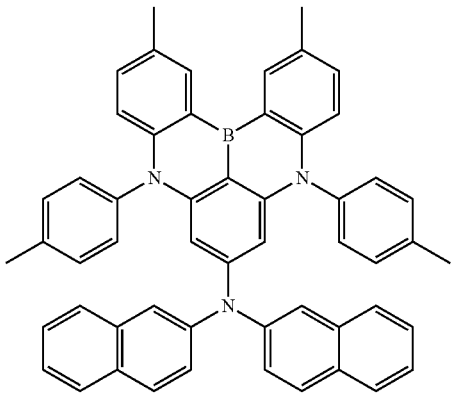
Dopant 133
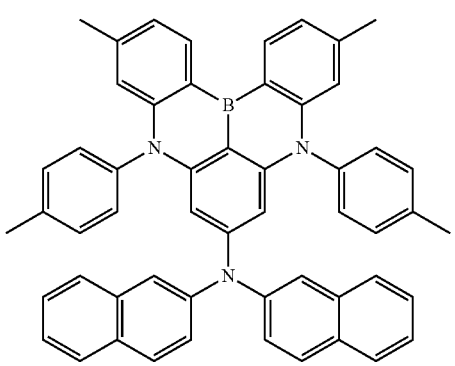

Dopant 134
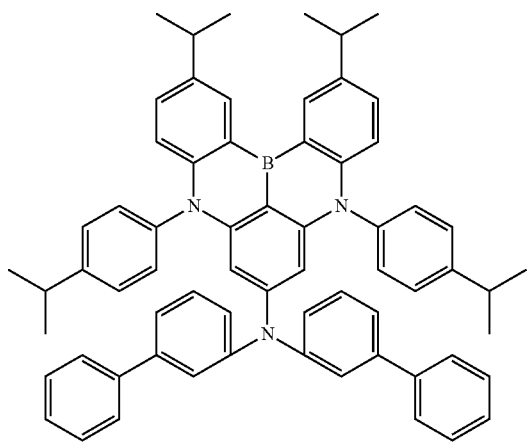
Dopant 135
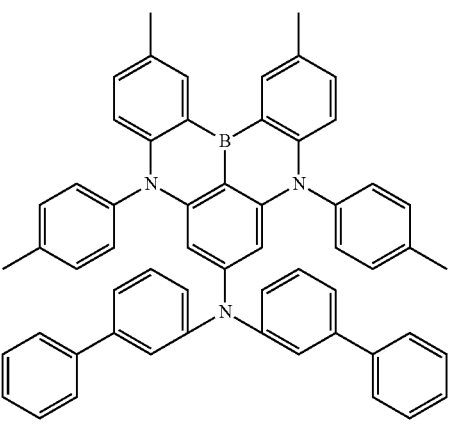
Dopant 136
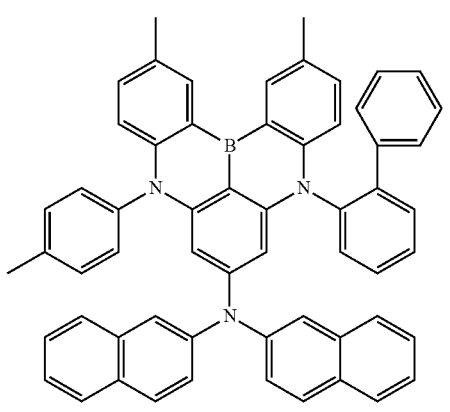
Dopant 137
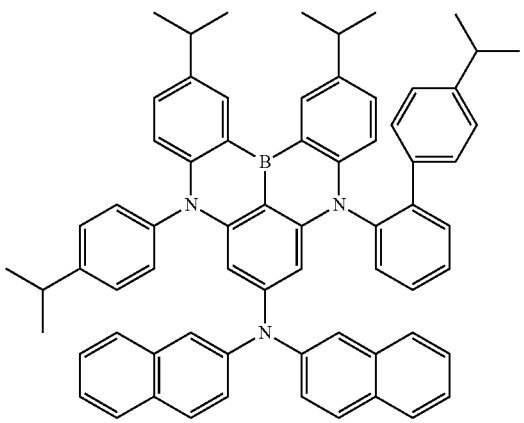
Dopant 138
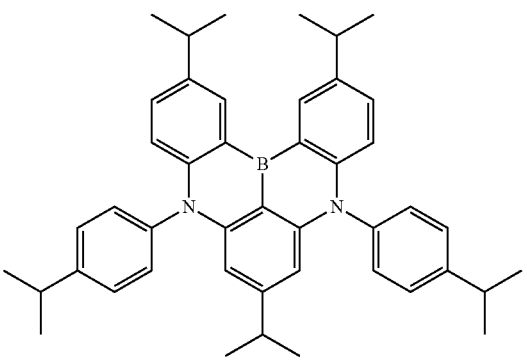
Dopant 139
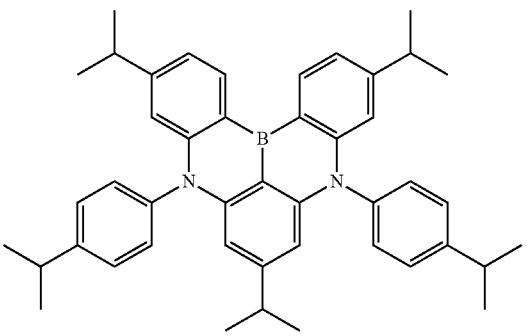
Dopant 140
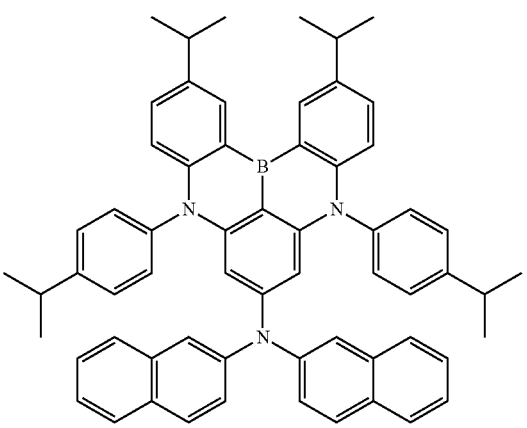

Dopant 141
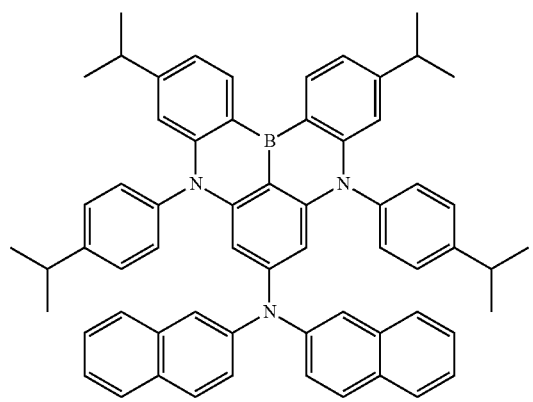
Dopant 142
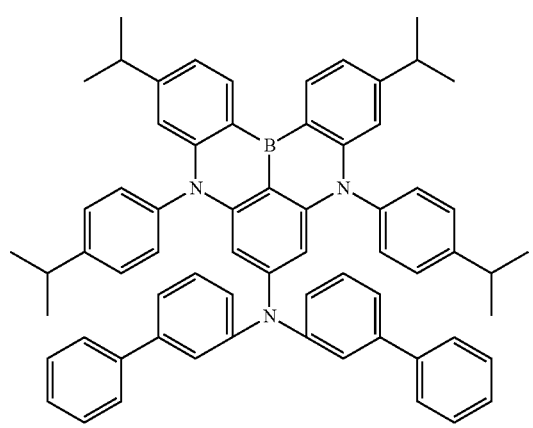
Dopant 143
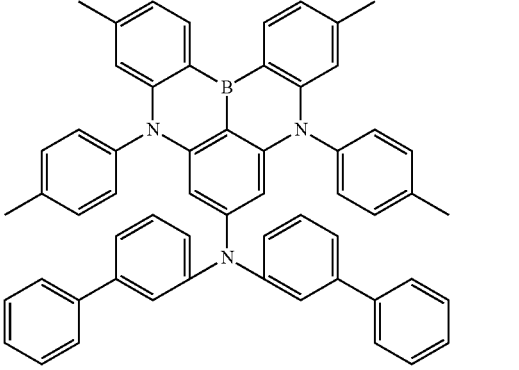
Dopant 144
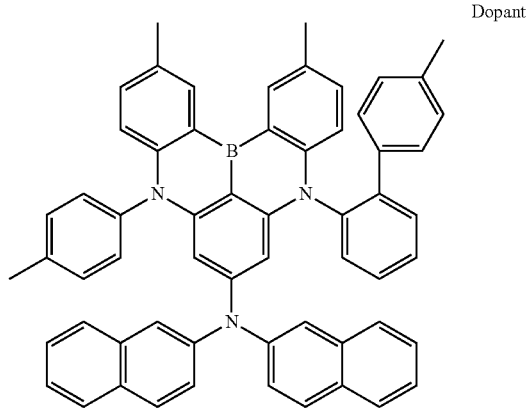
Dopant 145
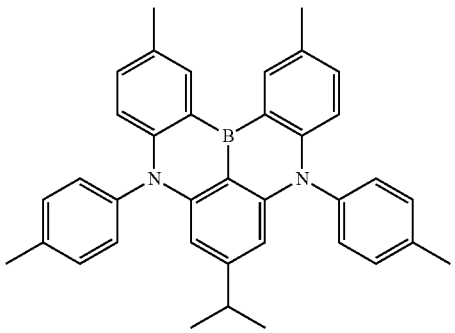
Dopant 146
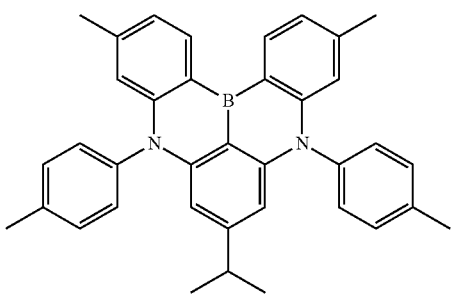
Dopant 147
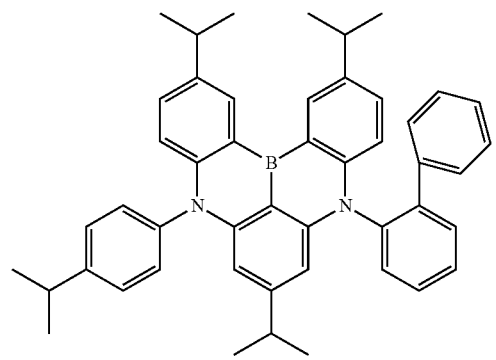
Dopant 148
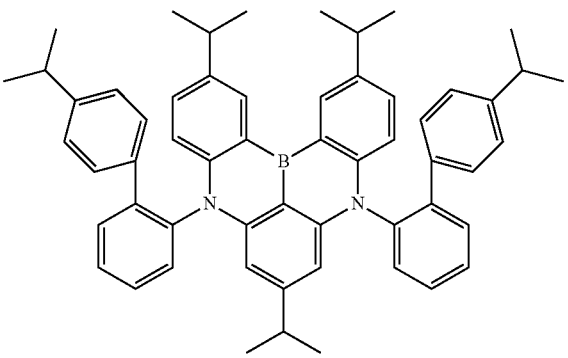

Dopant 149
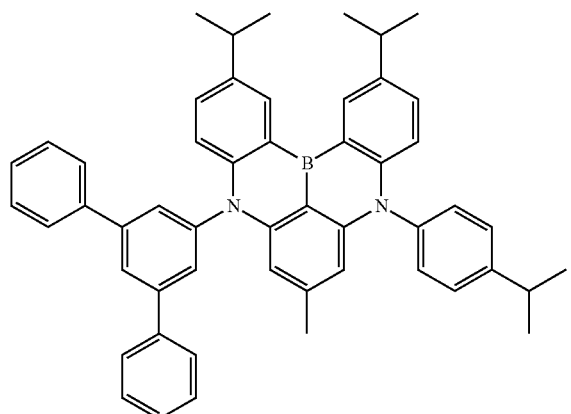
Dopant 152
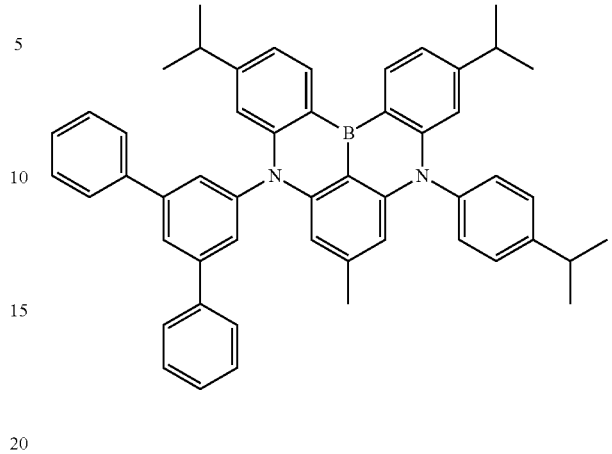
Dopant 150
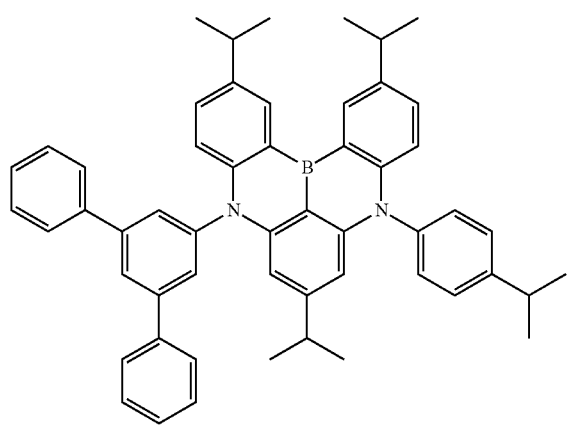
Dopant 153
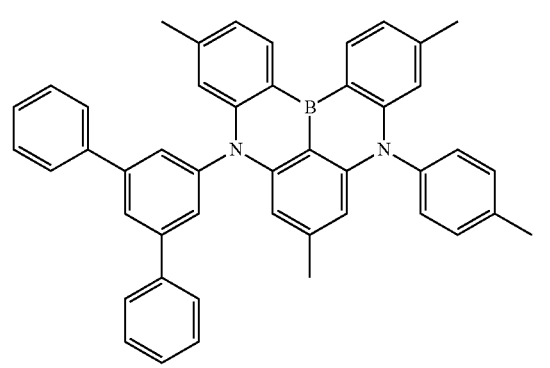
Dopant 151
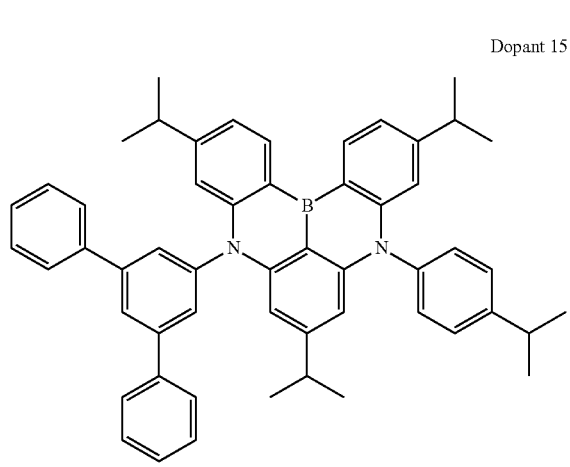
Dopant 154
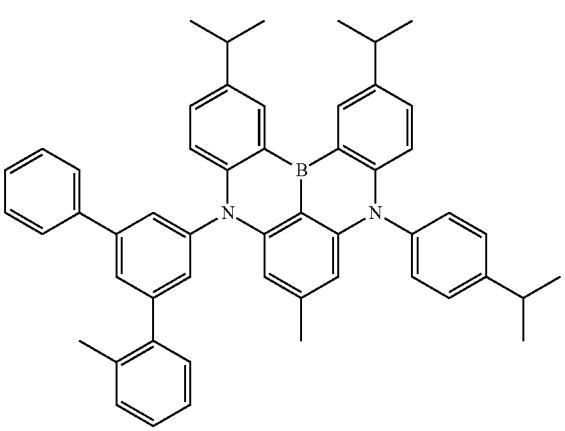

Dopant 155
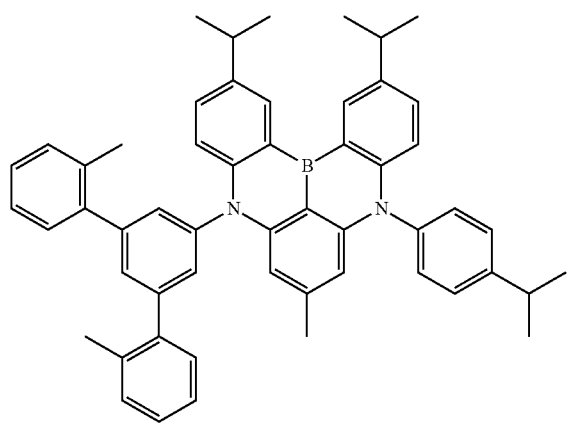
Dopant 158
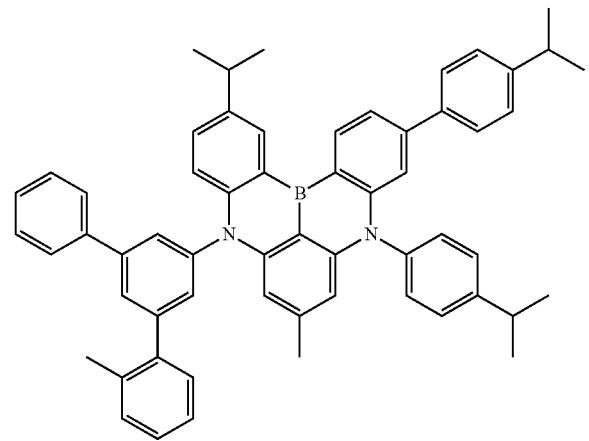
Dopant 156
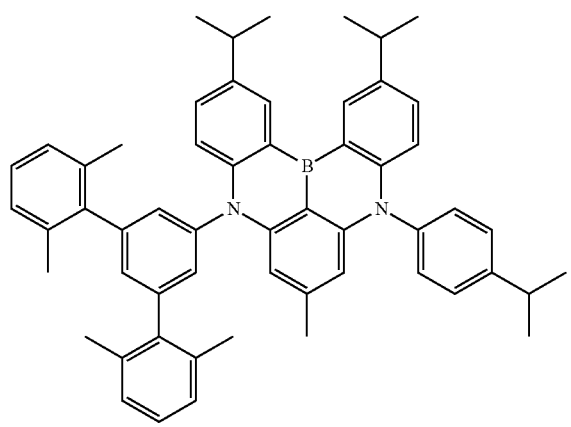
Dopant 159
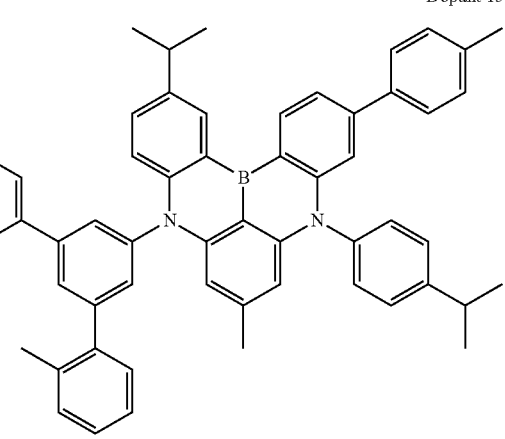
Dopant 157
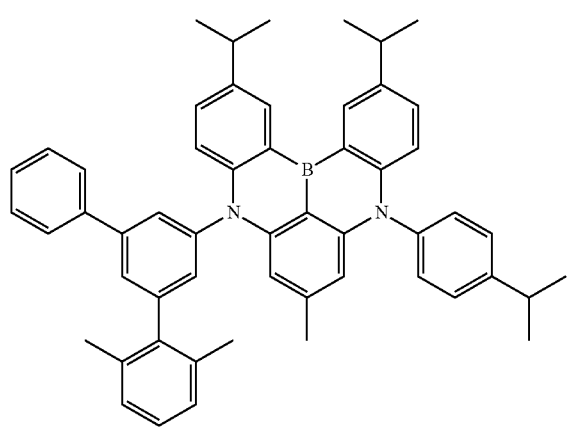
Dopant 160
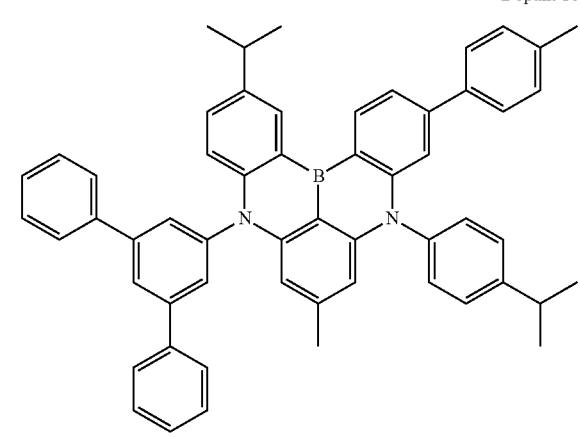

-continued
Dopant 161
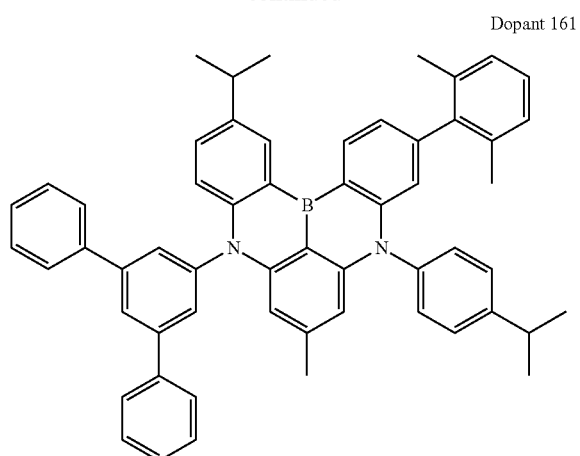
Dopant 162
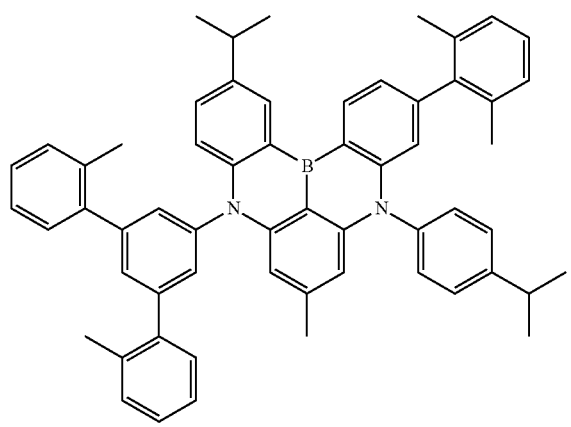
Dopant 163
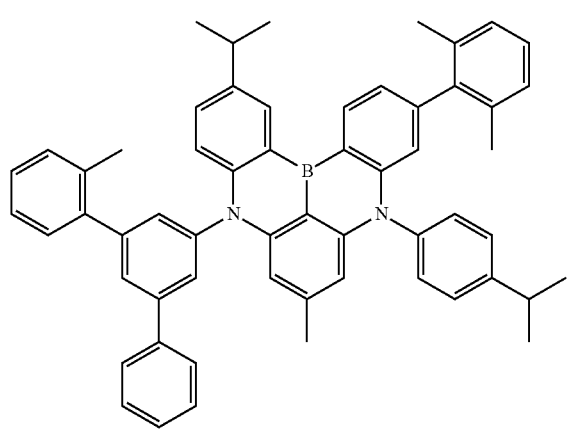
-continued
Dopant 164
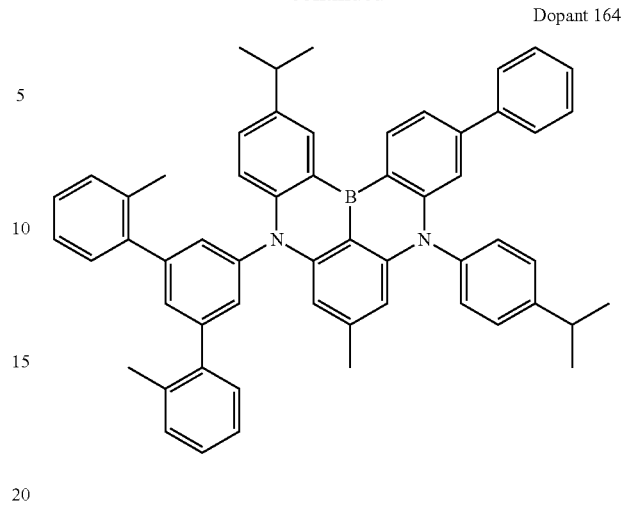
Dopant 165
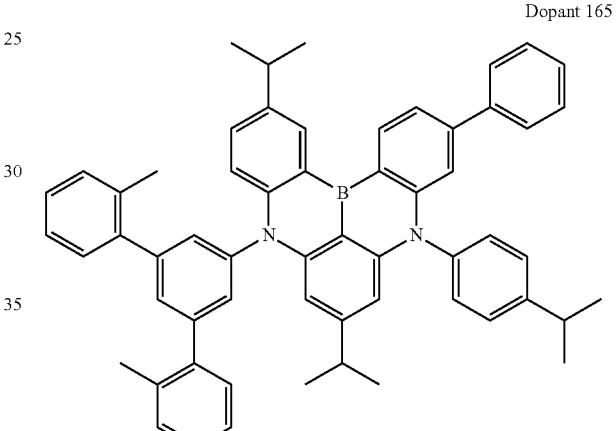
Dopant 166
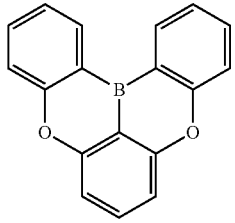
Dopant 167
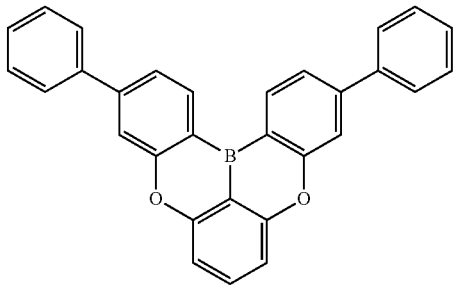

Dopant 168
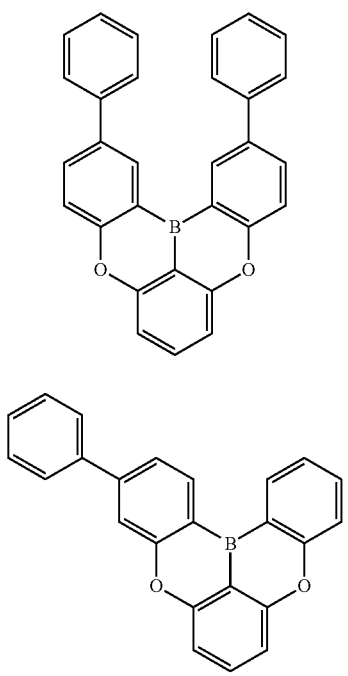
Dopant 169
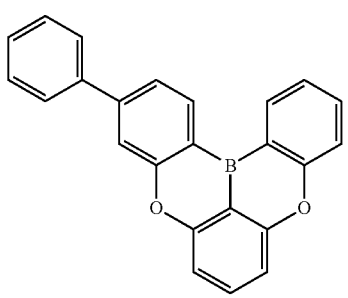
Dopant 170
Dopant 171
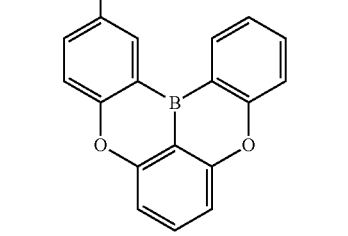
Dopant 172
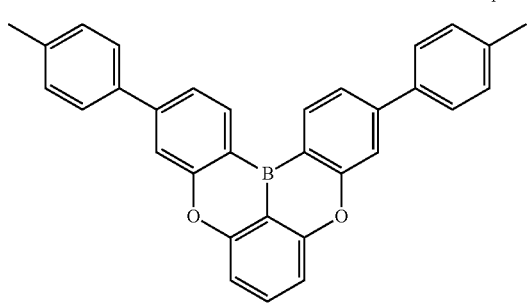
Dopant 173
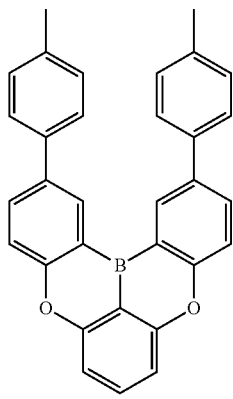
Dopant 174
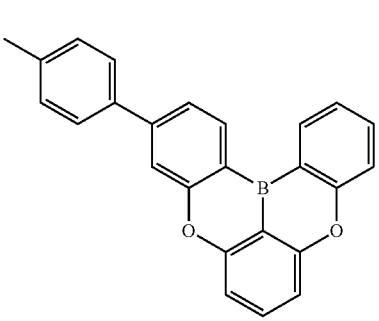
Dopant 175
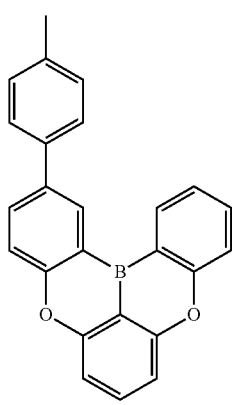
Dopant 176
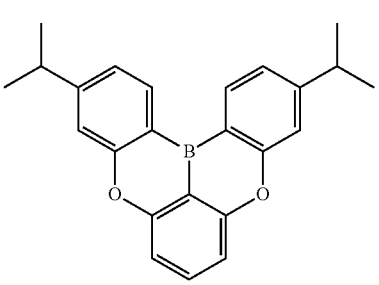

Dopant 177
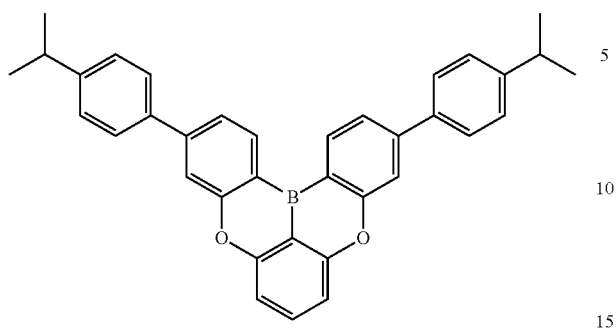
Dopant 181
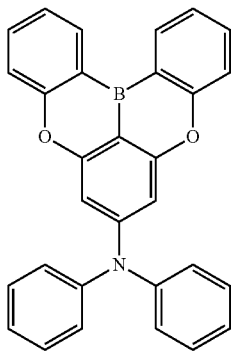
Dopant 178
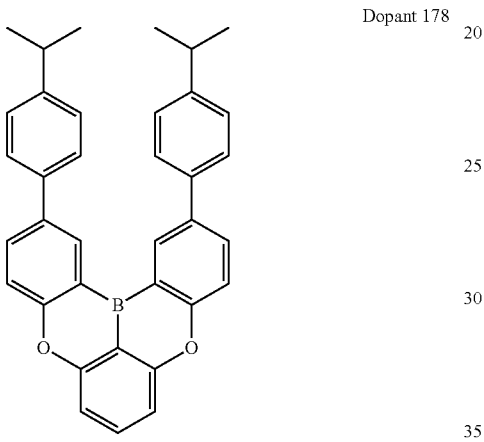
Dopant 182
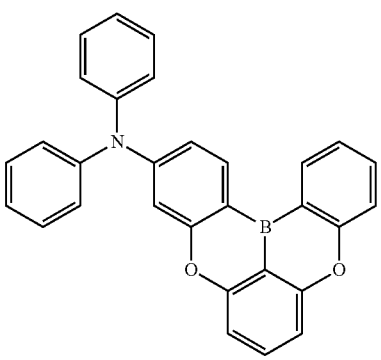
Dopant 179
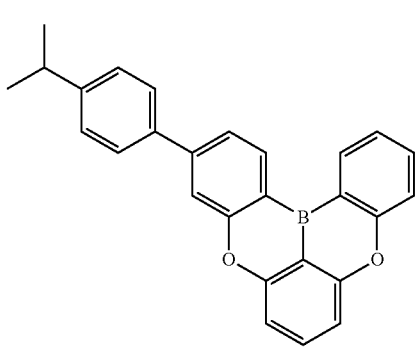
Dopant 183
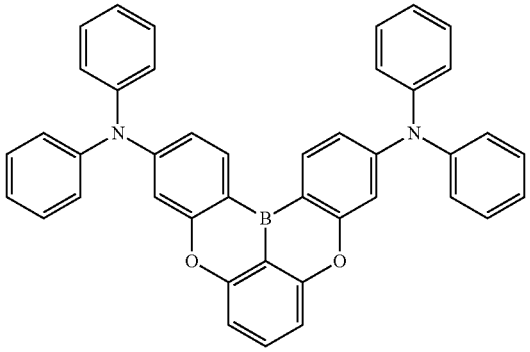
Dopant 180
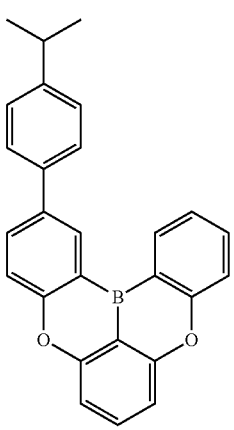
Dopant 184
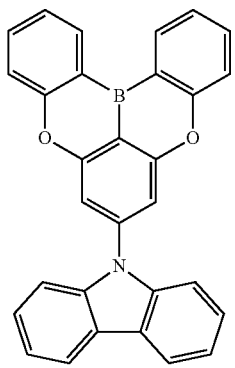

Dopant 185
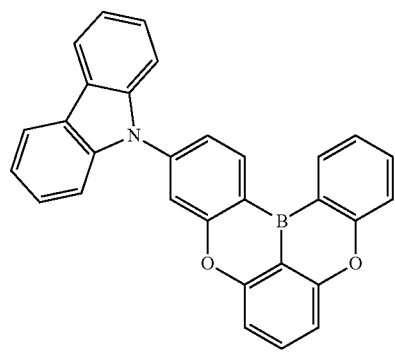
Dopant 189
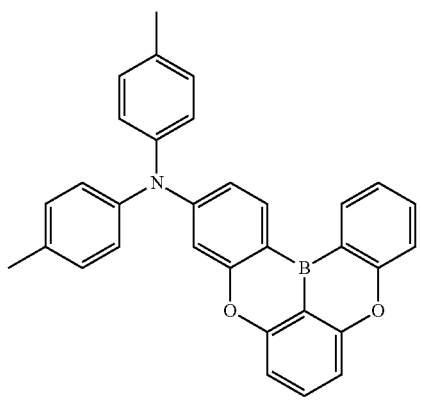
Dopant 186
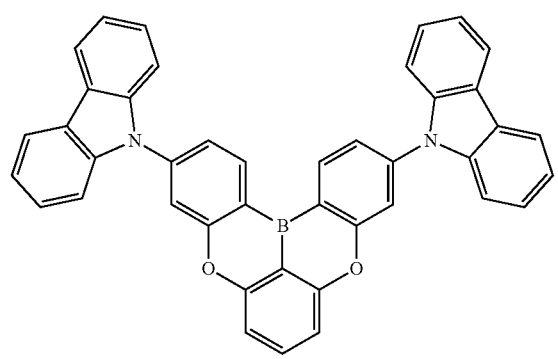
Dopant 190
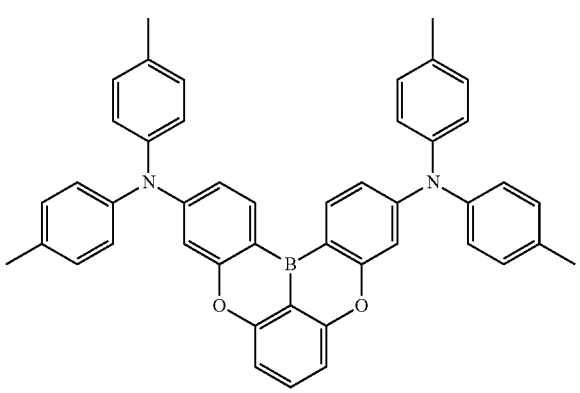
Dopant 187
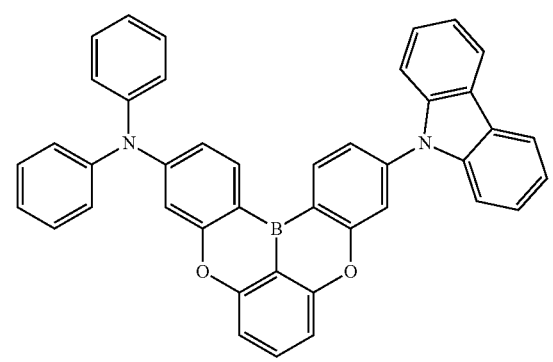
Dopant 191
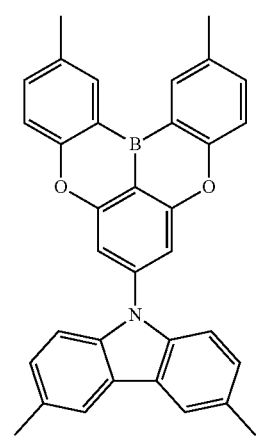
Dopant 188
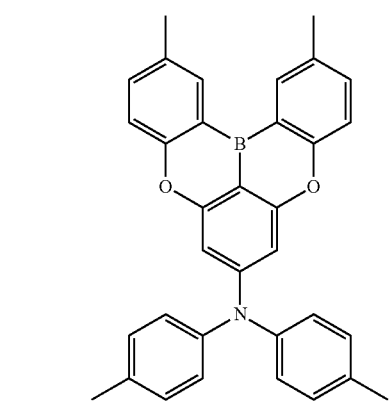
Dopant 192
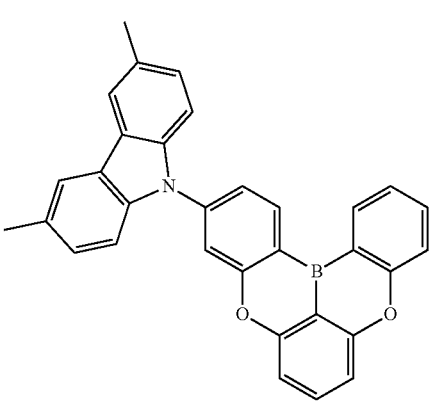

-continued
Dopant 193
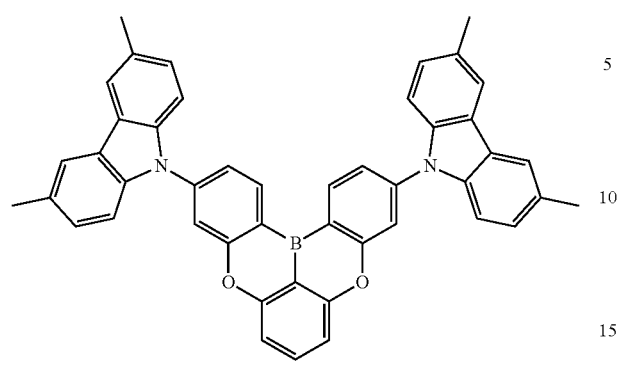
Dopant 194
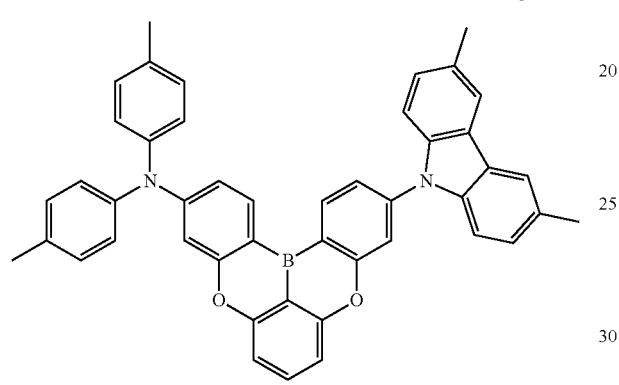
Dopant 195
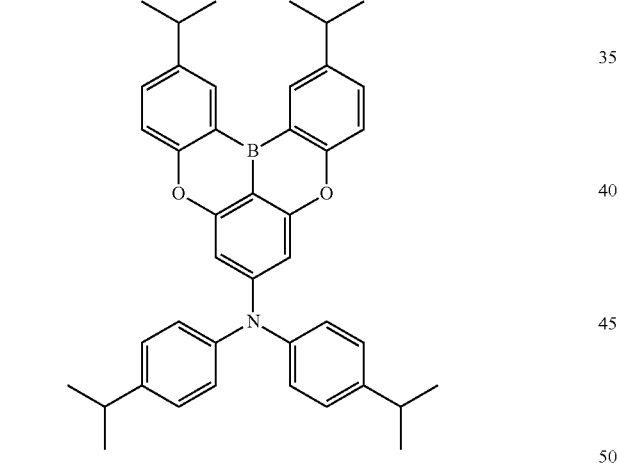
Dopant 196
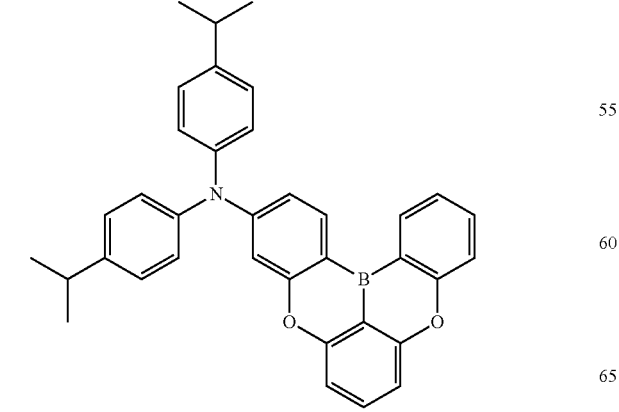
-continued
Dopant 197
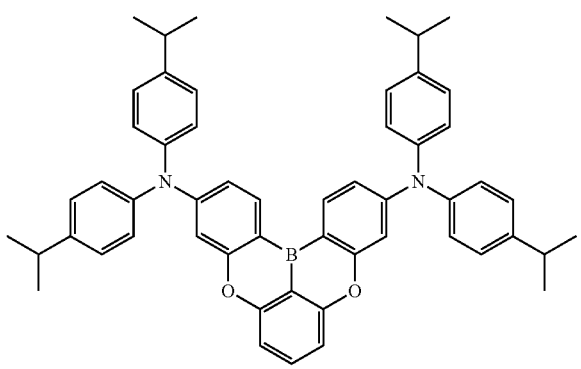
Dopant 198
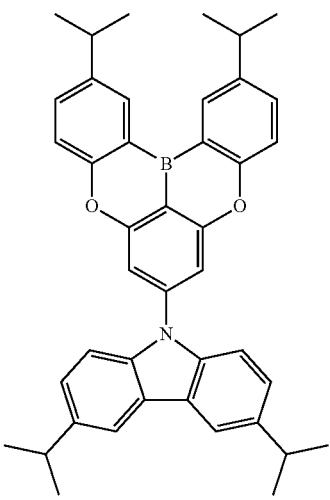
Dopant 199
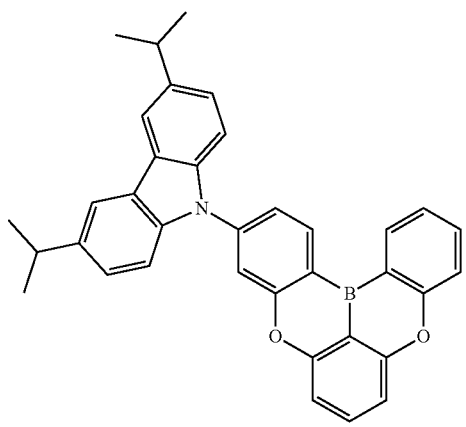

Dopant 200
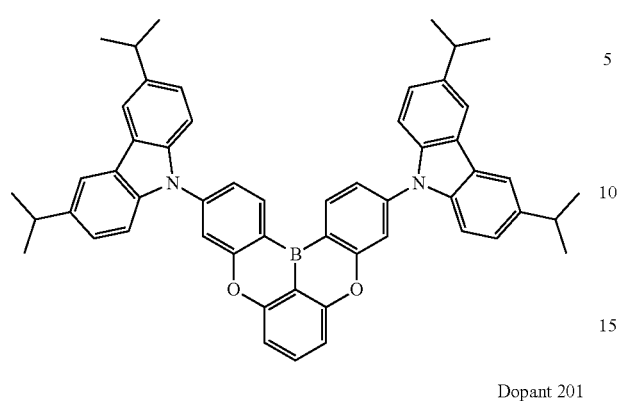
Dopant 201
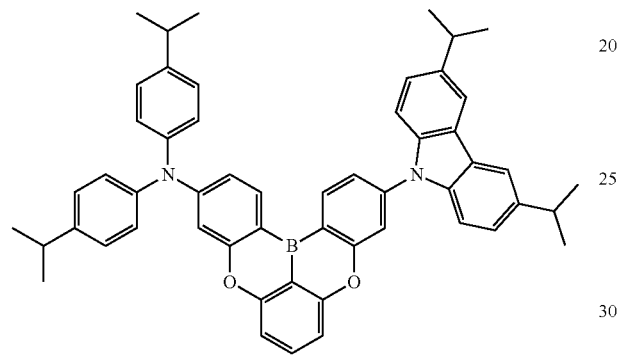
Dopant 202
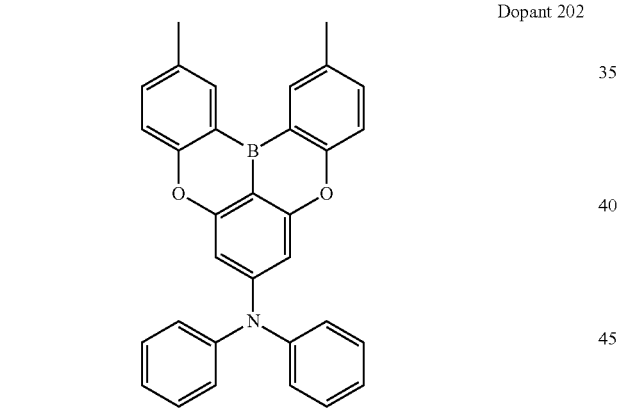
Dopant 203
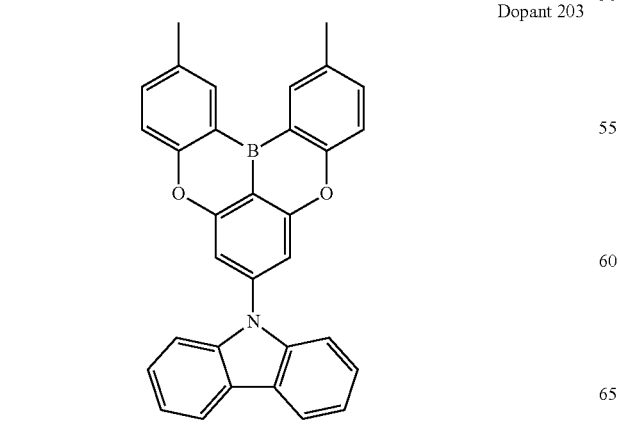
Dopant 204
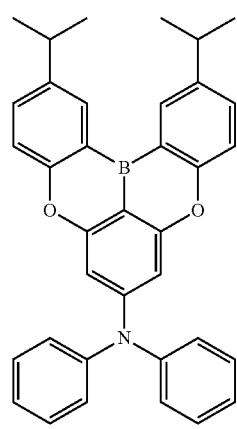
Dopant 205
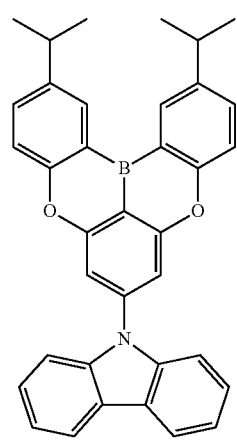
Dopant 206
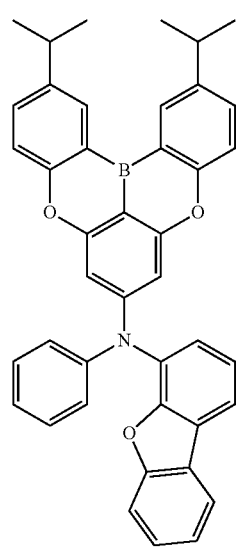

Dopant 207
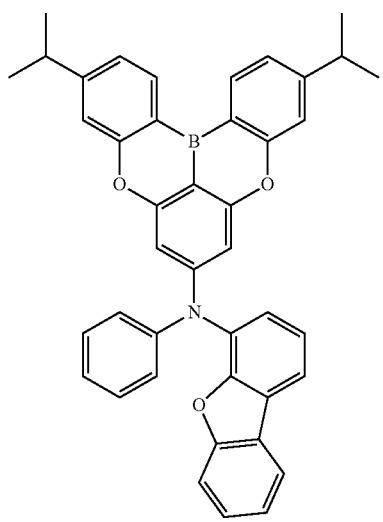
Dopant 208
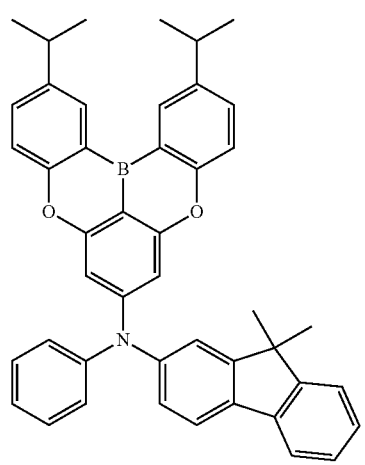
Dopant 209
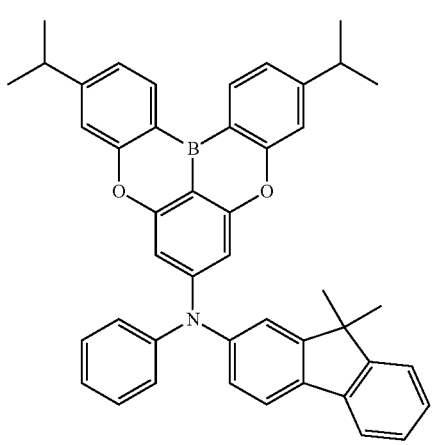
Dopant 210
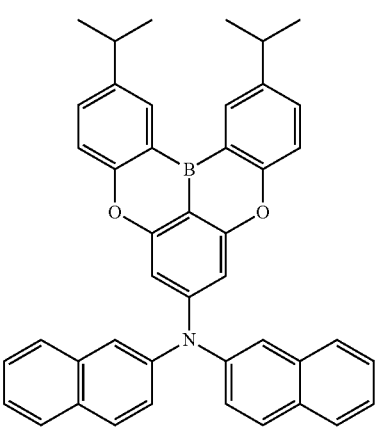
Dopant 211
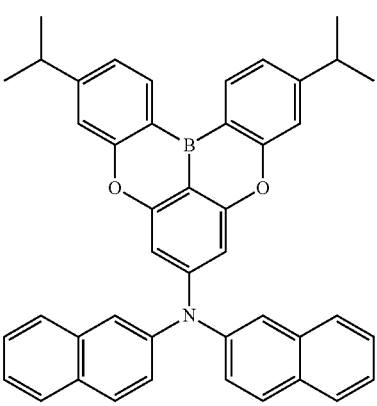
Dopant 212
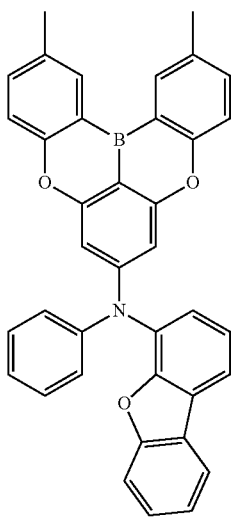

Dopant 213
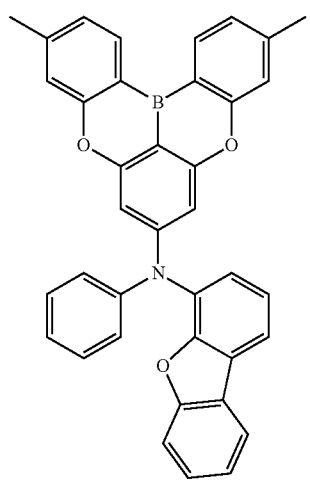
Dopant 214
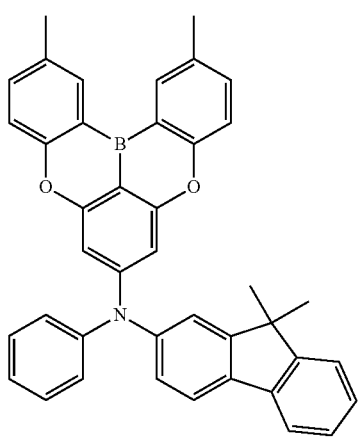
Dopant 215
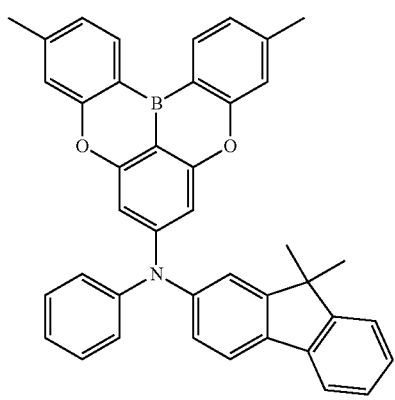
Dopant 216
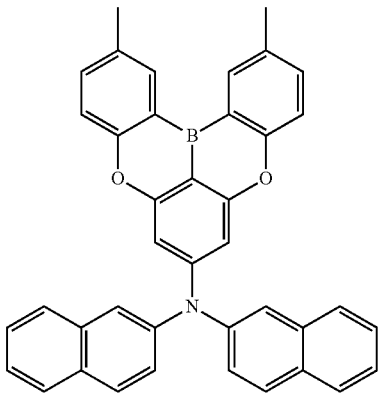
Dopant 217
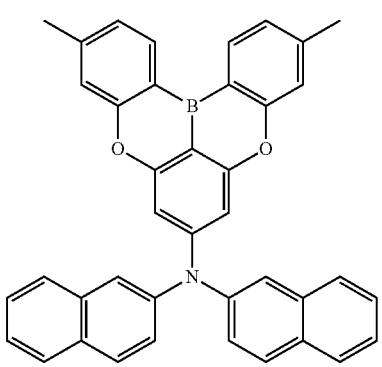
Dopant 218
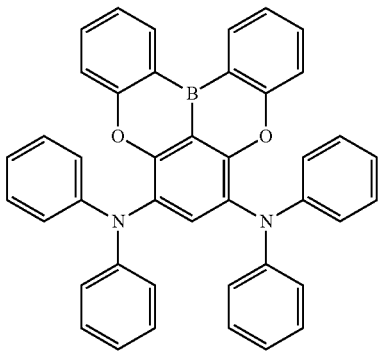
Dopant 219
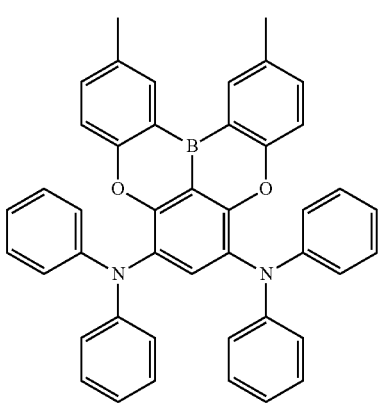

-continued
Dopant 220
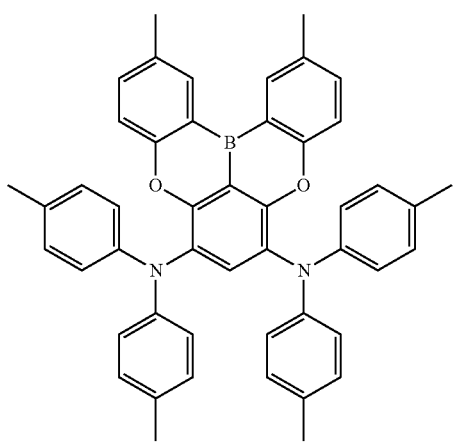
Dopant 221
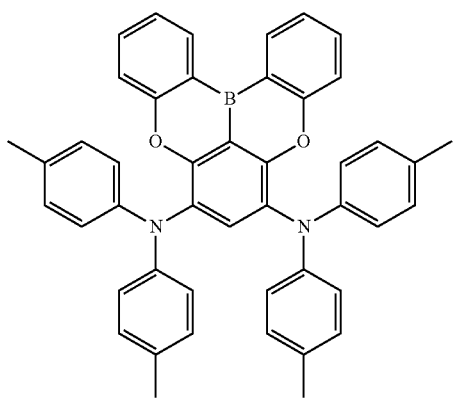
Dopant 222
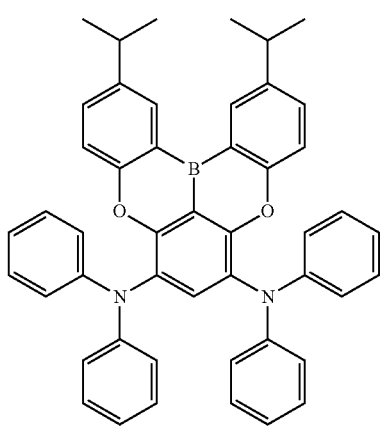
Dopant 223
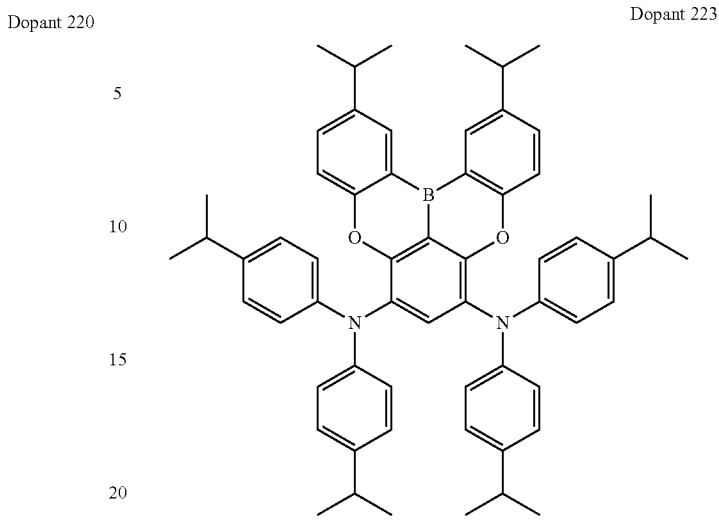
Dopant 224
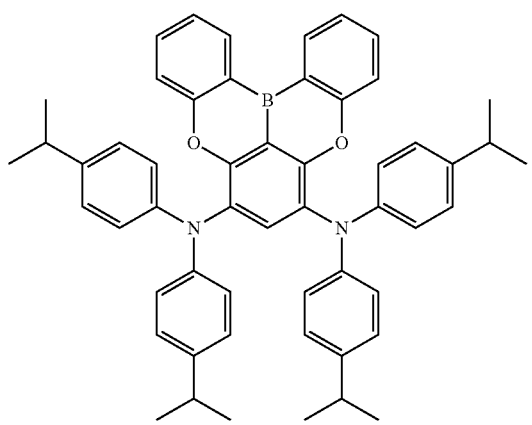
Dopant 225
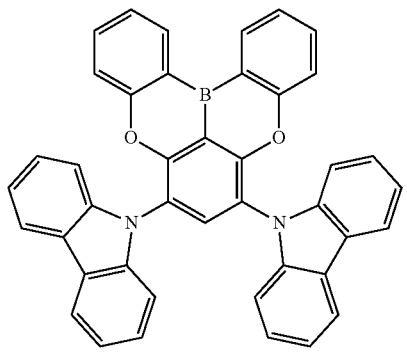

-continued
Dopant 226
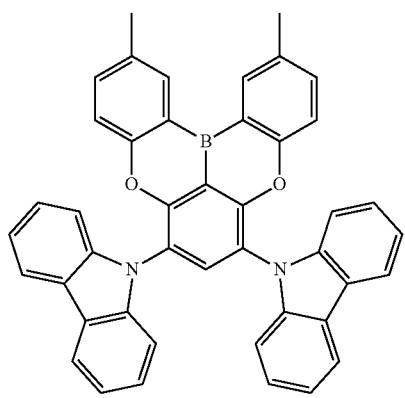
Dopant 227
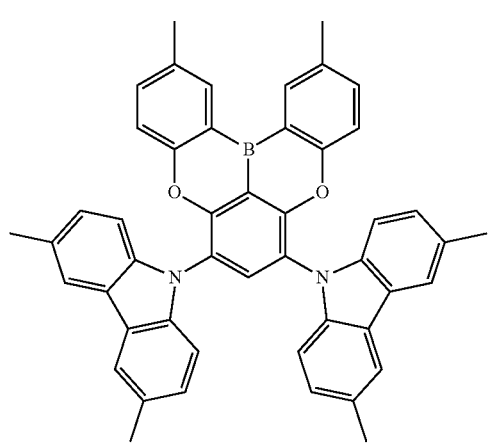
Dopant 228
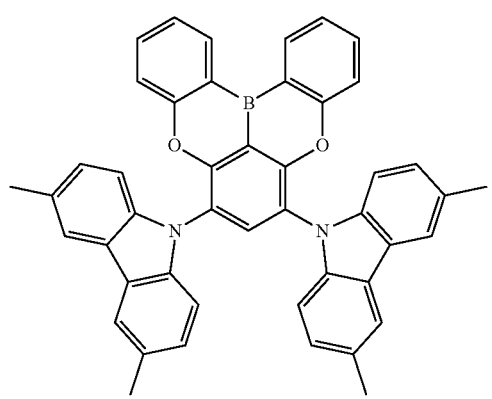
-continued
Dopant 229
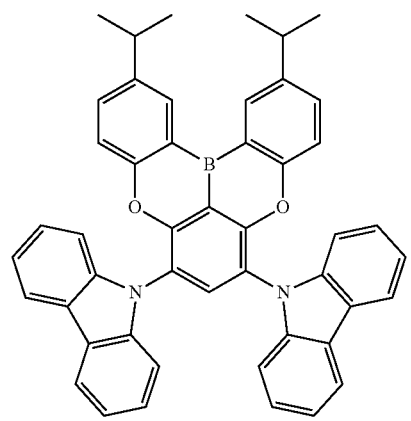
Dopant 230
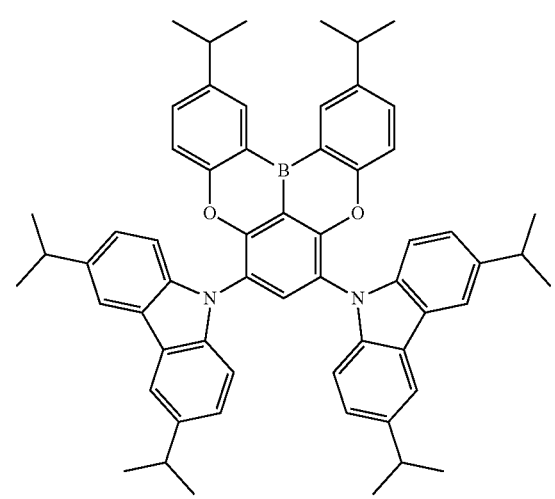
Dopant 231
Dopant 232
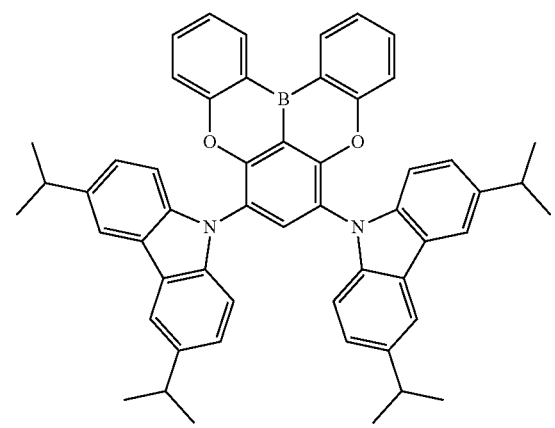

-continued

Dopant 233

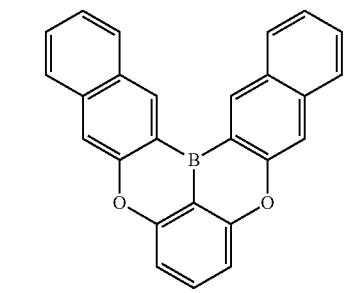

Dopant 234

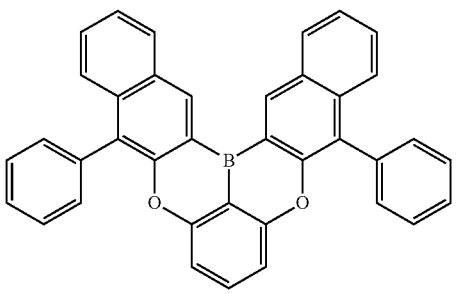

In one exemplary embodiment, the first dopant may be doped with a ratio of about 1 to about 50% by weight, and preferably about 1 to about 30% by weight in the EML 360. The EML 360 may be laminated with a thickness of, but is not limited to, about 10 nm to about 200 nm, preferably about 20 nm to about 100 nm, and more preferably about 20 nm to about 50 nm.

The HIL 340 is disposed between the first electrode 310 and the HTL 350 and improves an interface property between the inorganic first electrode 310 and the organic HTL 350. In one exemplary embodiment, the HIL 340 may include a hole injection material selected from, but is not limited to, the group consisting of 4,4'4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiophene)polystyrene sulfonate (PEDOT/PSS), 2,3,5,6-tetrafluoro-7,7,8,8-tetracyanoquinodimethane (F4TCNQ) and/or N-(biphenyl-4-yl)-9,9-dimethyl-N-(4-(9-phenyl-9H-carbazol-3-yl)phenyl)-9H-fluoren-2-amine.

In an alternative embodiment, the HIL 340 may include a hole transport material, which will be described, doped with the hole injection material. In this case, the hole injection material may be doped with a ratio of about 1 to about 50% by weight, and preferably about 1 to about 30% by weight in the HIL 340. The HIL 340 may be omitted in compliance of the OLED 300 property.

The HTL 350 is disposed adjacently to the EBL 355 between the first electrode 310 and the EBL 355. In one embodiment, the HTL 350 may include a hole transport material selected from, but is not limited to, N,N'-Diphenyl-N,N'-bis(3-methylphenyl-1,1'-biphenyl-4,4'-diamine (TPD), N,N'-bis[4-[bis(3-methylphenyl)amino]phenyl]-N,N'-diphenyl-[1,1'-biphenyl]-4,4'-diamine (DNTPD), NPB(NPD), 4,4'-bis(N-carbazolyl)-1,1'-biphenyl (CBP), Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-secbutylphenyl)diphenylamine))] (TFB), 1,1-bis(4-(N,N'-di(ptolyl)amino)phenyl)cyclohexane (TAPC), 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenl-9H-carbazol-3-yl)phenyl)-9H-fluoren-2-amine and/or N4,N4,N4',N4'-tetrakis([1,1'-biphenyl]-4-yl)-[1,1'-biphenyl]-4,4'-diamine.

In an exemplary embodiment, each of the HIL 340 and the HTL 350 may be laminated with a thickness of, but is not limited to, about 5 mm to about 200 nm, and preferably about 5 mm to about 100 nm.

The EBL 355 prevents electrons from transporting from the EML, 360 to the first electrode 310. The EBL 355 may include an amine-based compound having the following structure of Chemical Formula 5:

Chemical Formula 5

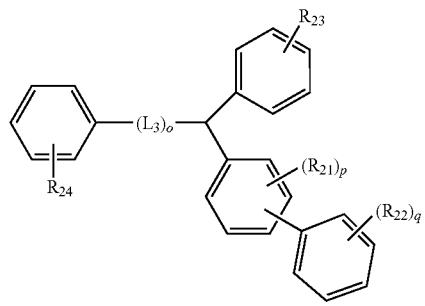

In Chemical Formula 5, $L_3$ is a $C_6$~$C_{30}$ arylene group. Each of $R_{21}$ and $R_{22}$ is independently hydrogen or two adjacent groups among $R_{21}$ or $R_{22}$ form a fused aromatic ring. $R_{23}$ is hydrogen or a $C_6$~$C_{30}$ aryl group. $R_{24}$ is a $C_5$~$C_{30}$ hetero aryl group. o is 0 (zero) or 1, p is a number of a substituent and is an integer of 0 (zero) to 4 and q is a number of a substituent and is n integer of 0 (zero) to 4.

As an example, $L_3$ may be a phenylene group, $R_{23}$ may be hydrogen, a phenyl group or a biphenyl group, and $R_{24}$ may be a carbazolyl group, a dibenzofuranyl group or a dibenzothiophenyl group in Chemical Formula 5. In an exemplary embodiment, the EBL 355 may include any amine-based compound having the following structure of Chemical Formula 6:

Chemical 6

H1

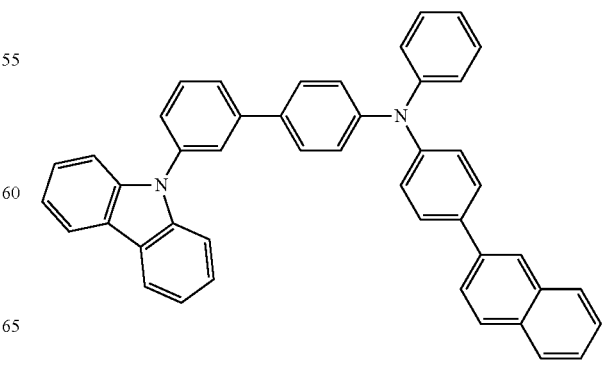

H2
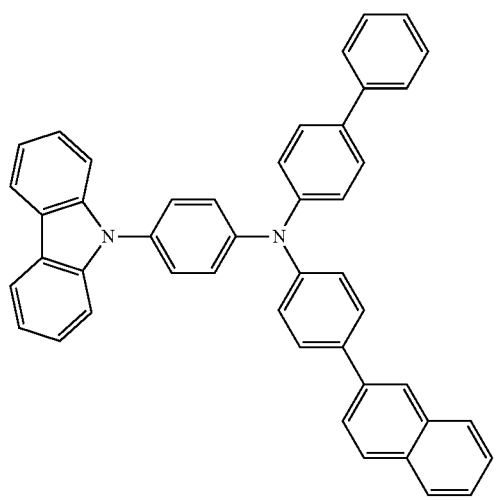
H3
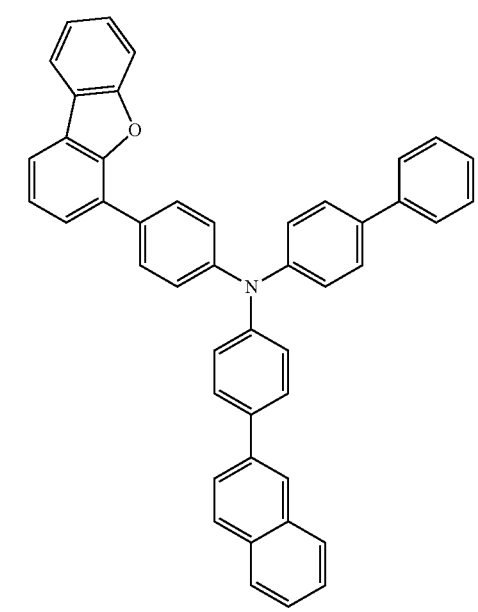
H4
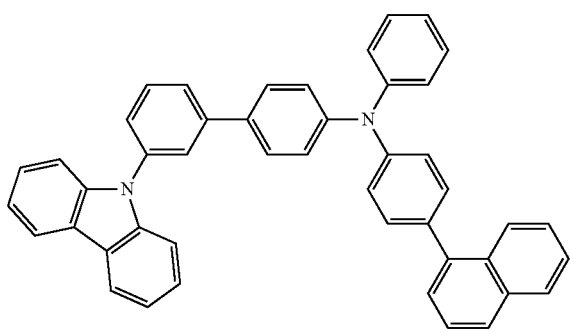
H5
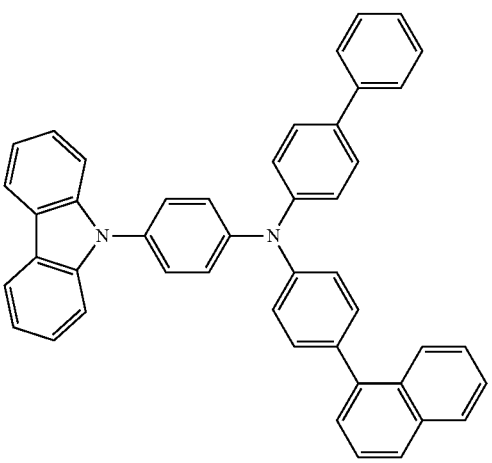
H6
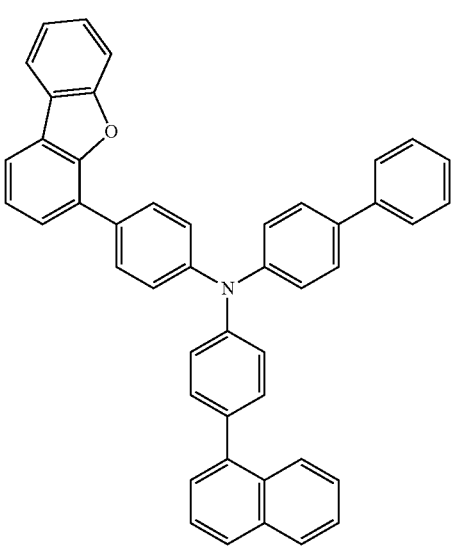
H7
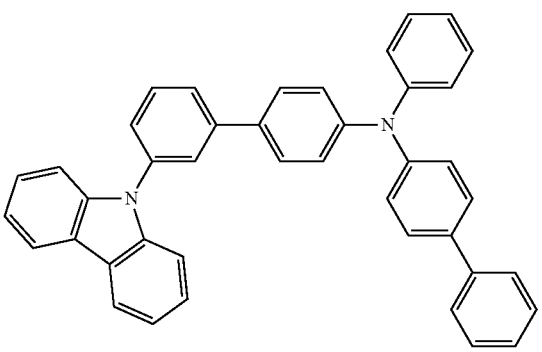

89
-continued
H8
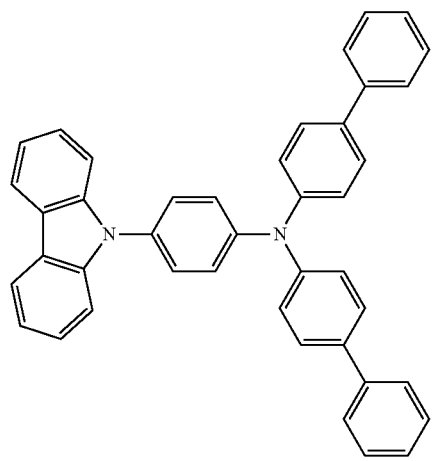
H9
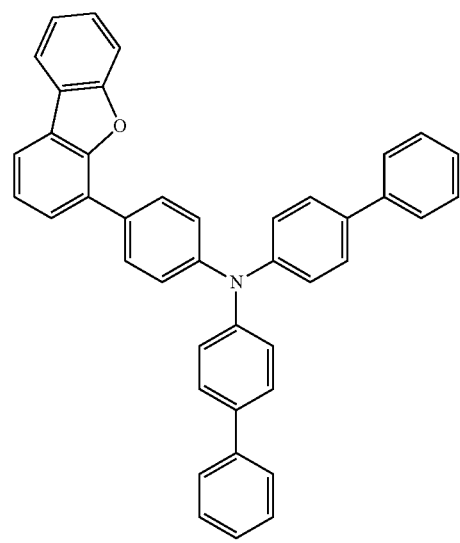
H10
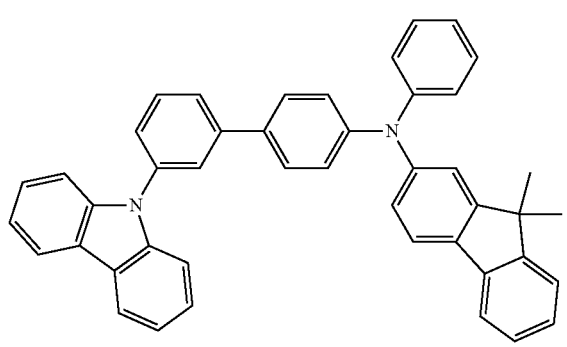
90
-continued
H11
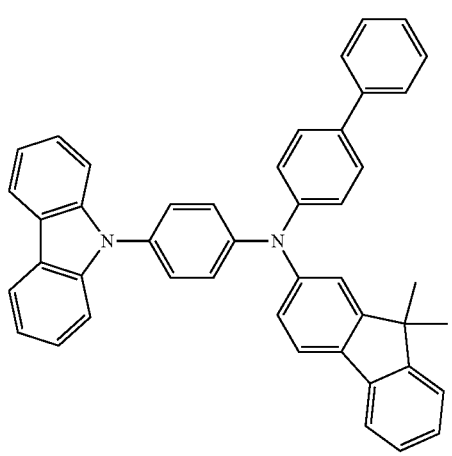
H12
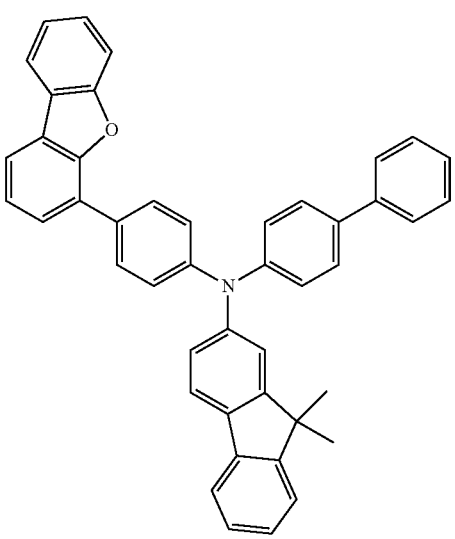
H13
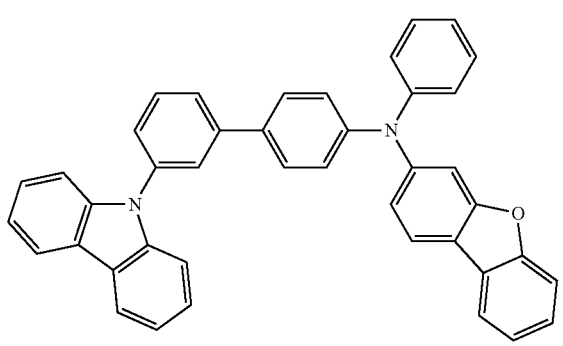

H14
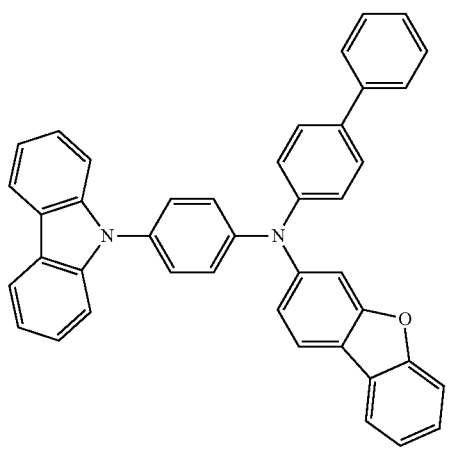
H15
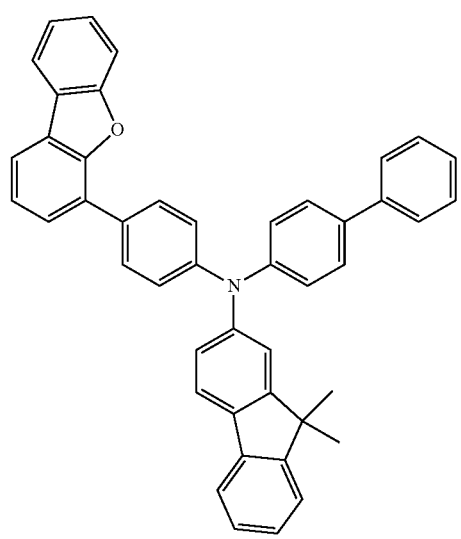
H16
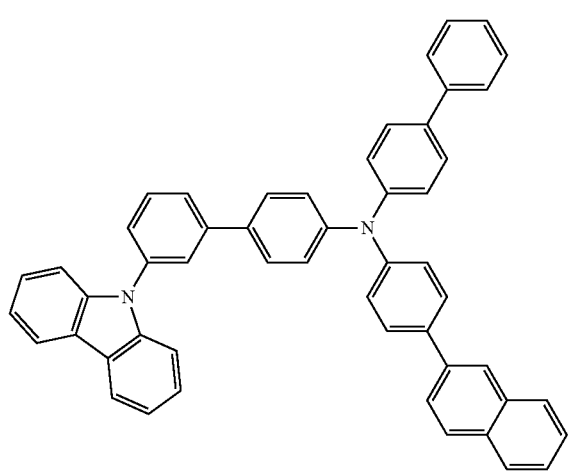
H17
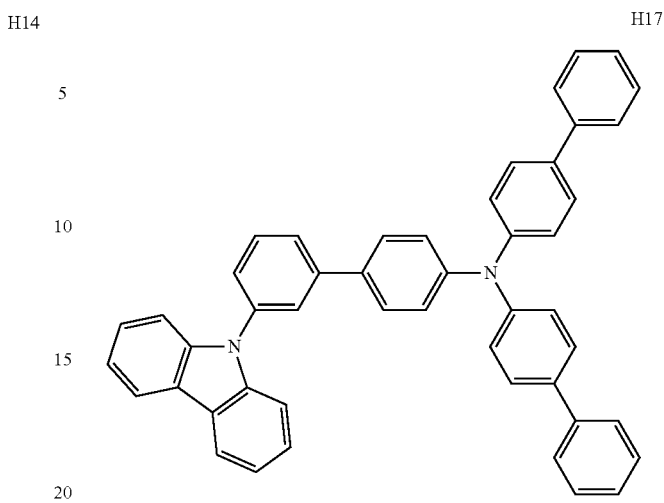
H18
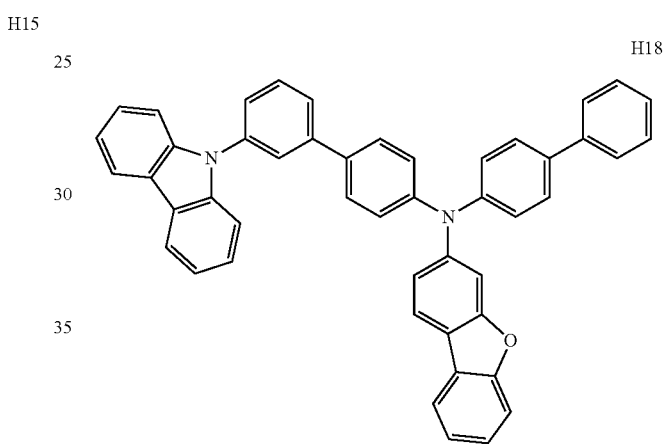
H19
H20
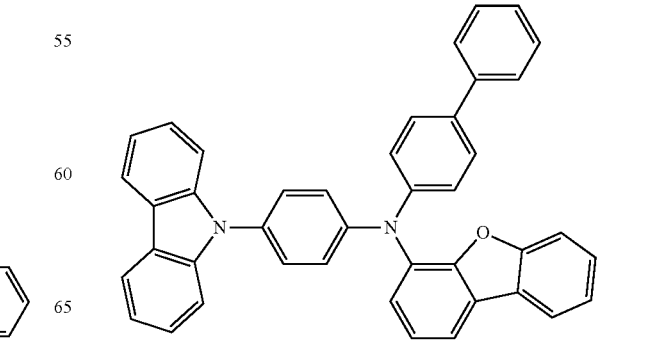

H21

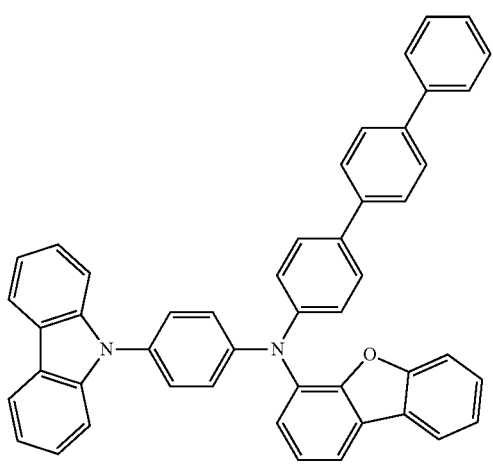

H22

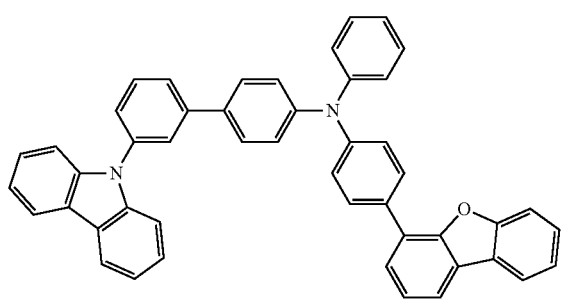

H23

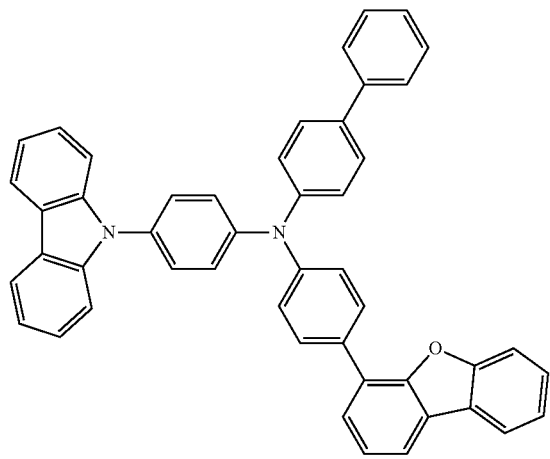

H24

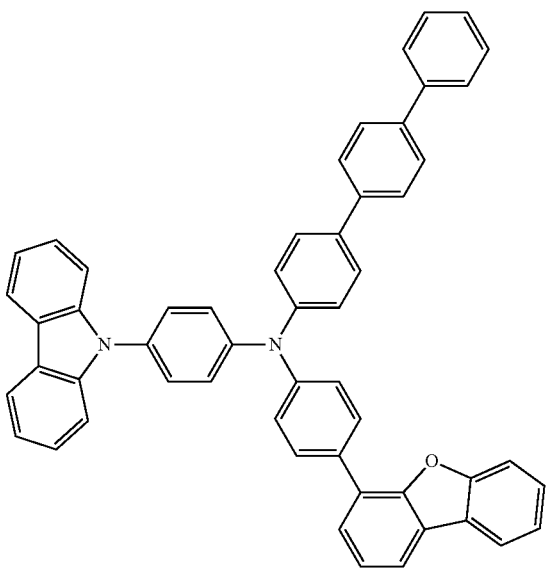

Alternatively, the OLED 300 may further include the HBL 375 which prevents holes from transporting from the EML 360 to the second electrode 320. As an example, the HBL 375 may include an azine-based compound having the following structure of Chemical Formula 7 and/or a benzimidazole-based compound having the following structure of Chemical Formula 9:

Chemical Formula 7

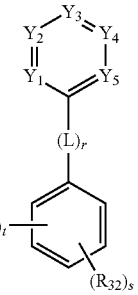

In Chemical Formula 7, each of Y1 to Y5 is independently CR31 or nitrogen (N) and at least three among the Y1 to Y5 is nitrogen, wherein R31 is a C6~C30 aryl group. L is a C6~C30 arylene group. R32 is a C6~C30 aryl group or a C5~C30 hetero aryl group. R33 is hydrogen or two adjacent groups of R32 form a fused aromatic ring. r is 0 (zero) or 1, s is 1 or 2 and t is an integer of 0 (zero) to 4.

Chemical Formula 9

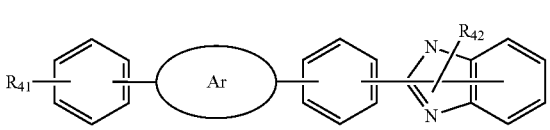

In Chemical Formula 9, Ar is a C10~C30 arylene group. R41 is a C6~C30 aryl group or a C5~C30 hetero aryl group. R42 is a C1~C10 alkyl group or a $C6~C_{30}$ aryl group.

In one exemplary embodiment, the aryl group constituting $R_{32}$ in Chemical Formula 7 may be unsubstituted or substituted further with another $C_6$~$C_{30}$ aryl group or $C_5$~$C_{30}$ hetero aryl group. For example, the aryl or the hetero aryl group that may be substituted to $R_{32}$ may be a $C_{10}$~$C_{30}$ fused aryl group or a $C_{10}$~$C_{30}$ fused hetero aryl group. $R_{33}$ in Chemical Formula 7 may be fused to form a naphthyl group. In one exemplary embodiment, the HBL 375 may include any azine-based compound having the following structure of Chemical Formula 8:

Chemical Formula 8

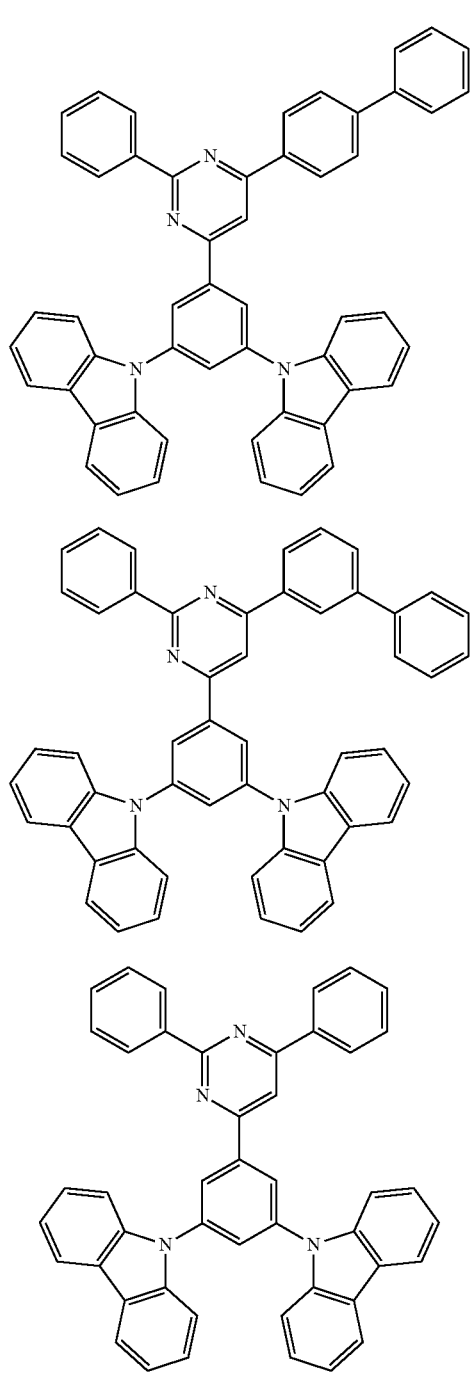

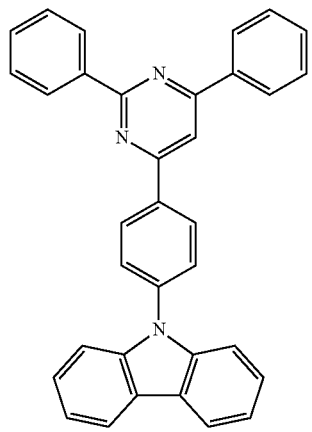

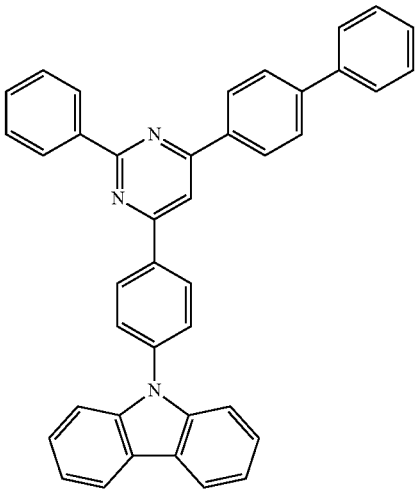

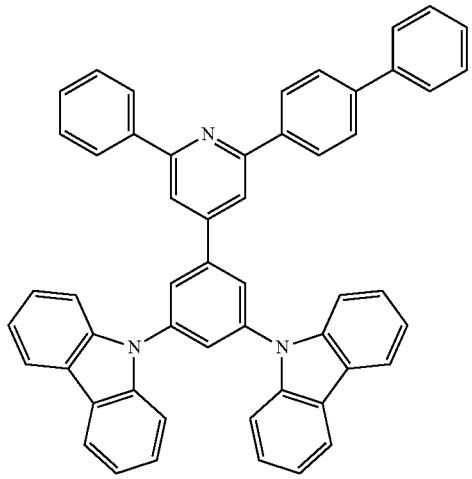

E7
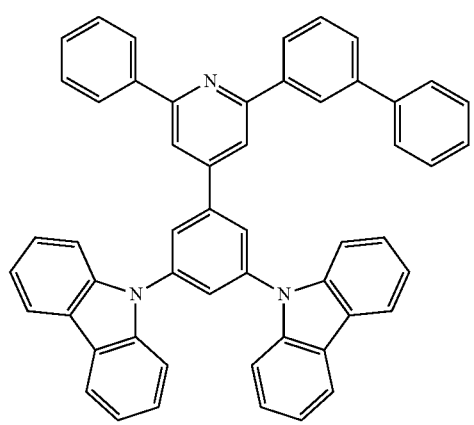
E8
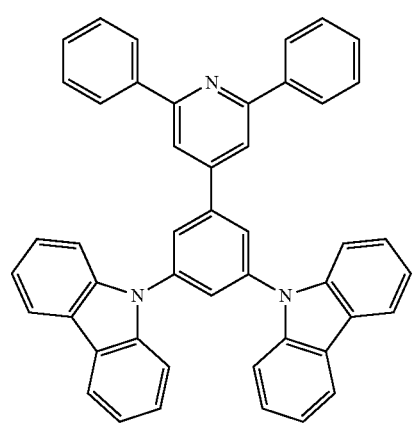
E9
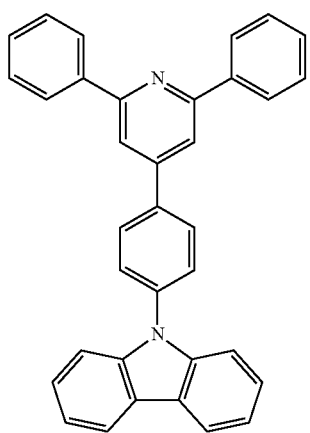
E10
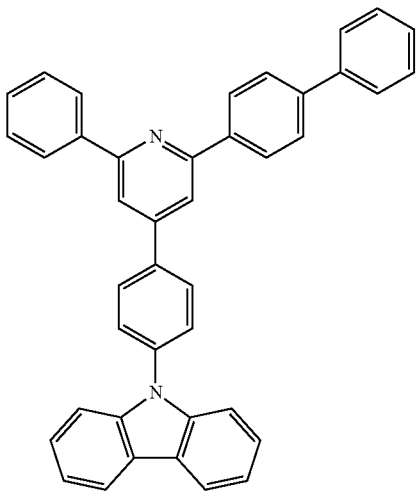
E11
E12

E13
E14
E15
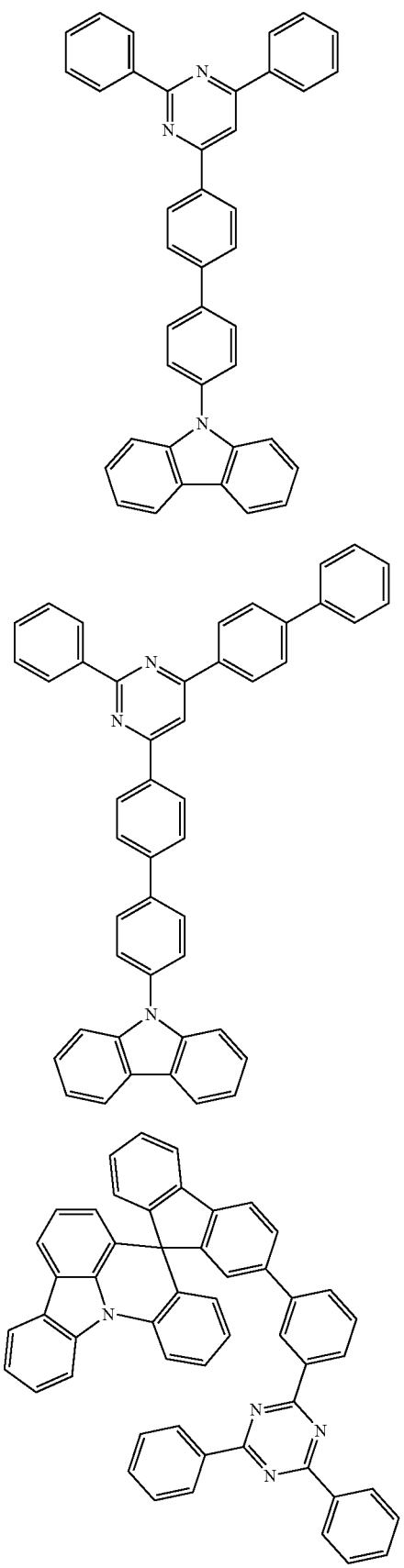
E16
E17
E18
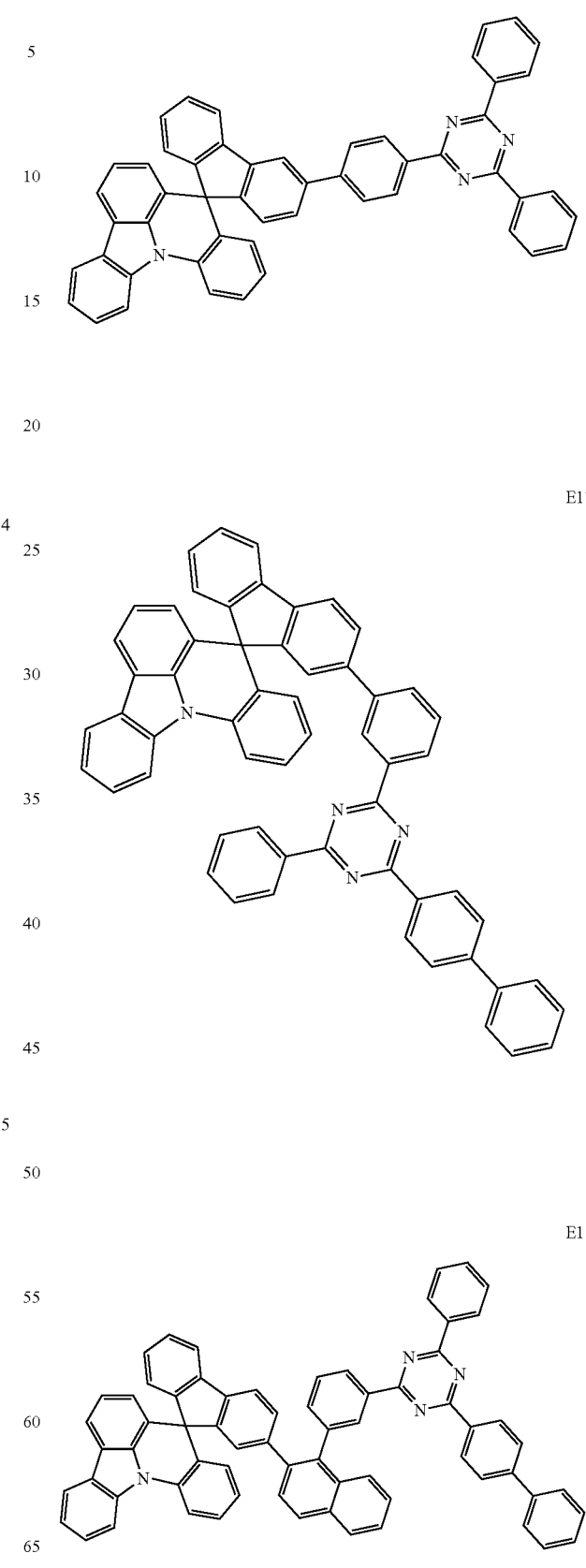

Chemical Formula 10

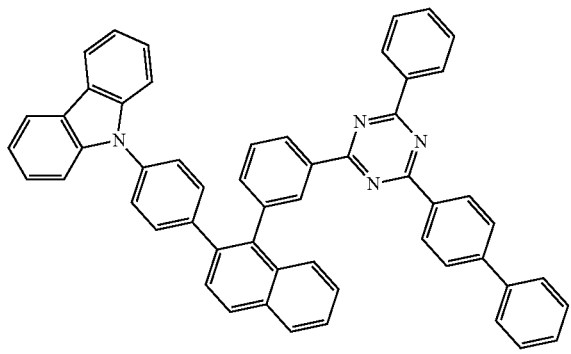
E19

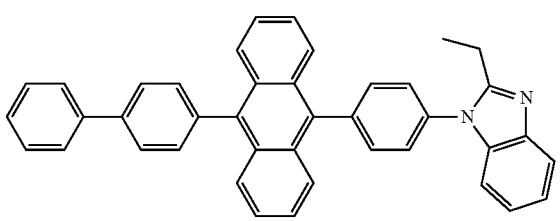
F1

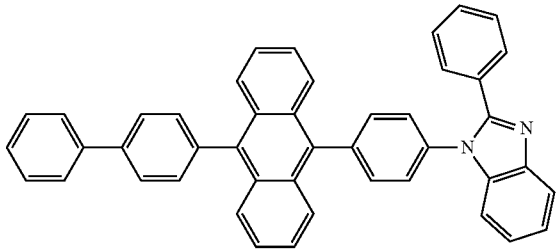
F2

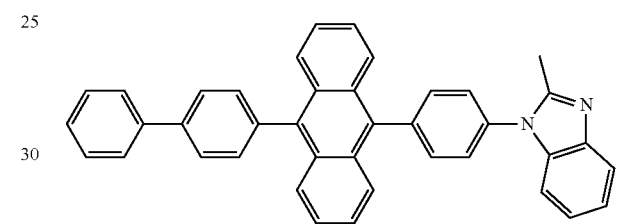
F3

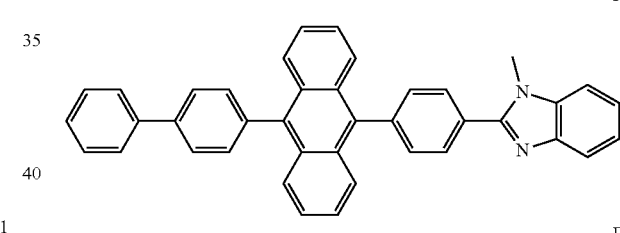
F4

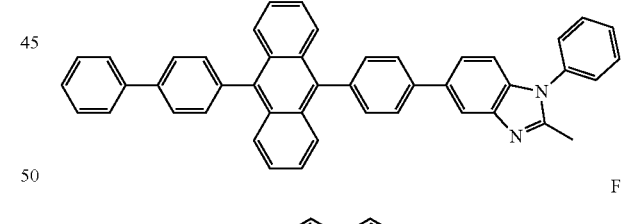
F5

E20

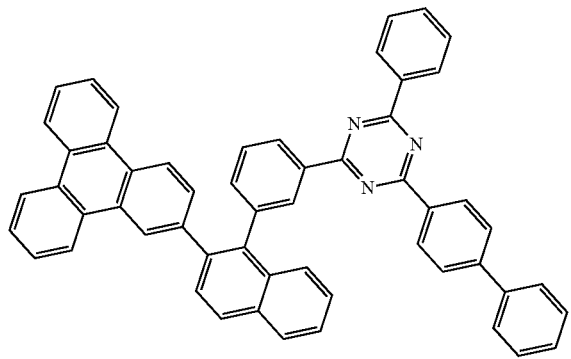
E21

F6

As an example, "Ar" in Chemical Formula 9 may be a naphthylene group or an anthracenylene group, R41 in Chemical Formula 9 may be a phenyl group or a benzimidazole group and R42 in Chemical Formula 9 may be a methyl group, an ethyl group or a phenyl group. In one exemplary embodiment, the benzimidazole compound that can be introduced into the HBL 375 may include any compound having the following structure of Chemical Formula 10:

In an exemplary embodiment, each of the EBL 355 and the HBL 375 may be independently laminated with a thickness of, but is not limited to, about 5 mm to about 200 nm, and preferably about 5 nm to about 100 nm.

The compound having the structure of Chemical Formulae 7 to 10 has good electron transport property as well as excellent hole blocking property. Accordingly, the HBL 375 including the compound having the structure of Chemical Formulae 7 to 10 may function as a hole blocking layer and an electron transport layer.

In an alternative embodiment, the OLED 300 may further include an electron transport layer (ETL, not shown) disposed between the HBL 375 and the EIL 380. In one exemplary embodiment, the ETL may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

Particularly, the ETL may include an electron transport material selected from, but is not limited to, the group consisting of tris-(8-hydroxyquinoline aluminum ($Alq_3$) 2-biphenyl-4-yl-5-(4-t-butylphenyl)-1,3,4-oxadiazole (PBD), Spiro-PBD, lithium quinolate (Liq), 3,5-Tris(N-phenylbenzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis (naphthalene-2-yl)4,7-diphenyl-1,10-phenanthroline (NBphen), 2,9-Dimethyl-4,7-diphenyl-1,10-phenathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), Diphenyl-4-triphenylsilyl-phenylphosphine oxide (TSPO1), 2-[4-(9,10-Di-2-naphthalenyl-2-anthracenyl)phenyl]-1-phenyl-1H-benzimdazole (ZADN), 1,3-bis(9-phenyl-1,10-phenathrolin-2-yl)benzene, 1,4-bis(2-phenyl-1,10-phenanthrolin-4-yl)benzene (p-bPPhenB) and/or 1,3-bis(2-phenyl-1,10-phenanthrolin-4-yl)benzene (m-bPPhenB).

Alternatively, the ETL may include the above-described electron transport material doped with metal such as an alkali metal and/or an alkaline earth metal. In this case, the ETL may include the alkali metal or the alkaline earth metal of, but is not limited to, about 1 to about 30% by weight. As an example, the alkali metal or the alkaline earth metal as a dopant in the ETL may include, but is not limited to, lithium (Li), sodium (Na), potassium (K), cesium (Cs), magnesium (Mg), strontium (Sr), barium (Ba) and radium (Ra).

The EIL 380 is disposed between the HBL 375 and the second electrode 320, and can improve physical properties of the second electrode 320 and therefore, can enhance the life span of the OLED 300. In one exemplary embodiment, the EIL 380 may include, but is not limited to, an alkali halide such as LiF, CsF, NaF, $BaF_2$ and the like, and/or an organic metal compound such as lithium benzoate, sodium stearate, and the like. The EIL 380 may be omitted in compliance with a structure of the OLED 300.

In an alternative embodiment, the EIL 380 may be an organic layer doped with the alkali metal such as Li, Na, K and/or Cs and/or the alkaline earth metal such as Mg, Sr, Ba and/or Ra. A host used in the EIL 380 may be the electron transport material and the alkali metal or the alkaline earth metal may be doped with a ratio of, but is not limited to, about 1 to about 30% by weight. As an example, each of the ETL and the EIL 380 may be laminated with a thickness of, but is not limited to, about 10 nm to about 200 nm, preferably about 10 nm to 100 nm.

The OLED 300 can improve its luminous efficiency and can enhance its luminous life time by applying the anthracene-based compound having the structure of Chemical Formulae 1 to 2 as the first host and the boron-based compound having the structure of Chemical Formulae 3 to 4 as the first dopant into the EML 360, the amine-based compound substituted with at least one fused hetero aryl group having the structure of Chemical Formulae 5 and 6 into the EBL 355, and optionally the azine-based compound having the structure of Chemical Formulae 7 to 8 and/or the benzimidazole-based compound having the structure of Chemical Formulae 9 to 10 into the HBL 375.

In the exemplary first embodiment, the OLED 300 may have single emitting unit 330. An OLED in accordance with the present disclosure may have a tandem structure including multiple emitting units. FIG. 4 is a schematic cross-sectional view illustrating an organic light emitting diode having a tandem structure of two emitting units in accordance with another exemplary embodiment of the present disclosure.

As illustrated in FIG. 4, the OLED 400 in accordance with the second embodiment of the present disclosure includes first and second electrodes 410 and 420 facing each other, a first emitting unit 430 disposed between the first and second electrodes 410 and 420, a second emitting unit 530 disposed between the first emitting unit 430 and the second electrode 420 and a first charge generation layer (CGL1) 490 disposed between the first and second emitting units 430 and 530.

The first electrode 410 may be an anode and include a conductive material having a relatively large work function values, for example, transparent conductive oxide (TCO) such as ITO, IZO, SnO, ZnO, ICO, AZO, and the like. The second electrode 420 may be a cathode and include a conductive material having a relatively small work function values such as Al, Mg, Ca, Ag, alloy thereof or combination thereof. As an example, each of the first and second electrodes 410 and 420 may be laminated with a thickness of, but is not limited to, about 30 nm to about 300 nm.

The first emitting unit 430 includes a first emitting material layer (EML1) 460 disposed between the first electrode 410 and the CGL1 490 and a first electron blocking layer (EBL1) 455 disposed between the first electrode 410 and the EML1 460. Alternatively, the first emitting unit 430 may further include a first hole blocking layer (HBL1) 475 disposed between the EML1 460 and CGL1 490. In addition, the first emitting unit 430 may further include a hole injection layer (HIL) 440 disposed between the first electrode 410 and the EBL1 455, a first hole transport layer (HTL1) 450 disposed between the HIL 440 and the EBL1 455, and optionally a first electron transport layer (ETL 1 not shown) disposed between the HBL 1 475 and the CGL1 490.

The second emitting unit 530 includes a second emitting material layer (EML2) 560 disposed between the CGL1 490 and the second electrode 420 and a second electron blocking layer (EBL2) 555 disposed between the CGL1 490 and the EML2 560. Alternatively, the second emitting unit 530 may further include a second hole blocking layer (HBL2) 575 disposed between the EML2 560 and the second electrode 420. In addition, the second emitting unit 530 may further include a second hole transport layer (HTL2) 550 disposed between the CGL1 490 and EBL2 555, an electron injection layer (EIL) 580 disposed between the HBL2 575 and the second electrode 420, and optionally a second electron transport layer (ETL2, not shown) disposed between the HBL2 575 and the EIL 580.

Both the EML 1 460 and the EML2 560 may include a first host which is the anthracene-based compound having the structure of Chemical Formulae 1 to 2 and a first dopant which is the boron-based compound having the structure of Chemical Formulae 3 to 4. In this case, the OLED 400 emits blue color light.

The HIL 440 is disposed between the first electrode 410 and the HTL1 450 and improves an interface property between the inorganic first electrode 410 and the organic HTL1 450. In one exemplary embodiment, the HIL 440 include a hole injection material selected from, but is not limited to, the group consisting of MTDATA, NATA, 1T-NATA, 2T-NATA, CuPc, TCTA, NPB(NPD), HAT-CN, TDAPB, PEDOT/PSS, F4TCNQ and/or N-(biphenyl-4-yl)-9,9-dimethyl-N-(4-(9-phenyl-9H-carbazol-3-yl)phenyl)-9H-fluoren-2-amine. In an alternative embodiment, the HIL 440 may include a hole transport material doped with the hole injection material. The HIL 440 may be omitted in compliance with a structure of OLED 400.

Each of the HTL1 450 and the HTL2 550 may independently include a hole transport material selected from, but is not limited to, TPD, DNTPD, NBP(NPD), CBP, poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenl-9H-carbazol-3-yl)phenyl)-9H-fluoren-2-amine and/or N4,N4,N4',N4'-tetrakis([1,1'-biphenyl]-4-yl)-[1,1'-biphenyl]-4,4'-diamine. Each of the HIL 440, the HTL1 450 and the HTL2 550 may be laminated with a thickness of, but is not limited to, about 5 nm to about 200 nm, and preferably about 5 nm to about 100 nm.

Each of the EBL1 455 and the EBL2 555 prevents electrons from transporting from the EML1 460 or EML2 560 to the first electrode 410 or the CGL1 490, respectively. As an example, each of the EBL1 455 and the EBL2 555 may independently include the amine-based compound having the structure of Chemical Formulae 5 to 6.

Each of the HBL1 475 and the HBL2 575 prevents holes from transporting from the EML1 460 or EML2 560 to the CGL1 490 or the second electrode 420, respectively. As an example, each of the HBL1 475 and the HBL2 575 may independently include the azine-based compound having the structure of Chemical Formulae 7 to 8 and/or the benzimidazole-based compound having the structure of Chemical Formulae 9 to 10. Each of the EBL1 455, the EBL2 555, the HBL1 475 and the HBL2 575 may be laminated with a thickness of, but is not limited to, about 5 nm to about 200 nm, and preferably about 5 nm to about 100 nm.

As described above, the compound having the structure of Chemical Formulae 7 to 10 has excellent electron transport property as well as excellent hole blocking property. Therefore, each of the HBL1 475 and the HBL2 575 may function as a hole blocking layer and an electron transport layer.

In an alternative embodiment, the first emitting unit 430 may further include a first electron transport layer (ETL1, not shown) disposed between the HBL1 475 and the CGL1 490 and/or the second emitting unit 530 may further include a second electron transport layer (ETL2, not shown) disposed between the HBL2 575 and the EIL 580. Each of the ETL1 and the ETL2 may independently include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

In one exemplary embodiment, each of the ETL1 and the ETL2 may independently include an electron transport material selected from, but is not limited to, the group consisting of $Alq_3$, PDB, spiro-PBD, Liq, TPBi, BAlq, Bphen, NBphen, BCP, TAZ, NTAZ, TpPyPB, TmPPPyTz, PFNBr, TPQ, TSPO1, ZADN, p-bPPhenB and/or m-bP-PhenB. Alternatively, each of the ETL1 and the ETL2 may include the electron transport material doped with an alkali metal such as Li, Na, K and Cs and/or an alkaline earth metal such as Mg, Sr, Ba and Ra.

The EIL 580 is disposed between the HBL2 575 and the second electrode 420. In one exemplary embodiment, the EIL 580 may include, but is not limited to, an alkali halide such as LiF, CsF, NaF, $BaF_2$ and the like, and/or an organic metal compound such as lithium benzoate, sodium stearate, and the like. In an alternative embodiment, the EIL 580 may include the electron transport material doped with the alkali metal and/or the alkaline earth metal. A host used in the EIL 580 may be the electron transport material and the alkali metal or the alkaline earth metal may be doped with a ratio of, but is not limited to, about 1 to about 30% by weight. As an example, each of the ETL1, the ETL2 and the EIL 580 may be laminated with a thickness of, but is not limited to, about 10 nm to about 200 nm, preferably about 10 nm to 100 nm.

The CGL1 490 is disposed between the first emitting unit 430 and the second emitting unit 530. The CGL1 490 includes an N-type CGL 510 disposed adjacently to the first emitting unit 430 and a P-type CGL 520 disposed adjacently to the second emitting unit 530. The N-type CGL 510 injects electrons into the first emitting unit 430 and the P-type CGL 520 injects holes into the second emitting unit 530.

As an example, the N-type CGL 510 may be an organic layer doped with an alkali metal such as Li, Na, K and/or Cs and/or an alkaline earth metal such as Mg, Sr, Ba and/or Ra. For example, a host used in the N-type CGL 510 may include, but is not limited to, an organic compound such as Bphen or MTDATA. The alkali metal or the alkaline earth metal may be doped by about 0.01 wt % to about 30 wt % in the N-type CGL 510.

The P-type CGL 520 may include, but is not limited to, an inorganic material selected from the group consisting of tungsten oxide ($WO_x$), molybdenum oxide ($MoO_x$), beryllium oxide ($Be_2O_3$), vanadium oxide ($V_2O_5$) and combination thereof, and/or an organic material selected from the group consisting of NPD, HAT-CN, F4TCNQ, TPD, N,N,N',N'-Tetranaphthalenyl-benzidine (TNB), TCTA, N,N'-dioctyl-3,4,9,10-perylenedicarboximide (PTCDI-C8) and combination thereof.

The OLED 400 in accordance with the second embodiment of the present disclosure can improve its luminous efficiency and can enhance its luminous life time by applying the anthracene-based compound having the structure of Chemical Formulae 1 to 2 as the first host and the boron-based compound having the structure of Chemical Formulae 3 to 4 as the first dopant into the EML1 460 and the EML2 560, the amine-based compound having the structure of Chemical Formulae 5 and 6 into the EBL1 455 and the EBL2 555, and optionally the azine-based compound having the structure of Chemical Formulae 7 to 8 and/or the benzimidazole-based compound having the structure of Chemical Formulae 9 to 10 into the HBL1 475 and the HBL2 575. In addition, the organic light emitting display device 100 (See, FIG. 2) can implement an image having high color purity by laminating double stack structure of two emitting units 430 and 530 each of which emits blue color light.

In the second embodiment, the OLED 400 has a tandem structure of two emitting units. An OLED may include three emitting units that further includes a third emitting unit disposed on the second emitting unit 530 except the EIL 580 (See, FIG. 6).

In the above embodiment, the organic light emitting device 100 and the OLEDs 300 and 400 implement blue (B)

emission. Unlikely, an organic light emitting device and an OLED can implement a full color display device including white (W) emission. FIG. 5 is a schematic cross-sectional view illustrating an organic light emitting display device in accordance with another exemplary embodiment of the present disclosure.

As illustrated in FIG. 5, the organic light emitting display device 600 comprises a first substrate 602 that defines each of a red pixel RP, a green pixel GP and a blue pixel BP, a second substrate 604 facing the first substrate 602, a thin film transistor Tr over the first substrate 602, an organic light emitting diode 700 disposed between the first and second substrates 602 and 604 and emitting white (W) light and a color filter layer 680 disposed between the organic light emitting diode 700 and the second substrate 604.

Each of the first and second substrates 602 and 604 may include, but is not limited to, glass, flexible material and/or polymer plastics. For example, each of the first and second substrates 602 and 604 may be made of PI, PES, PEN, PET, PC and combination thereof. The first substrate 602, over which a thin film transistor Tr and an organic light emitting diode 700 are arranged, forms an array substrate.

A buffer layer 606 may be disposed over the first substrate 602, and the thin film transistor Tr is disposed over the buffer layer 606 correspondingly to each of the red pixel RP, the green pixel GP and the blue pixel BP. The buffer layer 606 may be omitted.

A semiconductor layer 610 is disposed over the buffer layer 606. The semiconductor layer 610 may be made of oxide semiconductor material or polycrystalline silicon.

A gate insulating layer 620 including an insulating material, for example, inorganic insulating material such as silicon oxide ($SiO_x$) or silicon nitride ($SiN_x$) is disposed on the semiconductor layer 610.

A gate electrode 630 made of a conductive material such as a metal is disposed over the gate insulating layer 620 so as to correspond to a center of the semiconductor layer 610. An interlayer insulting layer 640 including an insulating material, for example, inorganic insulating material such as silicon oxide ($SiO_x$) or silicon nitride ($SiN_x$), or an organic insulating material such as benzocyclobutene or photo-acryl, is disposed on the gate electrode 630.

The interlayer insulating layer 640 has first and second semiconductor layer contact holes 642 and 644 that expose both sides of the semiconductor layer 610. The first and second semiconductor layer contact holes 642 and 644 are disposed over opposite sides of the gate electrode 630 with spacing apart from the gate electrode 630.

A source electrode 652 and a drain electrode 654, which are made of a conductive material such as a metal, are disposed on the interlayer insulating layer 640. The source electrode 652 and the drain electrode 654 are spaced apart from each other with respect to the gate electrode 630, and contact both sides of the semiconductor layer 610 through the first and second semiconductor layer contact holes 642 and 644, respectively.

The semiconductor layer 610, the gate electrode 630, the source electrode 652 and the drain electrode 654 constitute the thin film transistor Tr, which acts as a driving element.

Although not shown in FIG. 5, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 660 is disposed on the source and drain electrodes 652 and 654 with covering the thin film transistor Tr over the whole first substrate 602. The passivation layer 660 has a drain contact hole 662 that exposes the drain electrode 654 of the thin film transistor Tr.

The organic light emitting diode (OLED) 700 is located over the passivation layer 660. The OLED 700 includes a first electrode 710 that is connected to the drain electrode 654 of the thin film transistor Tr, a second electrode 720 facing from the first electrode 710 and an emissive layer 730 disposed between the first and second electrodes 710 and 720.

The first electrode 710 formed for each pixel region may be an anode and may include a conductive material having relatively high work function value. For example, the first electrode 710 may include, ITO, IZO, ITZO, SnO, ZnO, ICO, AZO, and the like. Alternatively, a reflective electrode or a reflective layer may be disposed under the first electrode 710. For example, the reflective electrode or the reflective layer may include, but is not limited to, APC alloy.

A bank layer 664 is disposed on the passivation layer 760 in order to cover edges of the first electrode 710. The bank layer 664 exposes a center of the first electrode 710 correspondingly to each of the red pixel RP, the green pixel GP and the blue pixel BP. The bank layer 664 may be omitted.

An emissive layer 730 including emitting units are disposed on the first electrode 710. As illustrated in FIG. 6, the emissive layer 730 may include multiple emitting units 830, 930 and 1030 and multiple charge generation layers 890 and 990. Each of the emitting units 830, 930 and 1030 includes an emitting material layer and may further include a hole injection layer, a hole transport layer, an electron blocking layer, a hole blocking layer, an electron transport layer and/or an electron injection layer.

The second electrode 720 is disposed over the first substrate 602 above which the emissive layer 730 is disposed. The second electrode 720 may be disposed over a whole display area, and may include a conductive material with a relatively low work function value compared to the first electrode 710, and may be a cathode. For example, the second electrode 720 may include, but is not limited to, aluminum (Al), magnesium (Mg), calcium (Ca), silver (Ag), alloy thereof or combination thereof such as aluminum-magnesium alloy (Al—Mg).

Since the light emitted from the emissive layer 730 is incident to the color filter layer 680 through the second electrode 720 in the organic light emitting display device 600 in accordance with the second embodiment of the present disclosure, the second electrode 720 has a thin thickness so that the light can be transmitted.

The color filter layer 680 is disposed over the OLED 700 and includes a red color filter 682, a green color filter 684 and a blue color filter 686 each of which is disposed correspondingly to the red pixel RP, the green pixel GP and the blue pixel BP, respectively. Although not shown in FIG. 5, the color filter layer 680 may be attached to the OLED 700 via an adhesive layer. Alternatively, the color filter layer 680 may be disposed directly on the OLED 700.

In addition, an encapsulation film may be disposed over the second electrode 720 in order to prevent outer moisture from penetrating into the OLED 700. The encapsulation film may have, but is not limited to, a laminated structure of a first inorganic insulating film, an organic insulating film and a second inorganic insulating film (See, 170 in FIG. 1). In addition, a polarizing plate may be attached onto the second substrate 604 to reduce reflection of external light. For example, the polarizing plate may be a circular polarizing plate.

In FIG. 5, the light emitted from the OLED 700 is transmitted through the second electrode 720 and the color filter layer 680 is disposed over the OLED 700. Alternatively, the light emitted from the OLED 700 is transmitted through the first electrode 710 and the color filter layer 680 may be disposed between the OLED 700 and the first substrate 602. In addition, a color conversion layer may be formed between the OLED 700 and the color filter layer 680. The color conversion layer may include a red color conversion layer, a green color conversion layer and a blue color conversion layer each of which is disposed correspondingly to each pixel (RP, GP and BP), respectively, so as to covert the white (W) color light to each of a red, green and blue color lights, respectively.

As described above, the white (W) color light emitted from the OLED 700 is transmitted through the red color filter 682, the green color filter 684 and the blue color filter 686 each of which is disposed correspondingly to the red pixel RP, the green pixel GP and the blue pixel BP, respectively, so that red, green and blue color lights are displayed in the red pixel RP, the green pixel GP and the blue pixel BP.

FIG. 6 is a schematic cross-sectional view illustrating an organic light emitting diode having a tandem structure of three emitting units in accordance with still another exemplary embodiment of the present disclosure. As illustrated in FIG. 6, the organic light emitting diode (OLED) 800 in accordance with the third embodiment of the present disclosure includes first and second electrode 810 and 820 facing each other, a first emitting unit 830 disposed between the first and second electrodes 810 and 820, a second emitting unit 930 disposed between the first emitting unit 830 and the second electrode 820, a third emitting unit 1030 disposed between the second emitting unit 930 and the second electrode 820, a first charge generation layer (CGL1) 890 disposed between the first and second emitting units 830 and 930, and a second charge generation layer (CGL2) 990 disposed between the second and third emitting units 930 and 1030.

At least one of the first to third emitting units 830, 930 and 1030 emits blue (B) color light, and at least another of the first to third emitting units 830, 930 and 1030 emits red green (RG) or yellow green (YG) color light. Hereinafter, the OLED 800, where the first and third emitting units 830 and 1030 emit blue (B) color light and the second emitting unit 930 emits red green (RG) or yellow green (YG) color light, will be explained.

The first electrode 810 may be an anode and include a conductive material having a relatively large work function values, for example, transparent conductive oxide (TCO). In one exemplary embodiment, the first electrode 810 may be made of ITO, IZO, SnO, ZnO, ICO, AZO, and the like. The second electrode 820 may be a cathode and include a conductive material having a relatively small work function values such as Al, Mg, Ca, Ag, alloy thereof or combination thereof. As an example, each of the first and second electrodes 810 and 820 may be laminated with a thickness of, but is not limited to, about 30 nm to about 300 nm.

The first emitting unit 830 includes a first emitting material layer (EML1) 860 disposed between the first electrode 820 and CGL1 890 and a first electron blocking layer (EBL1) 855 disposed between the first electrode 810 and the EML1 860. Alternatively, the first emitting unit 830 may further include a first hole blocking layer (HBL1) 875 disposed between the EML1 860 and the CGL1 890. In addition, the first emitting unit 830 may further include a hole injection layer (HIL) 840 disposed between the first electrode 810 and the EBL1 855, a first hole transport layer (HTL1) 850 disposed between the HIL 840 and the EBL1 855, and optionally a first electron transport layer (ETL1, not shown) disposed between the HBL1 875 and the CGL1 890.

The second emitting unit 930 includes a second emitting material layer (EML2) 960 disposed between the CGL1 890 and the CGL2 990 and may include a second hole transport layer (HTL2) 950 disposed between the CGL1 890 and the EML2 960 and a second electron transport layer (ETL2) 970 disposed between the EML2 960 and the CGL2 990. In addition, the second emitting unit 930 may further include a second electron blocking layer (EBL2) 955 disposed between the HTL2 950 and the EML2 960 and/or a second hole blocking layer (HBL2) 975 disposed between the EML2 960 and the ETL2 970.

The third emitting unit 1030 includes a third emitting material layer (EML3) 1060 disposed between the CGL2 990 and the second electrode 820 and a third electron blocking layer (EBL3) 1055 disposed between the CGL2 990 and the EML3 1060. Alternatively, the third emitting unit 1030 may further include a third hole blocking layer (HBL3) 1075 disposed between the EML3 1060 and the second electrode 820. In addition, the second emitting unit 1030 may further include a third hole transport layer (HTL3) 1050 disposed between the CGL2 990 and the EBL3 1055, an electron injection layer (EIL) 1080 disposed between the ETL3 and the second electrode 820, and optionally a third electron transport layer (ETL3) disposed between the HBL3 1075 and the EIL 1080.

Each of the EML1 860 and the EML3 1060 may include a first host which is the anthracene-based compound having the structure of Chemical Formulae 1 to 2 and a first dopant which is the boron-based compound having the structure of Chemical Formulae 3 to 4. In this case, each of the first emitting unit 830 and the third emitting unit 1030 emits blue color light, respectively.

The HIL 840 include a hole injection material selected from, but is not limited to, the group consisting of MTDATA, NATA, 1T-NATA, 2T-NATA, CuPc, TCTA, NPB (NP D), HAT-CN, TDAPB, PEDOT/PSS, F4TCNQ and/or N-(biphenyl-4-yl)-9,9-dimethyl-N-(4-(9-phenyl-9H-carbazol-3-yl)phenyl)-9H-fluoren-2-amine. In an alternative embodiment, the HIL 840 may include a hole transport material doped with the hole injection material. The HIL 840 may be omitted in compliance with a structure of OLED 800.

Each of the HTL1 850, the HTL2 950 and the HTL3 1050 may independently include a hole transport material selected from, but is not limited to, TPD, DNTPD, NBP(NPD), CBP, poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenl-9H-carbazol-3-yl)phenyl)-9H-fluoren-2-amine and/or N4,N4,N4',N4'-tetrakis([1,1'-biphenyl]-4-yl)-[1,1'-biphenyl]-4,4'-diamine. Each of the HIL 840, the HTL1 850, the HTL2 950 and the HTL3 1050 may be laminated with a thickness of, but is not limited to, about 5 nm to about 200 nm, and preferably about 5 nm to about 100 nm.

Each of the EBL1 855 and the EBL3 1055 prevents electrons from transporting from the EML 1 860 or EML3 1060 to the first electrode 810 or the CGL2 990, respectively. As an example, each of the EBL1 855 and the EBL3 1055 may independently include the amine-based compound having the structure of Chemical Formulae 5 to 6.

Each of the HBL1 875 and the HBL3 1075 prevents holes from transporting from the EML1 860 or EML3 1060 to the CGL1 890 or the second electrode 820, respectively. As an example, each of the HBL1 875 and the HBL3 1075 may independently include the azine-based compound having the structure of Chemical Formulae 7 to 8 and/or the benzimidazole-based compound having the structure of Chemical Formulae 9 to 10. Each of the EBL1 855, the EBL3 1055, the HBL1 875 and the HBL3 1075 may be laminated with a thickness of, but is not limited to, about 5 nm to about 200 nm, and preferably about 5 nm to about 100 nm.

As described above, the compound having the structure of Chemical Formulae 7 to 10 has excellent electron transport property as well as excellent hole blocking property. Therefore, each of the HBL1 875 and the HBL3 1075 may function as a hole blocking layer and an electron transport layer.

In an alternative embodiment, the first emitting unit 830 may further include a first electron transport layer (ETL1, not shown) disposed between the HBL1 875 and the CGL1 890 and the third emitting unit 1030 may further include a third electron transport layer (ETL3, not shown) disposed between the HBL3 1075 and the EIL 1080. Each of the ETL1 and the ETL3 may independently include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

In one exemplary embodiment, each of the ETL1 and the ETL3 may independently include an electron transport material selected from, but is not limited to, the group consisting of $Alq_3$, PDB, spiro-PBD, Liq, TPBi, BAlq, Bphen, NBphen, BCP, TAZ, NTAZ, TpPyPB, TmPPPyTz, PFNBr, TPQ, TSPO1, ZADN, p-bPPhenB and/or m-bPPhenB. Alternatively, each of the ETL1 and the ETL2 may include the electron transport material doped with an alkali metal such as Li, Na, K and Cs and/or an alkaline earth metal such as Mg, Sr, Ba and Ra.

The EIL 1080 is disposed between the HBL3 1075 and the second electrode 820. In one exemplary embodiment, the EIL 1080 may include, but is not limited to, an alkali halide such as LiF, CsF, NaF, $BaF_2$ and the like, and/or an organic metal compound such as lithium benzoate, sodium stearate, and the like. In an alternative embodiment, the EIL 1080 may include the electron transport material doped with the alkali metal and/or the alkaline earth metal. A host used in the EIL 1080 may be the electron transport material and the alkali metal or the alkaline earth metal may be doped with a ratio of, but is not limited to, about 1 to about 30% by weight. As an example, each of the ETL1, the ETL3 and the EIL 1080 may be laminated with a thickness of, but is not limited to, about 10 nm to about 200 nm, preferably about 10 nm to 100 nm.

In one exemplary embodiment, the EML2 960 may emit red green (RG) color light. In this case, the EML2 960 may include a second host, a second dopant as a green dopant and a third dopant as a red dopant.

As an example, the second host may include, but is not limited to, 9,9'-Diphenyl-9H,9'H-3,3'-bicarbazole (BCzPh), CBP, 1,3,5-Tris(carbazole-9-yl)benzene (TCP), TCTA, 4,4'-Bis(carbazole-9-yl)-2,2'-dimethylbipheyl (CDBP), 2,7-Bis(carbazole-9-yl)-9,9-dimethylfluorene (DMFL-CBP), 2,2',7,7'-Tetrakis(carbazole-9-yl)-9,9-spiorofluorene (Spiro-CBP), Bis[2-(diphenylphosphine)phenyl] ether oxide (DPEPO), 4'-(9H-carbazol-9-yl)biphenyl-3,5-dicarbonitrile (PCzB-2CN), 3'-(9H-carbazol-9-yl)biphenyl-3,5-dicarbonitrile (mCzB-2CN), 33,6-Bis(carbazole-9-yl)-9-(2-ethyl-hexyl)-9H-carbazole (TCz1), Bis(2-hydroxylphenyl)-pyridine)beryllium ($Bepp_2$), Bis(10-hydroxylbenzo[h] quinolinato)beryllium ($Bebg_2$) and/or 1,3,5-Tris(1-pyrenyl)benzene (TPB3).

The second dopant as the green dopant may include, but is not limited to, [Bis(2-phenylpyridine)] (pyridyl-2-benzofuro[2,3-b]pyridine)iridium, fac-Tris(2-phenylpyridine)iridium(III) (fac-Ir(ppy)₃), Bis(2-phenylpyridine)(acetylacetonate)iridium(III) (Ir(ppy)₂(acac)), Tris[2-(p-tolyl)pyridine]iridium(III) (Ir(mppy)₃), Bis(2-(naphthalene-2-yl)pyridine)(acetylacetonate)iridium(III) (Ir(npy)₂acac), Tris(2-phenyl-3-methyl-pyridine)iridium (Ir(3mppy)₃) and fac-Tris(2-(3-p-xylyl)phenyl)pyridine iridium(III) (TEG).

The third dopant which can be used as the red dopant may include, but is not limited to, [Bis(2-(4,6-dimethyl)phenylquinoline)] (2,2,6,6-tetramethylheptane-3,5-dionate) iridium(III), Bis[2-(4-n-hexylphenyl)quinoline](acetylacetonate)iridium(III) (Hex-Ir(phq)₂(acac)), Tris[2-(4-n-hexylphenyl)quinoline]iridium(III) (Hex-Ir(phq)₃), Tris[2-phenyl-4-methylquinoline]iridium(III) (Ir(Mphq)₃), Bis(2-phenylquinoline)(2,2,6,6-tetramethylheptene-3,5-dionate) iridium(III) (Ir(dpm)PQ₂), Bis(phenylisoquinoline)(2,2,6,6-tetramethylheptene-3,5-dionate)iridium(III) (Ir(dpm)(piq)₂), Bis[(4-n-hexylphenyl)isoquinoline] (acetylacetonate)iridium(III) (Hex-Ir(piq)₂(acac)), Tris[2-(4-n-hexylphenyl)quinoline]iridium(III) (Hex-Ir(piq)₃), Tris(2-(3-methylphenyl)-7-methyl-quinolato)iridium (Ir(dmpq)₃), Bis [2-(2-methylphenyl)-7-methyl-quinoline](acetylacetonate) iridium(III) (Ir(dmpq)₂(acac)) and Bis[2-(3,5-dimethylphenyl)-4-methyl-quinoline](acetylacetonate) iridium(III) (Ir(mphmq)₂(acac)).

In an alternative embodiment, the EML2 960 may emit yellow green (YG) color light. In this case, the EML2 960 may include a second host, a second dopant as a green dopant and a third dopant as a yellow dopant.

The second host may be the same as the host for emitting the red green (RG) light. The third dopant as the yellow dopant may include, but is not limited to, 5,6,11,12-Tetraphenylnaphthalene (Rubrene), 2,8-Di-tert-butyl-5,11-bis(4-tert-butylphenyl)-6,12-diphenyltetracene (TBRb), Bis(2-phenylbenzothiazolato)(acetylacetonate)irdium(III) (Ir(BT)₂(acac)), Bis(2-(9,9-diethytl-fluoren-2-yl)-1-phenyl-1H-benzo[d]imdiazolato)(acetylacetonate)iridium(III) (Ir(fbi)₂(acac)), Bis(2-phenylpyridine)(3-(pyridine-2-yl)-2H-chromen-2-onate)iridium(III) (fac-Ir(ppy)₂Pc) and Bis(2-(2,4-difluorophenyl)quinoline)(picolinate)iridium(III) (FPQlrpic).

When the EML2 960 emits red green (RG) or yellow green (YG) color light, each of the second and third dopants may be doped with a ratio of about 1 to about 50% by weight, and preferably about 1 to about 30% by weight in the EML2 960.

The EBL2 955 prevents electrons from transporting from the EML2 960 to the CGL1 890. The EBL2 955 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-bis(carbazol-9-yl)benzene (mCP), 3,3-di(9H-carbazol-9-yl)biphenyl (mCBP), CuPc, N'-bis[4-[bis(3-methylphenyl)amino]phenyl]-N,N'-diphenyl-[1,1'-biphenyl]-4,4'-diamine (DNTPD), TDAPB, DCDPA, 2,8-bis(9-phenyl-9H-carbazol-3-yl)dibenzo[b,d]thiophene, and/or 3,6-bis(N-carbazolyl)-N-phenyl-carbazole.

The HBL2 975 prevents holes from transporting from the EML2 960 to the CGL2 990. The HBL2 975 may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like. For example, the HBL2 975 may include a compound having a relatively low HOMO energy level compared to the EML2 960. The HBL2 975 may include, but is not limited to, BCP, BAlq, Alq$_3$, PBD, Spiro-PBD, Liq, Bis-4,5-(3,5-di-3-pyridylphenyl)-2-methylpyrimidine (B3PYMPM), DPEPO, TSPO1, 9-(6-(9H-carbazol-9-yl)pyridine-3-yl)-9H-3,9'-bicarbazole and combination thereof. Each of the EBL2 955 and the HBL2 975 may be laminated with a thickness of, but is not limited to, about 5 mm to about 200 nm, and preferably about 5 nm to about 100 nm.

The ETL2 970 may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like. As an example, the ETL2 970 may include an electron transport material selected from, but is not limited to, the group consisting of Alq$_3$, PBP, spiro-PBD, Liq, TPBi, BAlq, Bphen, NBphen, BCP, TAZ, NTAZ, TpPyPB, TmPPPyTz, PFNBr, TPQ, TSPO1, ZADN, 1,3-bis(9-phenyl-1,10-phenathrolin-2-yl)benzene, p-bPPhenB and/or m-bPPhenB. The ETL2 may be laminated with a thickness of, but is not limited to, about 10 nm to about 200 nm, and preferably about 10 nm to about 100 nm.

The CGL1 890 is disposed between the first and second emitting units 830 and 930 and the CGL2 990 is disposed between the second and third emitting units 930 and 1030. Each of the CGL1 890 and the CGL2 990 includes first and second N-type CGLs 910 and 1010 each of which is disposed adjacently to each of the first and second emitting units 830 and 930, respectively, and first and second P-type CGLs 920 and 1020 each of which is disposed adjacently to each of the second and third emitting units 930 and 1030, respectively. Each of the first and second N-type CGLs 910 and 1010 injects electrons into each of the first and second emitting units 830 and 930, respectively, and each of the P-type CGLs 920 and 1020 injects holes into each of the second and third emitting units 930 and 1030, respectively.

Each of the first and second N-type CGLs 910 and 1010 may independently be an organic layer doped with an alkali metal such as Li, Na, K and/or Cs and/or an alkaline earth metal such as Mg, Sr, Ba and/or Ra. For example, a host used in each of the first and second N-type CGLs 910 and 1010 may include independently, but is not limited to, an organic compound such as Bphen or MTDATA, respectively. The alkali metal or the alkaline earth metal may be doped by about 0.01 wt % to about 30 wt % in each of the first and second N-type CGLs 910 and 1010.

Each of the first and second P-type CGLs 920 and 1020 may include, but is not limited to, an inorganic material selected from the group consisting of tungsten oxide (WO$_x$), molybdenum oxide (MoO$_x$), beryllium oxide (Be$_2$O$_3$), vanadium oxide (V$_2$O$_5$) and combination thereof, and/or an organic material selected from the group consisting of NPD, HAT-CN, F4TCNQ, TPD, N,N,N',N'-Tetranaphthalenylbenzidine (TNB), TCTA, N,N'-dioctyl-3,4,9,10-perylenedicarboximide (PTCDI-C8) and combination thereof.

The OLED 800 in accordance with the third embodiment of the present disclosure can improve its luminous efficiency and can enhance its luminous life time by applying the anthracene-based compound having the structure of Chemical Formulae 1 to 2 as the first host and the boron-based compound having the structure of Chemical Formulae 3 to 4 as the first dopant into the EML1 860 and the EML3 1060, the amine-based compound having the structure of Chemical Formulae 5 and 6 into the EBL1 855 and the EBL3 1055, optionally the azine-based compound having the structure of Chemical Formulae 7 to 8 and/or the benzimidazole-based compound having the structure of Chemical Formulae 9 to 10 into the HBL1 875 and the HBL3 1075, and applying red green or yellow green luminescent materials into the EML2 960. Particularly, the OLED 800 includes a triple stack structure laminating two emitting units 830 and 1030 emitting blue (B) color light and one emitting unit 930 emitting red green (RG) or yellow green (YG) color light so that the organic light emitting display device 600 (See, FIG. 5) can emit white light (W).

In FIG. 6, a tandem-structured OLED 800 laminating three emitting units are described. An OLED may consist of the first emitting unit 830, the first charge generation layer 890 and the second emitting unit 930 without the second charge generation layer 990 and the third emitting unit 1030 (See, FIG. 4). In this case, one of the first and second emitting units 830 and 930 may emit blue (B) color light and the other of the first and second emitting units 830 and 930 may emit red green (RG) or yellow green (YG) color light.

In addition, an organic light emitting device in accordance with the present disclosure may include a color conversion layer. FIG. 7 is a schematic cross-sectional view illustrating an organic light emitting display device in still another exemplary embodiment of the present disclosure.

As illustrated in FIG. 7, the organic light emitting display device 1100 comprises a first substrate 1102 that defines each of a red pixel RP, a green pixel GP and a blue pixel BP, a second substrate 1104 facing the first substrate 1102, a thin film transistor Tr over the first substrate 1102, an organic light emitting diode 1200 disposed between the first and second substrates 1102 and 1104 and emitting blue (B) light and a color conversion layer 1180 disposed between the organic light emitting diode 1200 and the second substrate 1104. Although not shown in FIG. 7, a color filter may be formed disposed between the second substrate 1104 and the respective color conversion layer 1180.

The thin film transistor Tr is disposed over the first substrate 1102 correspondingly to each of the red pixel RP, the green pixel GP and the blue pixel BP. A passivation layer 1160, which has a drain contact hole 1162 exposing one electrode, for example a drain electrode, constituting the thin film transistor Tr, is formed with covering the thin film transistor Tr over the whole first substrate 1102.

The organic light emitting diode (OLED) 1200, which includes a first electrode 1210, an emissive layer 1230 and the second electrode 1220, is disposed over the passivation layer 1160. The first electrode 1210 may be connected to the drain electrode of the thin film transistor Tr through the drain contact hole 1162. In addition, a bank layer 1164 covering edges of the first electrode 1210 is formed at the boundary between the red pixel RP, the green pixel GP and the blue pixel BP. In this case, the OLED 1200 may have a structure of FIG. 3 or FIG. 4 and can emit blue (B) color light. The OLED 1200 is disposed in each of the red pixel RP, the green pixel GP and the blue pixel BP to provide blue (B) color light.

The color conversion layer 1180 may include a first color conversion layer 1182 corresponding to the red pixel RP and a second color conversion layer 1184 corresponding to the green pixel GP. As an example, the color conversion layer 1180 may include an inorganic luminescent material such as quantum dot (QD).

The blue (B) color light emitted from the OLED 1200 in the red pixel RP is converted into red (R) color light by the first color conversion layer 1182 and the blue (B) color light emitted from the OLED 1200 in the green pixel GP is converted into green (G) color light by the second color conversion layer 1184. Accordingly, the organic light emitting display device 1100 can implement a color image.

In addition, when the light emitted from the OLED 1200 is displayed through the first substrate 1102, the color conversion layer 1180 may be disposed between the OLED 1200 and the first substrate 1102.

Synthesis Example 1: Synthesis of Host 1

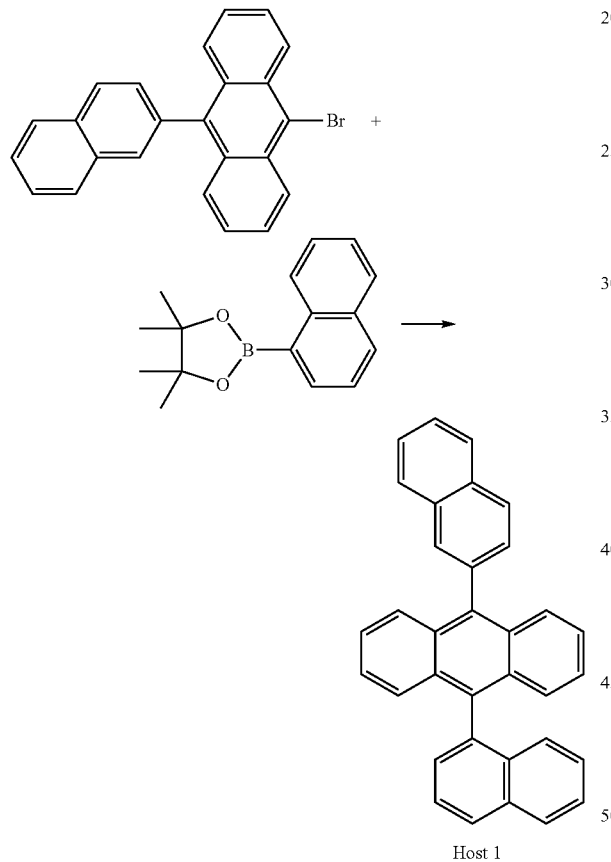

Host 1

2.00 g (5.23 mmol) of 10-bromo-9-(naphthalene-3-yl)-anthracene, 1.45 g (5.74 mmol) of 4,4,5,5-tetrametyl-2-(naphthlen-1-yl)-1,3,2-dioxaborolane, 0.24 g (0.26 mmol) of tris (dibenzylideneacetone) dipalladium (0) (Pd$_2$(dba)$_3$) and 50 mL of toluene 50 mL were added into 250 mL flask within a dry box. The reaction flask was removed from the dry box and then 20 mL of 2M sodium carbonate anhydride was added into the flaks. The reactants were stirred and heated at 90° C. overnight with monitoring the reaction by HPLC. The reaction flask was cooled down to room temperature and then an organic layer was separated from an aqueous layer. The aqueous layer was washed with dichloromethane (DCM) twice and the organic layer was concentrated with a rotary vaporizer to obtain a gray powder. The gray power was purified with alumina, precipitated with hexane and performed column chromatography using silica gel to give 2.00 g (yield: 89%) of white powder Host 1.

Synthesis Example 2: Synthesis of Host 2

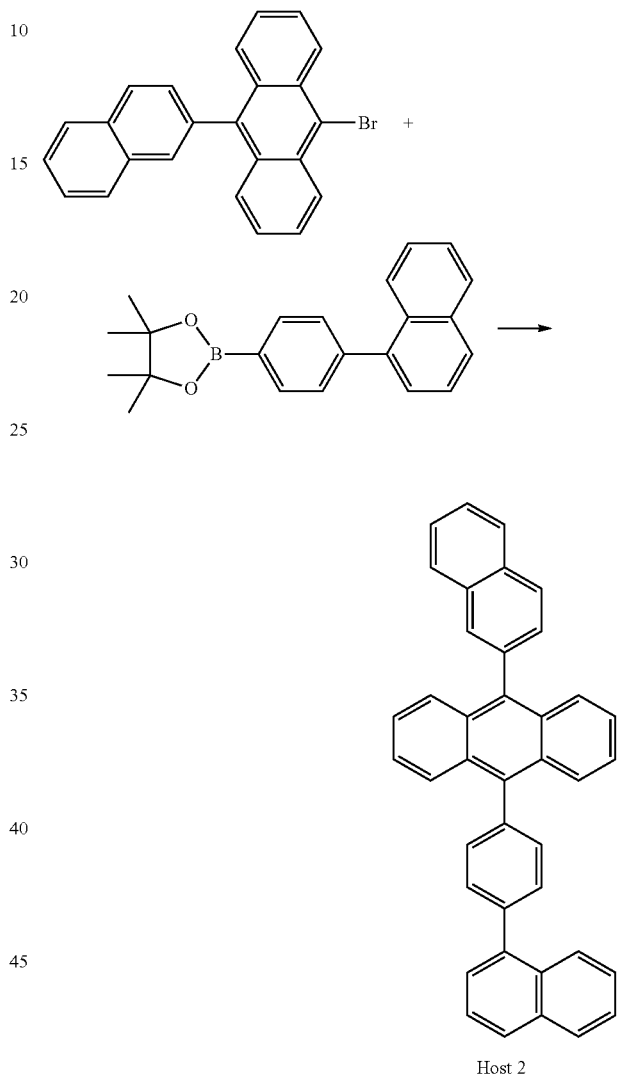

Host 2

2.00 g (5.23 mmol) of 10-bromo-9-(naphthalene-3-yl)-anthracene, 1.90 g (5.74 mmol) of 4,4,5,5-tetrametyl-2-(4-(naphthlen-4-yl)phenyl)-1,3,2-dioxaborolane, 0.24 g (0.26 mmol) Pd$_2$(dba)$_3$) and 50 mL of toluene were added into 250 mL flask within a dry box. The reaction flask was removed from the dry box and then 20 mL of 2M sodium carbonate anhydride was added into the flaks. The reactants were stirred and heated at 90° C. overnight with monitoring the reaction by HPLC. The reaction flask was cooled down to room temperature and then an organic layer was separated from an aqueous layer. The aqueous layer was washed with dichloromethane (DCM) twice and the organic layer was concentrated with a rotary vaporizer to obtain a gray powder. The gray power was purified with alumina, precipitated with hexane and performed column chromatography using silica gel to give 2.28 g (yield: 86%) of white powder Host 2.

Synthesis Example 3: Synthesis of Host 3

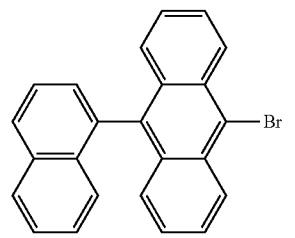

+

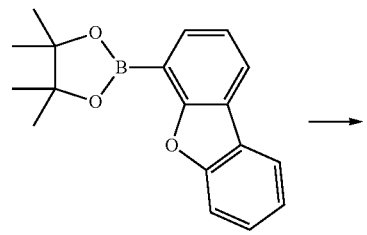

→

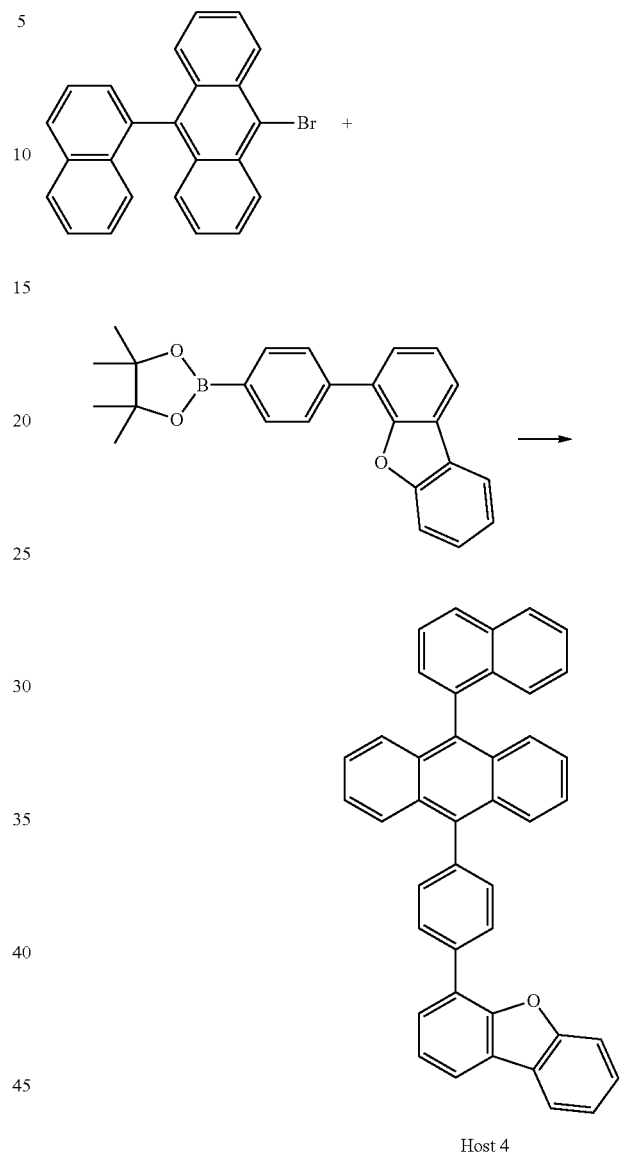

Host 3

2.00 g (5.23 mmol) of 10-bromo-9-(naphthalene-3-yl)-anthracene, 1.69 g (5.74 mmol) of 4,4,5,5-tetrametyl-2-(dibenzophen-1-yl)-1,3,2-dioxaborolane, 0.24 g (0.26 mmol) of tris (dibenzylideneacetone) dipalladium (0) (Pd$_2$(dba)$_3$) and 50 mL of toluene were added into 250 mL flask within a dry box. The reaction flask was removed from the dry box and then 20 mL of 2M sodium carbonate anhydride was added into the flaks. The reactants were stirred and heated at 90° C. overnight with monitoring the reaction by HPLC. The reaction flask was cooled down to a room temperature and then an organic layer was separated from an aqueous layer. The aqueous layer was washed with dichloromethane (DCM) twice and the organic layer was concentrated with a rotary vaporizer to obtain a gray powder. The gray power was purified with alumina, precipitated with hexane and performed column chromatography using silica gel to give 1.91 g (yield: 78%) of white powder Host 3.

Synthesis Example 4: Synthesis of Host 4

Host 4

2.00 g (5.23 mmol) of 10-bromo-9-(naphthalene-3-yl)-anthracene, 2.12 g (5.74 mmol) of 4,4,5,5-tetrametyl-2-(4-(dibenzophen-1-yl)phenyl)-1,3,2-dioxaborolane, 0.24 g (0.26 mmol) of tris (dibenzylideneacetone) dipalladium (0) (Pd$_2$(dba)$_3$) and 50 mL of toluene were added into 250 mL flask within a dry box. The reaction flask was removed from the dry box and then 20 mL of 2M sodium carbonate anhydride was added into the flaks. The reactants were stirred and heated at 90° C. overnight with monitoring the reaction by HPLC. The reaction flask was cooled down to room temperature and then an organic layer was separated from an aqueous layer. The aqueous layer was washed with dichloromethane (DCM) twice and the organic layer was concentrated with a rotary vaporizer to obtain a gray powder. The gray power was purified with alumina, precipitated with hexane and performed column chromatography using silica gel to give 2.34 g (yield: 82%) of white powder Host 4.

Synthesis Example 5: Synthesis of Dopant 56

(1) Synthesis of 3-nitro-N,N-diphenylanilin

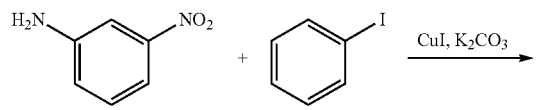

25.0 g of 3-nitroaniline, 81.0 g of iodobenzene, 3.5 g of copper (I) iodide, 100.0 g of potassium carbonate and 250 mL of o-dichlorobenzene were added into a flask under nitrogen atmosphere and then the flask was heated at reflux temperature with stirring for 14 hours. The reaction solution was cooled down to room temperature and then aqueous ammonia was added into the solution to obtain aliquots. The aliquots were purified with silica gel column chromatography using toluene:heptane=3:7 (volume ratio) as an eluent to give 44.0 g of 3-nitro-N,N-diphenylaniline.

(2) Synthesis of N1,N1-diphenylbenzene-1-3-diamine

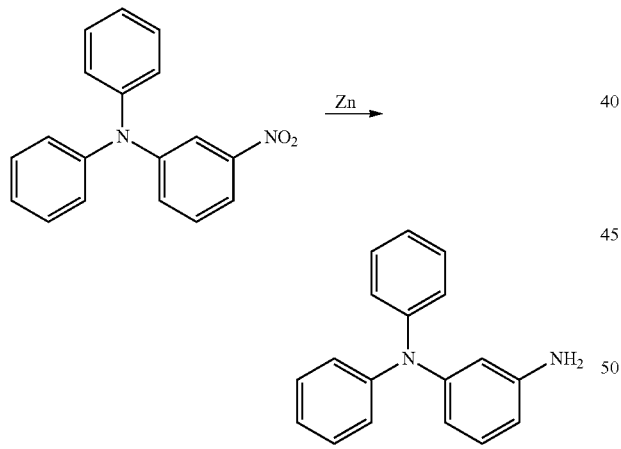

An acetic acid cooled at an ice-bath was added into a reaction vessel under nitrogen atmosphere. 44.0 g of 3-nitro-N,N-diphenyaniline was added in portions into the solvent such an extent that the reaction temperature did not rise significantly. After the addition was completed, the solution was stirred at room temperature for 30 minutes and then certified whether the starting material was lost or not. After the reaction was completed, a supernatant was collected by decantation, neutralized with sodium carbonate and then extracted with ethyl acetate. The extract was purified with silica gel column chromatography using toluene:heptane=9:1 (volume ratio) as an eluent. The solvent from the fraction containing the target substance was removed under reduced pressure and distillation, and then heptane was added thereto to re-precipitate the fraction to give 36.0 g of N1,N1-diphenylbenzene-1-3-diamine.

(3) Synthesis of N1,N1,N3-triphenylbenzene-1,3-diamine

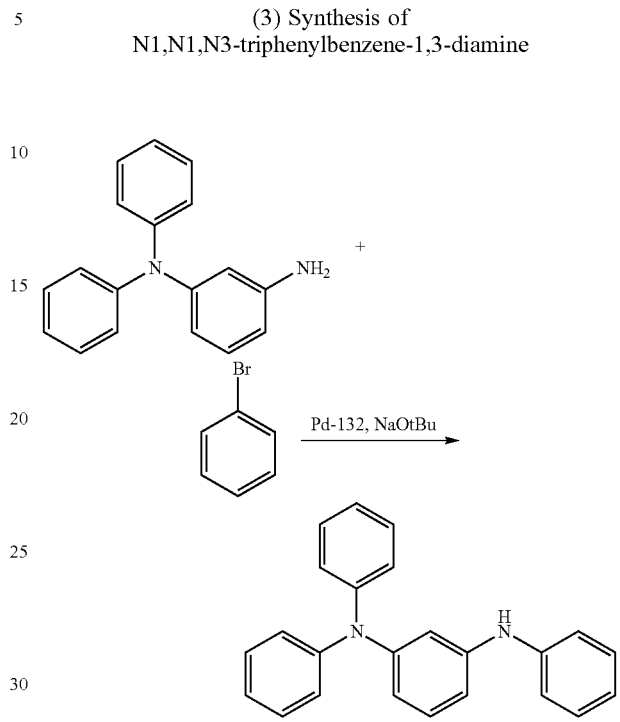

60.0 g of N1,N1-diphenylbenzene-1,3-diamine, 1.3 g of bis(di-tert-butyl(4-dimethylaminophenyl)phosphine)dichloropalladium (Pd-132), 33.5 g of sodium-tert0butoxide (NaOtBu) and 300 mL of xylene were added into a flask under nitrogen atmosphere and then the solution was heated at 120° C. with stirring. 36.2 g of bromobenzene dissolved in 50 mL of xylene was added dropwise to the solution and then heated for 1 hour with stirring again. After the reaction solution was cooled down to room temperature, water and ethyl acetate was added into the solution to obtain aliquots. The aliquots were purified with silica gel column chromatography using toluene:heptane=5:5 (volume ratio) as an eluent to give 73.0 g of N1,N1,N3-triphenylbenzene-1,3-diamine.

(4) Synthesis of N1,N1'-(2-chloro-1,3-phenylene)bis(N1,N1,N3-triphenybenzene-1,3-diamine

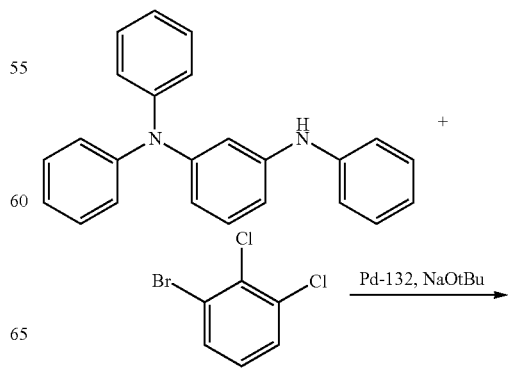

-continued

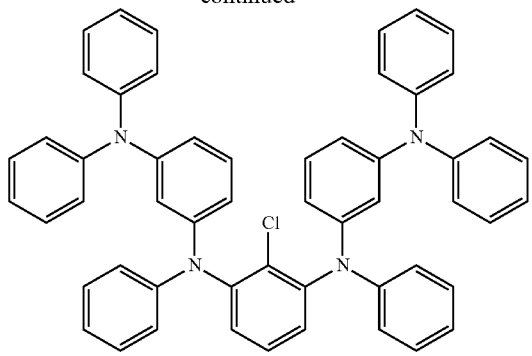

20.0 g of N1,N1,N3-triphenylbenzene-1,3-diamine, 6.4 g of 1-bromo-2,3-dichlorobenzene, 0.2 g of Pd-132, 6.8 g of NaOtBu and 70 mL of xylene were added into a flask under nitrogen atmosphere and then the solution was heated at 120° C. for 2 hours with stirring. After the reaction solution was cooled down to room temperature, water and ethyl acetate was added into the solution to obtain aliquots. The aliquots were purified with silica gel column chromatography using toluene:heptane=4:6 (volume ratio) as an eluent to give 15.0 g of N1,N1'-(2-chloro-1,3-phenylene)bis(N1,N1,N3-triphenylbenzene-1,3-diamine.

(5) Synthesis of Dopant 56

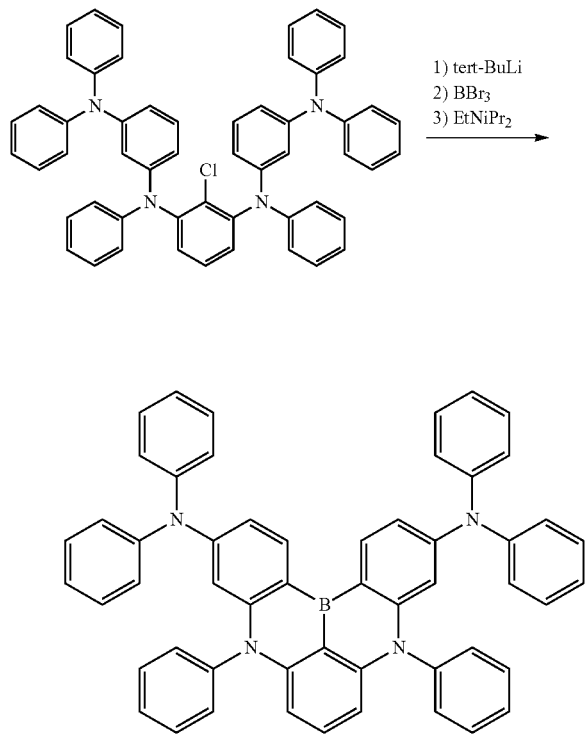 [SMILES: Clc1c(N(c2ccccc2)c2cccc(N(c3ccccc3)c3ccccc3)c2)cccc1N(c1ccccc1)c1cccc(N(c2ccccc2)c2ccccc2)c1 ; c1ccc(N(c2ccccc2)c2ccc3c(c2)N(c2ccccc2)c2cccc4c2B3c2ccc(N(c3ccccc3)c3ccccc3)cc2N4c2ccccc2)cc1]

12.0 g of N1,N1'-(2-chloro-1,3-phenylene)bis(N1,N1,N3-triphenylbenzene-1,3-diamine and 100 mL of tert-butyl benzene were added into a flask under nitrogen atmosphere, the solution was cooled on a ice bath and then 18.1 mL of 1.7 M tert-butyl lithium pentane was added dropwise to the solution. After the drop wise addition was completed, the solution was heated to 60° C. and stirred for 2 hours, and then components having a lower boiling point than that of tert-butyl benzene were distilled off under reduced pressure. The mixture was cooled down to −50° C., 2.9 mL of boron tribromide (BBr$_3$) was added to the mixture, the solution was raised to room temperature, and then stirred again for 30 minutes. The mixture was cooled again in an ice bath and 5.4 mL of N,N-diisopropylethylamine was added to the mixture. After stirring the reaction solution at room temperature until the exotherm was stopped, the reaction solution was raised to 120° C., and then was heated for 3 hours with stirring. The reaction solution was cooled down to room temperature, an aqueous solution of sodium acetate cooled in an ice bath and then ethyl acetate was added into the reaction solution, an insoluble solid was filtered out to obtain aliquots. The aliquots were purified with silica gel column chromatography using toluene:heptane=5:5 (volume ratio) as an eluent. The crude product was washed with heated heptane and ethyl acetate and was re-precipitated with a mixed solvent of toluene and ethyl acetate to give 2.0 g of Dopant 56.

Synthesis Example 6: Synthesis of Dopant 167

(1) Synthesis of 3,3"-((2-bromo-1,3-phenylene)bis(oxy))di-1,1'-biphenyl

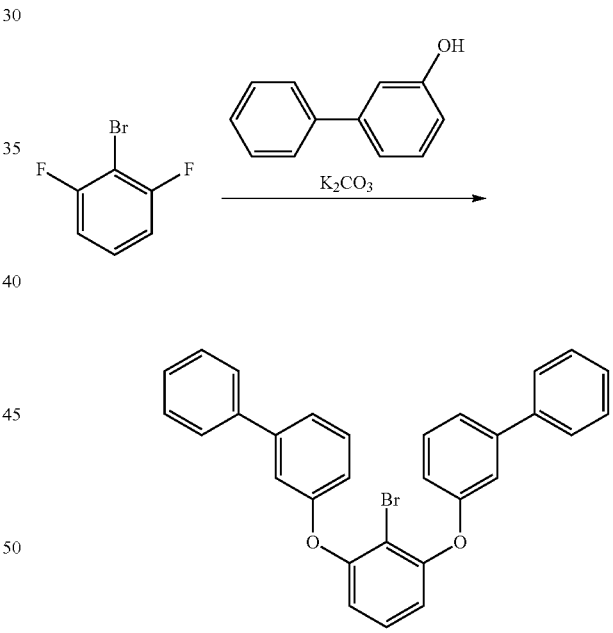

12.0 g of 2-bromo-1,3-difluorobenzene, 23.0 g of [1,1'-biphenyl]-3-ol, 34.0 g of potassium carbonate and 130 mL of N-methyl-2-pyrrolidone (NMP) were added into a flask under nitrogen atmosphere and then the solution was heated at 170° C. for 10 hours with stirring. After the reaction was stopped, the reaction solution was cooled down to room temperature, and water and toluene was added thereto to obtain aliquots. The solvent was distilled off under reduced pressure and the residue was purified with silica gel column chromatography using heptane:toluene=7:3 (volume ratio) as an eluent to give 26.8 g of 3.3"-((2-bromo-bis(oxy))di-1,1'-biphenyl.

(2) Synthesis of Dopant 167

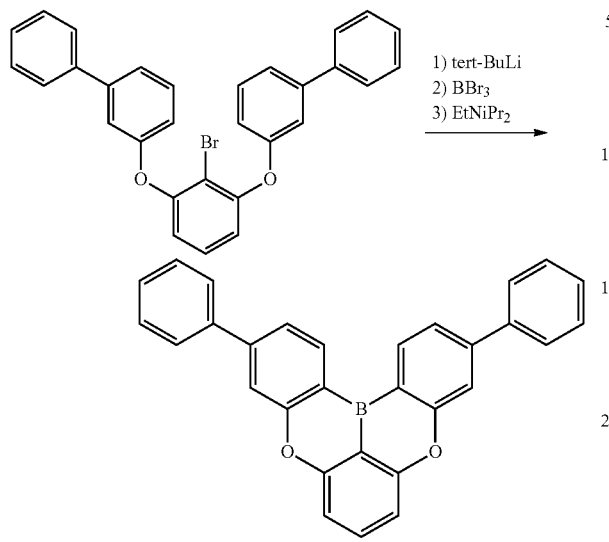

14.0 g of 3,3"-((2-bromo-1,3-phenylene)bis(oxy))di-1,1'-biphenyl and 140 mL of xylene were added into a flask under nitrogen atmosphere, the solution was cooled down to −40° C., and then 11.5 mL of 2.6 M n-butyl lithium hexane was added dropwise to the solution. After the drop wise addition was completed, the reaction solution was raised to room temperature, cooled down to −40° C., and 3.3 mL of boron tribromide was added thereto. The reaction mixture was heated to room temperature, stirred for 13 hours, cooled down to 0° C., 9.7 mL of N,N-diisopropylethylamine wad added, and the mixture was heated at 130° C. for 5 hours with stirring. The reaction solution was cooled down to room temperature, an aqueous solution of sodium acetate cooled in an ice bath was added and stirred, and a solid separated by suction filtration was collected. The obtained solid was washed with water, followed by methanol and then heptane and recrystallized with chlorobenzene to give 8.9 g of Dopant 167.

Example 1: Fabrication of Organic Light Emitting Diode (OLED)

An organic light emitting diode was fabricated applying Host 1 synthesized in the Synthesis Example 1 as a host into an emitting material layer (EML) and Dopant 56 synthesized in the Synthesis Example 5 as a dopant into the EML, H1 in Chemical Formula 6 into an electron blocking layer (EBL) and E1 in Chemical Formula 8 into a hole blocking layer (HBL). A glass substrate (40 mm×40 mm×40 mm) onto which ITO was coated as a thin film was washed and ultrasonically cleaned by solvent such as isopropyl alcohol, acetone and distilled water for 5 minutes and dried at 100° C. oven. After cleaning the substrate, the substrate was treated with $O_2$ plasma under vacuum for 2 minutes and then transferred to a vacuum chamber for depositing emission layer. Subsequently, an emission layer and a cathode were deposited by evaporation from a heating boat with setting the deposition ratio of 1 Å/s under $5\sim7\times10^{-7}$ Torr as the following order:

a hole injection layer (HIL) (N4,N4,N4',N4'-tetrakis([1,1'-biphenyl]-4-yl)-[1,1'-biphenyl]-4,4'-diamine doped with HAT-CN (3 wt %); thickness: 100 Å); a hole transport layer (HTL) (N4,N4,N4',N4'-tetrakis([1,1'-biphenyl]-4-yl)-[1,1'-biphenyl]-4,4'-diamine; thickness: 1000 Å), an EBL (H1 in Chemical Formula 6; thickness: 100 Å); an EML (Host 1 doped with Dopant 56 (2 wt %); thickness: 200 Å); a HBL (E1 in Chemical Formula 8; thickness: 100 Å); an electron injection layer (EIL) (1,3-bis(9-phenyl-1,10-phenanthroli-2-yl)benzene doped with Li (2 wt %); thickness: 200 Å); and a cathode (Al; thickness: 500 Å).

And then, cappling layer (CPL) was deposited over the cathode and the device was encapsualted by glass. After deposition of emissve layer and the cathode, the LED was transferred from the depostion chamber to a dry box for film formation, followed by encapsulation using UV-curable epoxy and moisture getter. The manufacture organic light emitting diode had an emision area of 9 mm².

Examples 2~3: Fabrication of OLEDs

An OLED was fabricated as the same process and the same materials as in Example 1, except that H2 in Chemical Formula 6 (Example 2) or H3 in Chemical Formula 6 (Example 3) was used as the material in the EBL in place of H1.

Example 4: Fabrication of OLED

An OLED was fabricated as the same process and the same materials as in Example 1, except that Host 2 synthesized in the Synthesis Example 2 was used as the host in the EML in place of Host 1.

Examples 5~6: Fabrication of OLEDs

An OLED was fabricated as the same process and the same materials as in Example 4, except that H2 in Chemical Formula 6 (Example 2) or H3 in Chemical Formula 6 (Example 3) was used as the material in the EBL in place of H1.

Comparative Examples 1~5: Fabrication of OLEDs

An OLED was fabricated as the same process and the same materials as in Example 1, except that pyrene-based host 1,3,6,8-tetraphenyl-pyrene was used as the host in the EML in place of Host 1, and NPB (Comparative Example 1, Ref. 1), tri-(biphenyl-4-yl)amine (Comparative Example 2, Ref. 2), H1 in Chemical Formula 6 (Comparative Example 3, Ref. 3), H2 in Chemical Formula 6 (Comparative Example 4, Ref. 4) or H3 in Chemical Formula 6 (Comparative Example 5, Ref. 5) was used as the material in the EBL.

Comparative Examples 6~7: Fabrication OLEDs

An OLED was fabricated as the same process and the same materials as in Example 1, except that NPB (Comparative Example 6, Ref. 6) or tri(biphenyl-4-yl)amine (Comparative Example 7, Ref. 7) was used as the material in the EBL in place of H1.

Comparative Examples 8~9: Fabrication of OLEDs

An OLED was fabricated as the same process and the same materials as in Example 4, except that NPB (Comparative Example 8, Ref. 8) or tri(biphenyl-4-yl)amine (Comparative Example 9, Ref. 9) was used as the material in the EBL in place of H1.

Experimental Example 1: Measurement of Luminous Properties of OLED

Each of the OLEDs fabricated in Examples 1 to 6 and Comparative Examples 1 to 9 was connected to an external power source and then luminous properties for all the diodes were evaluated using a constant current source (KEITHLEY) and a photometer PR650 at room temperature. In particular, driving voltage (V), current efficiency (Cd/A) and color coordinates at a current density of 10 mA/cm2 and time period (T95) at which the luminance was reduced to 95% at 3000 nit at 40° C. and at a current density of 22.5 mA/m2. The measurement results are indicated in the following Table 1.

TABLE 1

Luminous Properties of OLED

| Sample | V | cd/A | (CIEx, CIEy) | $T_{95}$ (h) |
|---|---|---|---|---|
| Ref. 1 | 4.07 | 3.20 | (0.1360, 0.0662) | 36 |
| Ref. 2 | 3.95 | 3.02 | (0.1362, 0.0668) | 26 |
| Ref. 3 | 4.09 | 3.11 | (0.1360, 0.0664) | 82 |
| Ref. 4 | 3.93 | 3.28 | (0.1356, 0.0678) | 89 |
| Ref. 5 | 3.96 | 3.26 | (0.1354, 0.0680) | 69 |
| Ref. 6 | 3.82 | 4.68 | (0.1390, 0.0611) | 42 |
| Ref. 7 | 3.70 | 4.50 | (0.1392, 0.0617) | 30 |
| Example 1 | 3.84 | 4.59 | (0.1390, 0.0614) | 214 |
| Example 2 | 3.68 | 4.76 | (0.1386, 0.0627) | 220 |
| Example 3 | 3.71 | 4.74 | (0.1384, 0.0629) | 195 |
| Ref. 8 | 3.77 | 4.70 | (0.1390, 0.0612) | 45 |
| Ref. 9 | 3.65 | 4.52 | (0.1392, 0.0618) | 32 |
| Example 4 | 3.79 | 4.61 | (0.1390, 0.0614) | 228 |
| Example 5 | 3.63 | 4.78 | (0.1386, 0.0628) | 236 |
| Example 6 | 3.66 | 4.76 | (0.1384, 0.0630) | 211 |

As indicated in Table 1, compared to the OLEDs using the pyrene-based host in the Ref. 1 to Ref. 5, the OLEDs using the anthracene-based host in the Examples 1 to 6 lowered their driving voltage up to 10.8%, enhanced their current efficiency up to 58.3% and their luminous life time up to 807.7%, and showed substantially identical color coordinates. Compared to the OLEDs using NPB or monocyclic aryl substituted amine-based material as the EBL material in the Ref. 6 to Ref. 9, the OLEDs using the amine-based material substituted with at least one fused hetero aryl ring as the EBL material in the Examples 1 to 6 enhanced their luminous life time up to 637.6% (compare Example 5 to Ref. 9) and showed the substantially identical driving voltage, current efficiency and color coordinates.

Example 7: Fabrication of OLED

An OLED was fabricated as the same process and the same materials as in Example 1, except that Host 3 synthesized in the Synthesis Example 3 was used as the host in the EML in place of Host 1.

Examples 8~9: Fabrication of OLEDs

An OLED was fabricated as the same process and the same materials as in Example 7, except that H2 in Chemical Formula 6 (Example 8) or H3 in Chemical Formula 6 (Example 9) was used as the material in the EBL in place of H1.

Comparative Examples 10~11: Fabrication OLEDs

An OLED was fabricated as the same process and the same materials as in Example 7, except that NPB (Comparative Example 10, Ref. 10) or tri(biphenyl-4-yl)amine (Comparative Example 11, Ref. 11) was used as the material in the EBL in place of H1.

Example 10: Fabrication of OLED

An OLED was fabricated as the same process and the same materials as in Example 1, except that Host 4 synthesized in the Synthesis Example 4 was used as the host in the EML in place of Host 1.

Examples 11~12: Fabrication of OLEDs

An OLED was fabricated as the same process and the same materials as in Example 10, except that H2 in Chemical Formula 6 (Example 11) or H3 in Chemical Formula 6 (Example 12) was used as the material in the EBL in place of H1.

Comparative Examples 12~13: Fabrication OLEDs

An OLED was fabricated as the same process and the same materials as in Example 10, except that NPB (Comparative Example 12, Ref. 12) or tri(biphenyl-4-yl)amine (Comparative Example 13, Ref. 13) was used as the material in the EBL in place of H1.

Experimental Example 2: Measurement of Luminous Properties of OLED

Luminous properties for each of the OLEDs fabricated in Examples 7 to 12 and Comparative Examples 10 to 13 was evaluated as the same process as Experimental Example 1. The measurement results are indicated in the following Table 2:

TABLE 2

Luminous Properties of OLED

| Sample | V | cd/A | (CIEx, CIEy) | $T_{95}$ (h) |
|---|---|---|---|---|
| Ref. 10 | 4.01 | 4.55 | (0.1389, 0.0610) | 39 |
| Ref. 11 | 3.88 | 4.38 | (0.1391, 0.0611) | 28 |
| Example 7 | 4.05 | 4.46 | (0.1389, 0.0613) | 206 |
| Example 8 | 3.86 | 4.62 | (0.1387, 0.0622) | 214 |
| Example 9 | 3.89 | 4.61 | (0.1384, 0.0625) | 185 |
| Ref. 12 | 3.94 | 4.62 | (0.1389, 0.0609) | 41 |
| Ref. 13 | 3.81 | 4.44 | (0.1391, 0.0610) | 29 |
| Example 10 | 3.96 | 4.53 | (0.1388, 0.0614) | 228 |
| Example 11 | 3.79 | 4.70 | (0.1388, 0.0620) | 216 |
| Example 12 | 3.83 | 4.68 | (0.1383, 0.0624) | 192 |

As indicated in Table 2, compared to the OLEDs using NPB or monocyclic aryl substituted amine-based material as the EBL material in the Ref. 10 to Ref. 13, the OLEDs using the amine-based material substituted with at least one fused hetero aryl ring as the EBL material in the Examples 7 to 12 enhanced their luminous life time up to 644.8% (compare Example 11 to Ref. 13) and showed the substantially identical driving voltage, current efficiency and color coordinates.

Example 13: Fabrication of OLED

An OLED was fabricated as the same process and the same materials as in Example 1, except that Dopant 167 synthesized in the Synthesis Example 6 was used as the dopant in the EML in place of Dopant 56.

Examples 14~15: Fabrication of OLEDs

An OLED was fabricated as the same process and the same materials as in Example 13, except that H2 in Chemical Formula 6 (Example 14) or H3 in Chemical Formula 6 (Example 15) was used as the material in the EBL in place of H1.

Example 16: Fabrication of OLED

An OLED was fabricated as the same process and the same materials as in Example 13, except that Host 2 synthesized in the Synthesis Example 2 was used as the host in the EML in place of Host 1.

Examples 17~18: Fabrication of OLEDs

An OLED was fabricated as the same process and the same materials as in Example 16, except that H2 in Chemical Formula 6 (Example 17) or H3 in Chemical Formula 6 (Example 18) was used as the material in the EBL in place of H1.

Comparative Examples 14~18: Fabrication OLEDs

An OLED was fabricated as the same process and the same materials as in Example 13, except that pyrene-based host 1,3,6,8-tetraphenyl-pyrene was used as the host in the EML in place of Host 1, and NPB (Comparative Example 14, Ref. 14), tri-(biphenyl-4-yl)amine (Comparative Example 15, Ref. 15), H1 in Chemical Formula 6 (Comparative Example 16, Ref. 16), H2 in Chemical Formula 6 (Comparative Example 17, Ref. 17) or H3 in Chemical Formula 6 (Comparative Example 18, Ref. 18) was used as the material in the EBL.

Comparative Examples 19~20: Fabrication OLEDs

An OLED was fabricated as the same process and the same materials as in Example 13, except that NPB (Comparative Example 19, Ref. 19) or tri(biphenyl-4-yl)amine (Comparative Example 20, Ref. 20) was used as the material in the EBL in place of H1.

Comparative Examples 21~22: Fabrication of OLEDs

An OLED was fabricated as the same process and the same materials as in Example 16, except that NPB (Comparative Example 21, Ref. 21) or tri(biphenyl-4-yl)amine (Comparative Example 22, Ref. 22) was used as the material in the EBL in place of H1.

Experimental Example 3: Measurement of Luminous Properties of OLED

Luminous properties for each of the OLEDs fabricated in Examples 13 to 18 and Comparative Examples 14 to 22 were evaluated as the same process as Experimental Example 1. The measurement results are indicated in the following Table 3:

TABLE 3

| Luminous Properties of OLED | | | | |
| --- | --- | --- | --- | --- |
| Sample | V | cd/A | (CIEx, CIEy) | $T_{95}$ (h) |
| Ref. 14 | 4.22 | 3.40 | (0.1348, 0.1262) | 33 |
| Ref. 15 | 4.10 | 3.22 | (0.1350, 0.1268) | 23 |
| Ref. 16 | 4.24 | 3.31 | (0.1348, 0.1264) | 68 |
| Ref. 17 | 4.08 | 3.48 | (0.1344, 0.1278) | 76 |
| Ref. 18 | 4.11 | 3.46 | (0.1342, 0.1280) | 55 |
| Ref. 19 | 3.97 | 4.88 | (0.1378, 0.1211) | 39 |
| Ref. 20 | 3.85 | 4.70 | (0.1380, 0.1217) | 27 |
| Example 13 | 3.99 | 4.79 | (0.1378, 0.1214) | 198 |
| Example 14 | 3.83 | 4.96 | (0.1374, 0.1227) | 202 |
| Example 15 | 3.86 | 4.94 | (0.1372, 0.1229) | 178 |
| Ref. 21 | 3.92 | 4.90 | (0.1378, 0.1212) | 41 |
| Ref. 22 | 3.80 | 4.72 | (0.1380, 0.1218) | 29 |
| Example 16 | 3.94 | 4.81 | (0.1378, 0.1214) | 210 |
| Example 17 | 3.78 | 4.98 | (0.1374, 0.1228) | 220 |
| Example 18 | 3.81 | 4.96 | (0.1372, 0.1230) | 194 |

As indicated in Table 3, compared to the OLEDs using the pyrene-based host in the Ref. 14 to Ref. 18, the OLEDs using the anthracene-based host in the Examples 13 to 18 lowered their driving voltage up to 10.8%, enhanced their current efficiency up to 54.7% and their luminous life time up to 856.5%, and showed substantially identical color coordinates. Compared to the OLEDs using NPB or monocyclic aryl substituted amine-based material as the EBL material in the Ref. 19 to Ref. 22, the OLEDs using the aryl amine-based material substituted with at least one fused hetero aryl ring as the EBL material in the Examples 14 to 18 enhanced their luminous life time up to 658.6% (compare Example 17 to Ref. 22) and showed the substantially identical driving voltage, current efficiency and color coordinates.

Example 19: Fabrication of OLED

An OLED was fabricated as the same process and the same materials as in Example 13, except that Host 3 synthesized in the Synthesis Example 3 was used as the host in the EML in place of Host 1.

Examples 20~21: Fabrication of OLEDs

An OLED was fabricated as the same process and the same materials as in Example 19, except that H2 in Chemical Formula 6 (Example 20) or H3 in Chemical Formula 6 (Example 21) was used as the material in the EBL in place of H1.

Comparative Examples 23~24: Fabrication OLEDs

An OLED was fabricated as the same process and the same materials as in Example 19, except that NPB (Comparative Example 23, Ref. 23) or tri(biphenyl-4-yl)amine (Comparative Example 23, Ref. 23) was used as the material in the EBL in place of H1.

Example 22: Fabrication of OLED

An OLED was fabricated as the same process and the same materials as in Example 13, except that Host 4 synthesized in the Synthesis Example 4 was used as the host in the EML in place of Host 1.

Examples 23~24: Fabrication of OLEDs

An OLED was fabricated as the same process and the same materials as in Example 22, except that H2 in Chemical Formula 6 (Example 23) or H3 in Chemical Formula 6 (Example 24) was used as the material in the EBL in place of H1.

Comparative Examples 25~26: Fabrication OLEDs

An OLED was fabricated as the same process and the same materials as in Example 22, except that NPB (Comparative Example 25, Ref. 25) or tri(biphenyl-4-yl)amine (Comparative Example 26, Ref. 26) was used as the material in the EBL in place of H1.

Experimental Example 4: Measurement of Luminous Properties of OLED

Luminous properties for each of the OLEDs fabricated in Examples 19 to 24 and Comparative Examples 23 to 26 were evaluated as the same process as Experimental Example 1. The measurement results are indicated in the following Table 4:

TABLE 4

Luminous Properties of OLED

| Sample | V | cd/A | (CIEx, CIEy) | $T_{95}$ (h) |
|---|---|---|---|---|
| Ref. 23 | 4.16 | 4.75 | (0.1377, 0.1210) | 36 |
| Ref. 24 | 4.03 | 4.58 | (0.1379, 0.1211) | 26 |
| Example 19 | 4.20 | 4.66 | (0.1377, 0.1213) | 191 |
| Example 20 | 4.01 | 4.82 | (0.1375, 0.1222) | 197 |
| Example 21 | 4.04 | 4.81 | (0.1372, 0.1225) | 170 |
| Ref. 25 | 4.09 | 4.82 | (0.1377, 0.1209) | 38 |
| Ref. 26 | 3.96 | 4.64 | (0.1379, 0.1210) | 27 |
| Example 22 | 4.11 | 4.73 | (0.1376, 0.1213) | 192 |
| Example 23 | 3.94 | 4.90 | (0.1376, 0.1220) | 199 |
| Example 24 | 3.98 | 4.88 | (0.1371, 0.1224) | 177 |

As indicated in Table 4, compared to the OLEDs using NPB or monocyclic aryl substituted amine-based material as the EBL material in the Ref. 23 to Ref. 26, the OLEDs using the amine-based material substituted with at least one hetero aryl ring as the EBL material in the Examples 19 to 24 enhanced their luminous life time up to 657.7.5% (compare Example 20 to Ref. 24) and showed the substantially identical driving voltage, current efficiency and color coordinates.

Example 25: Fabrication of OLED

An OLED was fabricated as the same process and the same materials as in Example 1, except that F1 in Chemical Formula 10 was used as the HBL material in place of E1 in Chemical Formula 8.

Example 26: Fabrication of OLED

An OLED was fabricated as the same process and the same materials as in Example 25, except that H3 in Chemical Formula 6 was used as the EBL material in place of H1 in Chemical Formula 6.

Comparative Examples 27: Fabrication of OLED

An OLED was fabricated as the same process and the same materials as in Example 25, except that tri(biphenyl-4-yl)amine (Ref. 27) was used as the EBL material in place of H1 in Chemical Formula 6.

Example 27: Fabrication of OLED

An OLED was fabricated as the same process and the same materials as in Example 25, except that Host 2 synthesized in the Synthesis Example 2 was used as the host in the EML in place of Host 1.

Example 28: Fabrication of OLED

An OLED was fabricated as the same process and the same materials as in Example 27, except that H2 in Chemical Formula 6 was used as the EBL material in place of H1 in Chemical Formula 6.

Comparative Examples 28: Fabrication of OLED

An OLED was fabricated as the same process and the same materials as in Example 27, except that tri(biphenyl-4-yl)amine (Ref. 28) was used as the EBL material in place of H1 in Chemical Formula 6.

Example 29: Fabrication of OLED

An OLED was fabricated as the same process and the same materials as in Example 25, except that Dopant 167 synthesized in the Synthesis Example 6 was used as the dopant in the EML in place of Dopant 56.

Example 30: Fabrication of OLED

An OLED was fabricated as the same process and the same materials as in Example 29, except that H2 in Chemical Formula 6 was used as the EBL material in place of H1 in Chemical Formula 6.

Comparative Examples 29: Fabrication of OLED

An OLED was fabricated as the same process and the same materials as in Example 29, except that tri(biphenyl-4-yl)amine (Ref. 29) was used as the EBL material in place of H1 in Chemical Formula 6.

Example 3 1: Fabrication of OLED

An OLED was fabricated as the same process and the same materials as in Example 29, except that Host 2 synthesized in the Synthesis Example 2 was used as the host in the EML in place of Host 1.

Example 32: Fabrication of OLED

An OLED was fabricated as the same process and the same materials as in Example 31, except that H2 in Chemical Formula 6 was used as the EBL material in place of H1 in Chemical Formula 6.

Comparative Examples 30: Fabrication of OLED

An OLED was fabricated as the same process and the same materials as in Example 31, except that tri(biphenyl-4-yl)amine (Ref. 30) was used as the EBL material in place of H1 in Chemical Formula 6.

Experimental Example 5: Measurement of Luminous Properties of OLED

Luminous properties for each of the OLEDs fabricated in Examples 25 to 32 and Comparative Examples 27 to 30 were evaluated as the same process as Experimental Example 1. The measurement results are indicated in the following Table 5:

TABLE 5

Luminous Properties of OLED

| Sample | V | cd/A | (CIEx, CIEy) | $T_{95}$ (h) |
|---|---|---|---|---|
| Ref. 27 | 3.52 | 4.98 | (0.1420, 0.0561) | 19 |
| Example 25 | 3.54 | 4.89 | (0.1420, 0.0564) | 96 |
| Example 26 | 3.38 | 5.06 | (0.1416, 0.0577) | 99 |
| Ref. 28 | 3.47 | 5.00 | (0.1420, 0.0562) | 20 |
| Example 27 | 3.49 | 4.91 | (0.1420, 0.0564) | 103 |
| Example 28 | 3.33 | 5.08 | (0.1416, 0.0578) | 106 |
| Ref. 29 | 3.67 | 5.18 | (0.1408, 0.1161) | 18 |
| Example 29 | 3.68 | 5.09 | (0.1408, 0.1164) | 89 |
| Example 30 | 3.53 | 5.26 | (0.1404, 0.1117) | 91 |
| Ref. 30 | 3.62 | 5.20 | (0.1408, 0.1162) | 18 |
| Example 31 | 3.64 | 5.11 | (0.1408, 0.1164) | 95 |
| Example 32 | 3.48 | 5.28 | (0.1404, 0.1178) | 99 |

As indicated in Table 5, compared to the OLEDs using monocyclic aryl substituted amine-based material as the EBL material in the Ref. 27 to Ref. 30, the OLEDs using the amine-based material substituted with at least one fused hetero aryl ring as the EBL material in the Examples 25 to 32 lowered slightly their driving voltage, increased their current efficiency slightly, showed the substantially identical color coordinates and enhanced their luminous lift time up to 4.5 times (compare Example 32 to Ref. 30).

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents.

The various embodiments described above can be combined to provide further embodiments. All of patents, patent application publications, patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. An organic light emitting diode, comprising:
a first electrode;
a second electrode facing the first electrode; and
a first emitting unit including a first emitting material layer disposed between the first and second electrodes and a first electron blocking layer disposed between the first electrode and the first emitting material layer,
wherein the first emitting material layer includes a host having the following structure of Chemical Formula 1 and a dopant having the following structure of Chemical Formula 3, and the first electron blocking layer includes an amine-based compound having the following structure of Chemical Formula 5:

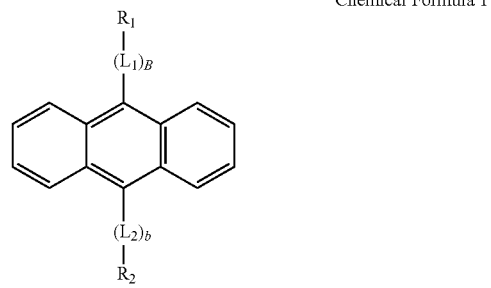

Chemical Formula 1 wherein each of $R_1$ and $R_2$ is independently a $C_6\sim C_{30}$ aryl group or a $C_5\sim C_{30}$ hetero aryl group; each of $L_1$ and $L_2$ is independently a $C_6\sim C_{30}$ arylene group; and each of a and b is an integer of 0 (zero) or 1,
with the proviso that the host having the structure of Chemical Formula 1 is not the following:

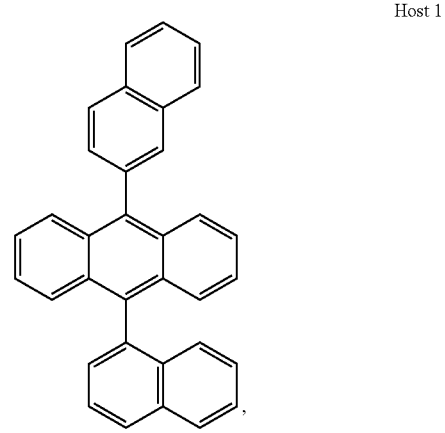

Host 1

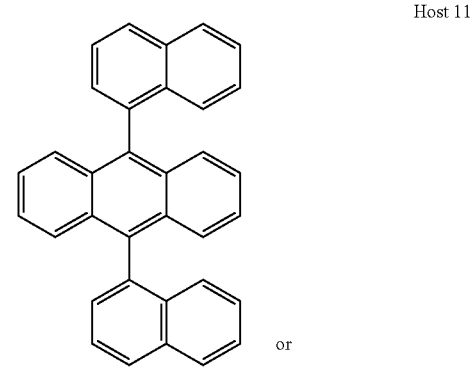

Host 11 or

Host 12

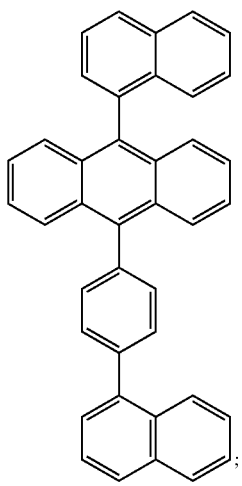

Dopant 36

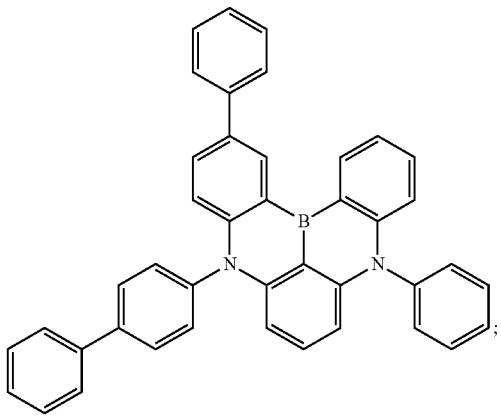

Chemical Formula 3

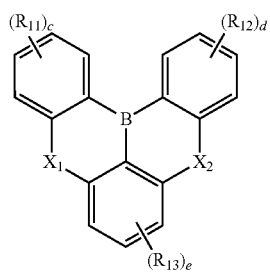

wherein each of $R_{11}$ and $R_{12}$ is independently a $C_1$~$C_{20}$ alkyl group, a $C_6$~$C_{30}$ aryl group, a $C_5$~$C_{30}$ hetero aryl group or a $C_6$~$C_{30}$ aryl amino group, or two adjacent groups among $R_{11}$ or two adjacent groups among $R_{12}$ form a fused aromatic or hetero aromatic ring; each of c and d is independently an integer of 0 (zero) to 4; $R_{13}$ is a $C_1$~$C_{10}$ alkyl group, a $C_6$~$C_{30}$ aryl group, a $C_5$~$C_{30}$ hetero aryl group or a $C_5$~$C_{30}$ aromatic amino group; e is an integer of 0 (zero) to 3; each of $X_1$ and $X_2$ is independently oxygen (O) or $NR_{14}$, wherein $R_{14}$ is a $C_6$~$C_{30}$ aryl group, with the proviso that the dopant having the structure of Chemical Formula 3 is not the following:

Dopant 1

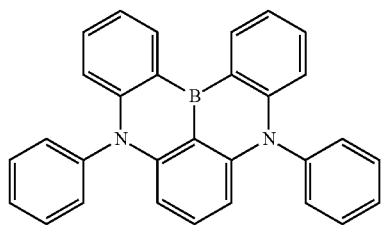

or

Chemical Formula 5

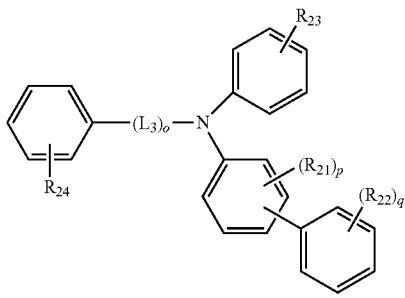

wherein $L_3$ is a $C_6$~$C_{30}$ arylene group; each of $R_{21}$ and $R_{22}$ is independently hydrogen or two adjacent groups among $R_{21}$ or $R_{22}$ form a fused aromatic ring; $R_{23}$ is hydrogen or a $C_6$~$C_{30}$ aryl group; $R_{24}$ is a $C_5$~$C_{30}$ hetero aryl group; o is 0 (zero) or 1; p is a number of a substituent and is an integer of 0 (zero) to 4; and q is a number of a substituent and is n integer of 0 (zero) to 4, with the proviso that the amine-based compound having the structure of Chemical Formula 5 is not the following:

H2

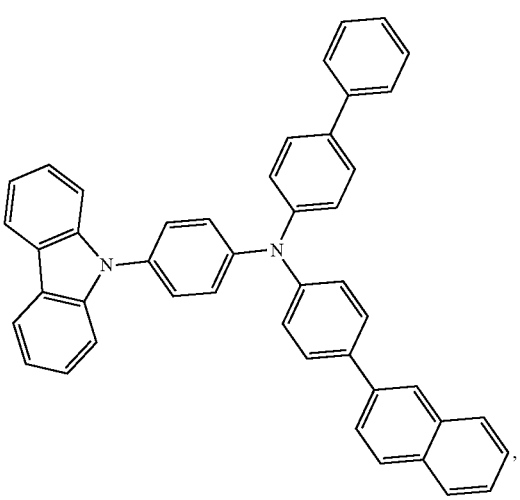

H5
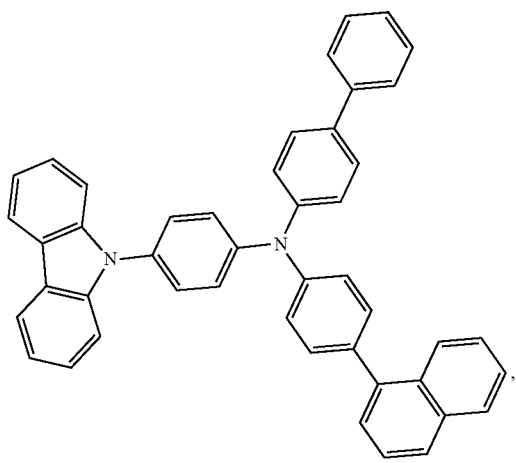
Host 2
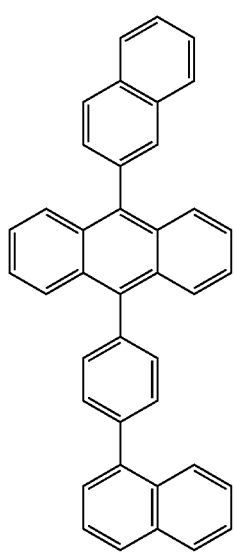
H7
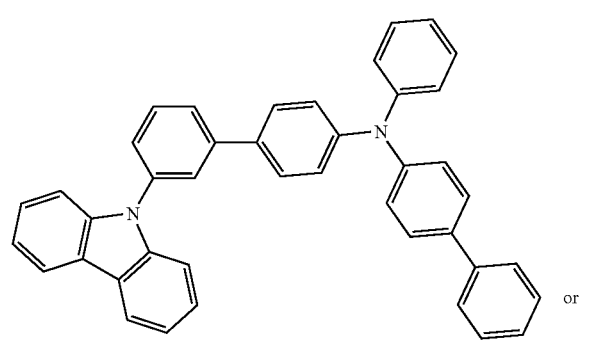
or
Host 3
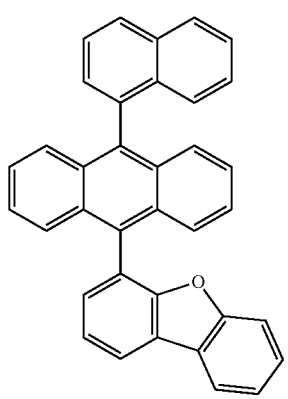
H8
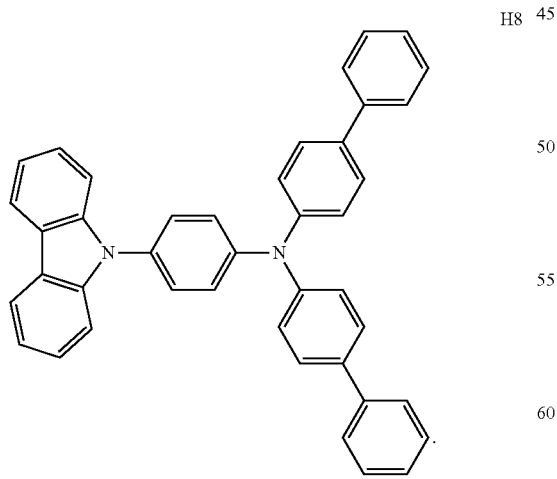
Host 4
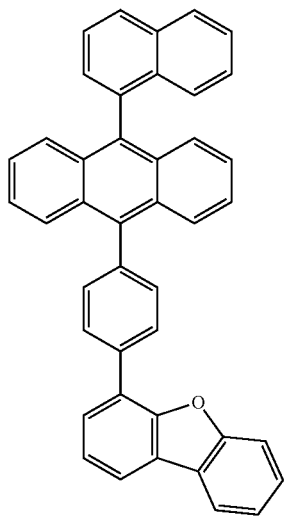
2. The organic light emitting diode of claim 1, wherein the host comprises an organic compound selected from the following compounds:

Host 5
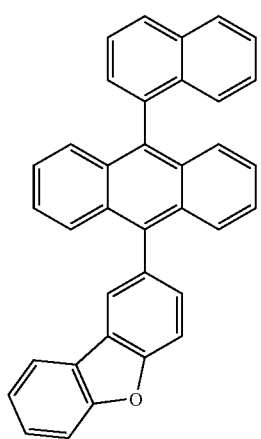
Host 6
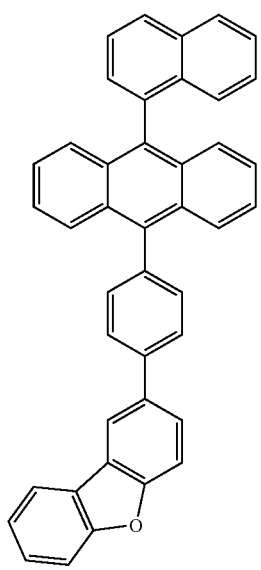
Host 7
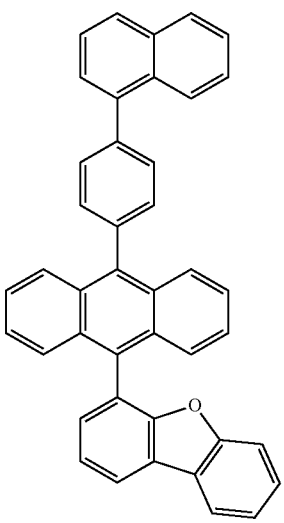
Host 8
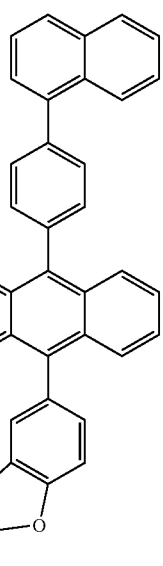
Host 9
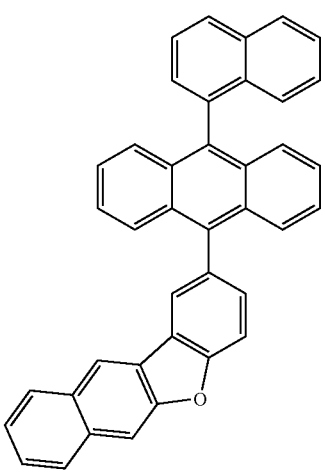
Host 10
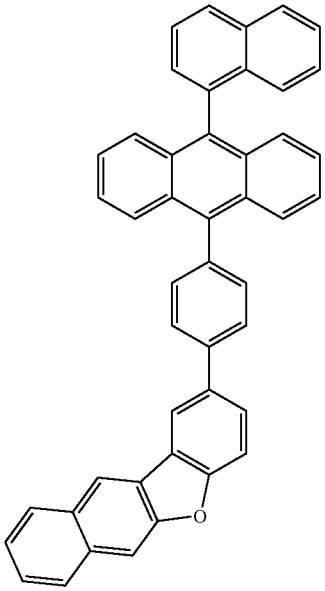

Host 13
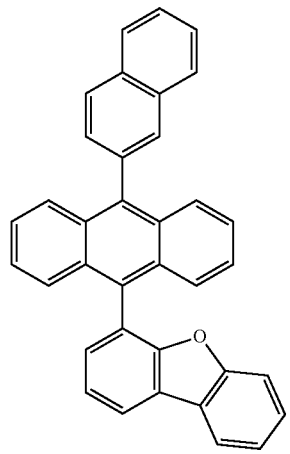
Host 14
Host 15
Host 16
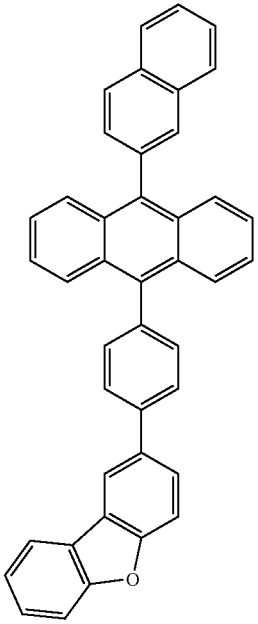
Host 17
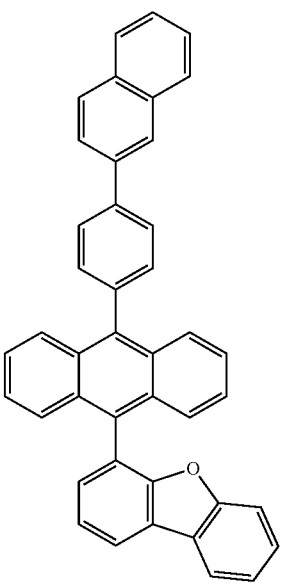

Host 18
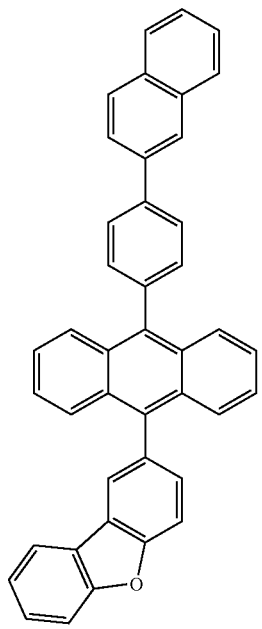
Host 19
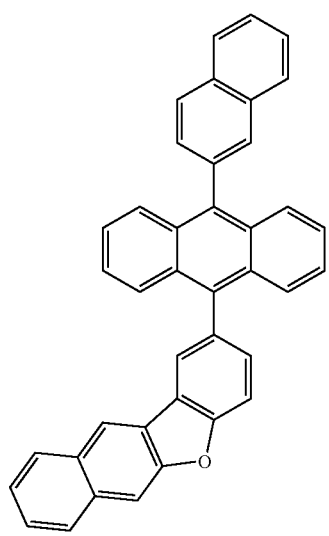
Host 20
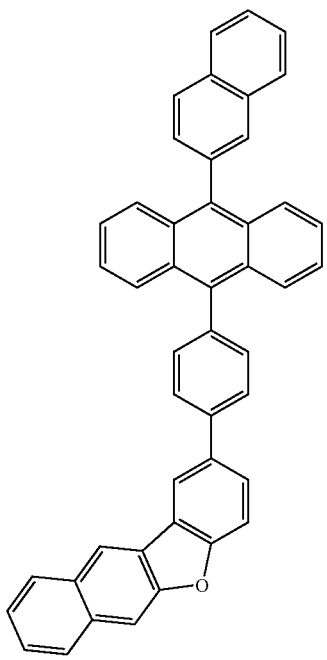
Host 21
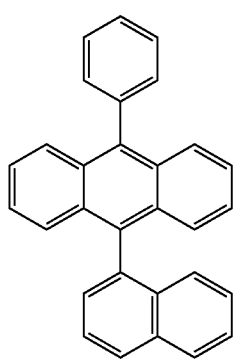
Host 22
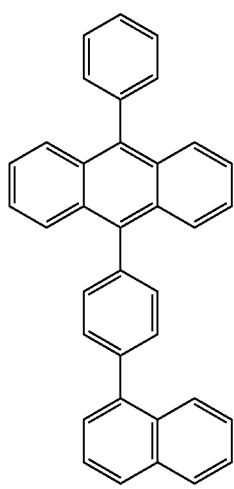

Host 23
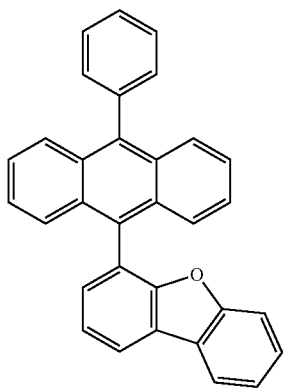
Host 24
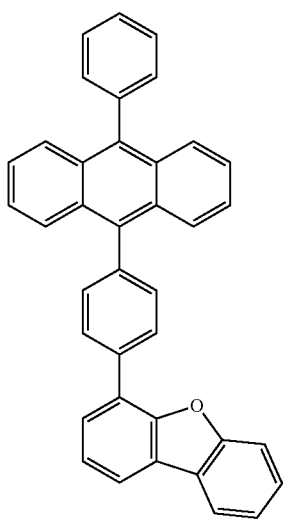
Host 25
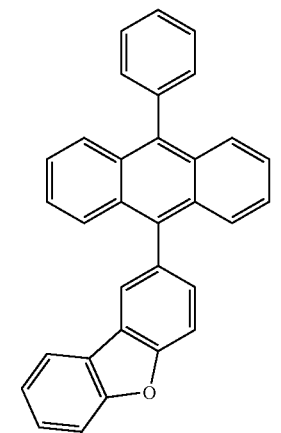
Host 26
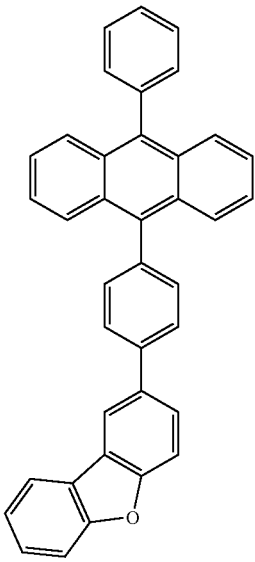
Host 27
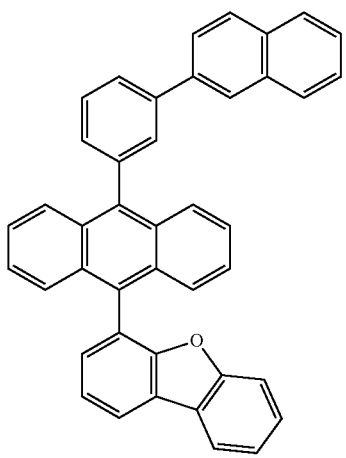
Host 28
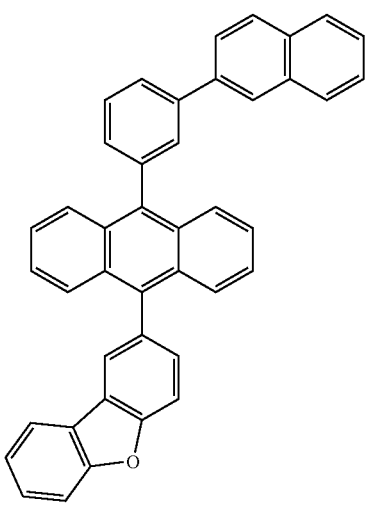

Host 29
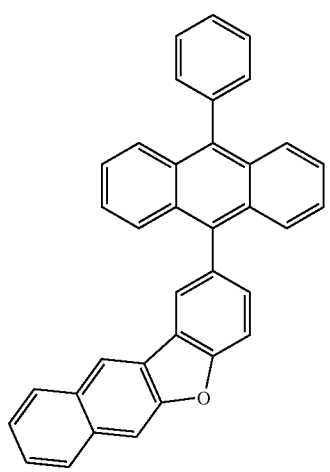
Host 30
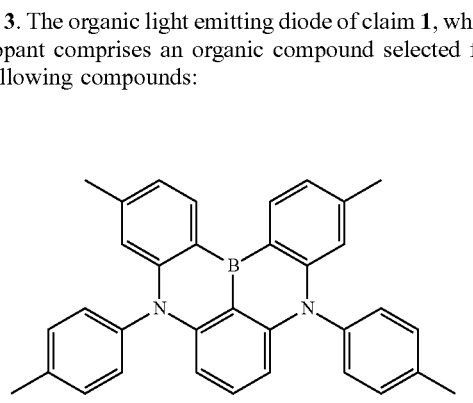
3. The organic light emitting diode of claim 1, wherein the dopant comprises an organic compound selected from the following compounds:
Dopant 2
Dopant 3
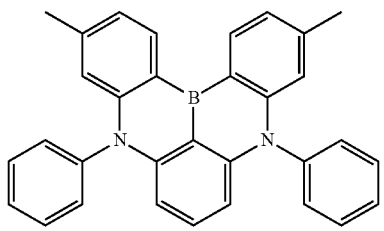
Dopant 4
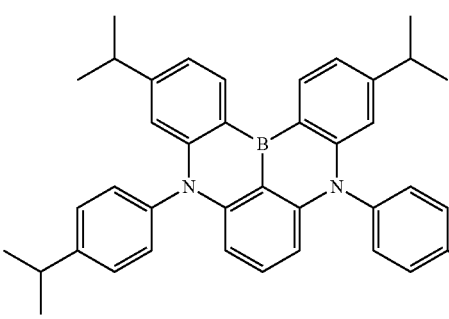
Dopant 5
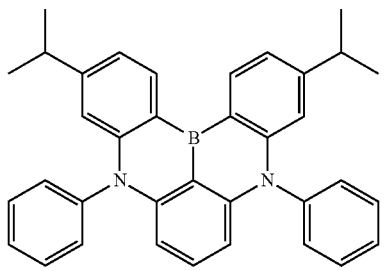
Dopant 6
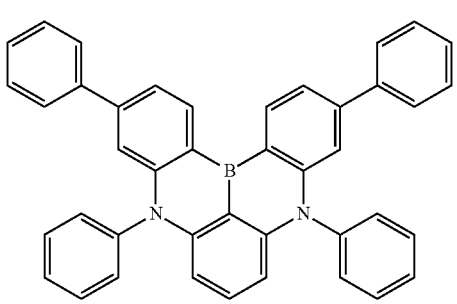
Dopant 7

Dopant 8
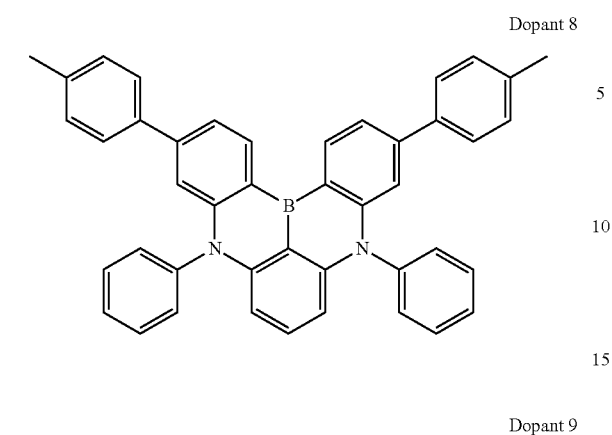
Dopant 9
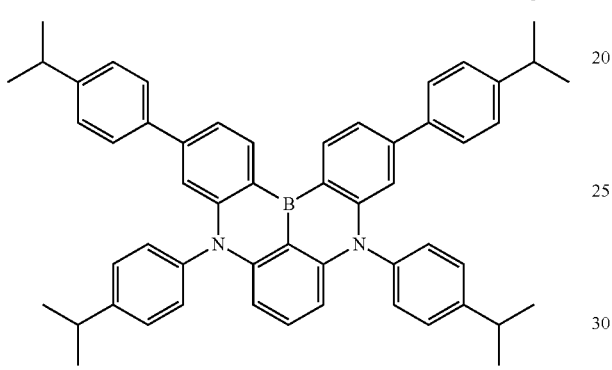
Dopant 10
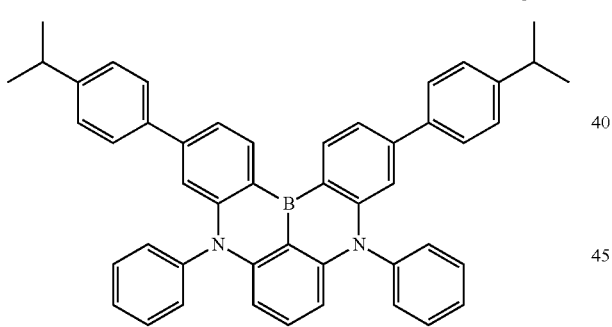
Dopant 11
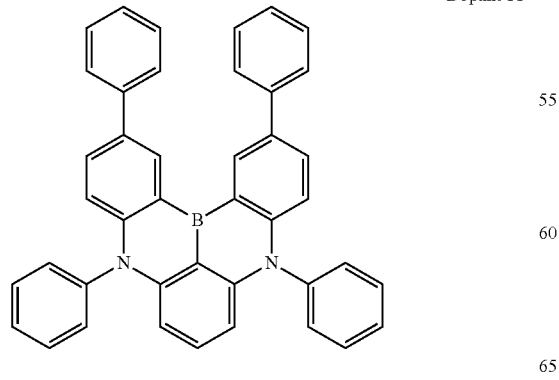
Dopant 12
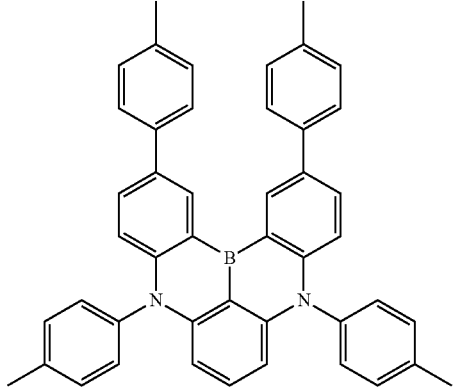
Dopant 13
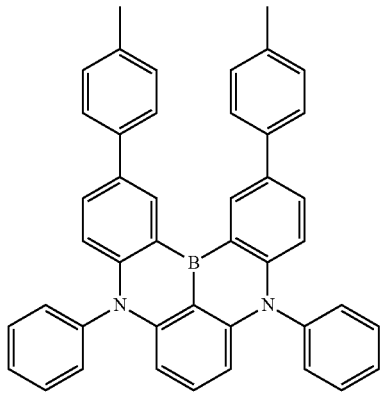
Dopant 14
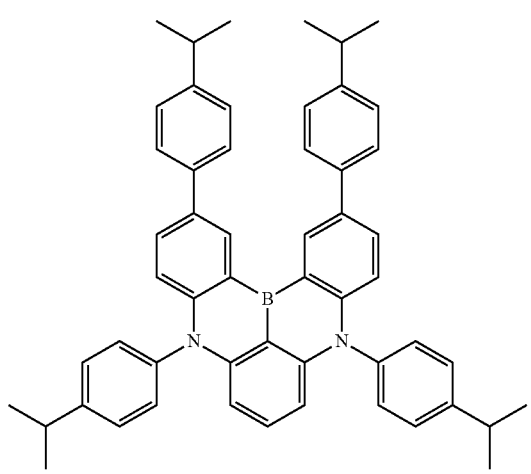

Dopant 15
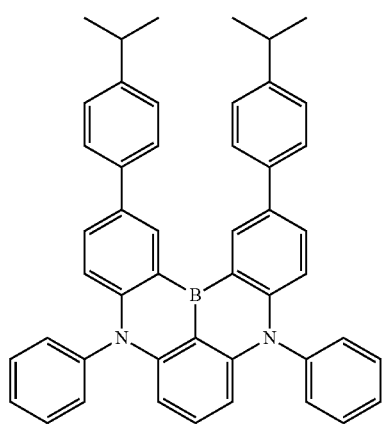
Dopant 19
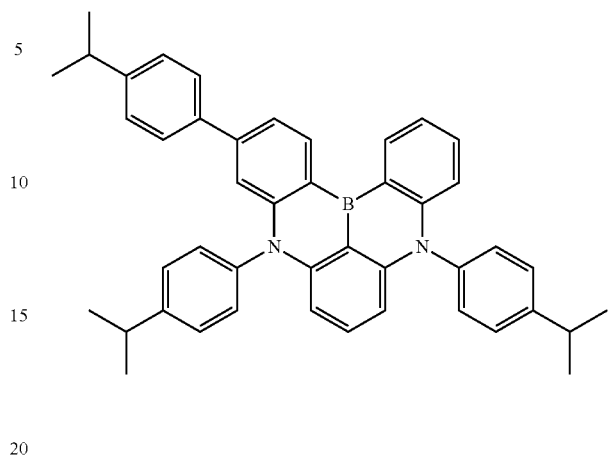
Dopant 16
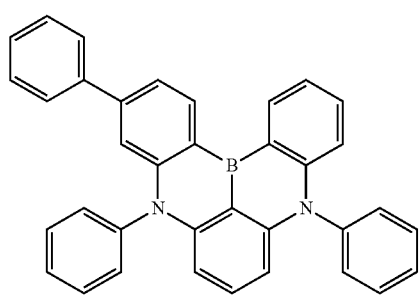
Dopant 20
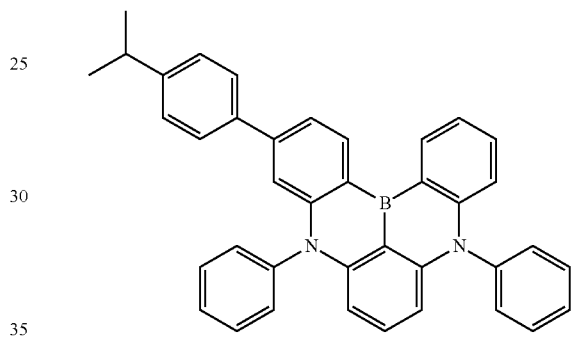
Dopant 17
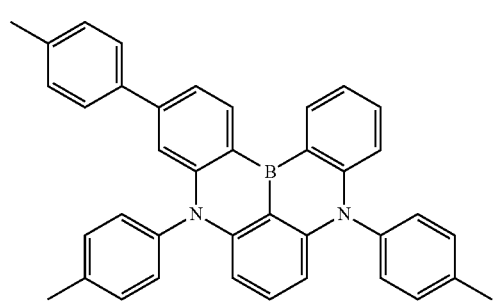
Dopant 21
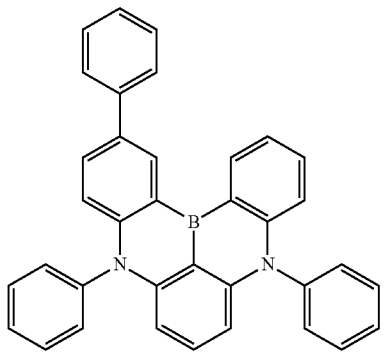
Dopant 18
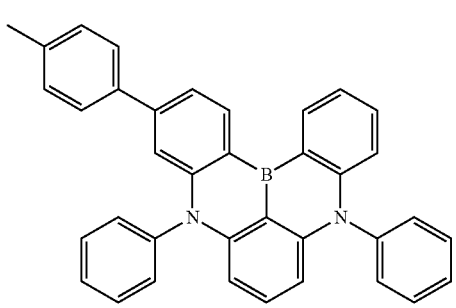
Dopant 22
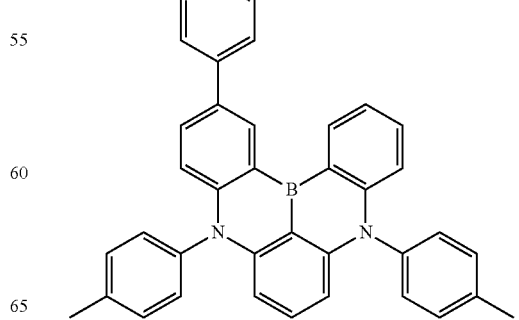

-continued
Dopant 23
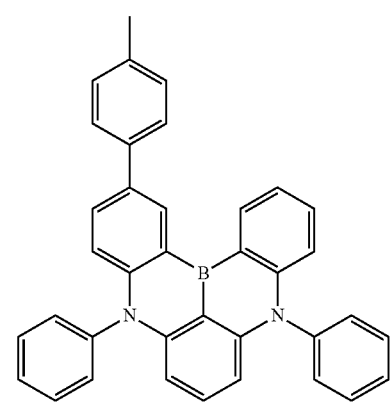
Dopant 24
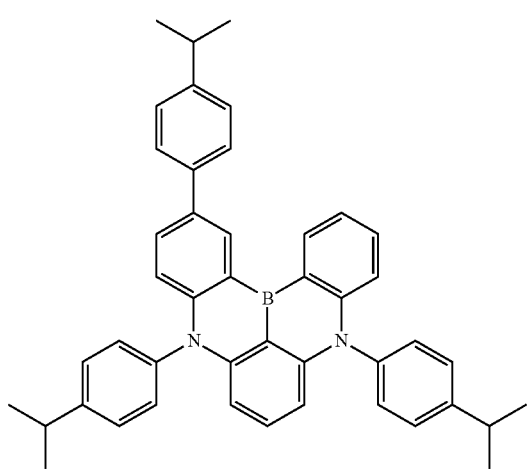
Dopant 25
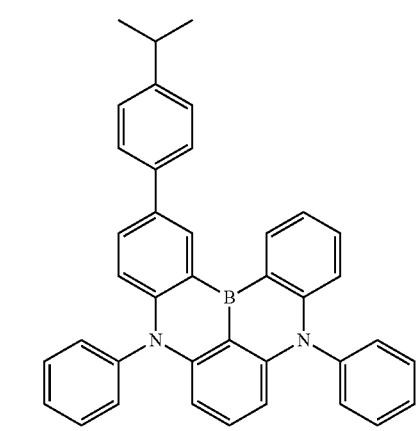
-continued
Dopant 26
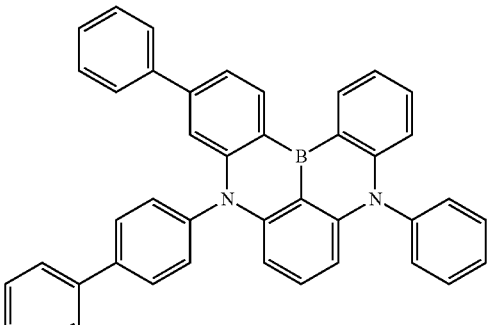
Dopant 27
Dopant 28
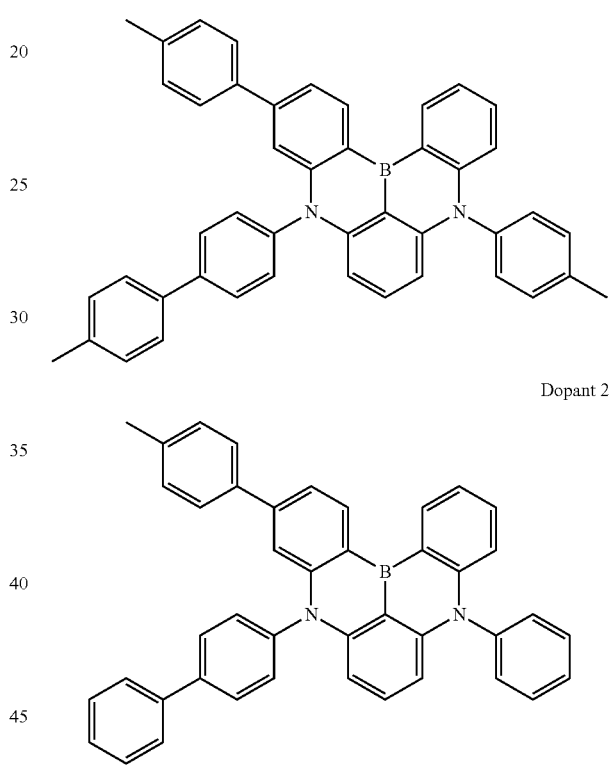
Dopant 29
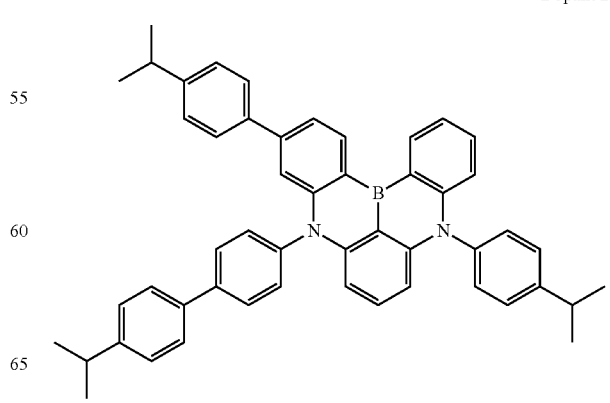

Dopant 30
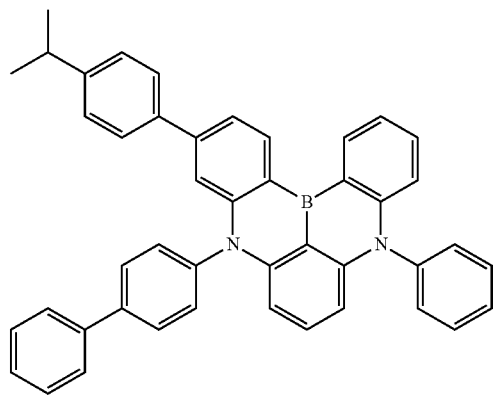
Dopant 33
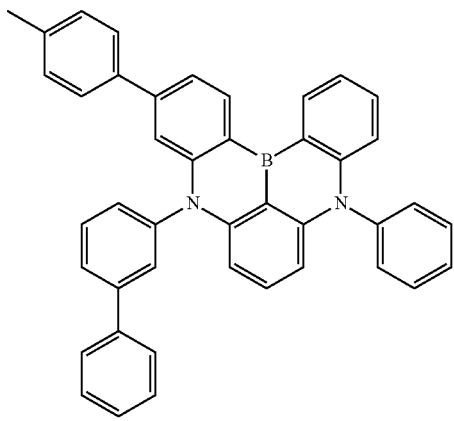
Dopant 31
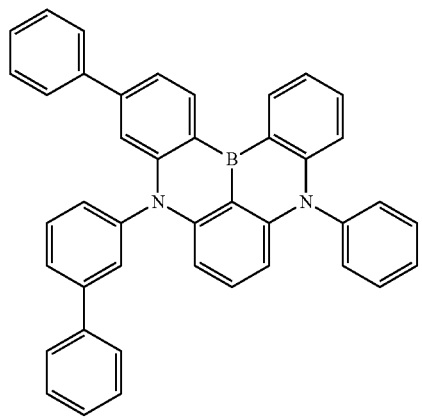
Dopant 34
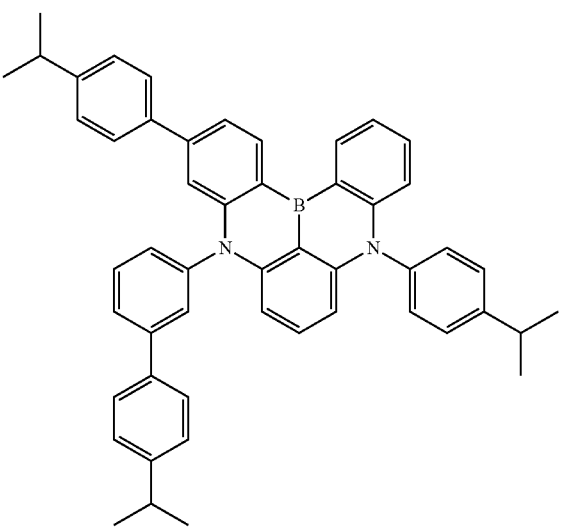
Dopant 32
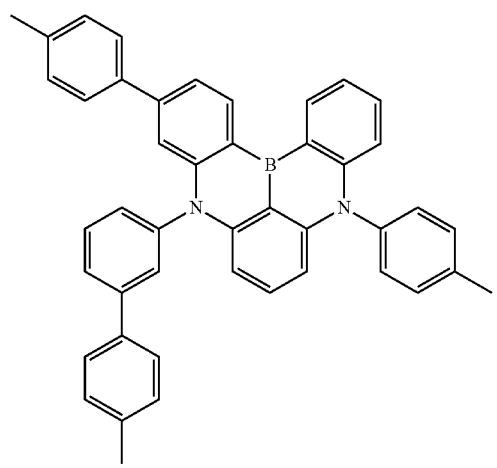
Dopant 35
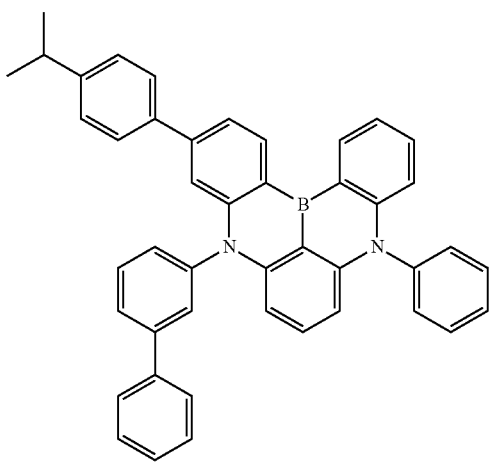

Dopant 37
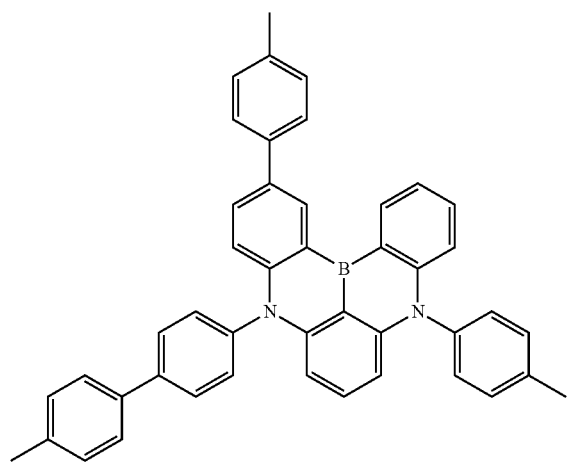
Dopant 40
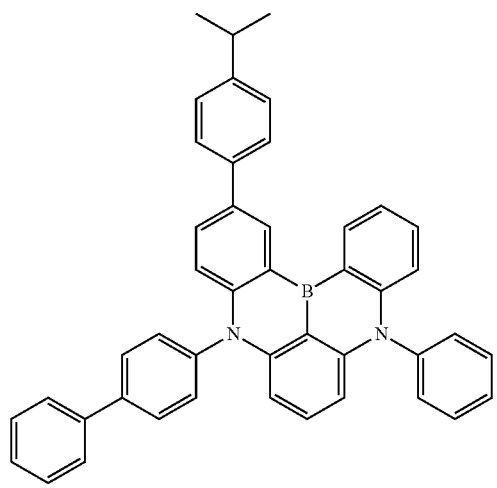
Dopant 38
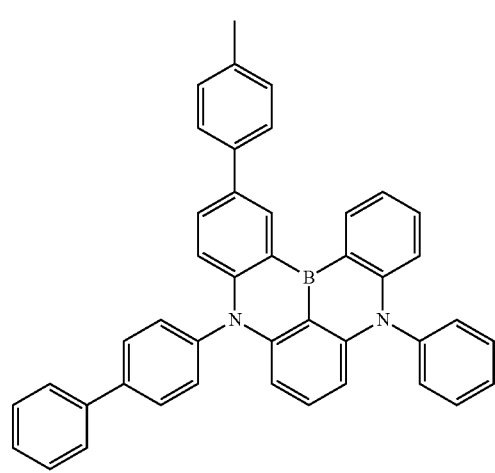
Dopant 41
Dopant 39
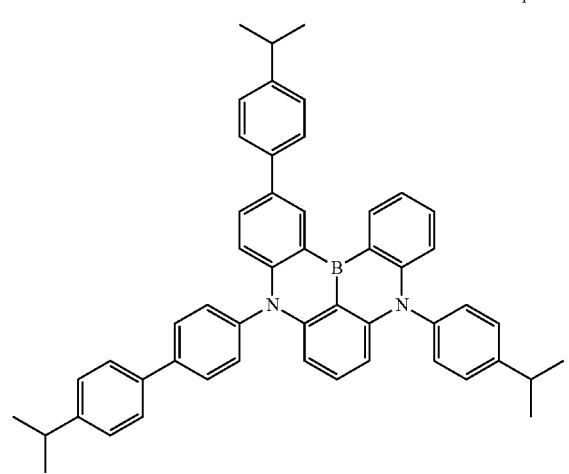
Dopant 42
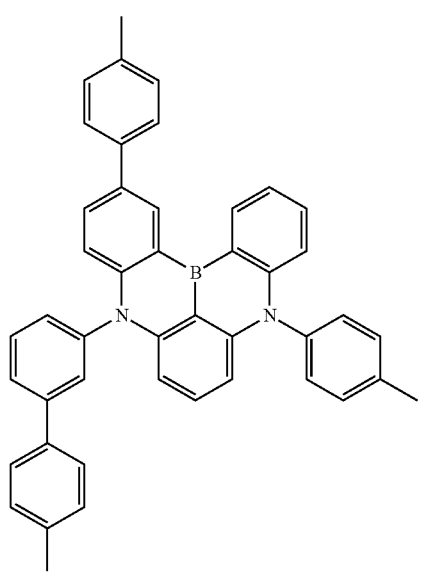

Dopant 43
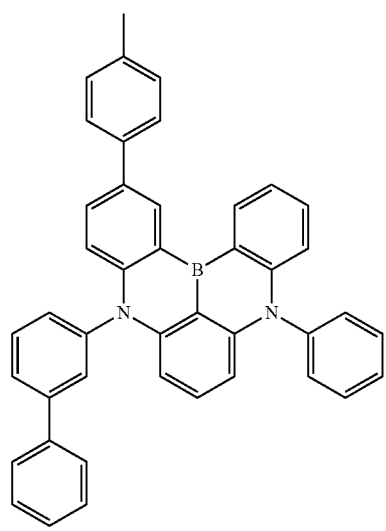
Dopant 44
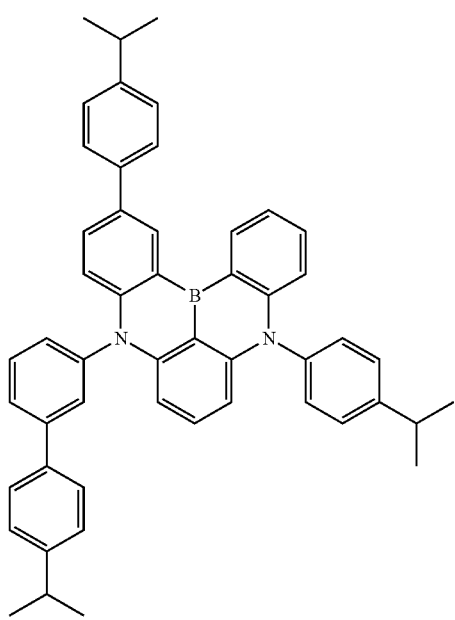
Dopant 45
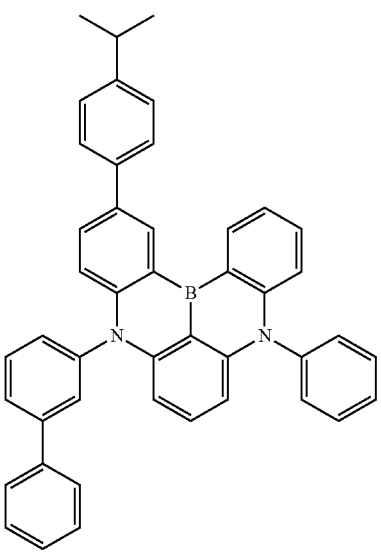
Dopant 46
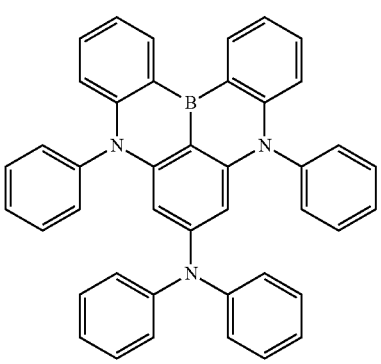
Dopant 47
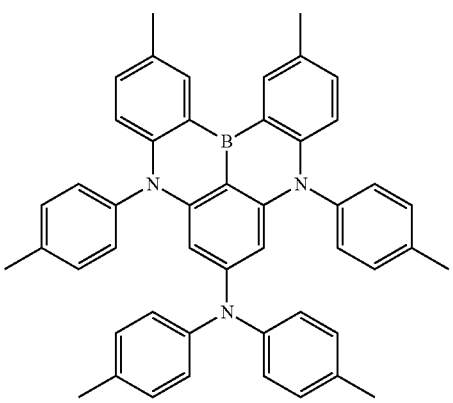

-continued
Dopant 48
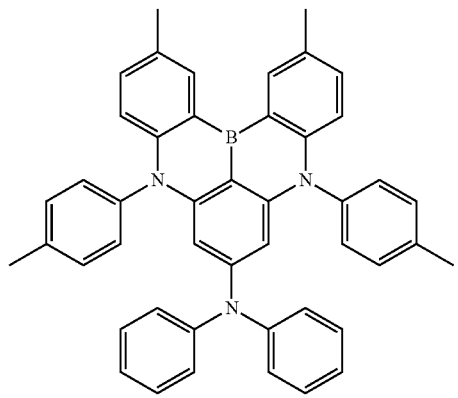
Dopant 49
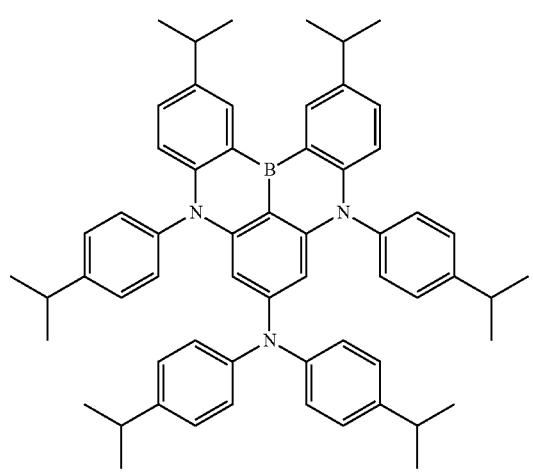
Dopant 50
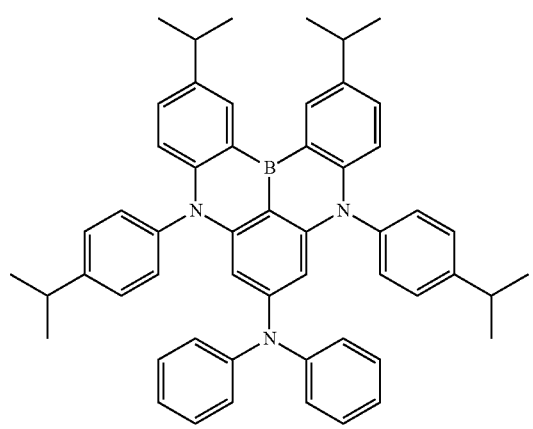
-continued
Dopant 51
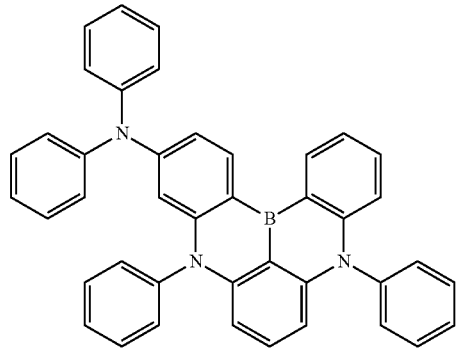
Dopant 52
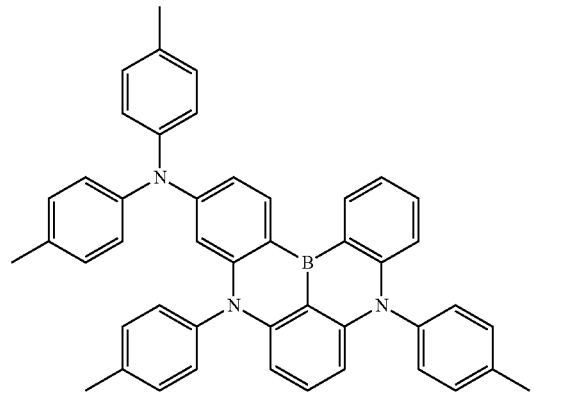
Dopant 53
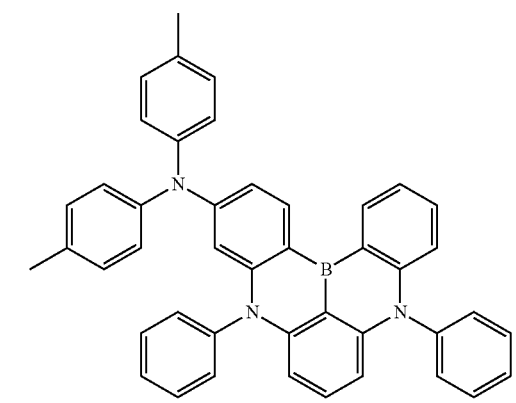
Dopant 54
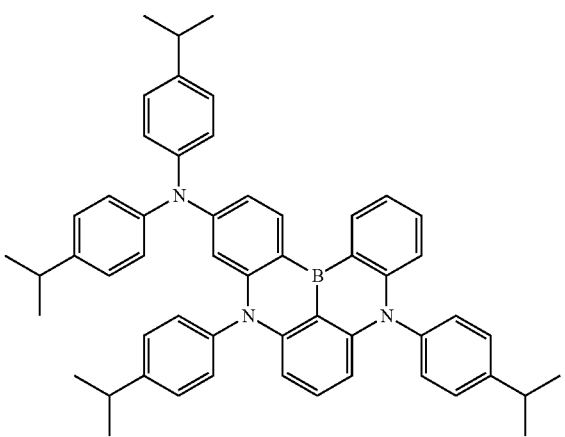

Dopant 55
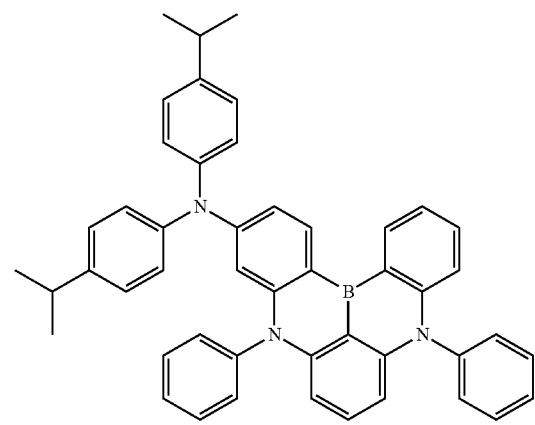
Dopant 56
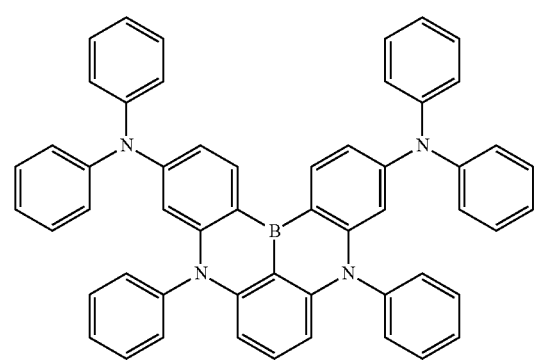
Dopant 57
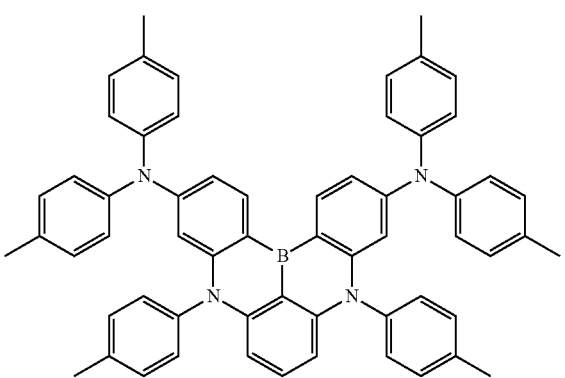
Dopant 58
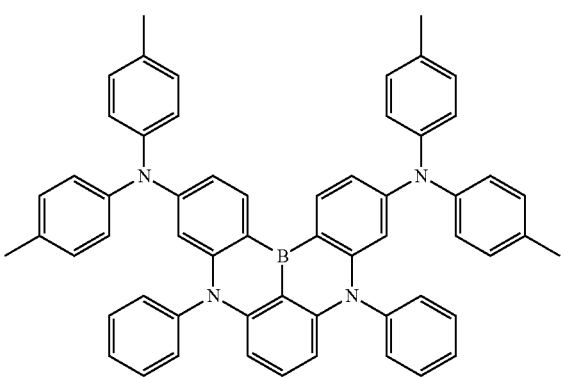
Dopant 59
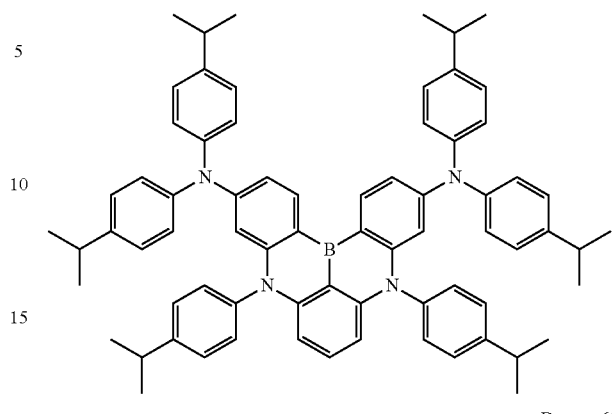
Dopant 60
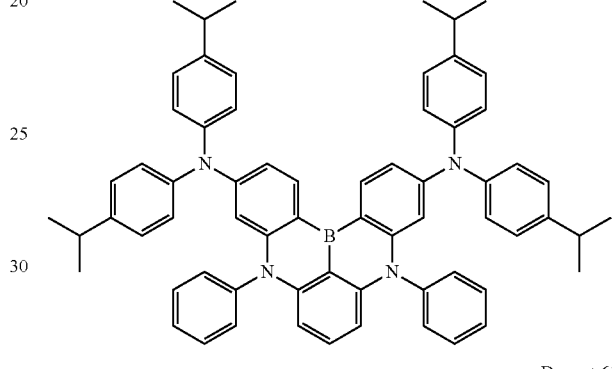
Dopant 61
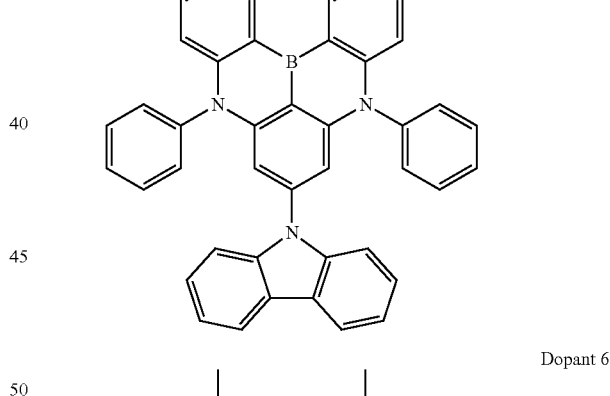
Dopant 62
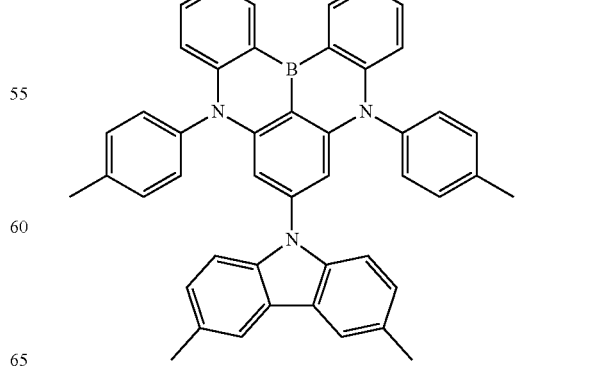

Dopant 63
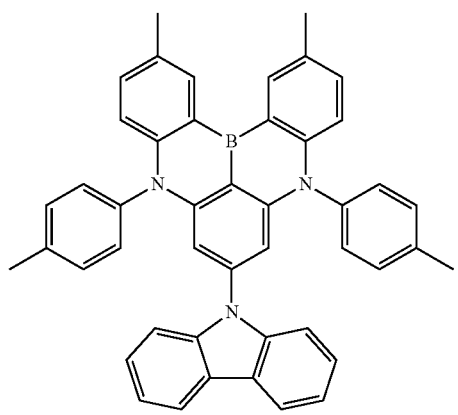
Dopant 64
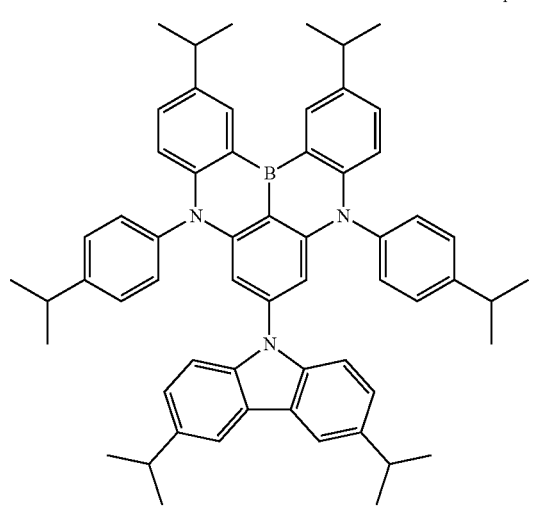
Dopant 65
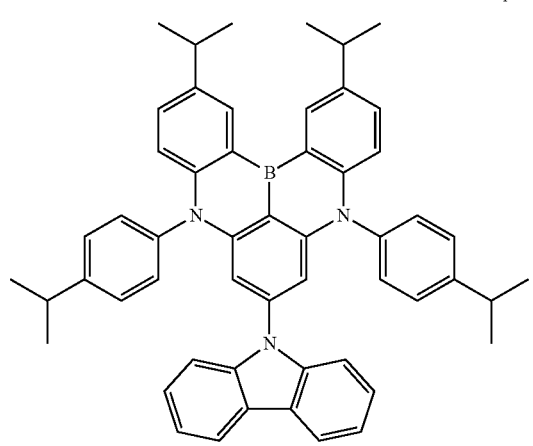
Dopant 66
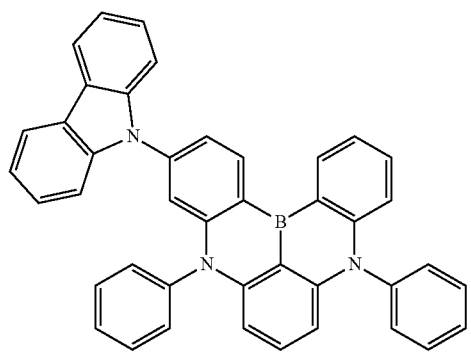
Dopant 67
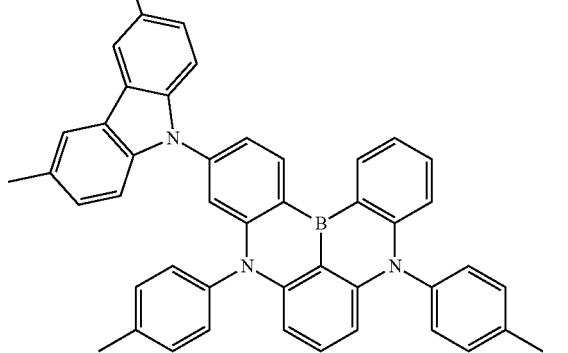
Dopant 68
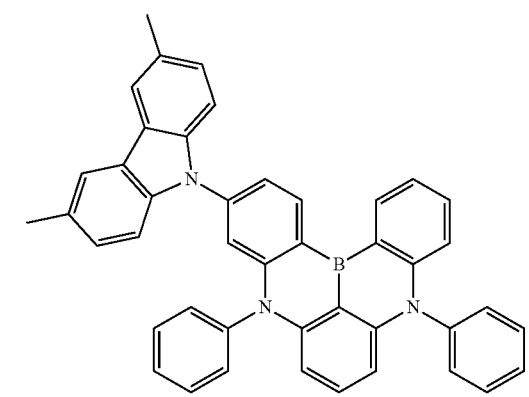
Dopant 69
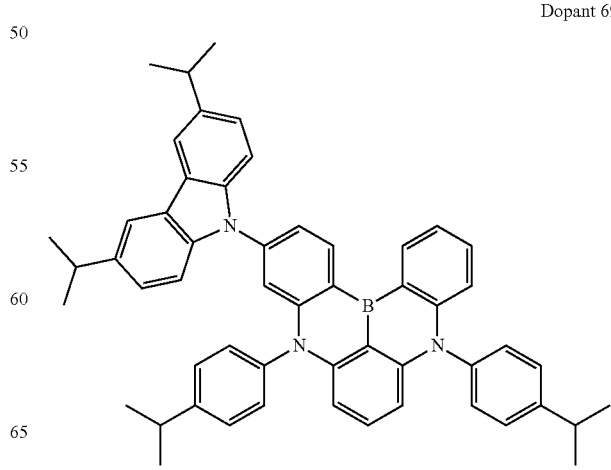

Dopant 70
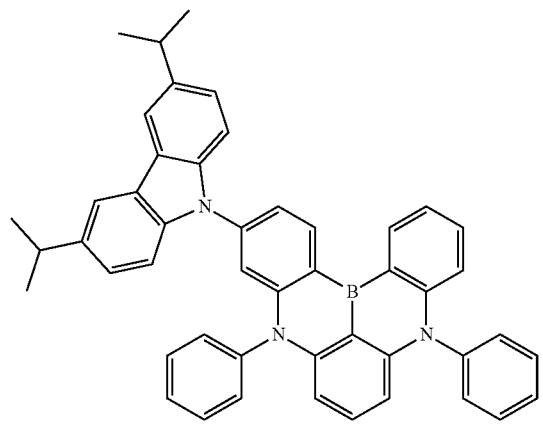
Dopant 74
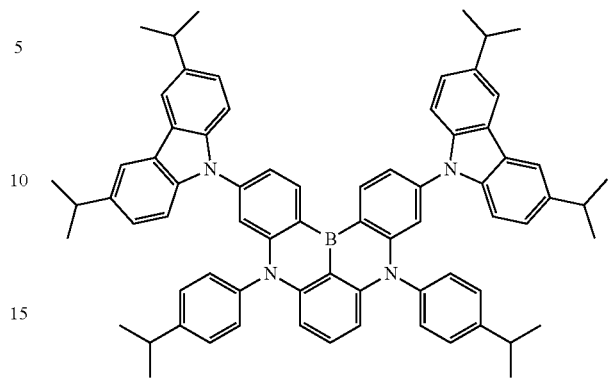
Dopant 71
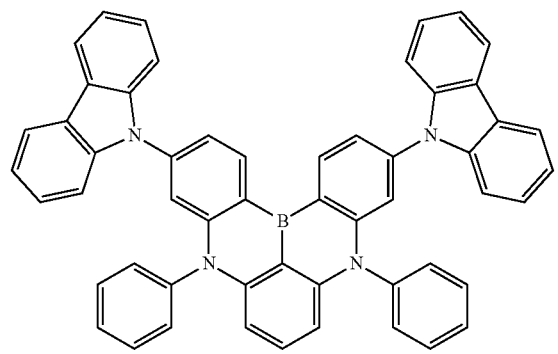
Dopant 75
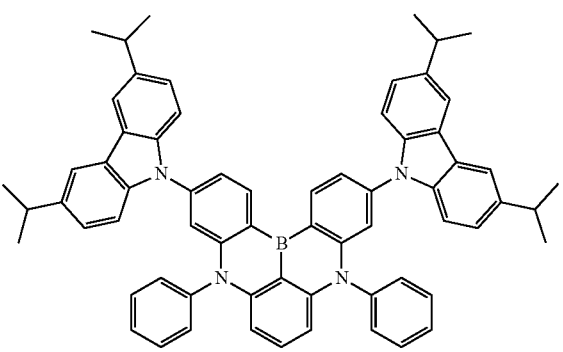
Dopant 72
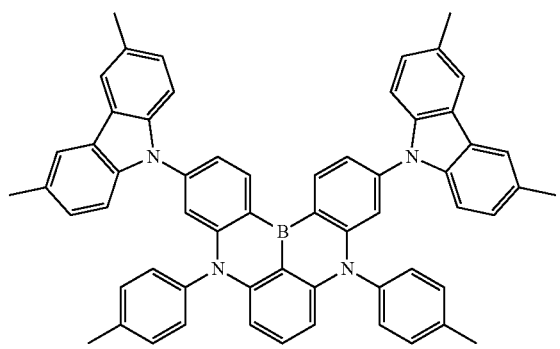
Dopant 76
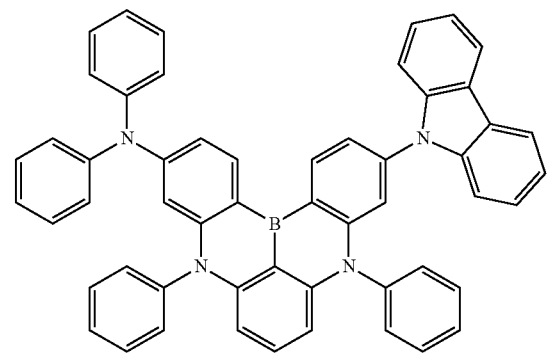
Dopant 73
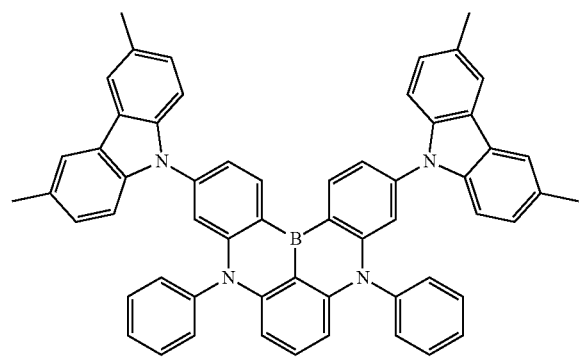
Dopant 77
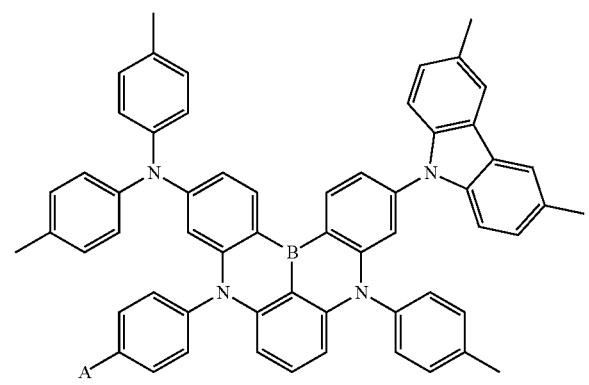

Dopant 78
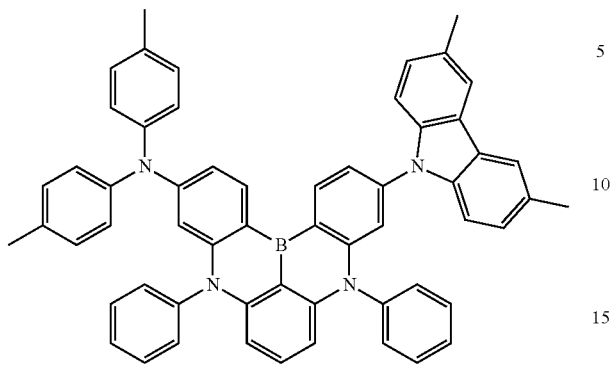
Dopant 82
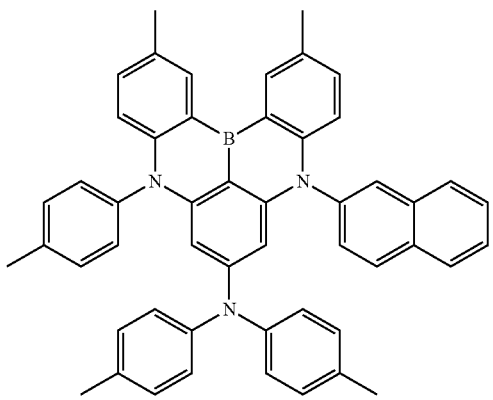
Dopant 79
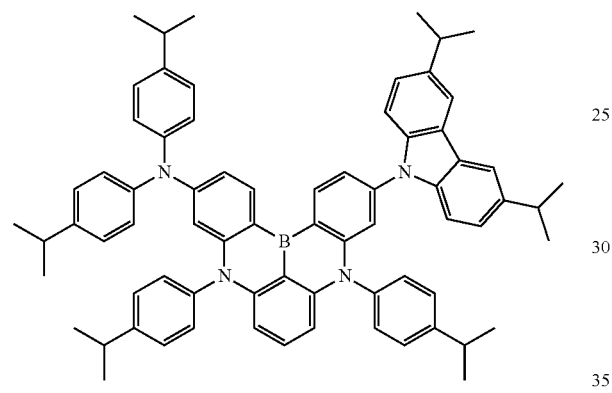
Dopant 83
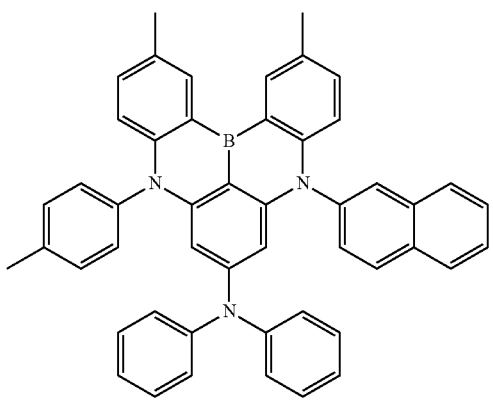
Dopant 80
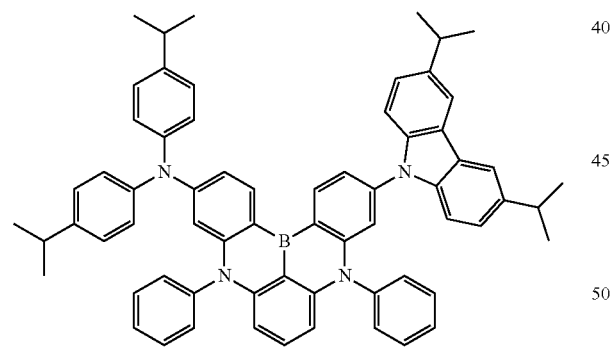
Dopant 81
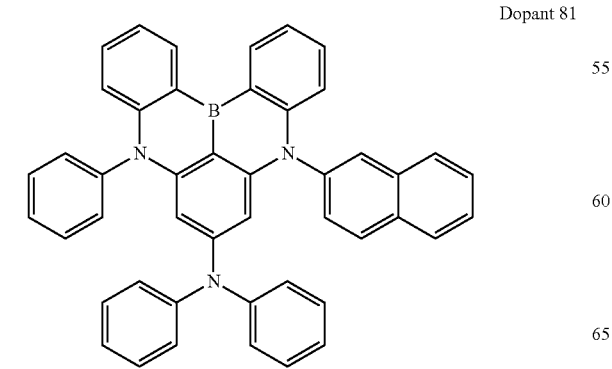
Dopant 84
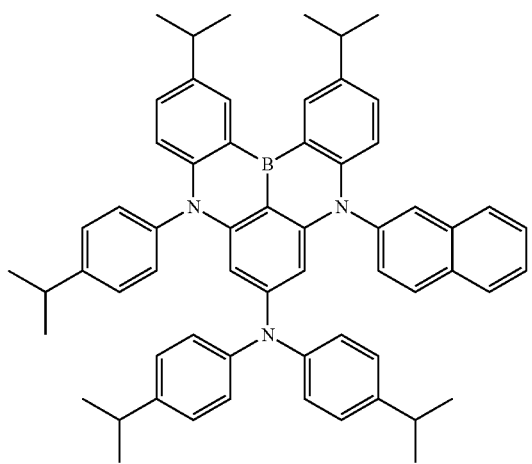

-continued
Dopant 85
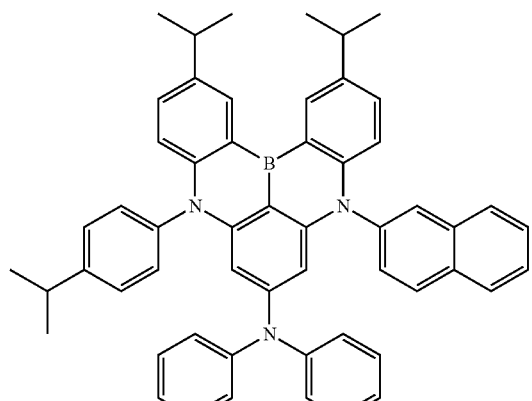
Dopant 86
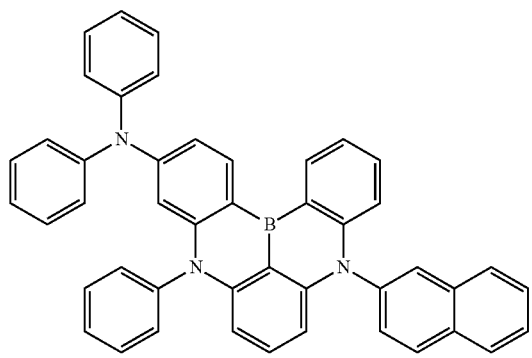
Dopant 87
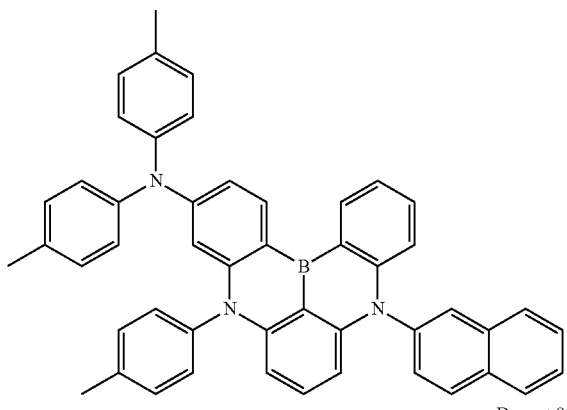
Dopant 88
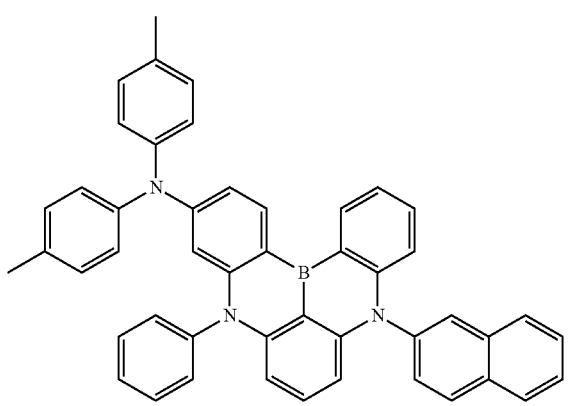
-continued
Dopant 89
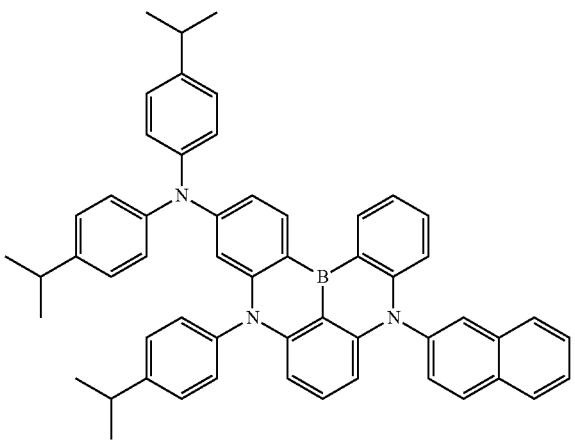
Dopant 90
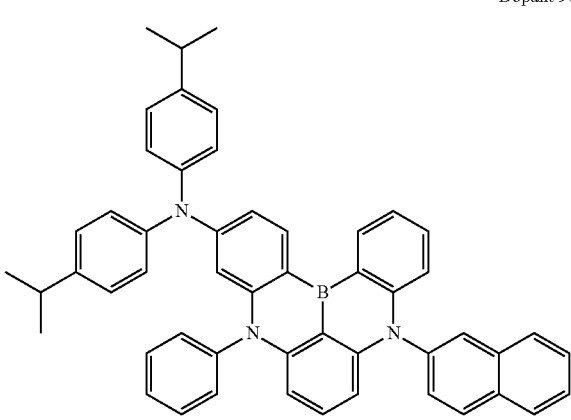
Dopant 91
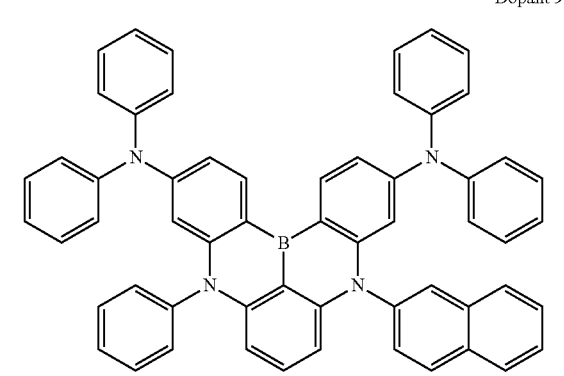
Dopant 92
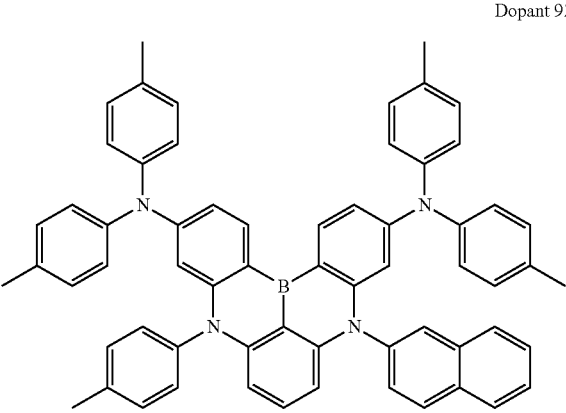

Dopant 93
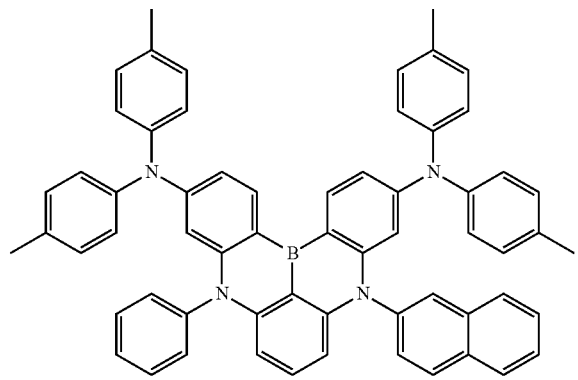
Dopant 94
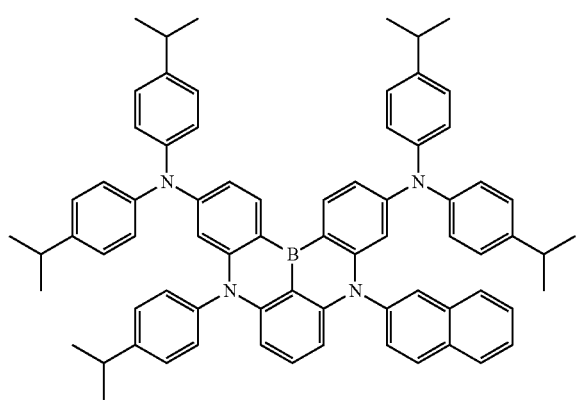
Dopant 95
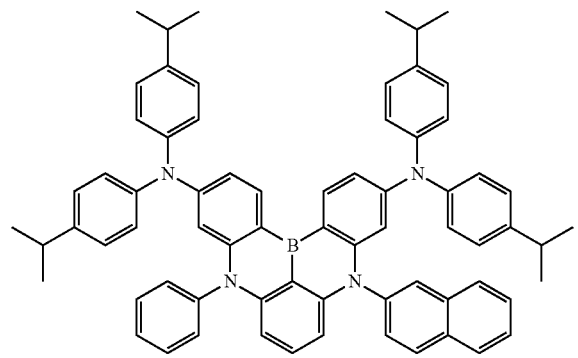
Dopant 96
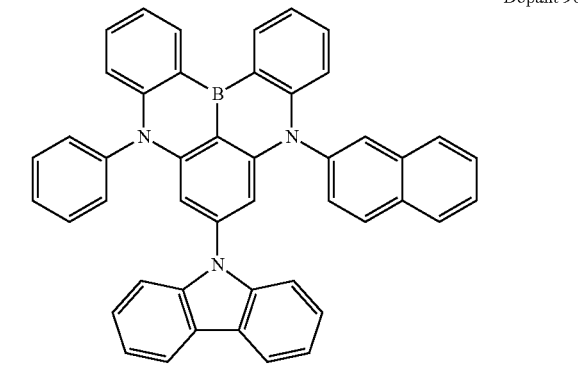
Dopant 97
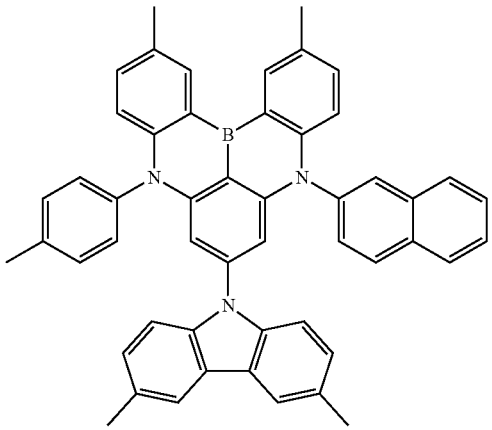
Dopant 98
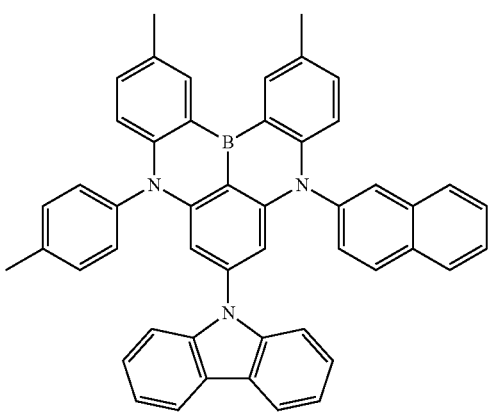
Dopant 99
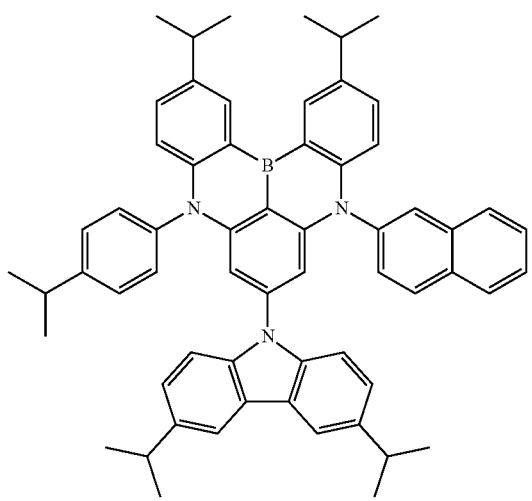

Dopant 100
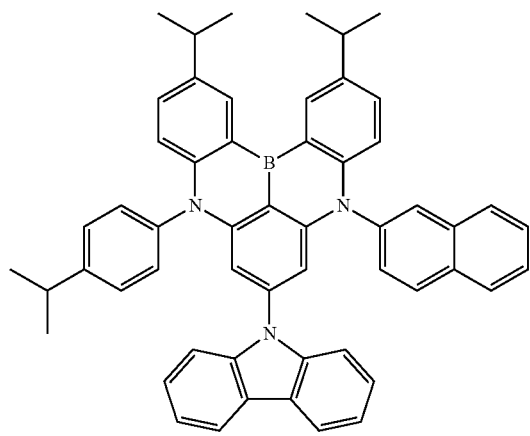
Dopant 101
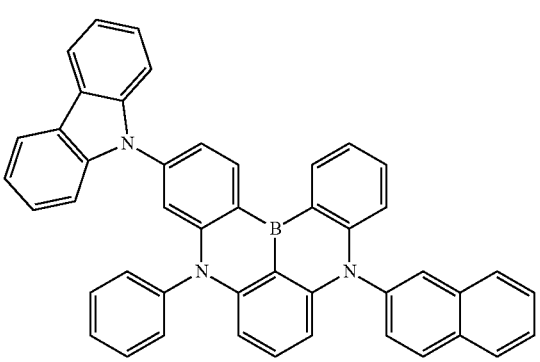
Dopant 102
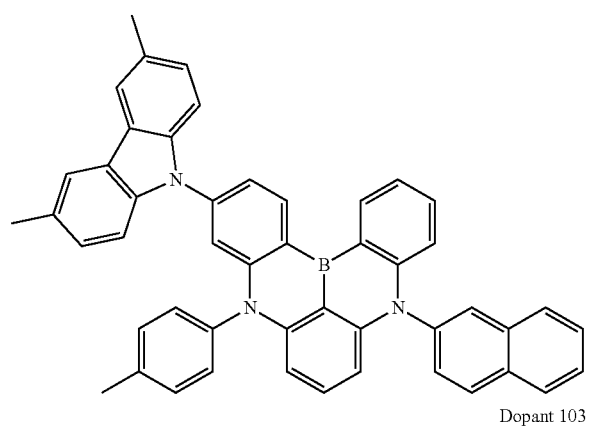
Dopant 103
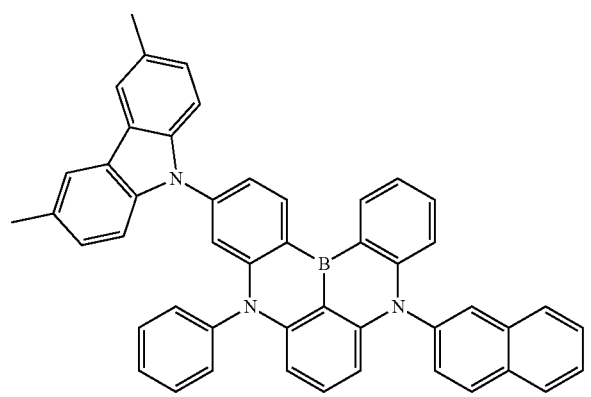
Dopant 104
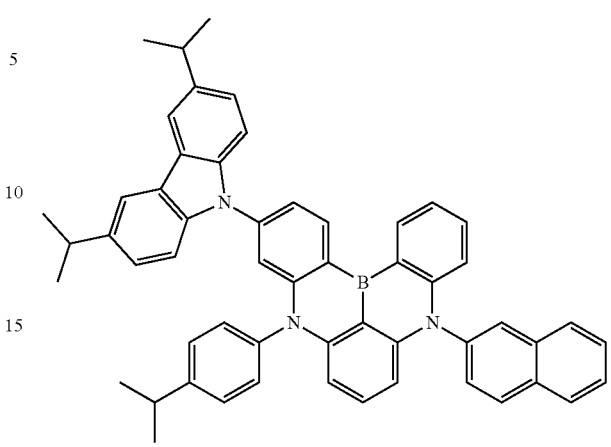
Dopant 105
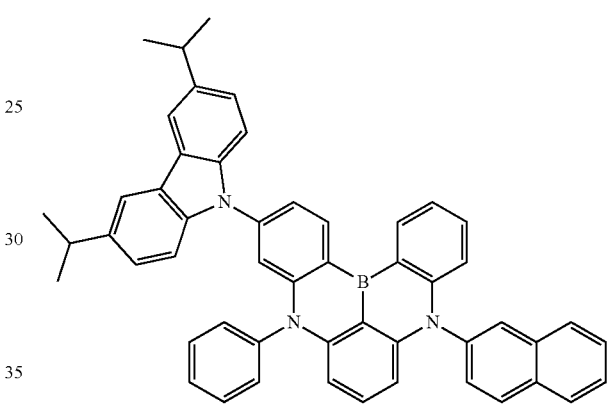
Dopant 106
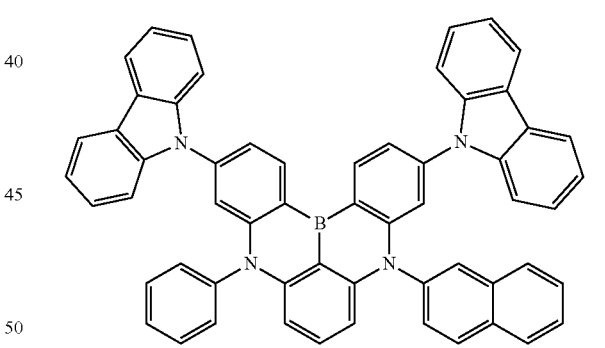
Dopant 107
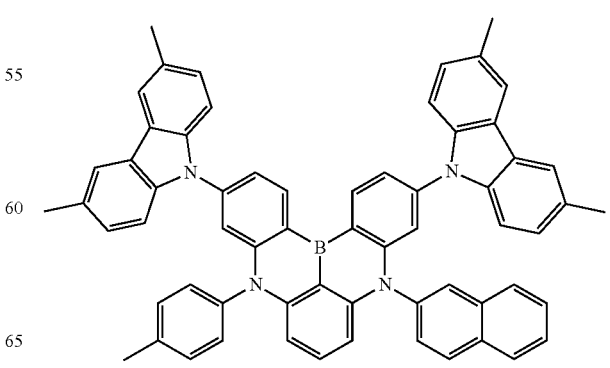

Dopant 108
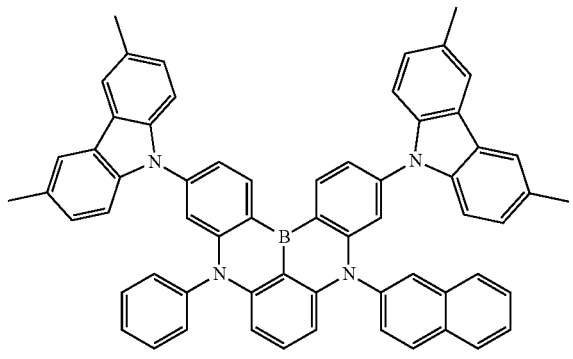
Dopant 109
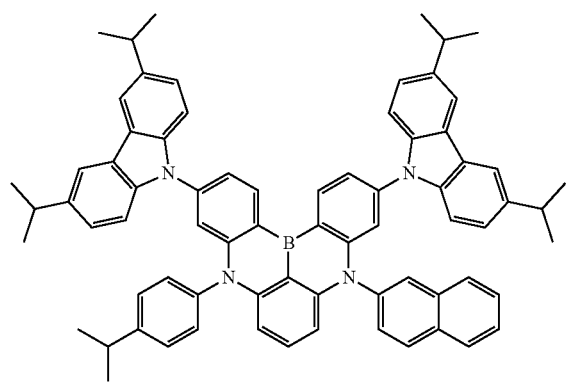
Dopant 110
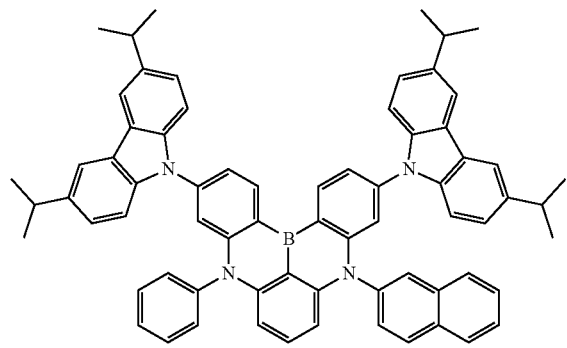
Dopant 111
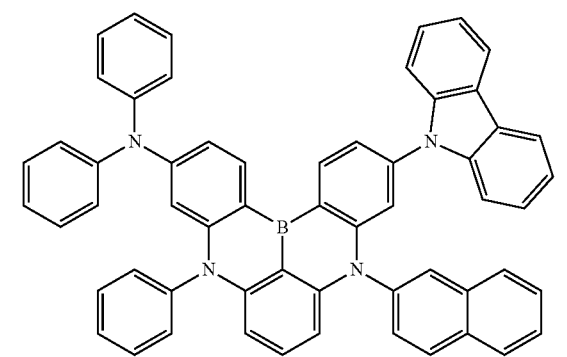
Dopant 112
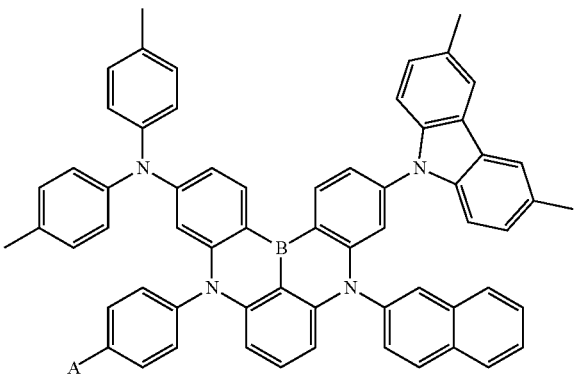
Dopant 113
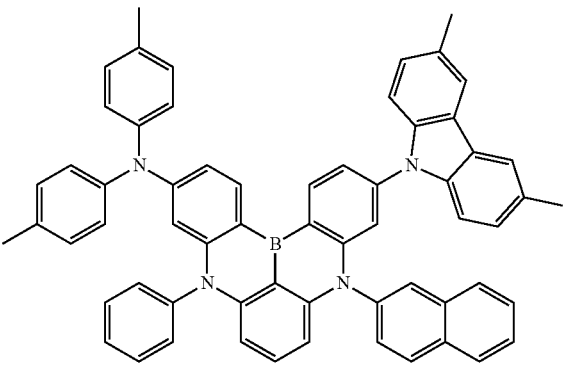
Dopant 114
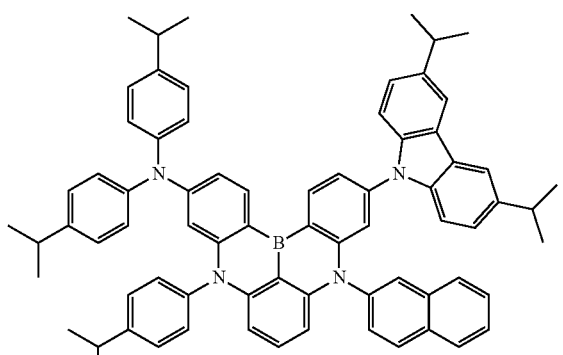
Dopant 115
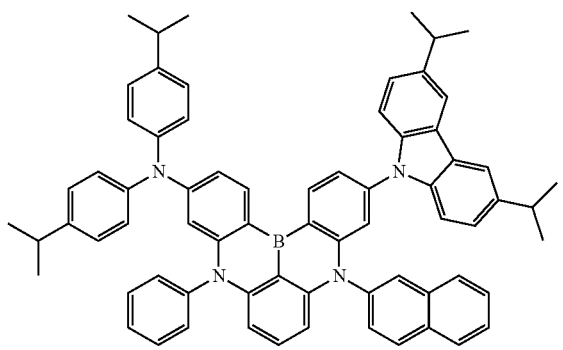

Dopant 116
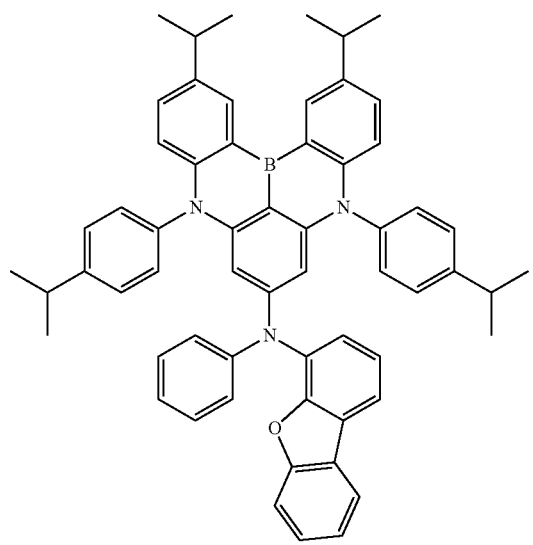
Dopant 117
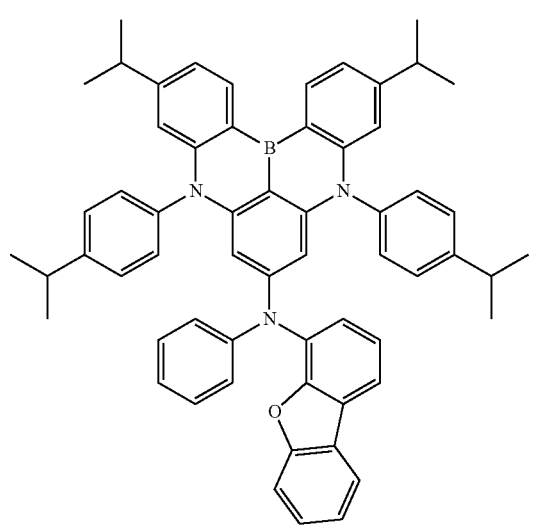
Dopant 118
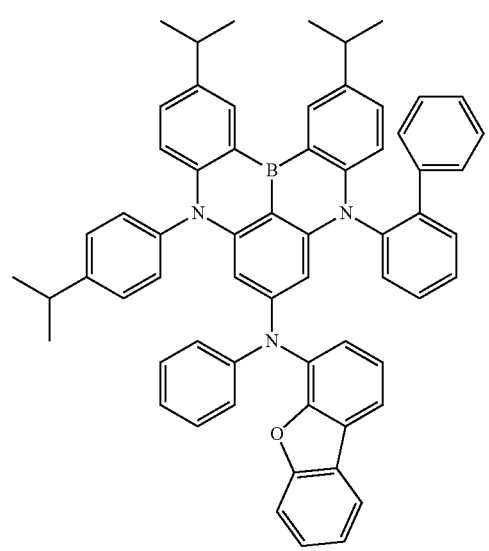
Dopant 119
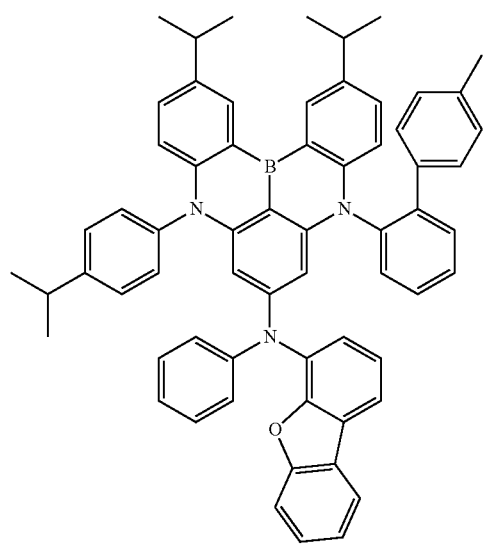
Dopant 120
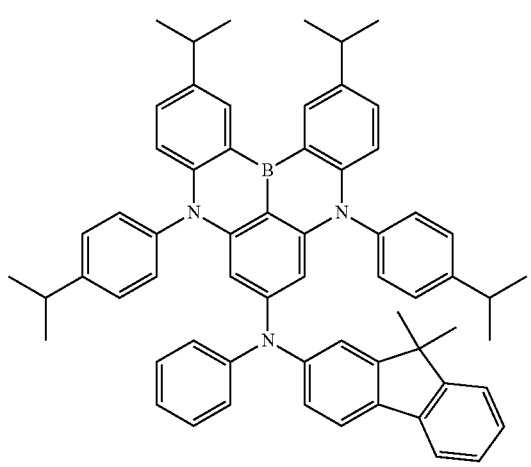
Dopant 121
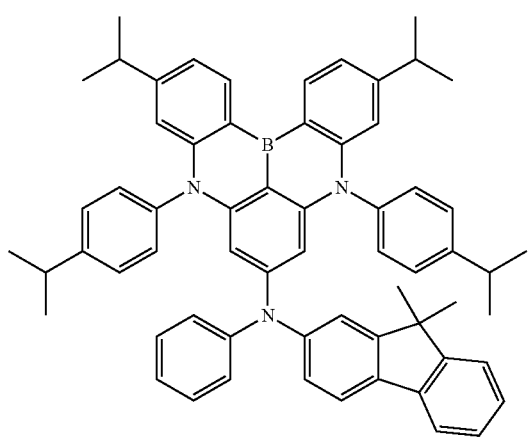

Dopant 122
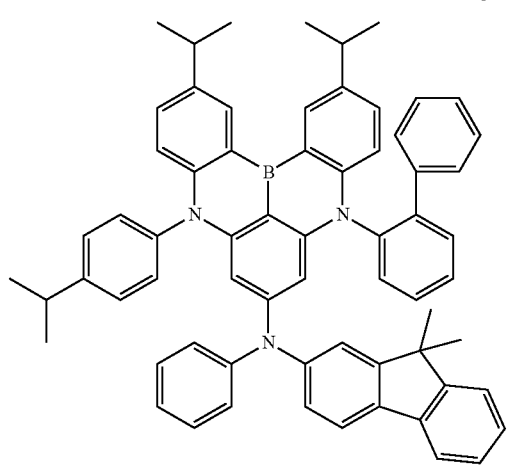
Dopant 123
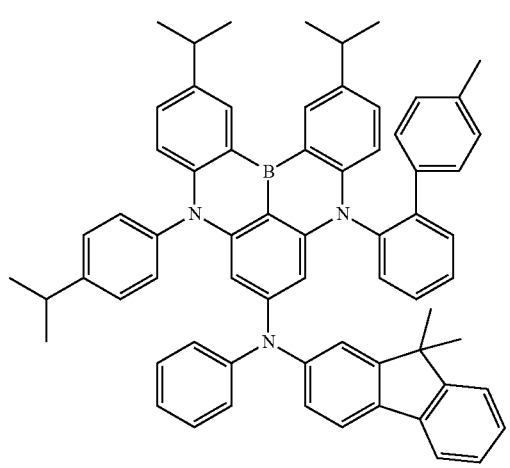
Dopant 124
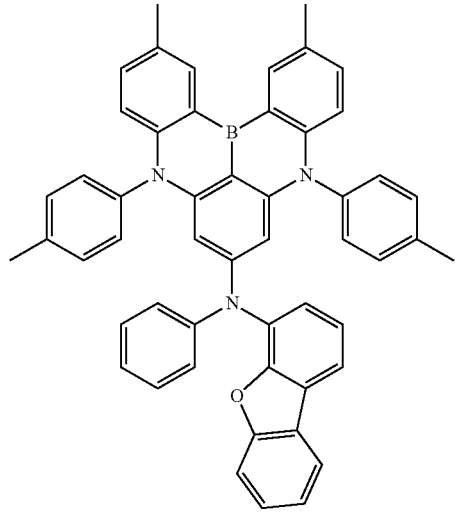
Dopant 125
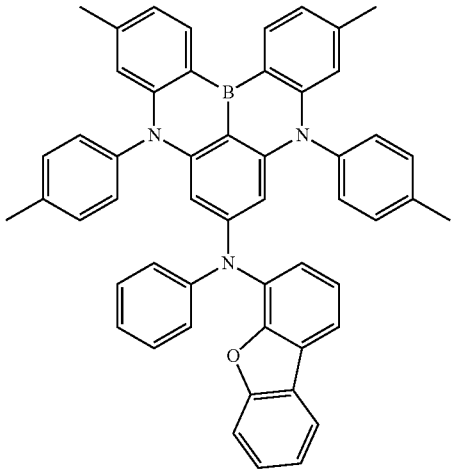
Dopant 126
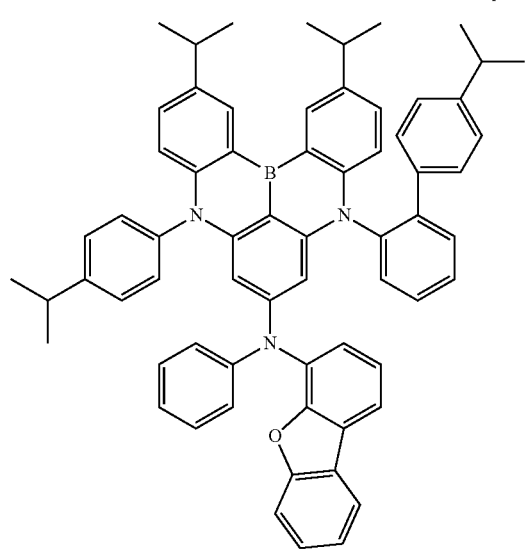
Dopant 127
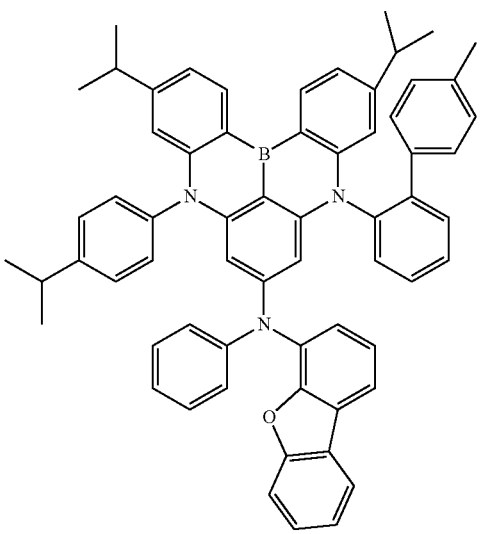

Dopant 128
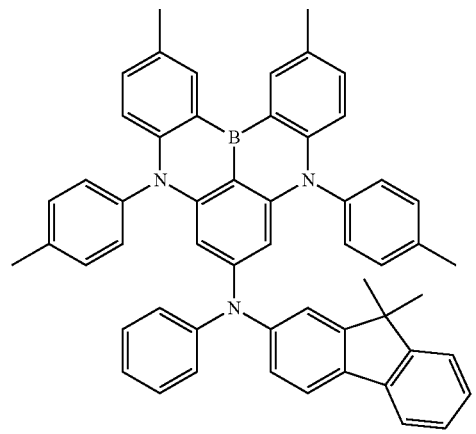
Dopant 129
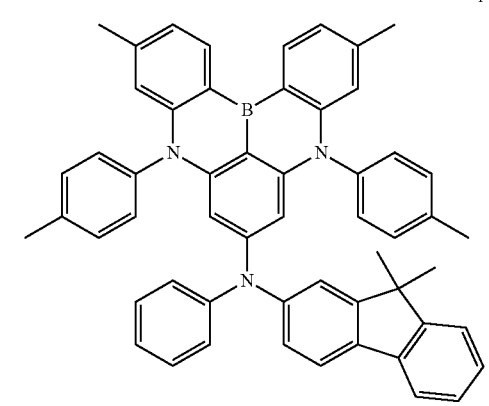
Dopant 130
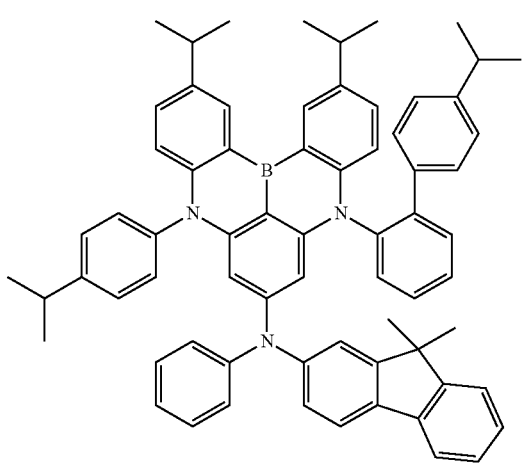
Dopant 131
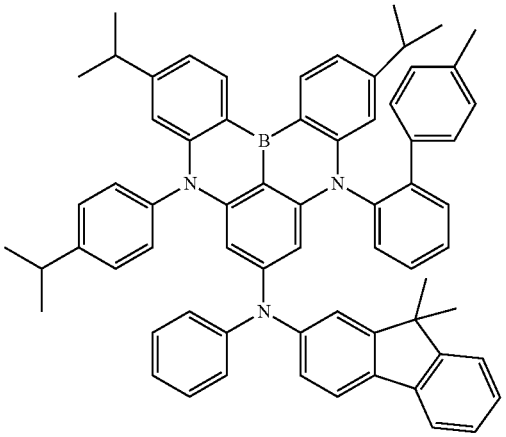
Dopant 132
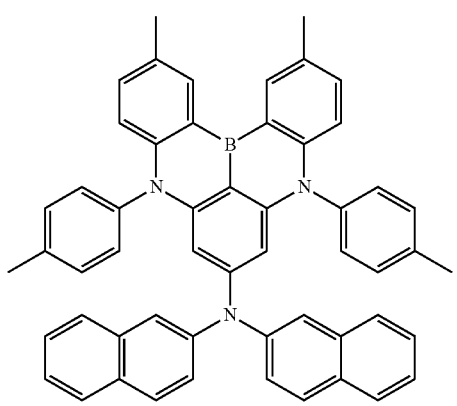
Dopant 133
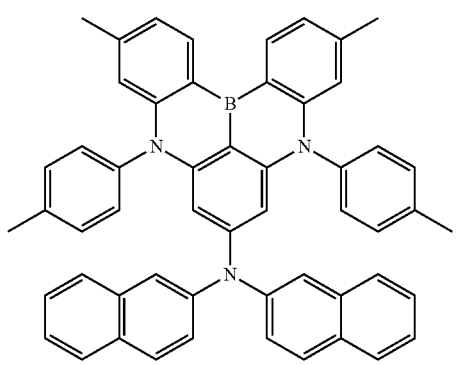
Dopant 134
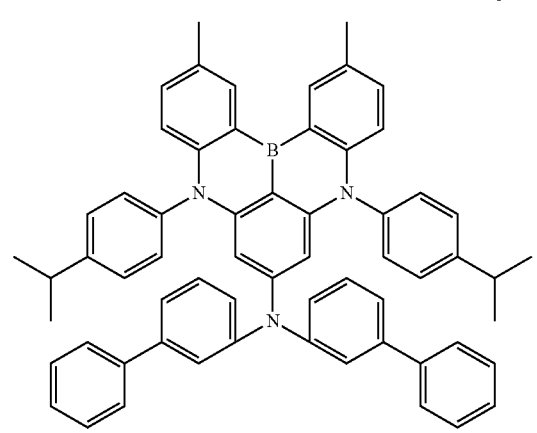

-continued
Dopant 135
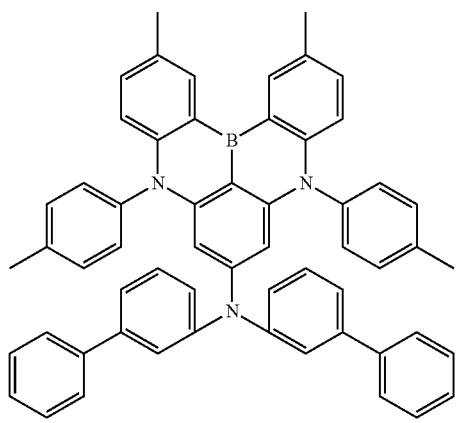
Dopant 136
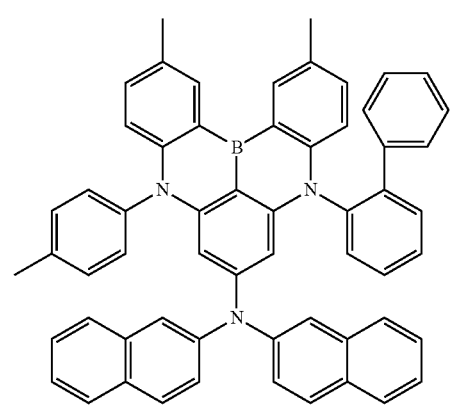
Dopant 137
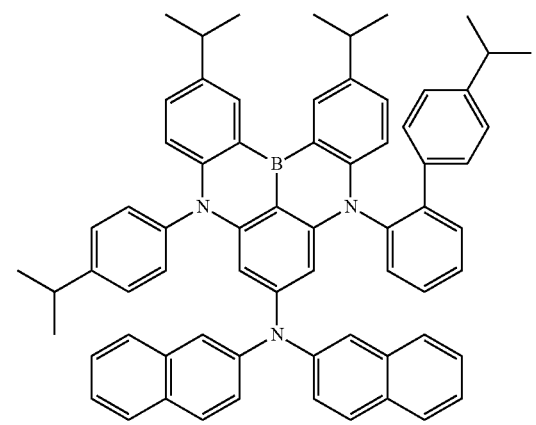
Dopant 138
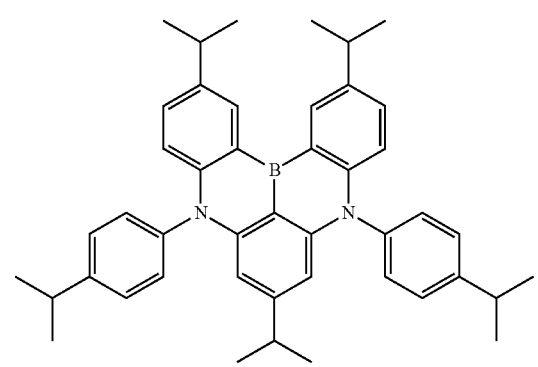
Dopant 139
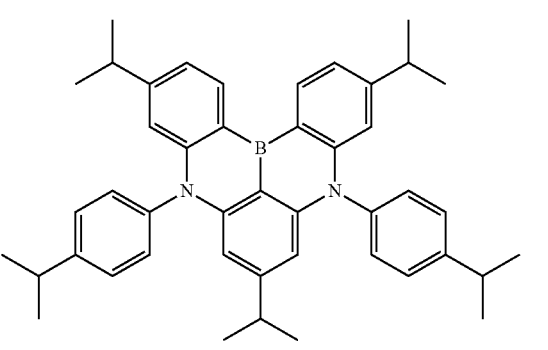
Dopant 141
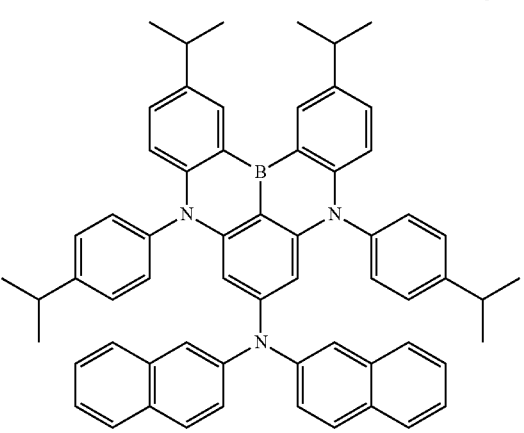
Dopant 142
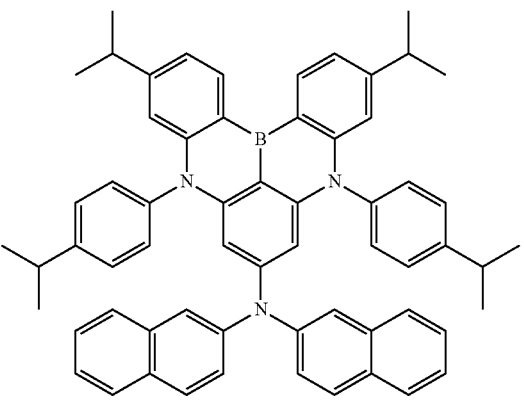
Dopant 143
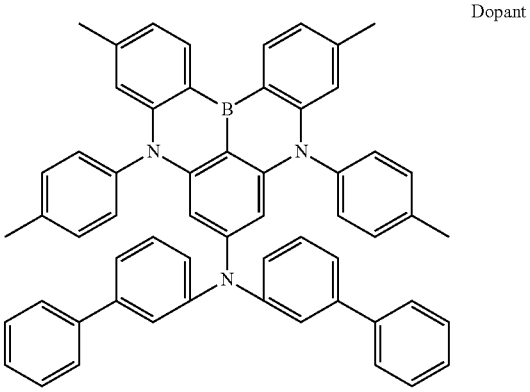

Dopant 144
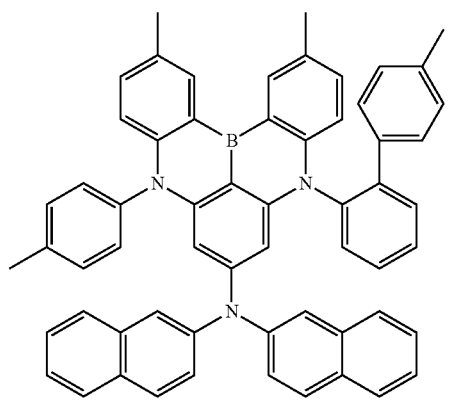
Dopant 145
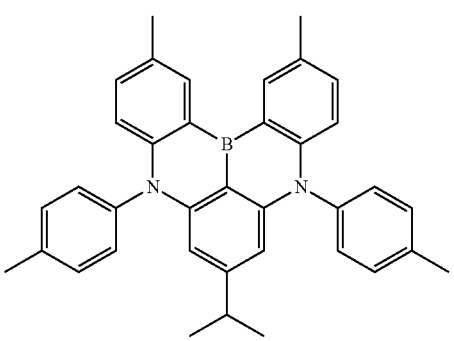
Dopant 146
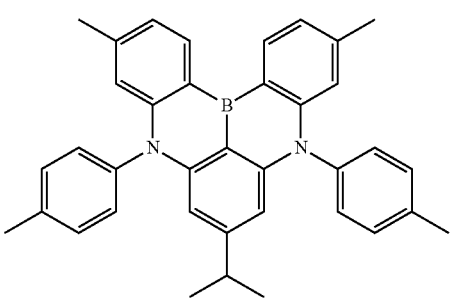
Dopant 147
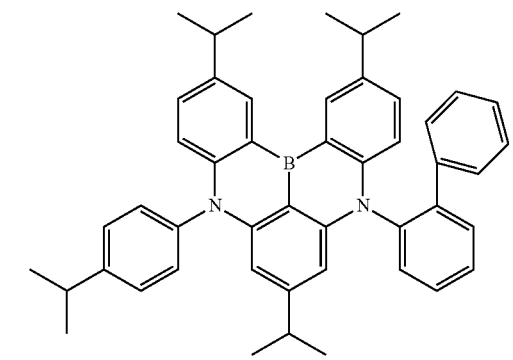
Dopant 148
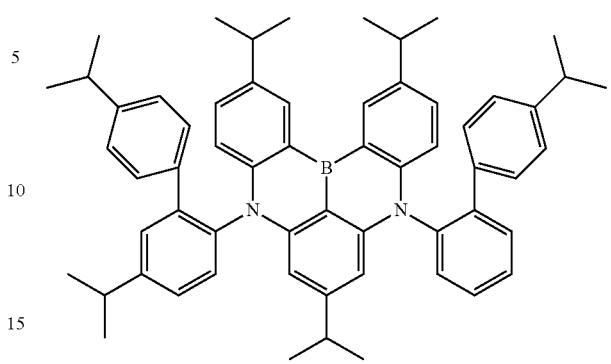
Dopant 149
Dopant 150

Dopant 151
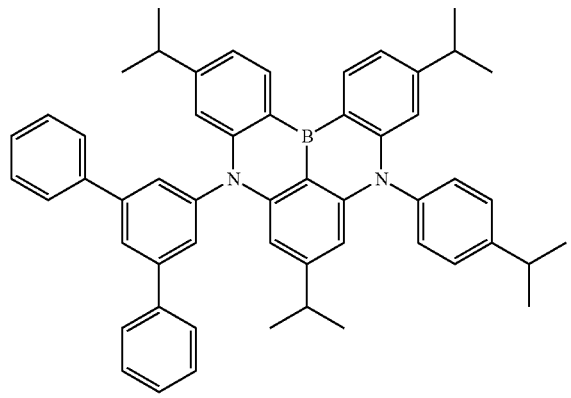
Dopant 152
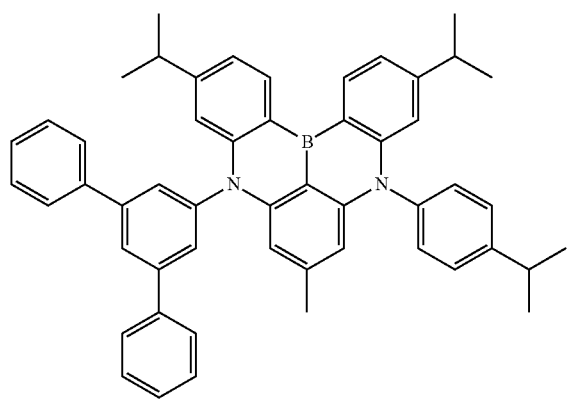
Dopant 153
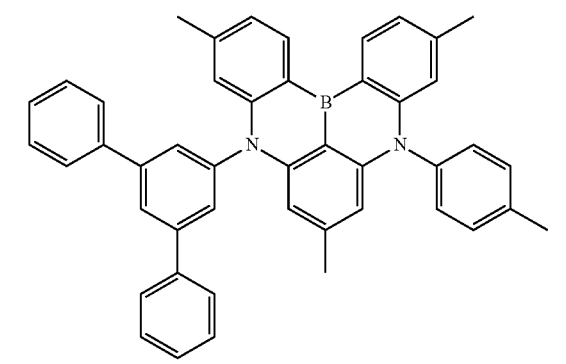
Dopant 154
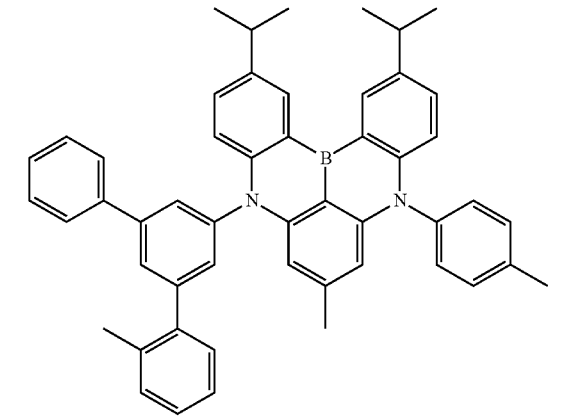
Dopant 155
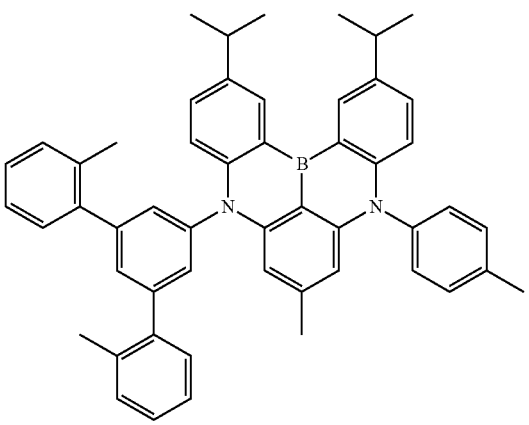
Dopant 156
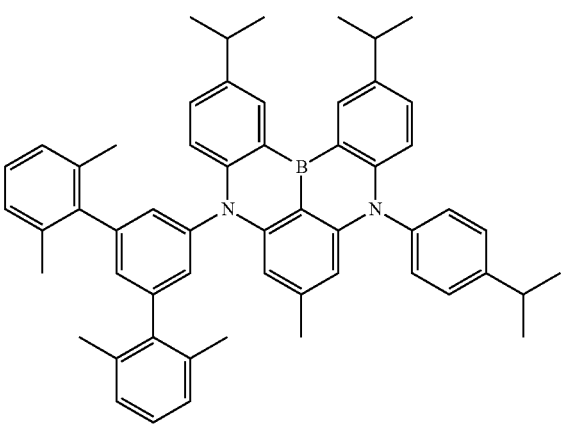
Dopant 157
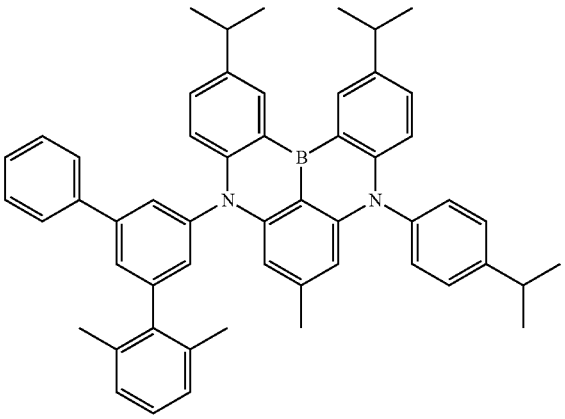

-continued
Dopant 158
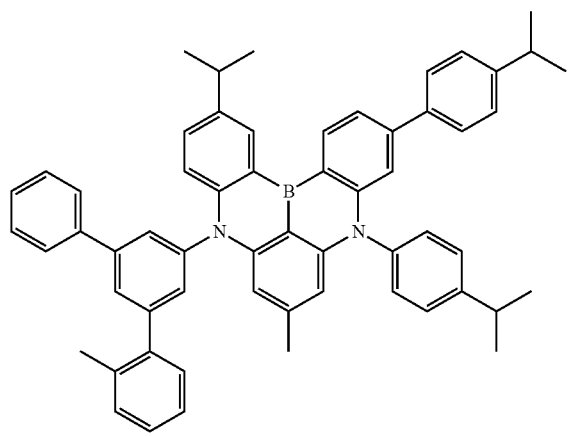
Dopant 161
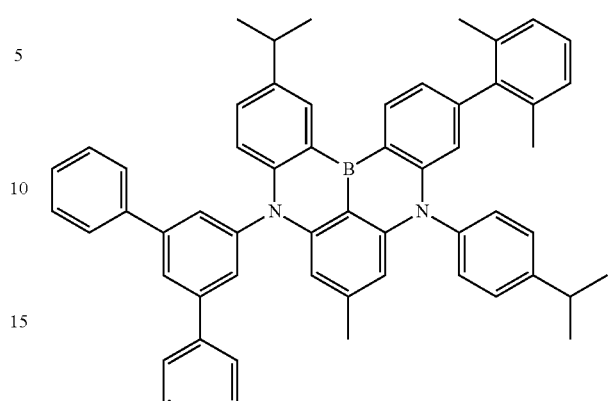
Dopant 159
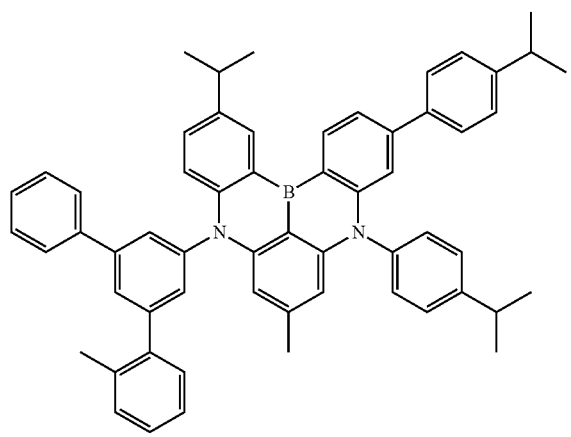
Dopant 162
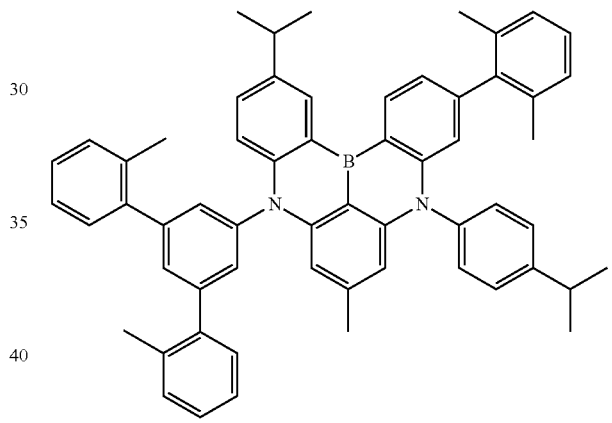
Dopant 160
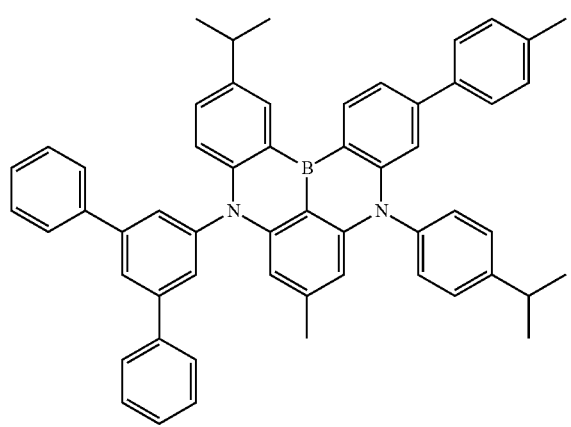
Dopant 163
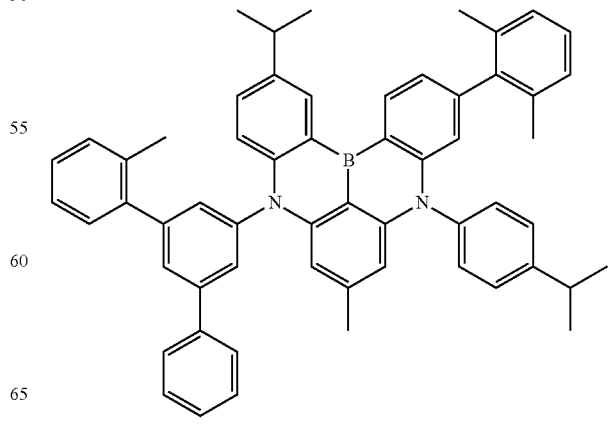

Dopant 164
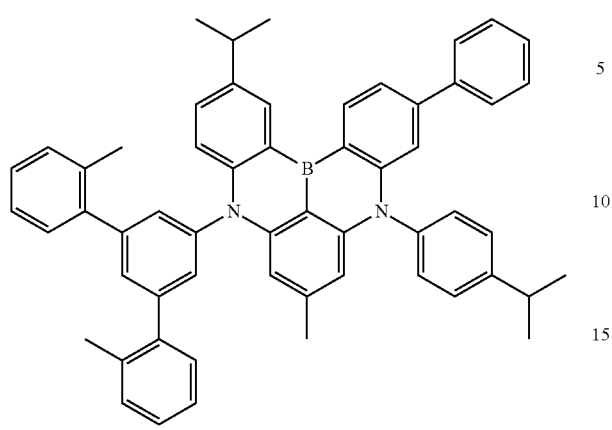
Dopant 165
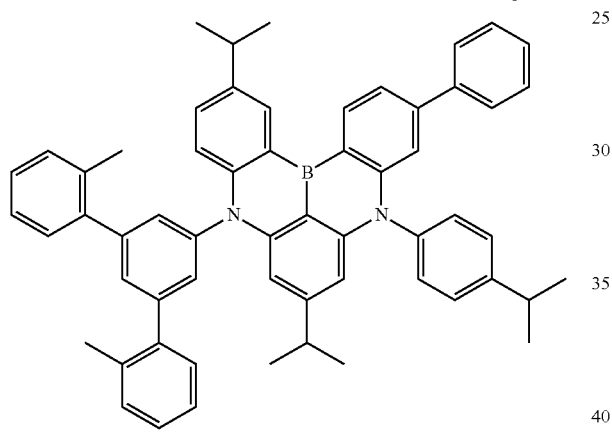
Dopant 166
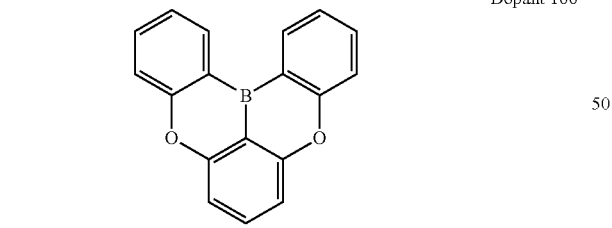
Dopant 167
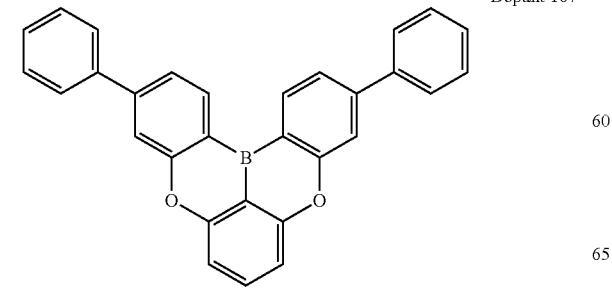
Dopant 168
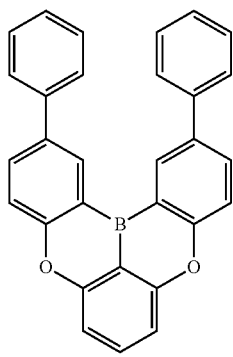
Dopant 169
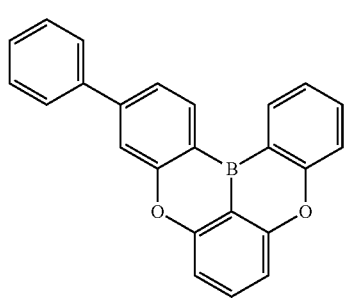
Dopant 170
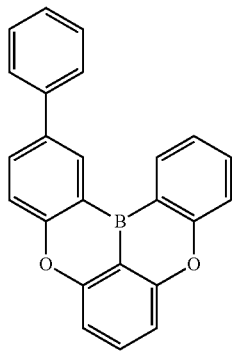
Dopant 171
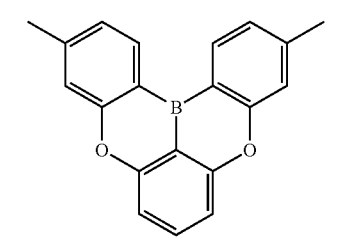
Dopant 172

-continued
Dopant 173
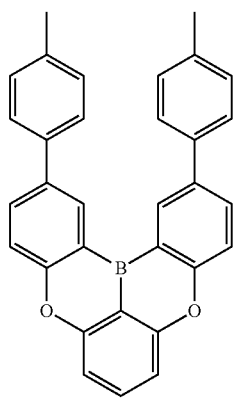
Dopant 174
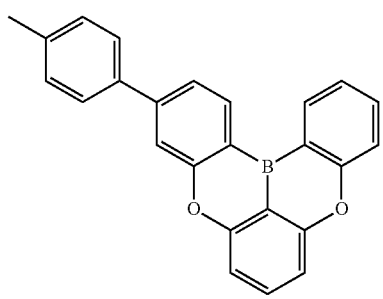
Dopant 175
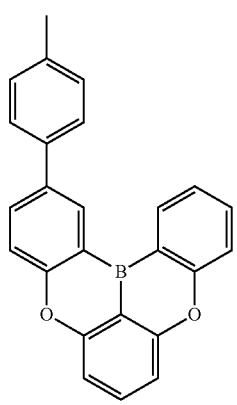
Dopant 176
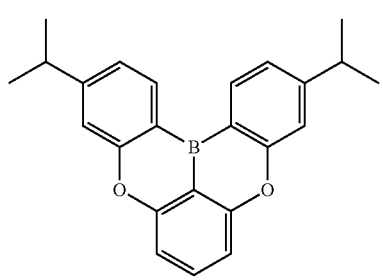
Dopant 177
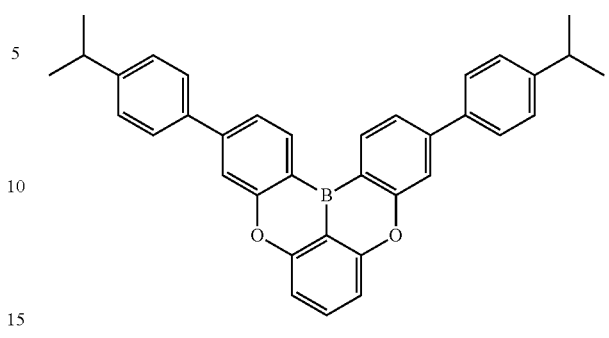
Dopant 178
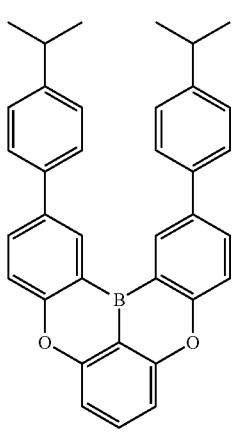
Dopant 179
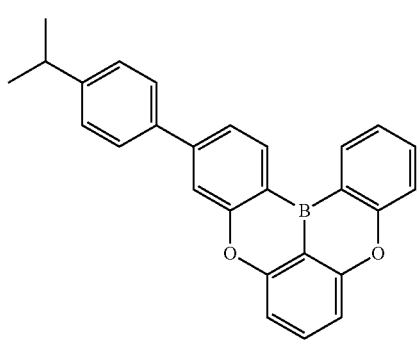
Dopant 180
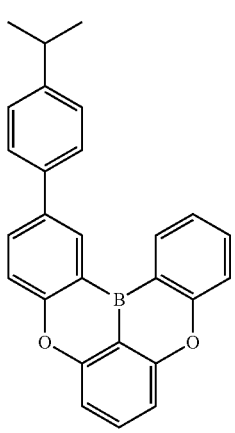

-continued
Dopant 181
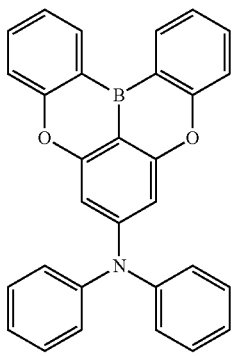
Dopant 182
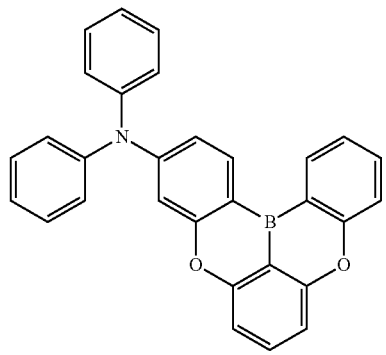
Dopant 183
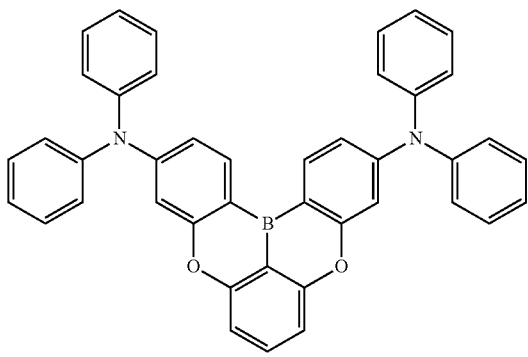
Dopant 184
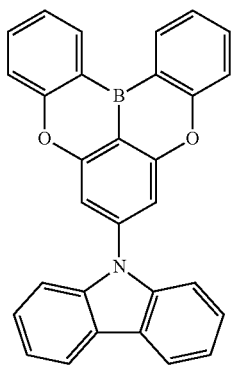
Dopant 185
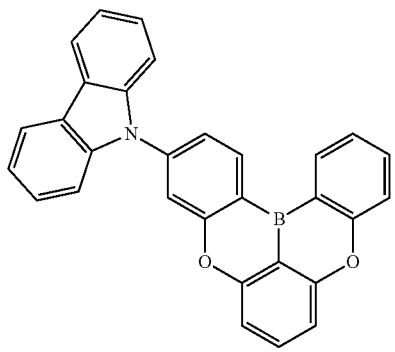
Dopant 186
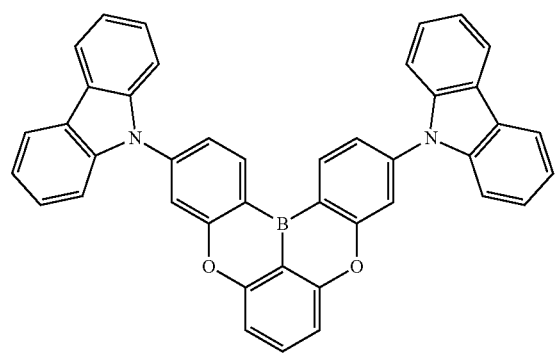
Dopant 187
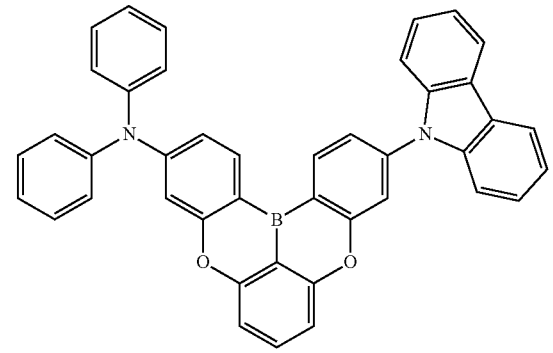
Dopant 188
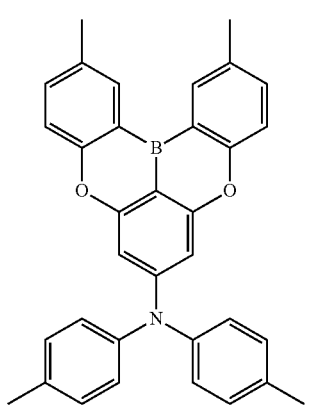

-continued
Dopant 189
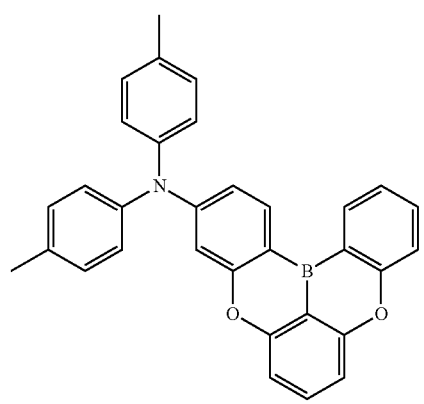
Dopant 190
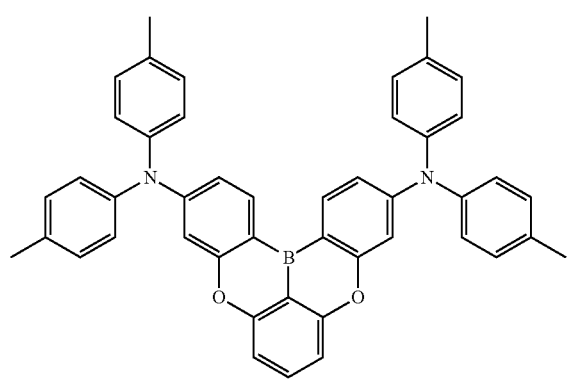
Dopant 191
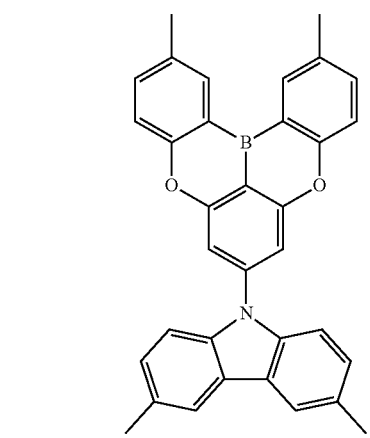
Dopant 192
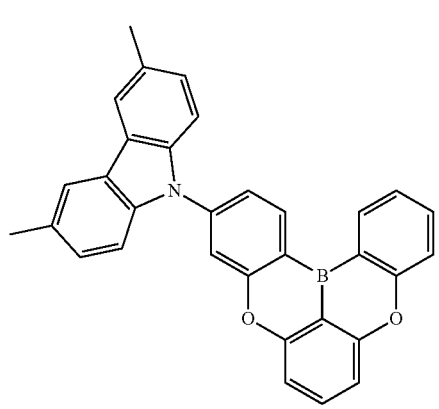
-continued
Dopant 193
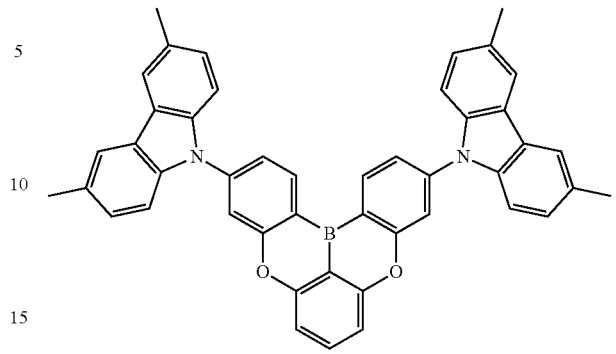
Dopant 194
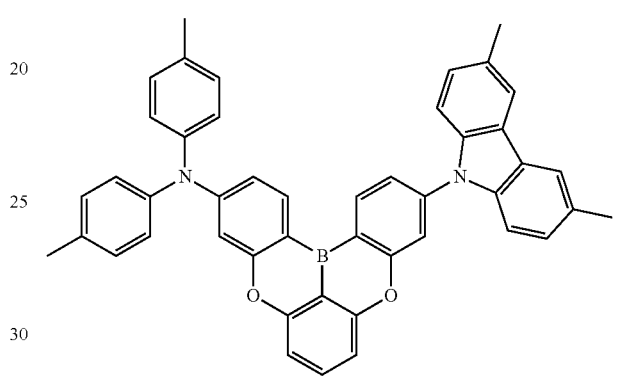
Dopant 195
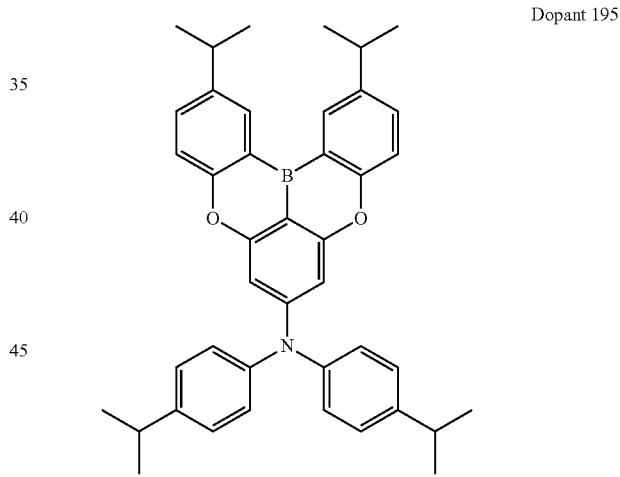
Dopant 196
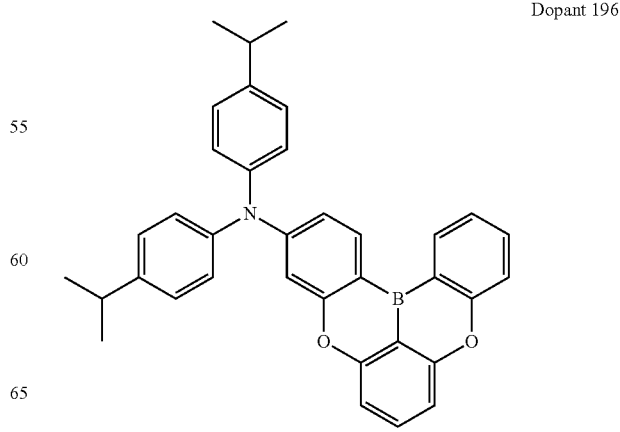

Dopant 197
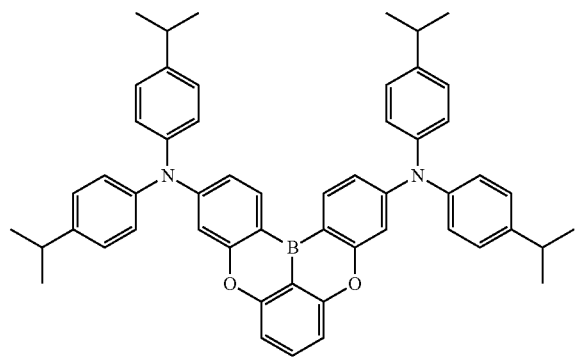
Dopant 198
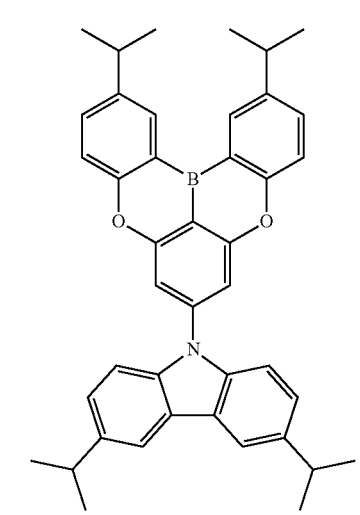
Dopant 199
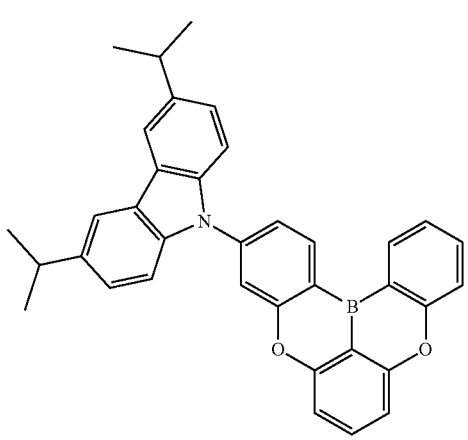
Dopant 200
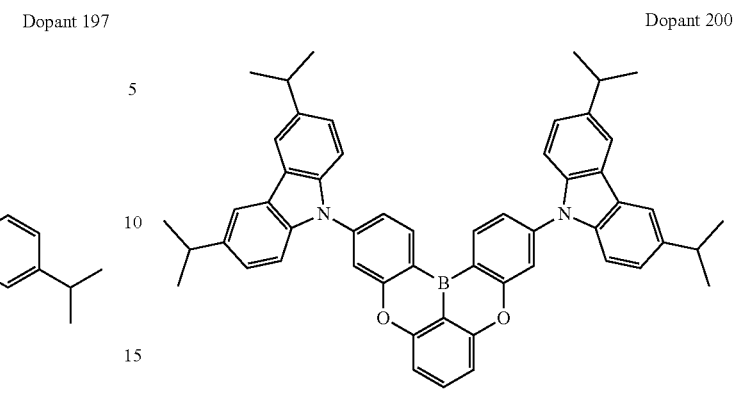
Dopant 201
Dopant 202
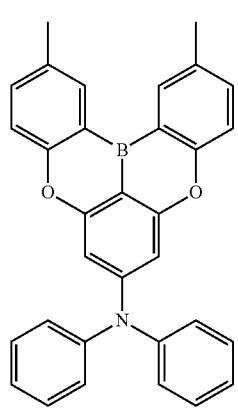
Dopant 203
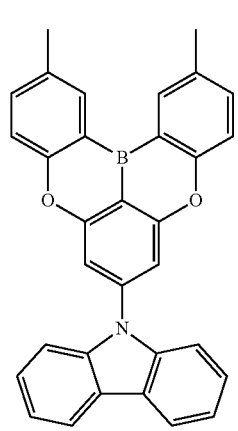

-continued
Dopant 204
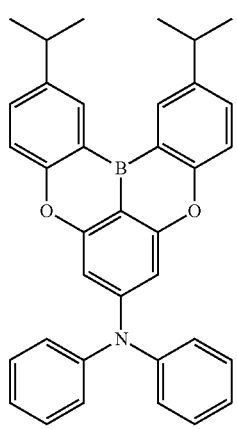
Dopant 205
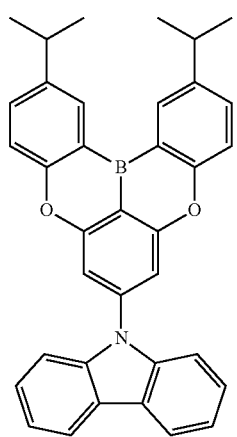
Dopant 206
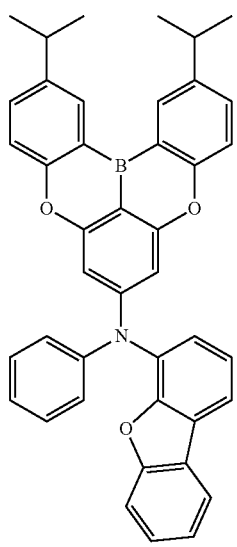
-continued
Dopant 207
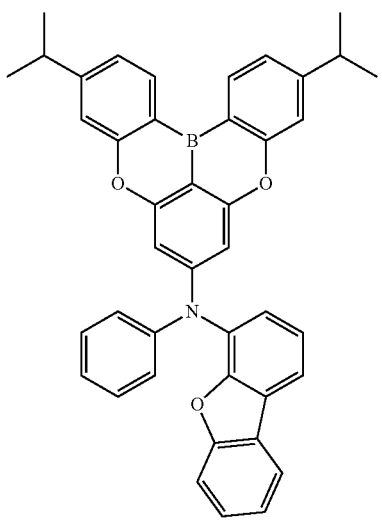
Dopant 208
Dopant 209
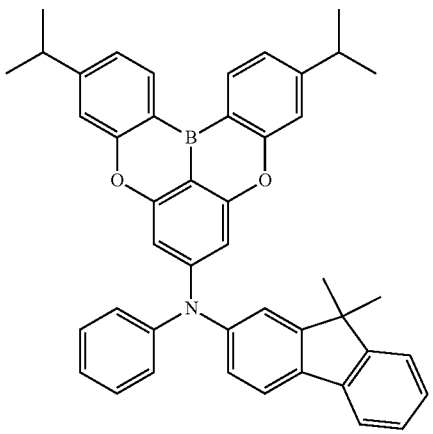

203
-continued
Dopant 210
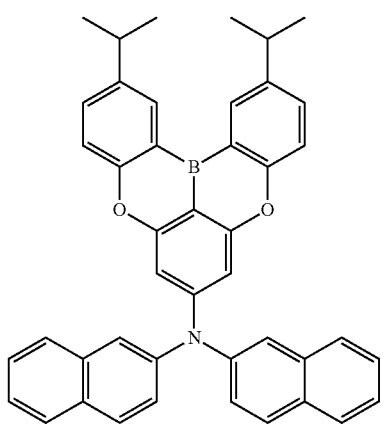
Dopant 211
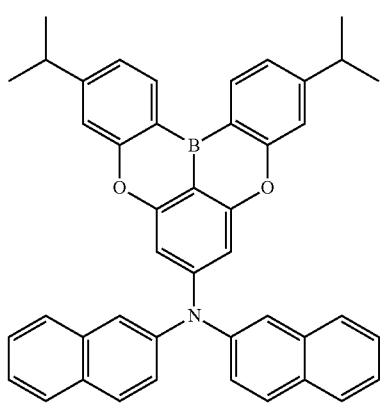
Dopant 212
204
-continued
Dopant 213
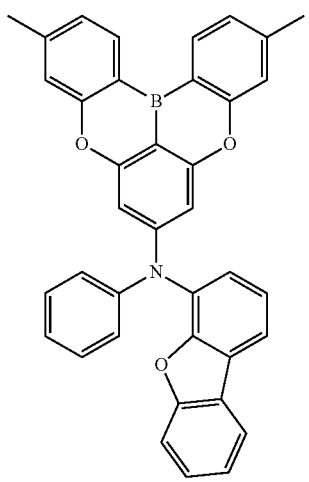
Dopant 214
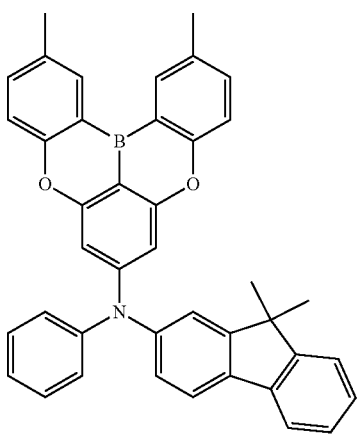
Dopant 215
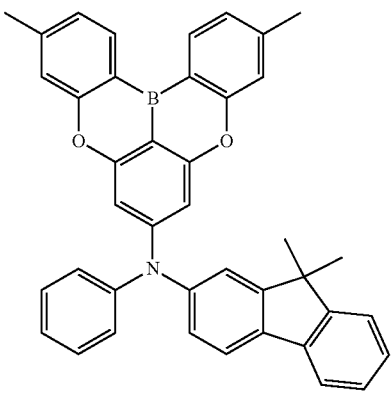

Dopant 216
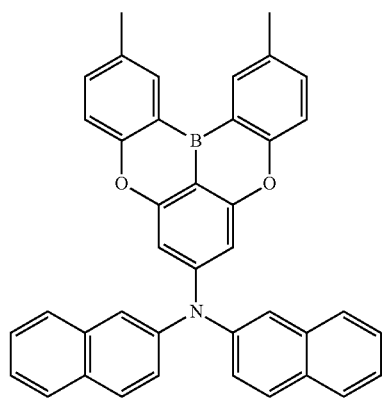
Dopant 217
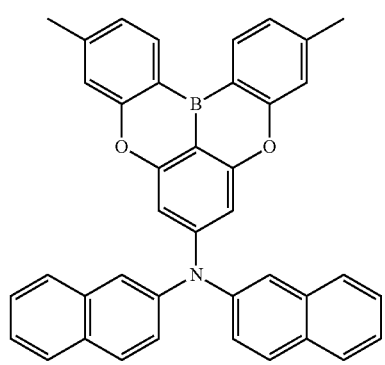
Dopant 218
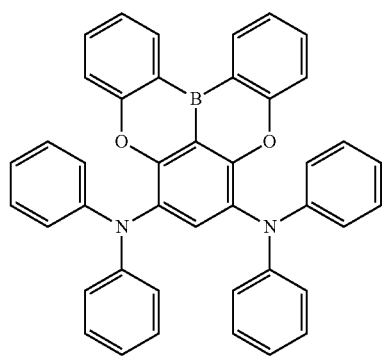
Dopant 219
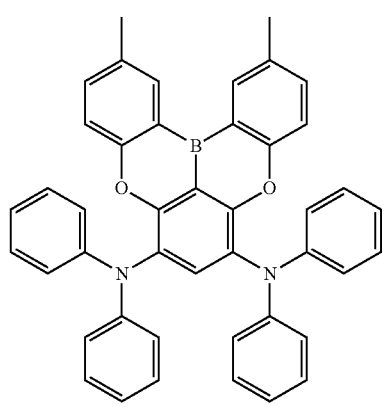
Dopant 220
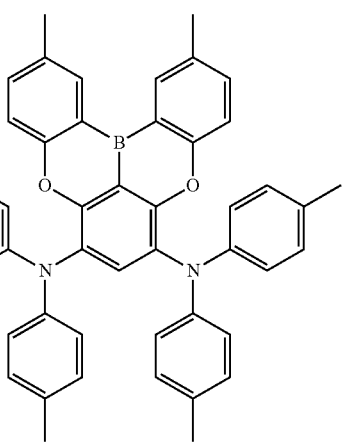
Dopant 221
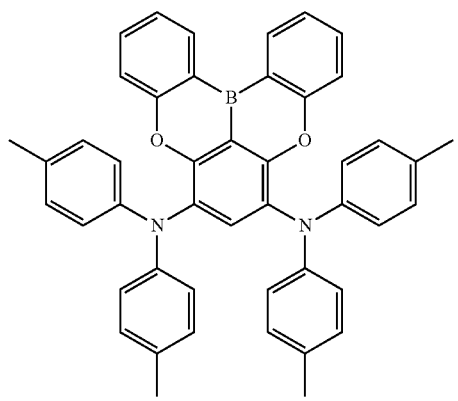
Dopant 222
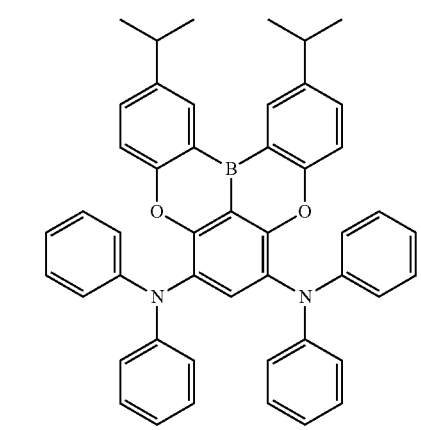

Dopant 223
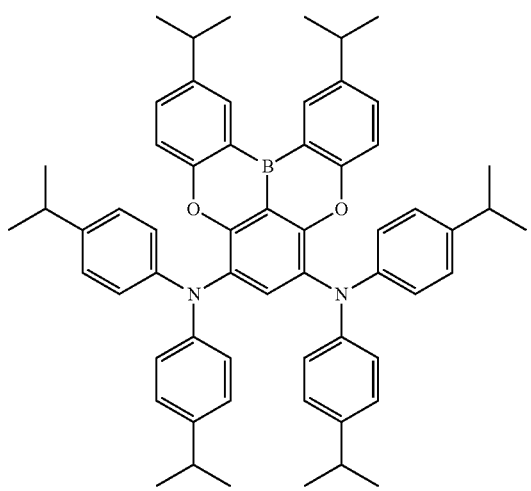
Dopant 224
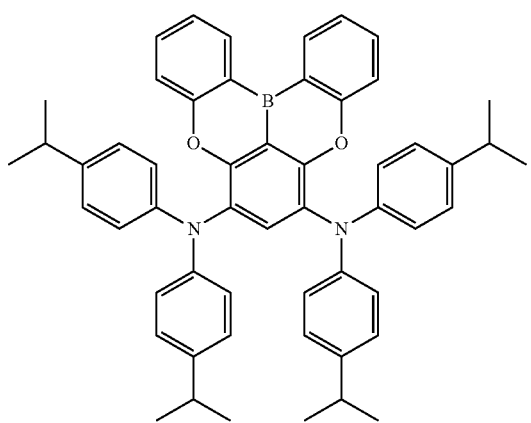
Dopant 225
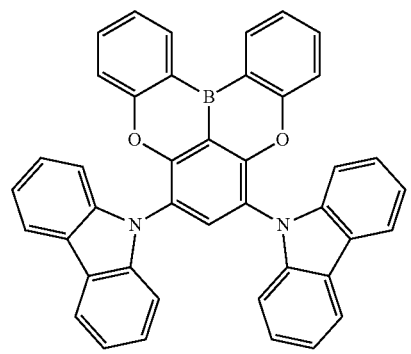
Dopant 226
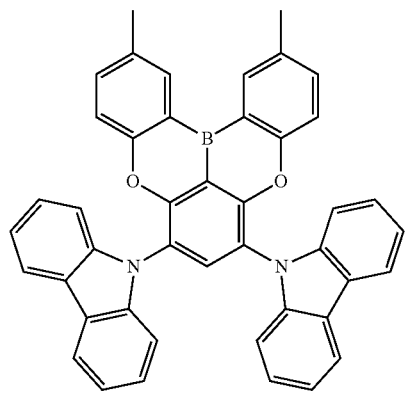
Dopant 227
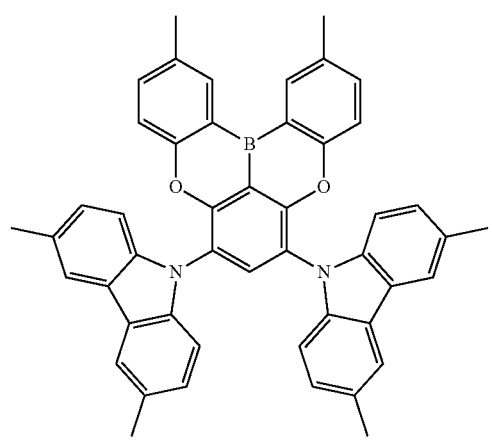
Dopant 228
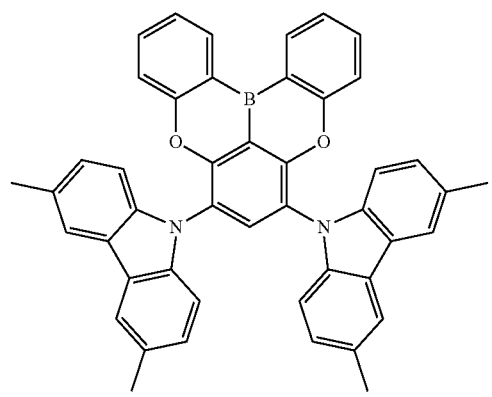

209
-continued
Dopant 229
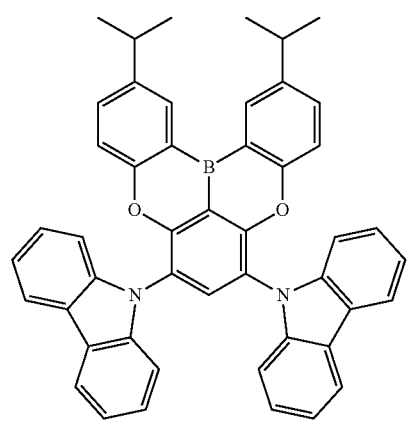
Dopant 230
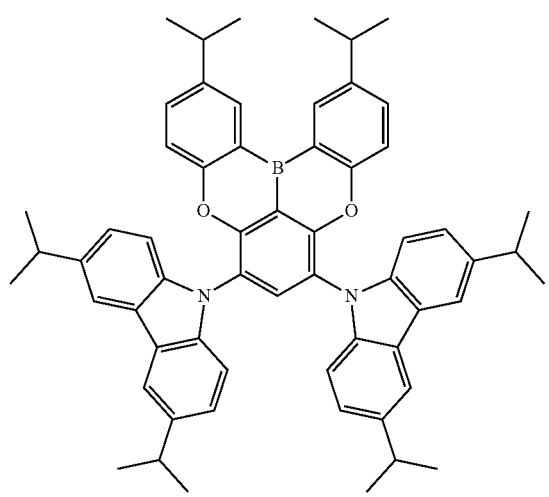
Dopant 231
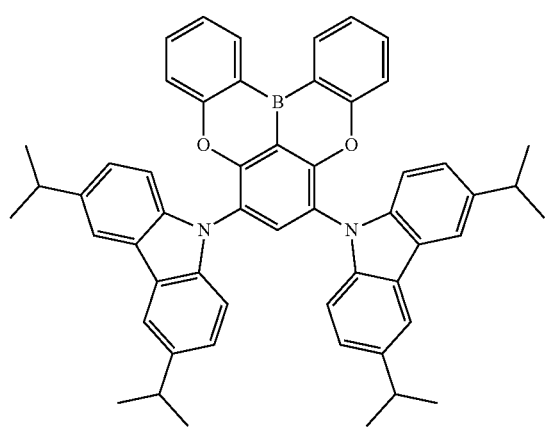
210
-continued
Dopant 232
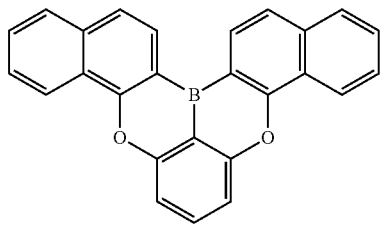
Dopant 233
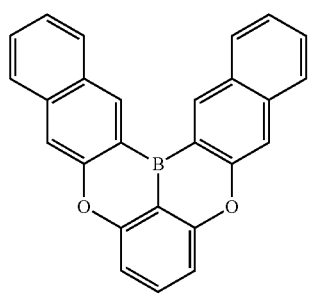
Dopant 234
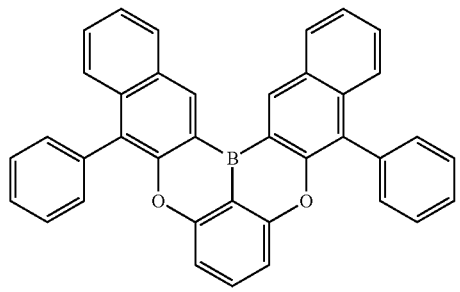
4. The organic light emitting diode of claim 1, wherein the amine-based compound having the structure of Chemical Formula 5 comprises an amine-based compound selected from the following compounds:
H1
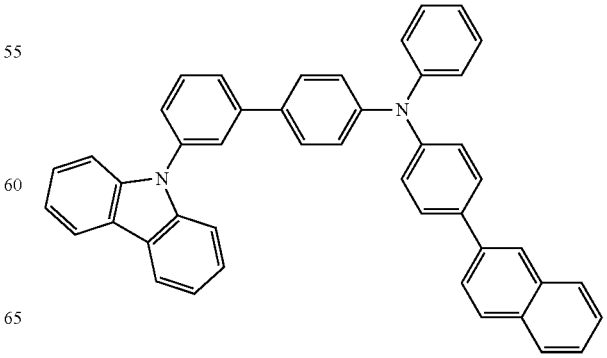

211
-continued
212
-continued
H3
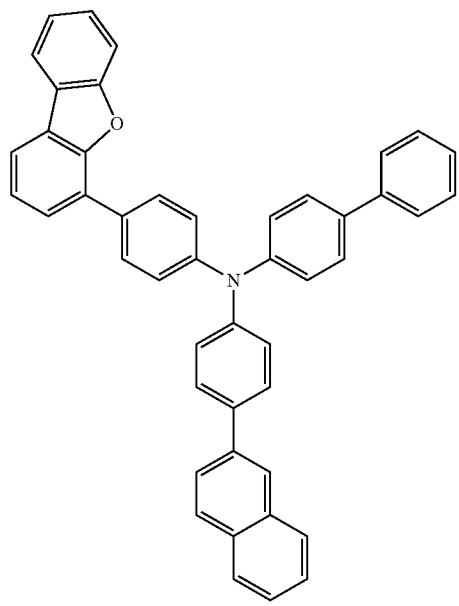
H9
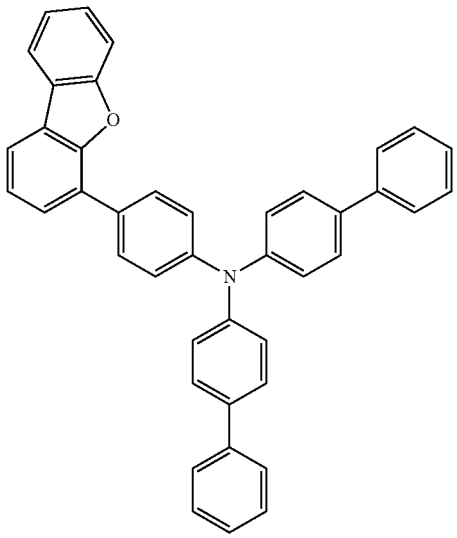
H4
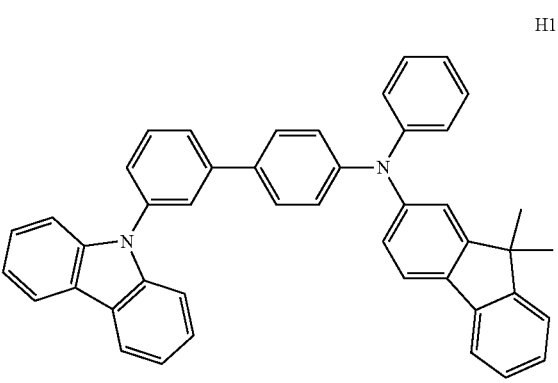
H10
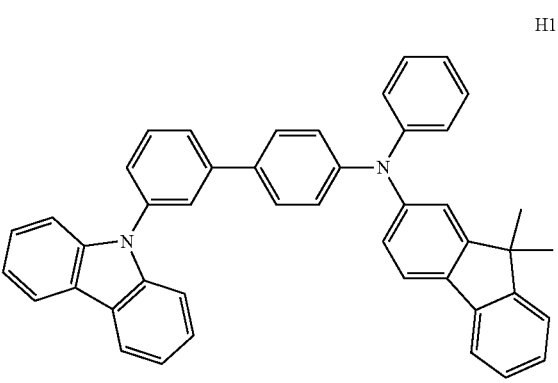
H6
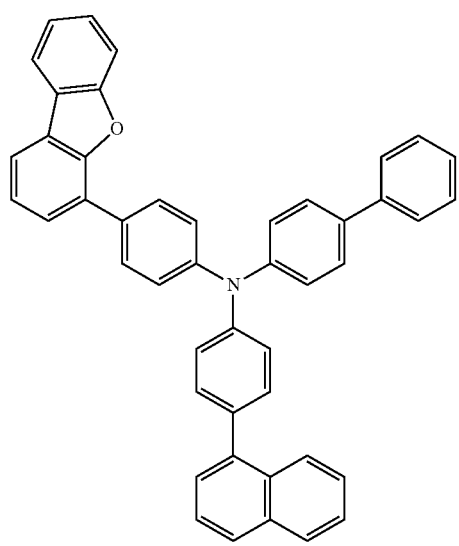
H11
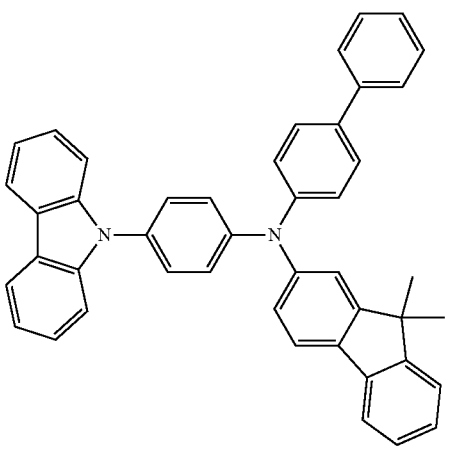

213
-continued
214
-continued
H12
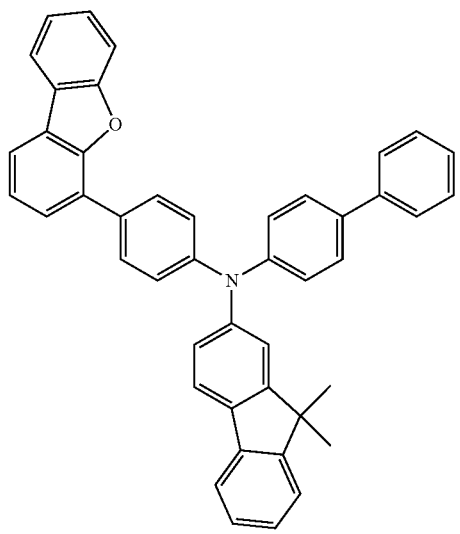
H15
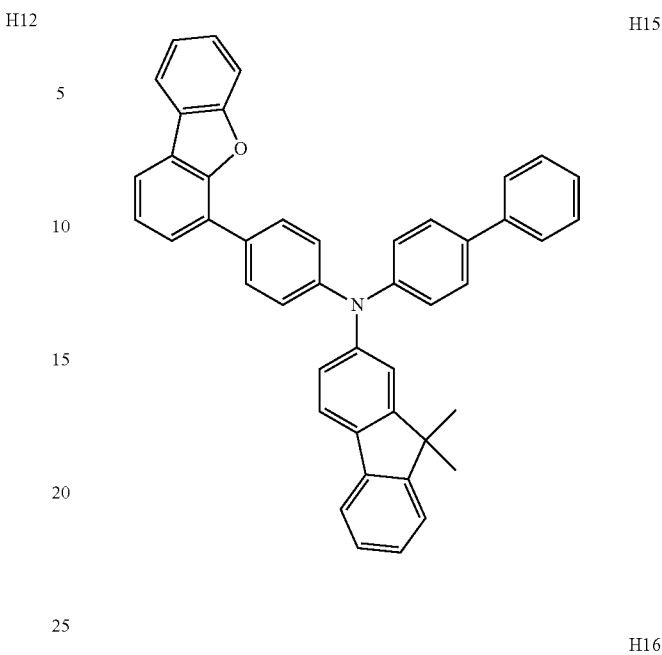
H13
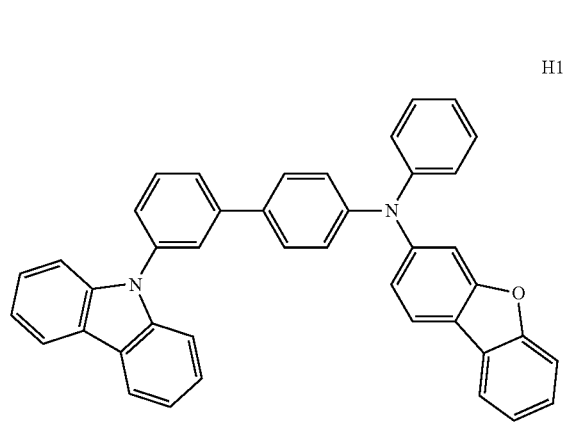
H16
H14
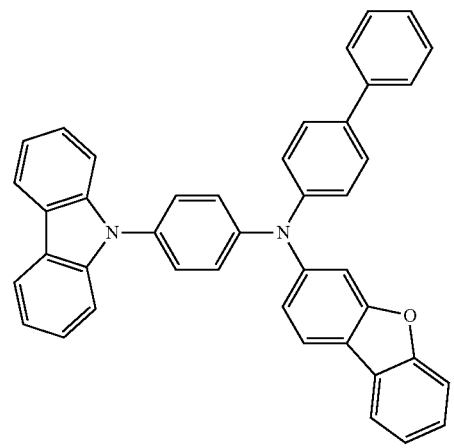
H17
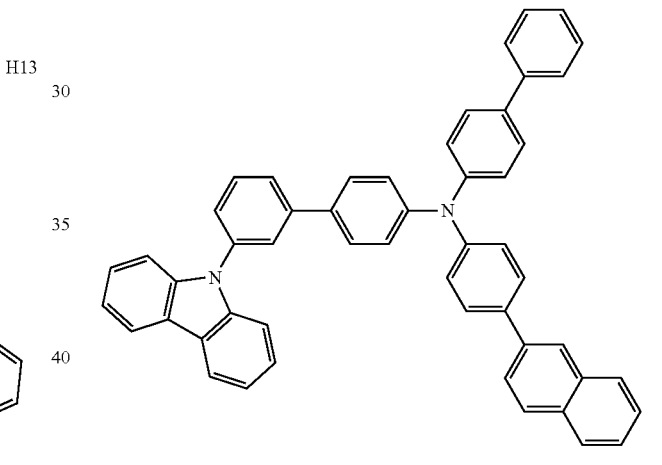
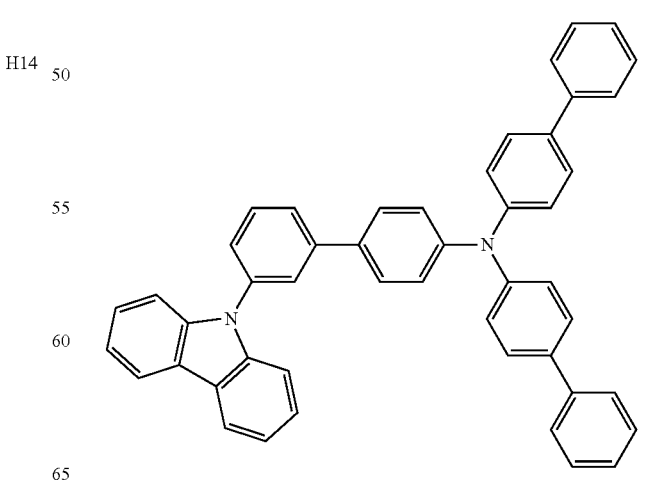

H18

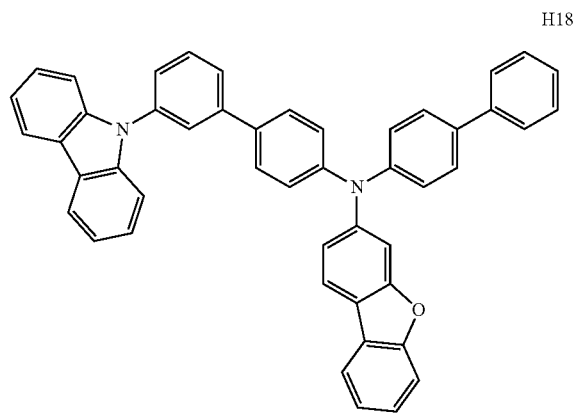

H22

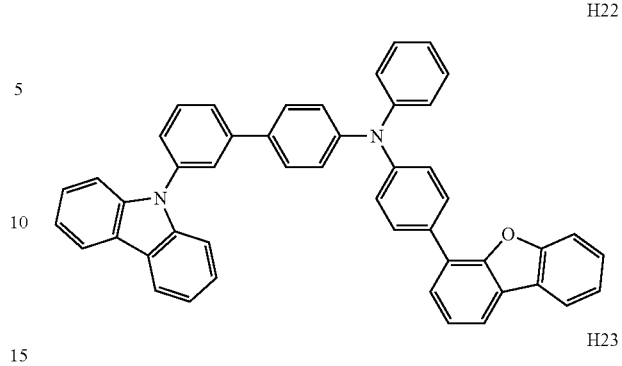

H19

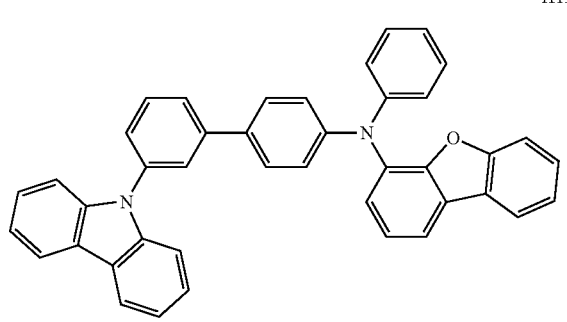

H23

H20

H24

H21

5. The organic light emitting diode of claim 1, further comprises a first hole blocking layer disposed between the first emitting material layer and the second electrode.

6. The organic emitting diode of claim 5, wherein the first hole blocking layer includes an azine-based compound having the following structure of Chemical Formula 7 or a benzimidazole-based compound having the following structure of Chemical Formula 9:

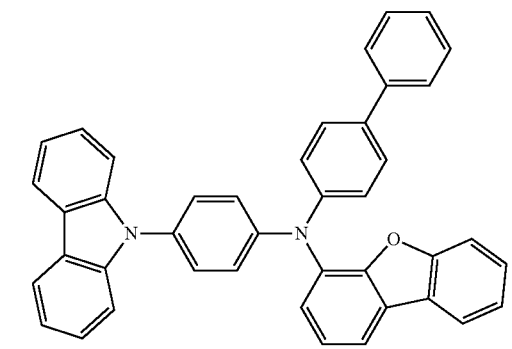

Chemical Formula 7

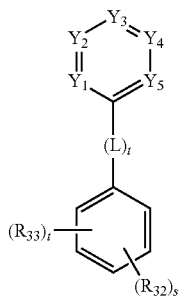

wherein each of $Y_1$ to $Y_5$ is independently $CR_{31}$ or nitrogen (N) and at least three among the Y1 to $Y_5$ is nitrogen, wherein $R_{31}$ is a $C_6$~$C_{30}$ aryl group; L is a $C_6$~$C_{30}$ arylene group; $R_{32}$ is a $C_6$~$C_{30}$ aryl group or a $C_5$~$C_{30}$ hetero aryl group; $R_{33}$ is hydrogen or two adjacent $R_{32}$ form a fused aromatic ring; r is 0 (zero) or 1, s is 1 or 2 and t is an integer of 0 (zero) to 4;

Chemical Formula 9

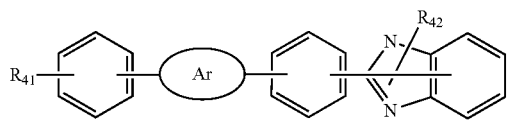

wherein Ar is a $C_{10}$~$C_{30}$ arylene group; $R_{41}$ is a $C_6$~$C_{30}$ aryl group or a $C_5$~$C_{30}$ hetero aryl group; and $R_{42}$ is a $C_1$~$C_{10}$ alkyl group or a $C_6$~$C_{30}$ aryl group.

7. The organic light emitting diode of claim 6, wherein the azine-based compound comprises an azine-based compound selected from the following compounds:

E1

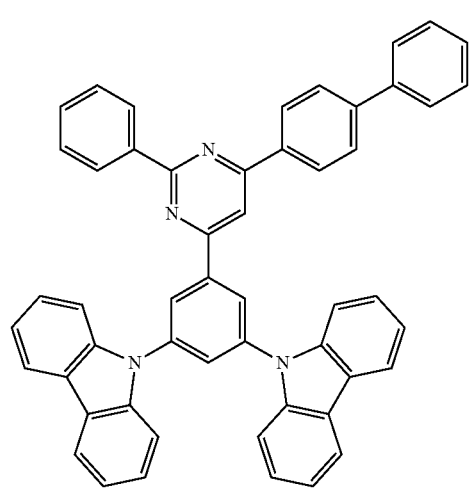

E2

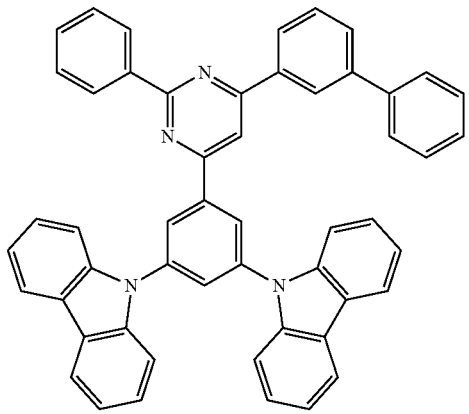

E3

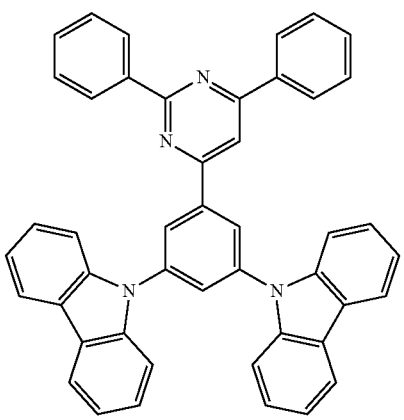

E4

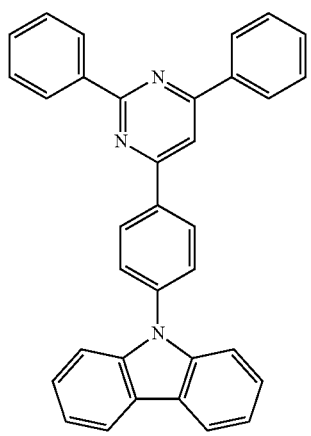

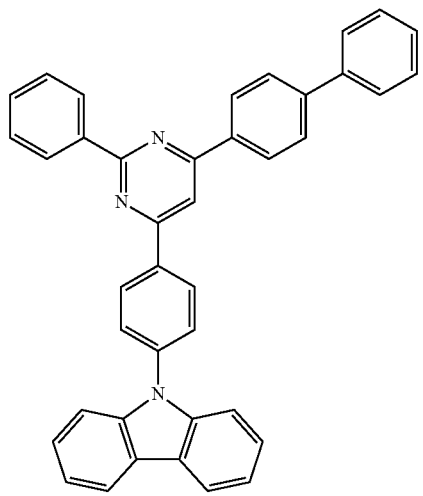
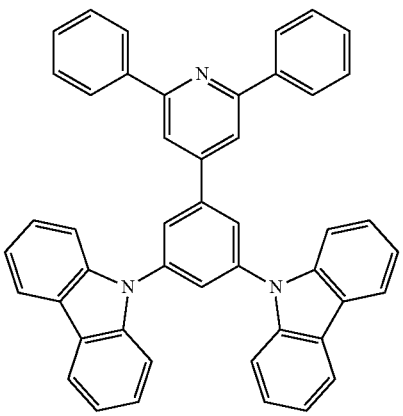

-continued
E11
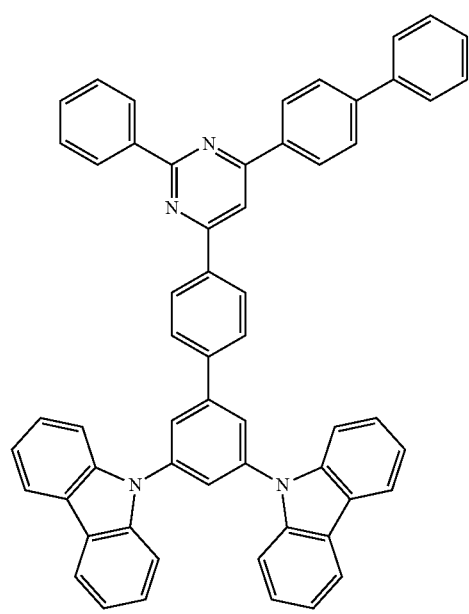
E12
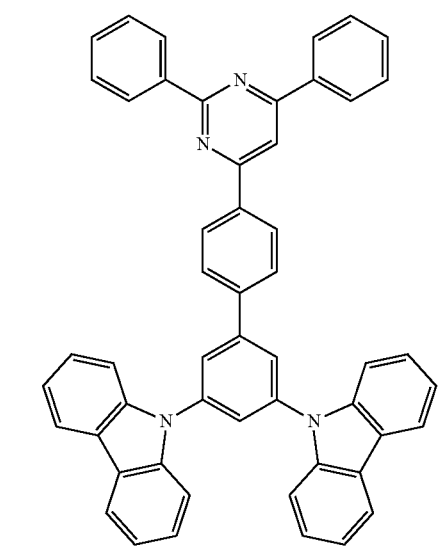
-continued
E13
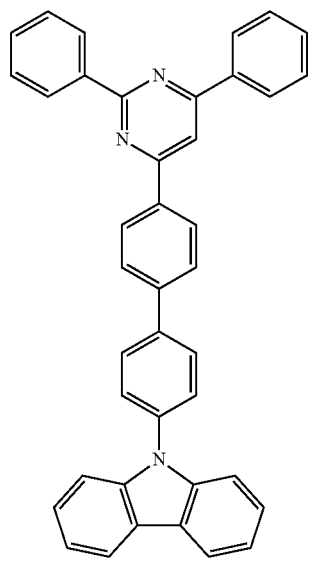
E14
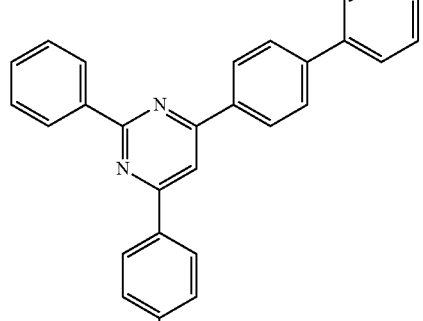
E15
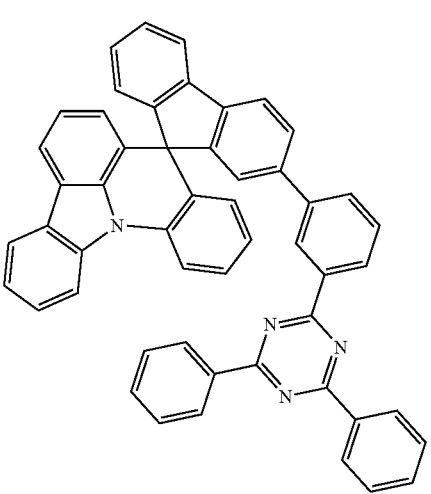

E16
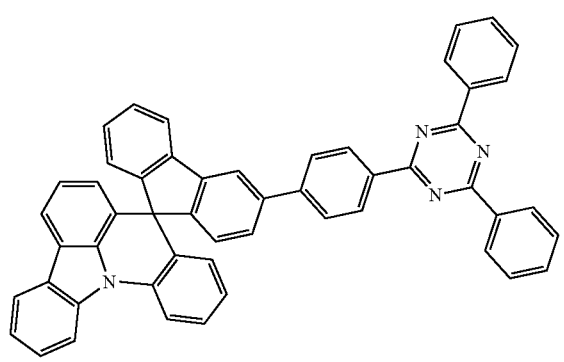
E19
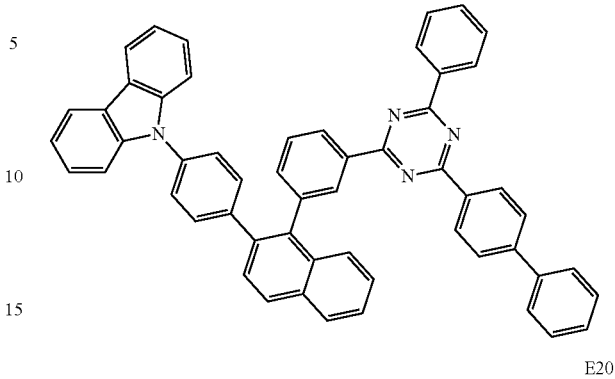
E17
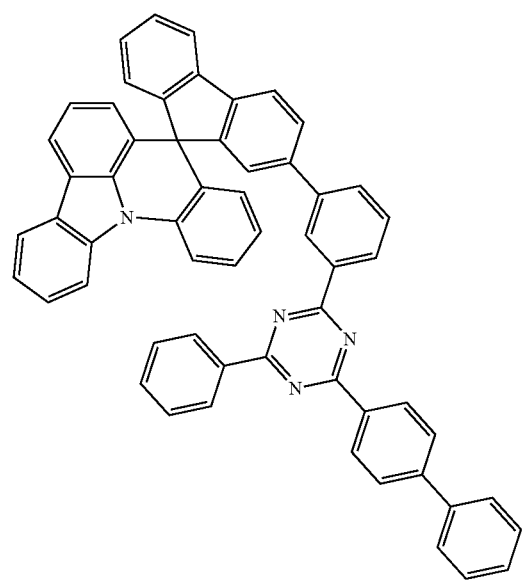
E20
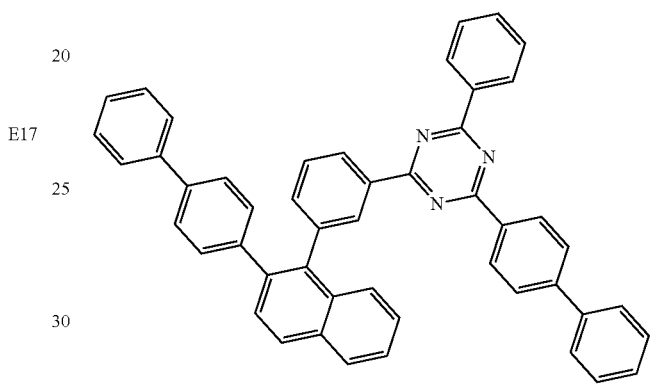
E21
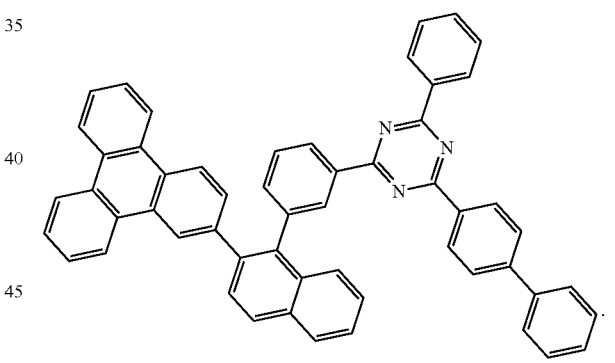
E18
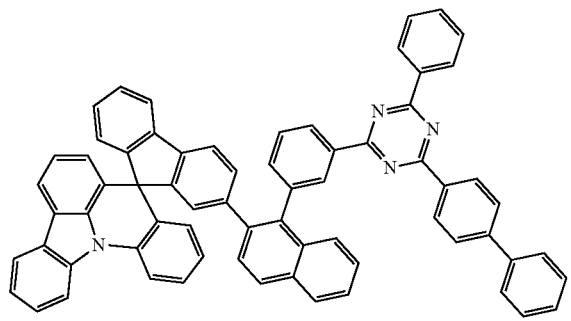
8. The organic light emitting diode of claim 6, wherein the benzimidazole-based compound is selected from one of the following compounds:
F1
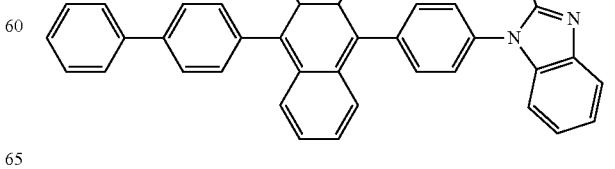

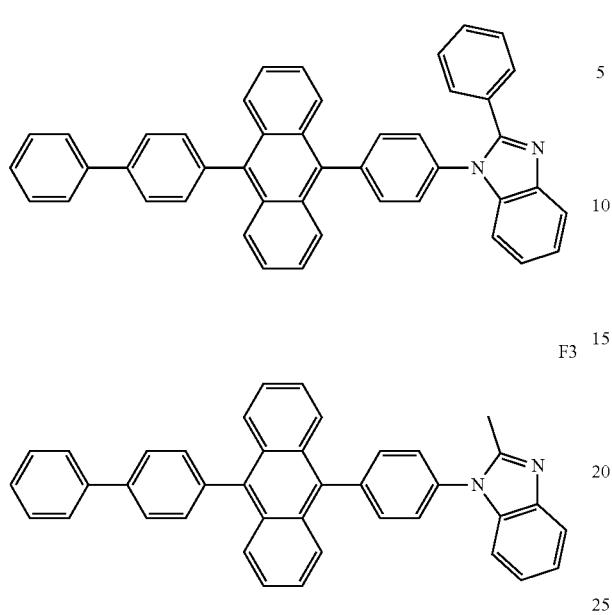

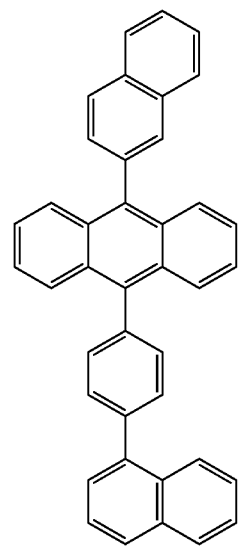

Host 2

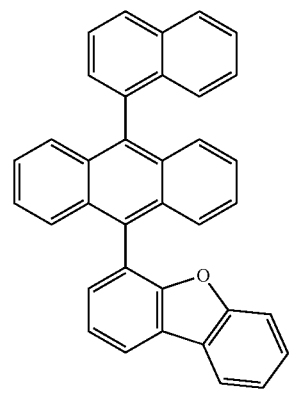

Host 3

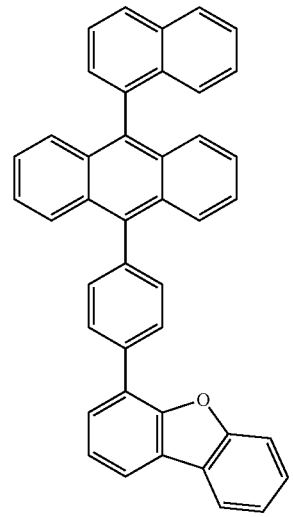

Host 4

9. The organic light emitting diode of claim 2, further comprises a second emitting unit disposed between the first emitting unit and the second electrode and including a second emitting material layer, and a first charge generation layer disposed between the first and second emitting units, and wherein at least one of the first and second emitting material layers includes the host selected from one of the following compounds:

-continued
Host 5
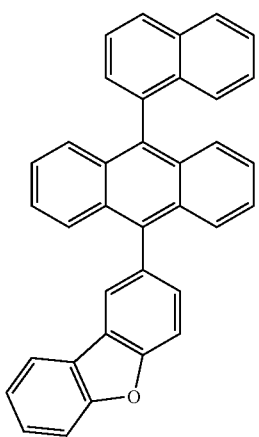
Host 6
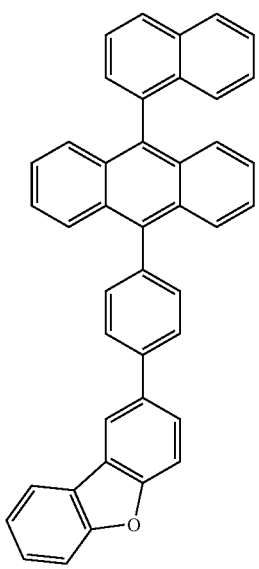
Host 7
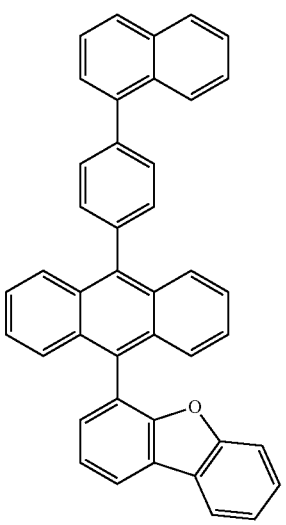
-continued
Host 8
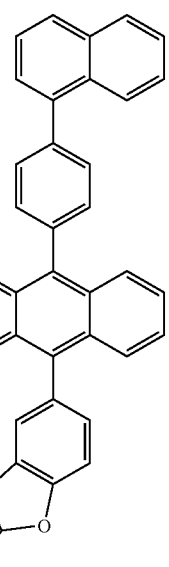
Host 9
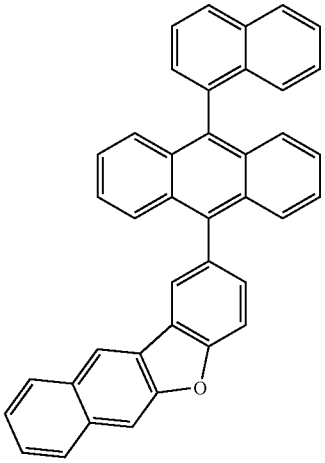
Host 10
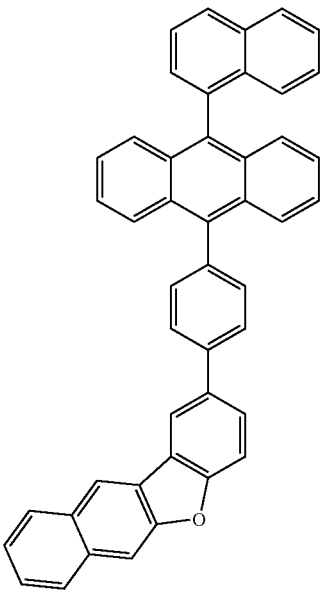

Host 13
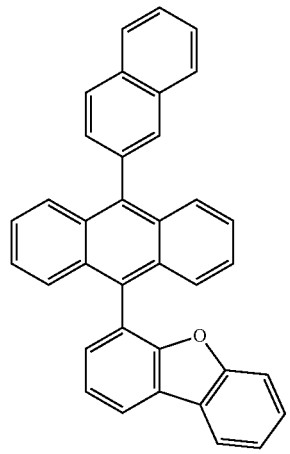
Host 14
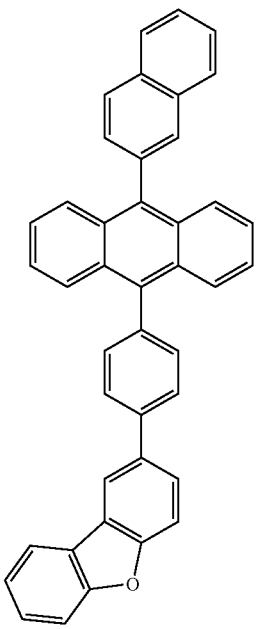
Host 15
Host 16
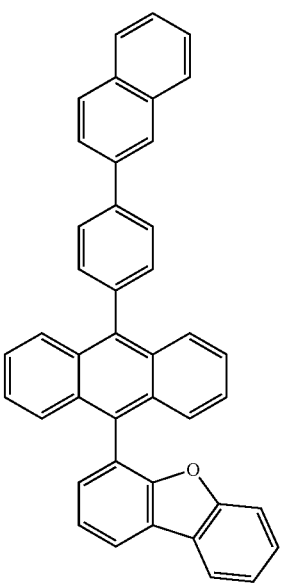
Host 17

Host 18
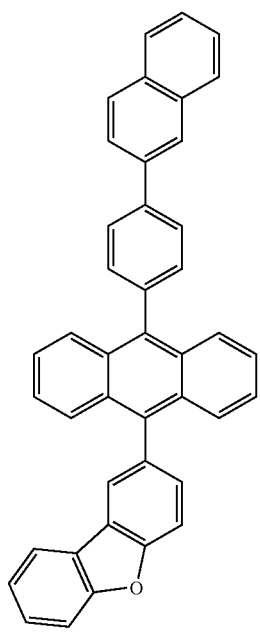
Host 19
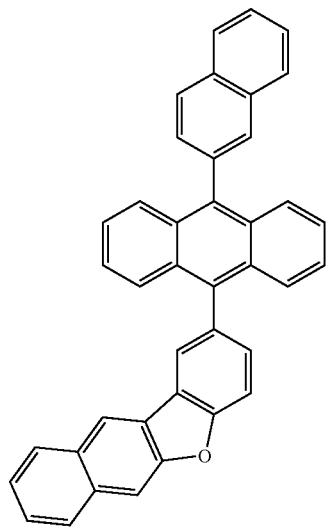
Host 20
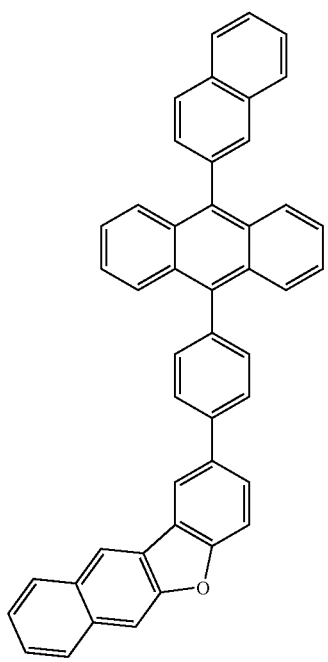
Host 21
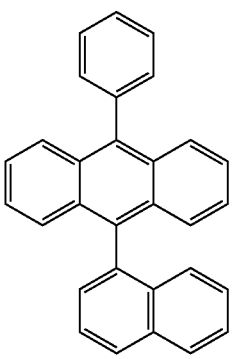
Host 22
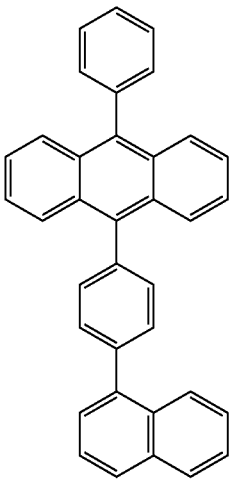

Host 23
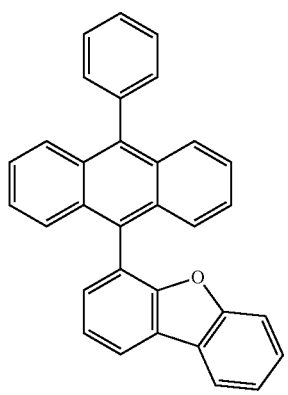
Host 24
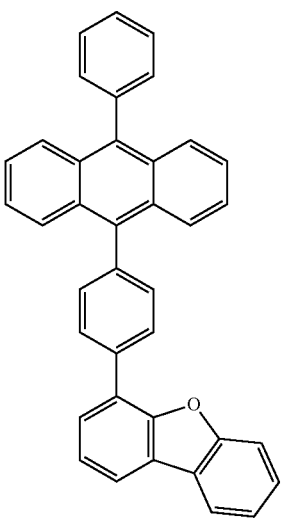
Host 25
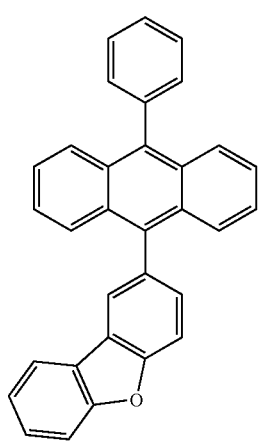
Host 26
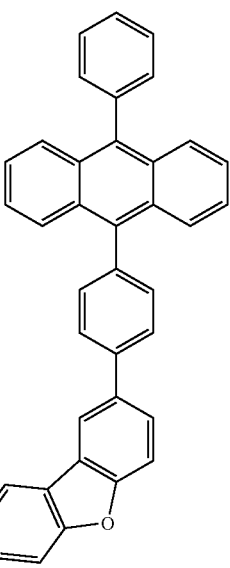
Host 27
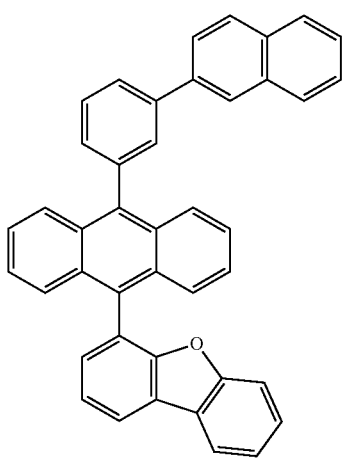
Host 28
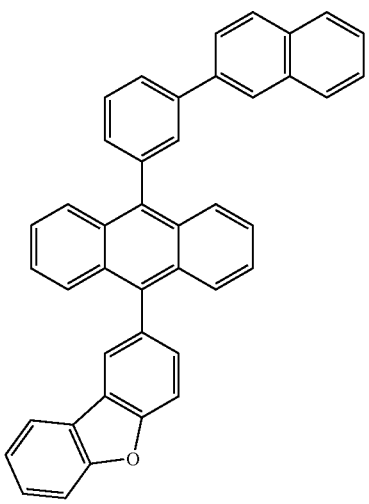

Host 29

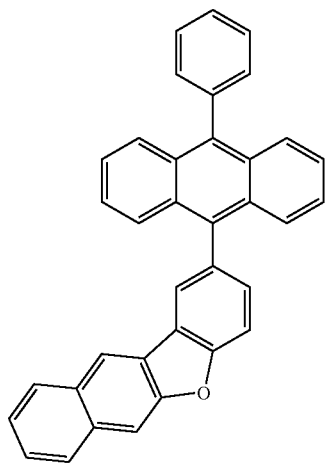

Host 30

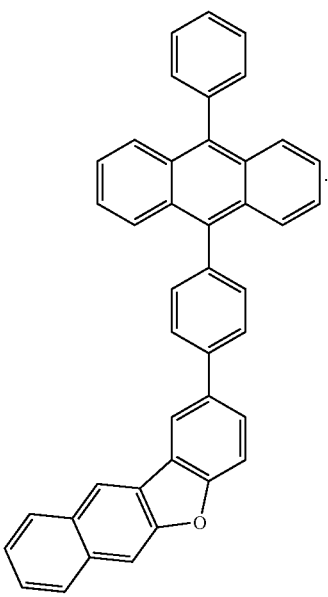

10. The organic light emitting diode of claim 9, wherein the second emitting unit further comprises a second electron blocking layer disposed between the first charge generation layer and the second emitting material layer, and wherein the second electron blocking layer includes the amine-based compound having the structure of Chemical Formula 5.

11. The organic light emitting diode of claim 10, further comprises at least one hole blocking layer of a first hole blocking layer disposed between the first emitting material layer and the first charge generation layer and a second hole blocking layer disposed between the second emitting material layer and the second electrode.

12. The organic light emitting diode of claim 11, wherein the at least one hole blocking layer includes an azine-based compound having the following structure of Chemical Formula 7 or a benzimidazole-based compound having the following structure of Chemical Formula 9:

Chemical Formula 7 wherein each of $Y_1$ to $Y_5$ is independently $CR_{31}$ or nitrogen (N) and at least three among the Y1 to $Y_5$ is nitrogen, wherein $R_{31}$ is a $C_6$~$C_{30}$ aryl group; L is a $C_6$~$C_{30}$ arylene group; $R_{32}$ is a $C_6$~$C_{30}$ aryl group or a $C_5$~$C_{30}$ hetero aryl group; $R_{33}$ is hydrogen or two adjacent $R_{32}$ form a fused aromatic ring; r is 0 (zero) or 1, s is 1 or 2 and t is an integer of 0 (zero) to 4;

Chemical Formula 9 wherein Ar is a $C_{10}$~$C_{30}$ arylene group; $R_{41}$ is a $C_6$~$C_{30}$ aryl group or a $C_5$~$C_{30}$ hetero aryl group; and $R_{42}$ is a $C_1$~$C_{10}$ alkyl group or a $C_6$~$C_{30}$ aryl group.

13. The organic light emitting diode of claim 9, wherein the second emitting material layer emits yellow-green color light.

14. The organic light emitting diode of claim 9, wherein the second emitting material layer emits red-green color light.

15. The organic light emitting diode of claim 9, further comprises a third emitting unit disposed between the second emitting unit and the second electrode and including a third emitting material layer, and a second charge generation layer disposed between the second and third emitting units, and wherein at least one of the first to third emitting material layers includes the host having the structure of Chemical Formula 1 and the dopant having the structure of Chemical Formula 3.

16. The organic light emitting diode of claim 15, the third emitting unit further comprises a third electron blocking layer disposed between the second charge generation layer and the third emitting material layer, and wherein the third electron blocking layer includes the amine-based compound having the structure of Chemical Formula 5.

17. The organic light emitting diode of claim 16, further comprises at least one hole blocking layer of a first hole blocking layer disposed between the first emitting material layer and the first charge generation layer, a second hole blocking layer disposed between the second emitting material layer and the second charge generation layer and a third hole blocking layer disposed between the third emitting material layer and the second electrode.

18. The organic light emitting diode of claim 17, wherein the hole blocking layer includes an azine-based compound having the following structure of Chemical Formula 7 or a benzimidazole-based compound having the following structure of Chemical Formula 9:

Chemical Formula 7

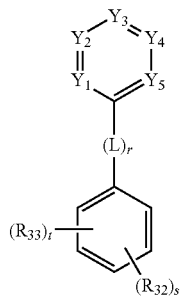

wherein each of $Y_1$ to $Y_5$ is independently $CR_{31}$ or nitrogen (N) and at least three among the Y1 to $Y_5$ is nitrogen, wherein $R_{31}$ is a $C_6$~$C_{30}$ aryl group; L is a $C_6$~$C_{30}$ arylene group; $R_{32}$ is a $C_6$~$C_{30}$ aryl group or a $C_5$~$C_{30}$ hetero aryl group; $R_{33}$ is hydrogen or two adjacent $R_{32}$ form a fused aromatic ring; r is 0 (zero) or 1, s is 1 or 2 and t is an integer of 0 (zero) to 4;

Chemical Formula 9

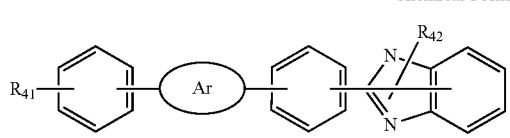

wherein Ar is a $C_{10}$~$C_{30}$ arylene group; $R_{41}$ is a $C_6$~$C_{30}$ aryl group or a $C_5$~$C_{30}$ hetero aryl group; and $R_{42}$ is a $C_1$~$C_{10}$ alkyl group or a $C_6$~$C_{30}$ aryl group.

19. An organic light emitting device, comprising:
a substrate; and
an organic light emitting diode including a first electrode, a second electrode facing the first electrode and a first emitting unit including a first emitting material layer disposed between the first and second electrodes and a first electron blocking layer disposed between the first electrode and the first emitting material layer, and disposed over the substrate,
wherein the first emitting material layer includes a host having the following structure of Chemical Formula 1 and a dopant having the following structure of Chemical Formula 3, and the first electron blocking layer includes an amine-based compound having the following structure of Chemical Formula 5:

Chemical Formula 1

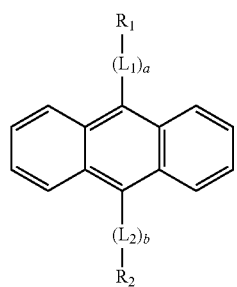

wherein each of $R_1$ and $R_2$ is independently a $C_6$~$C_{30}$ aryl group or a $C_5$~$C_{30}$ hetero aryl group; each of $L_1$ and $L_2$ is independently a $C_6$~$C_{30}$ arylene group; and each of a and b is an integer of 0 (zero) or 1, with the proviso that the host having the structure of Chemical Formula 1 is not the following:

Host 1

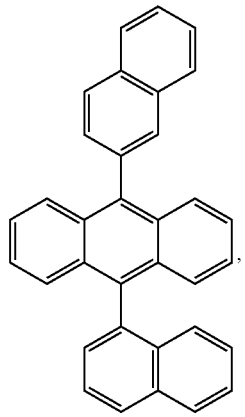

Host 11

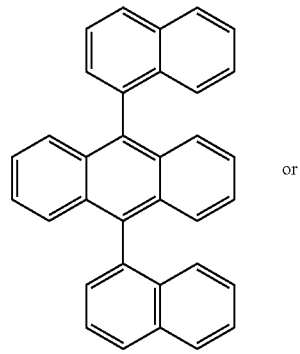

or

Host 12

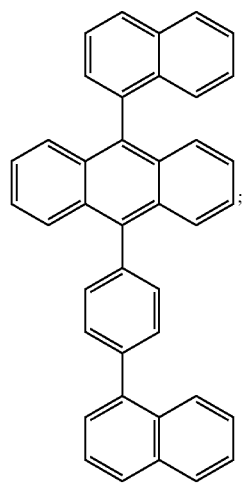

;

Chemical Formula 3

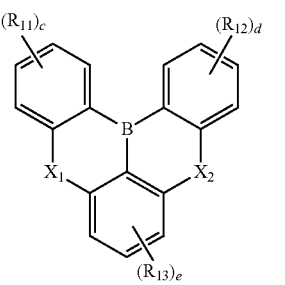

wherein each of $R_{11}$ and $R_{12}$ is independently a $C_1\sim C_{20}$ alkyl group, a $C_6\sim C_{30}$ aryl group, a $C_5\sim C_{30}$ hetero aryl group or a $C_6\sim C_{30}$ aryl amino group, or two adjacent groups among $R_{11}$ or two adjacent groups among $R_{12}$ form a fused aromatic or hetero aromatic ring; each of c and d is independently an integer of 0 (zero) to 4; $R_{13}$ is a $C_1\sim C_{10}$ alkyl group, a $C_6\sim C_{30}$ aryl group, a $C_5\sim C_{30}$ hetero aryl group or a $C_5\sim C_{30}$ aromatic amino group; e is an integer of 0 (zero) to 3; each of $X_1$ and $X_2$ is independently oxygen (O) or $NR_{14}$, wherein $R_{14}$ is a $C_6\sim C_{30}$ aryl group, with the proviso that the dopant having the structure of Chemical Formula 3 is not the following:

Dopant 1

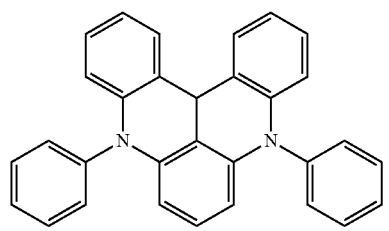

or

Dopant 36

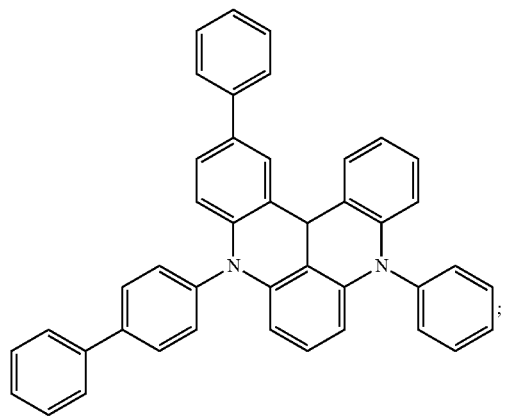

Chemical Formula 5

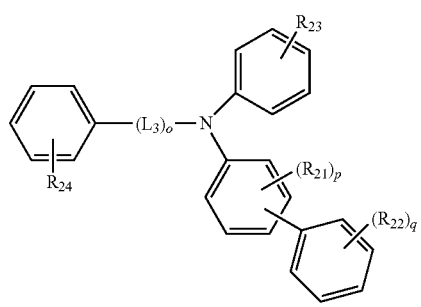

wherein $L_3$ is a $C_6\sim C_{30}$ arylene group; each of $R_{21}$ and $R_{22}$ is independently hydrogen or two adjacent groups among $R_{21}$ or $R_{22}$ form a fused aromatic ring; $R_{23}$ is hydrogen or a $C_6\sim C_{30}$ aryl group; $R_{24}$ is a $C_5\sim C_{30}$ hetero aryl group; o is 0 (zero) or 1; p is a number of a substituent and is an integer of 0 (zero) to 4; and q is a number of a substituent and is n integer of 0 (zero) to 4, with the proviso that the amine-based compound having the structure of Chemical Formula 5 is not the following:

H2

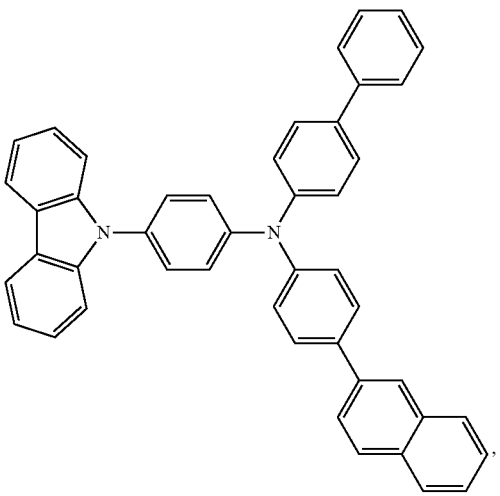

H5

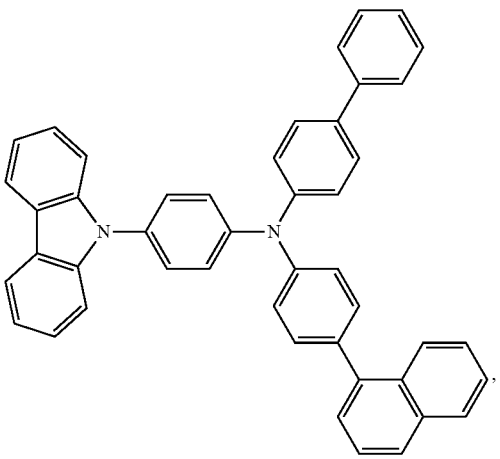

H7

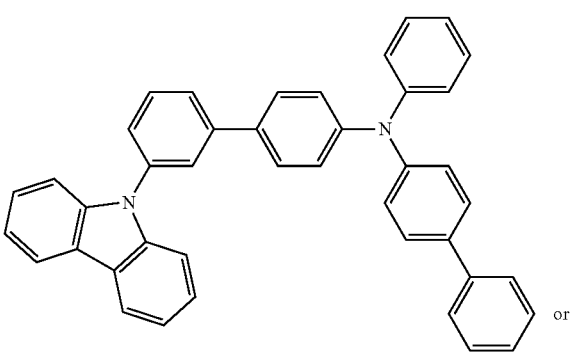

or

-continued
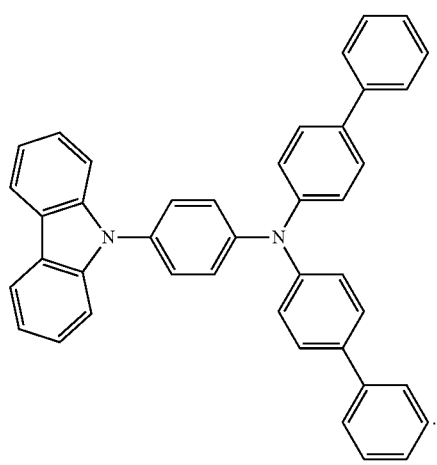
H8
20. The organic light emitting device of claim 19, wherein the host comprises an organic compound selected from the following compounds:
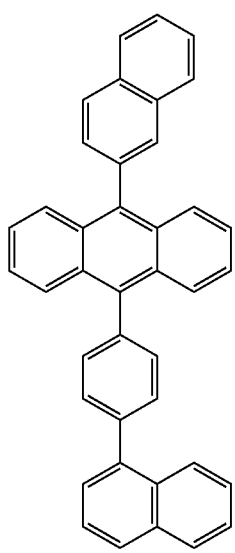
Host 2
-continued
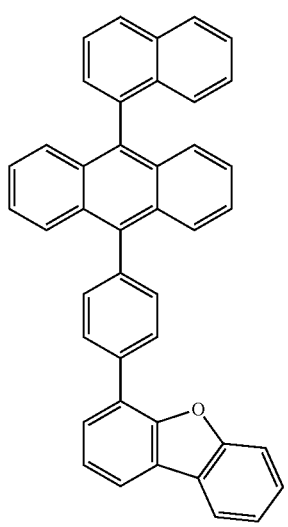
Host 4
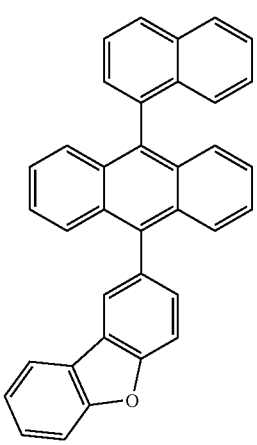
Host 5
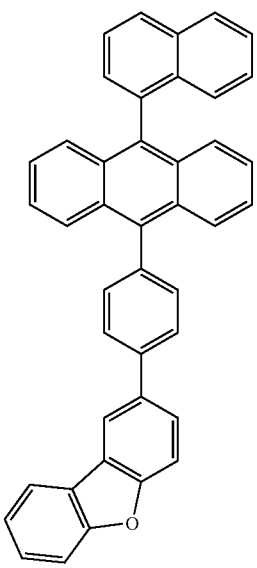
Host 6

-continued
Host 7
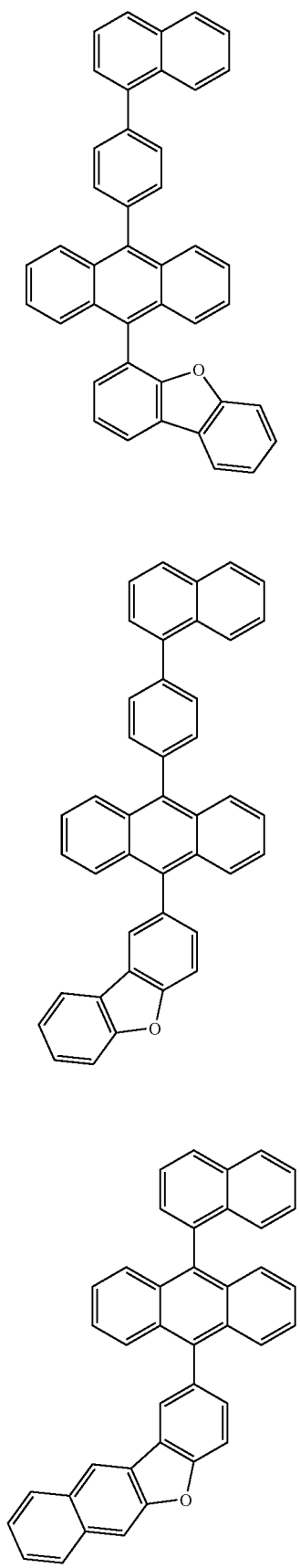
Host 8
Host 9
-continued
Host 10
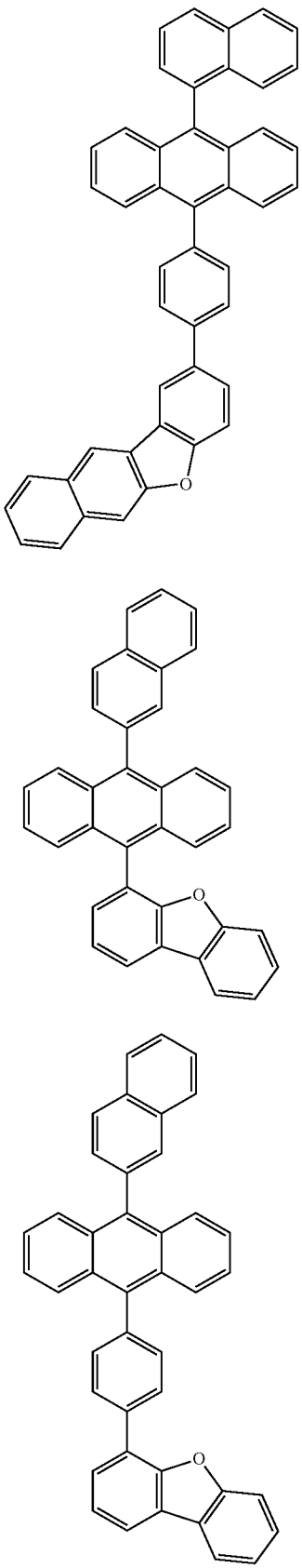
Host 13
Host 14

Host 15
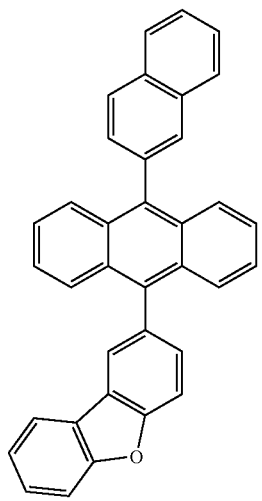
Host 16
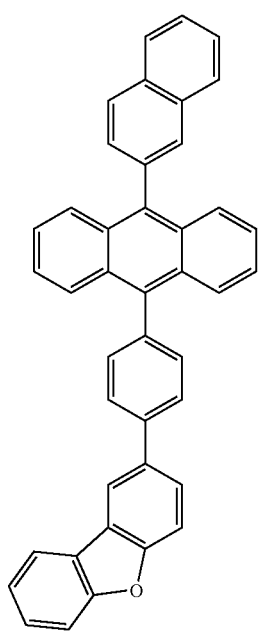
Host 17
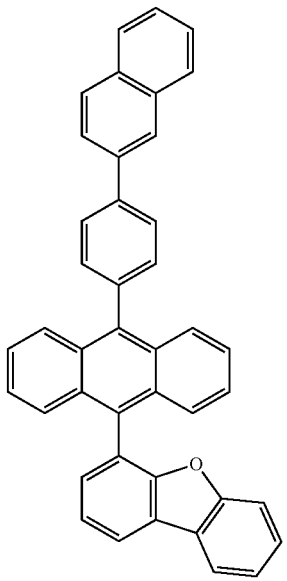
Host 18
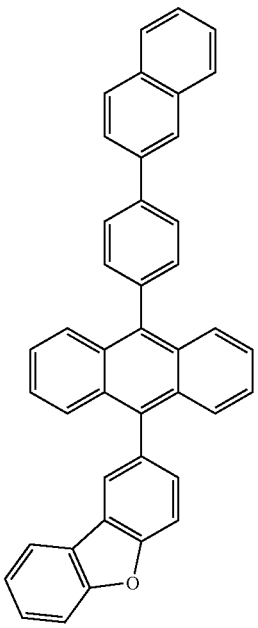

Host 19
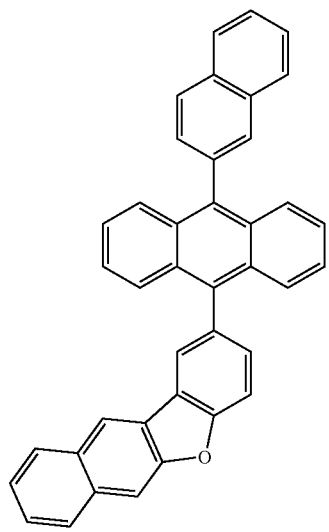
Host 20
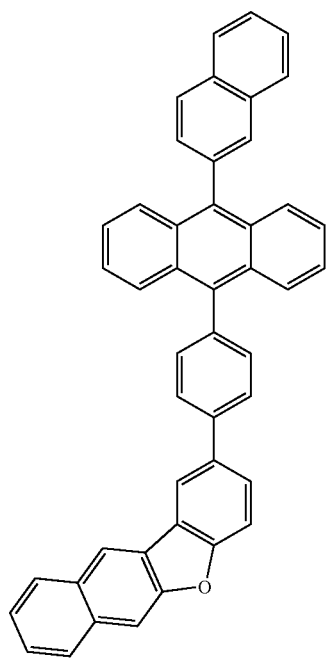
Host 21
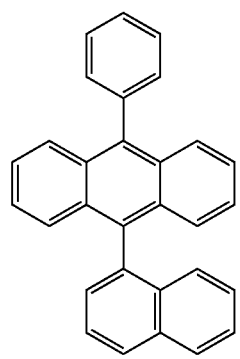
Host 22
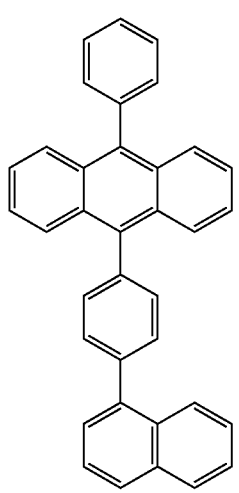
Host 23
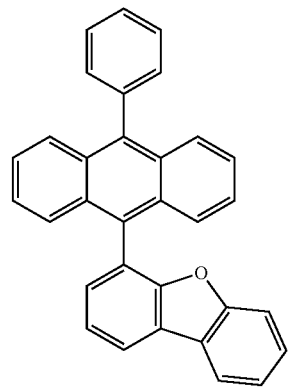
Host 24
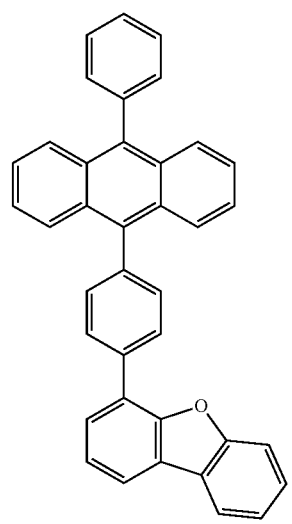

Host 25
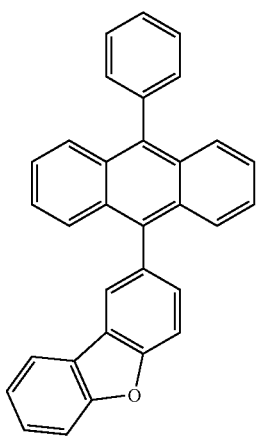
Host 26
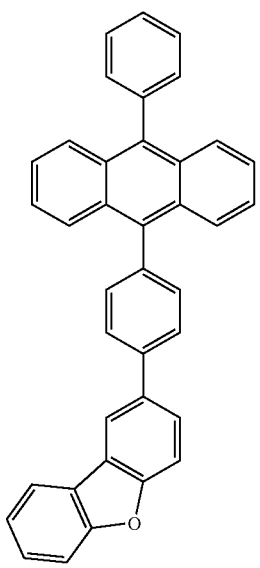
Host 27
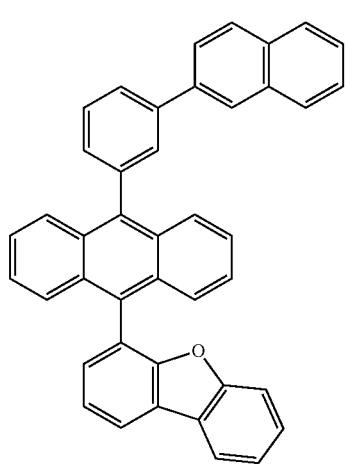
Host 28
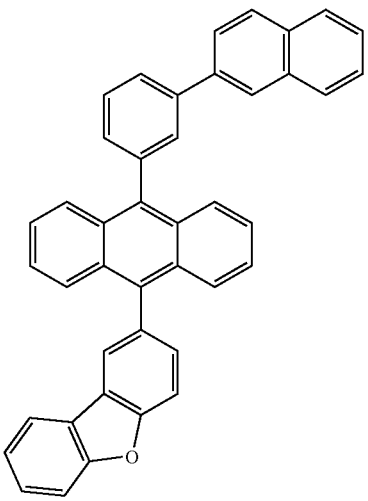
Host 29
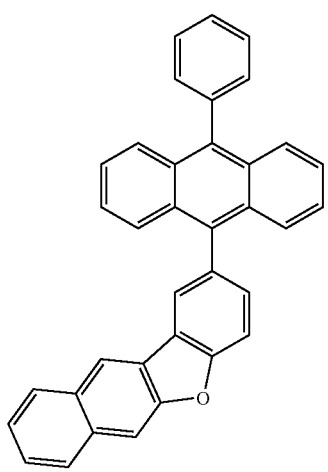
Host 30
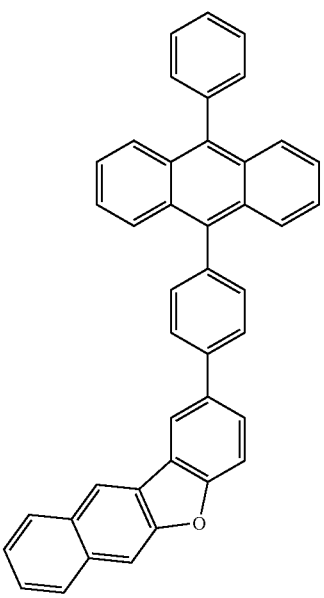
21. The organic light emitting device of claim 19, wherein the dopant comprises an organic compound selected from the following compounds:

Dopant 2
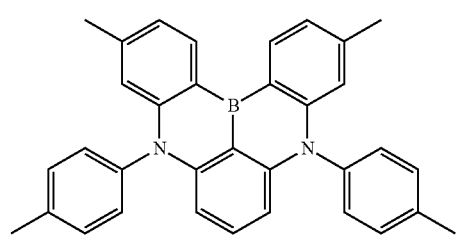
Dopant 3
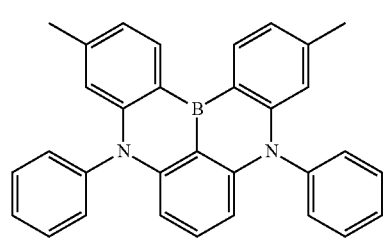
Dopant 4
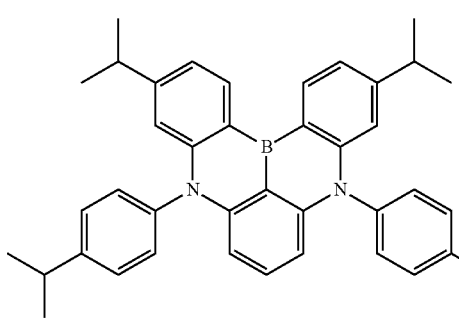
Dopant 5
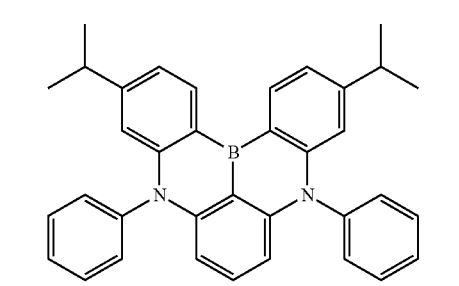
Dopant 6
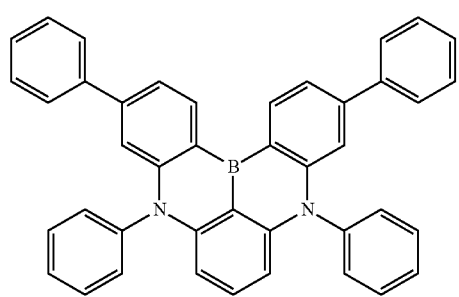
Dopant 7
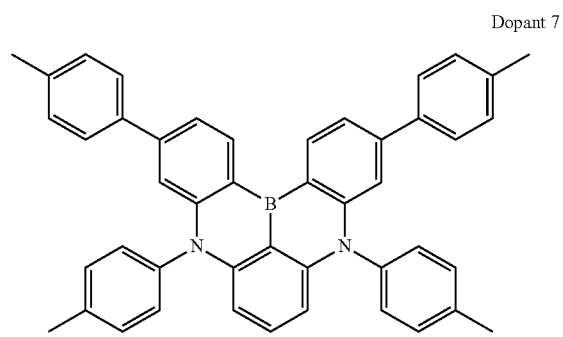
Dopant 8
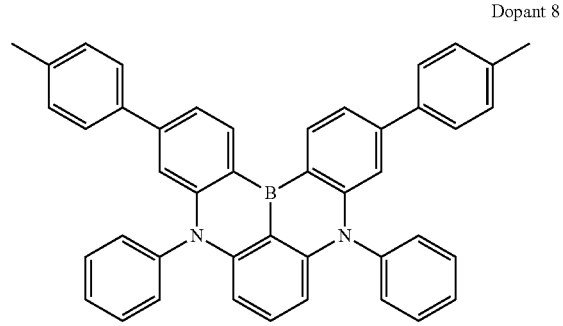
Dopant 9
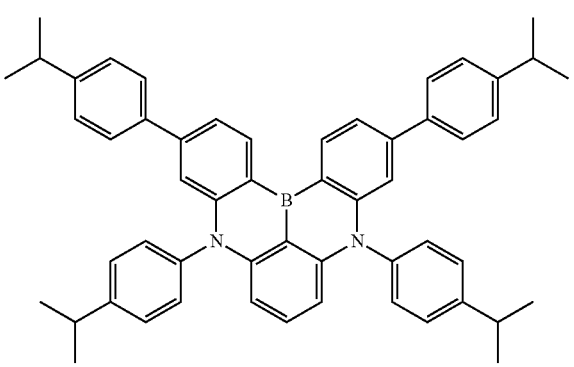
Dopant 10
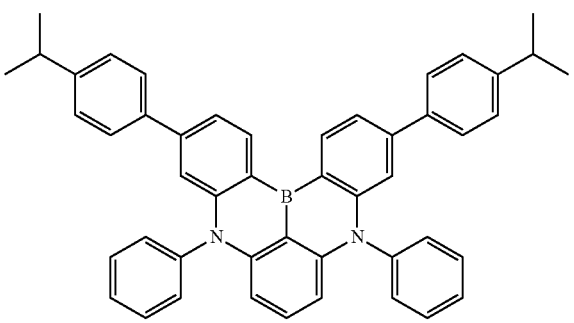

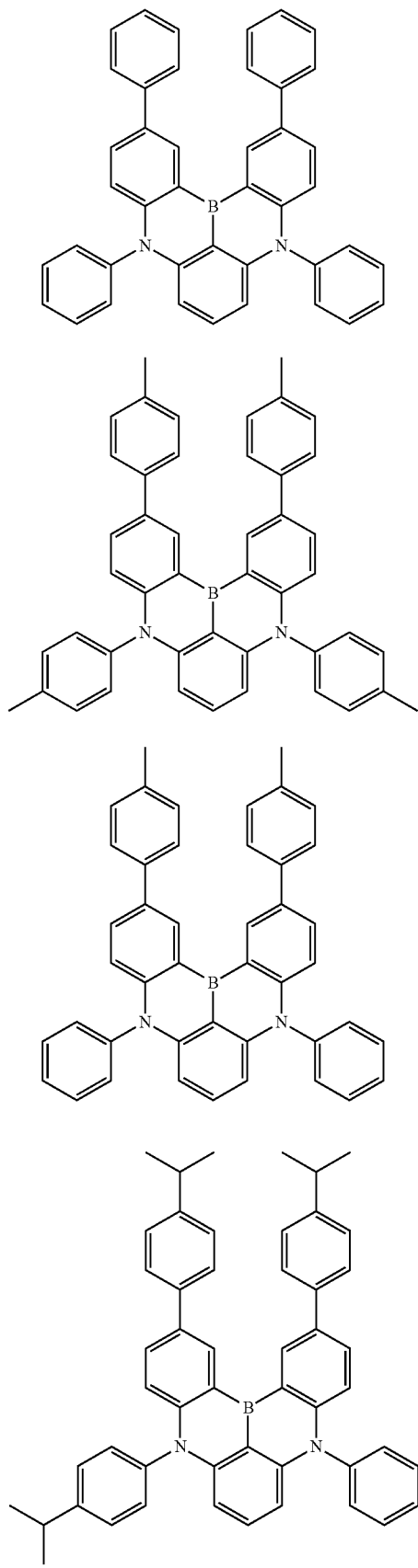
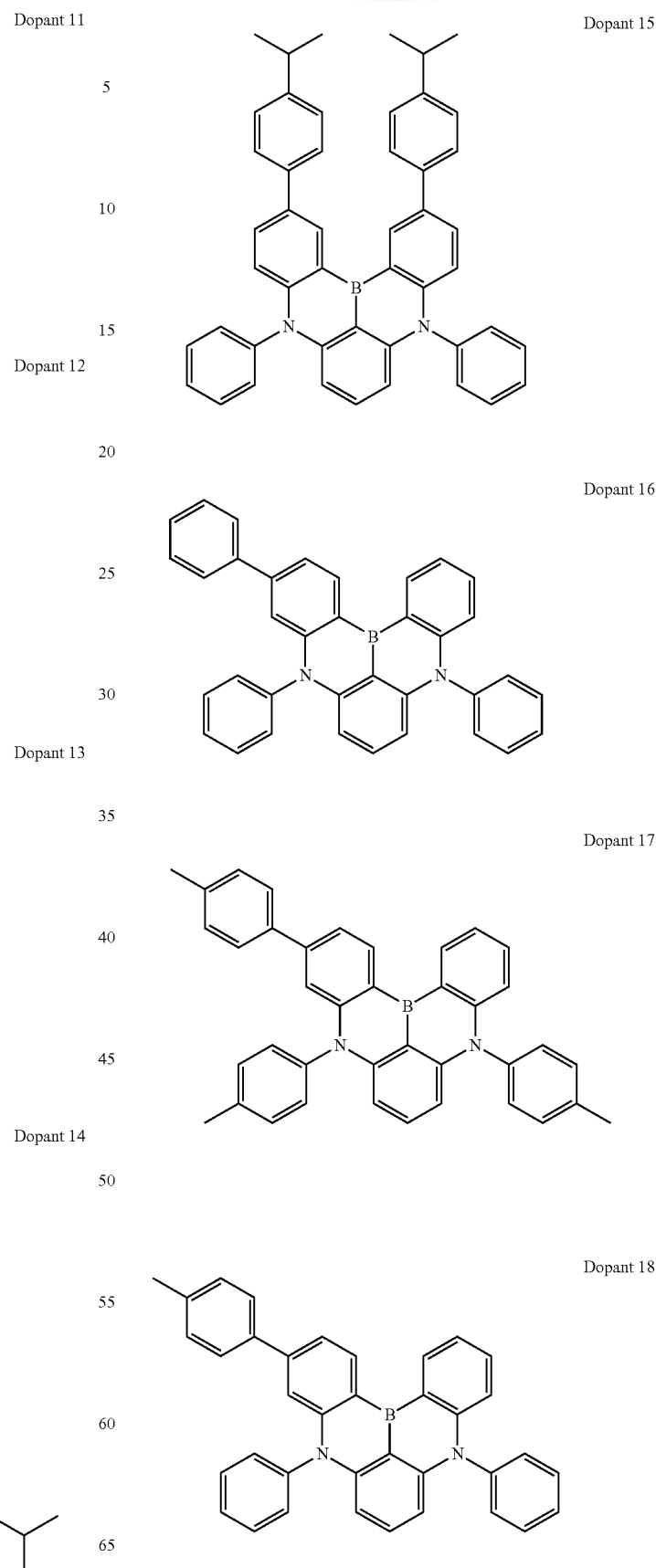

Dopant 19
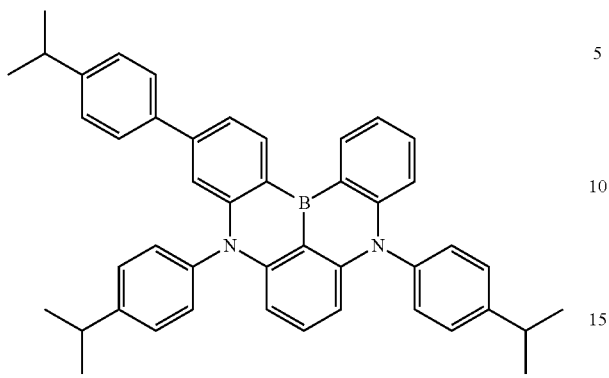
Dopant 20
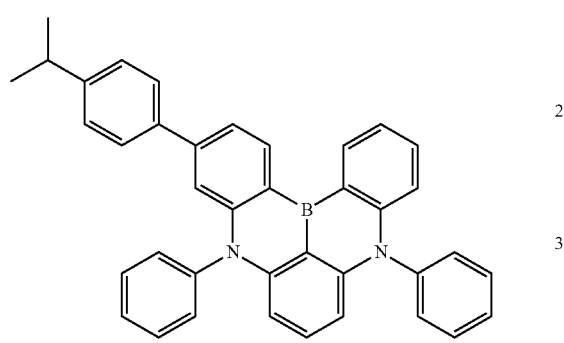
Dopant 21
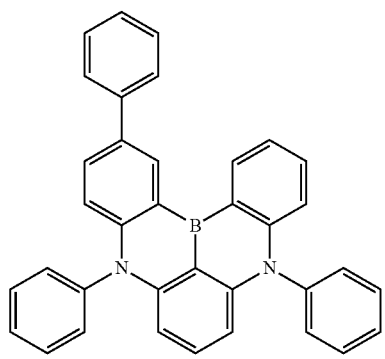
Dopant 22
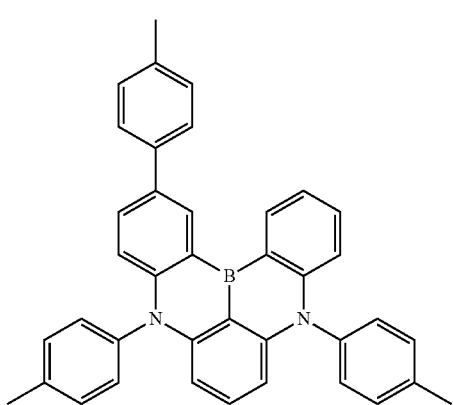
Dopant 23
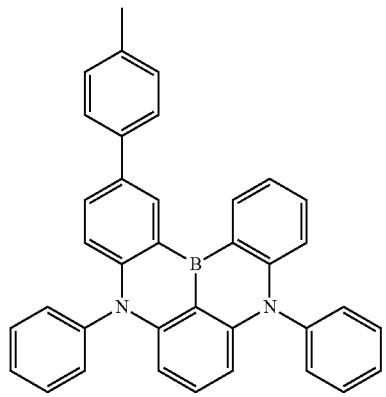
Dopant 24
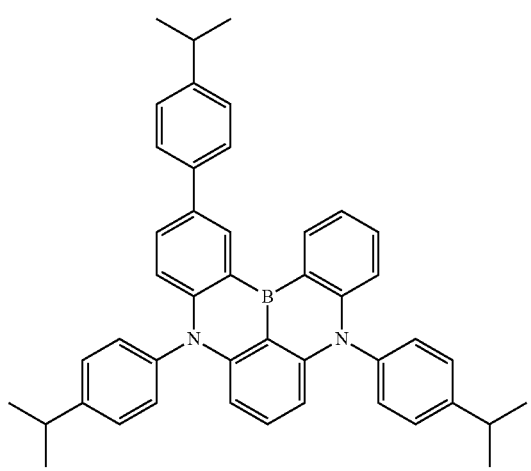
Dopant 25
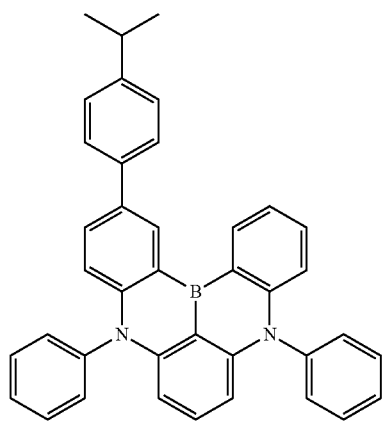

Dopant 26
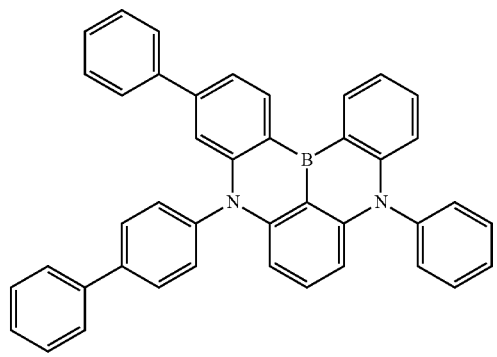
Dopant 27
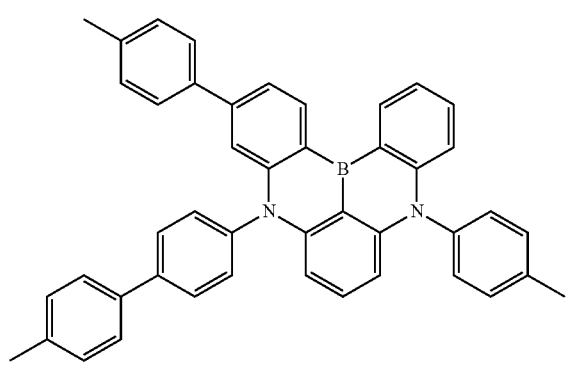
Dopant 28
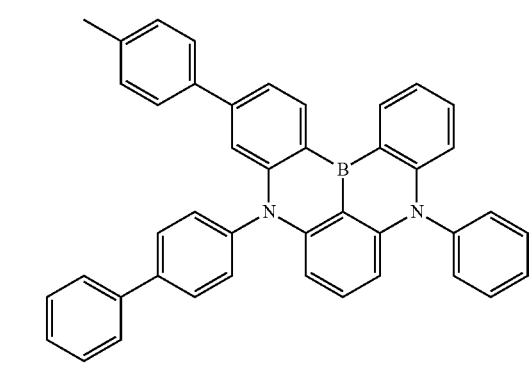
Dopant 29
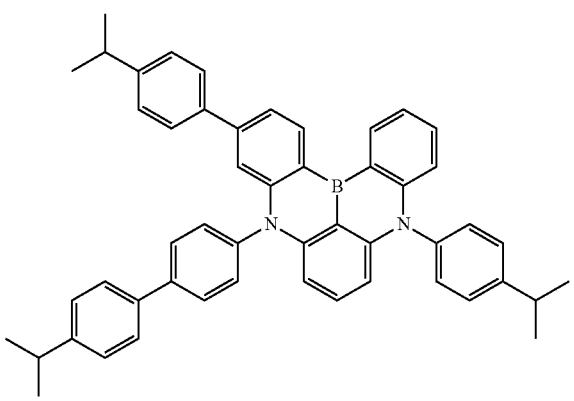
Dopant 30
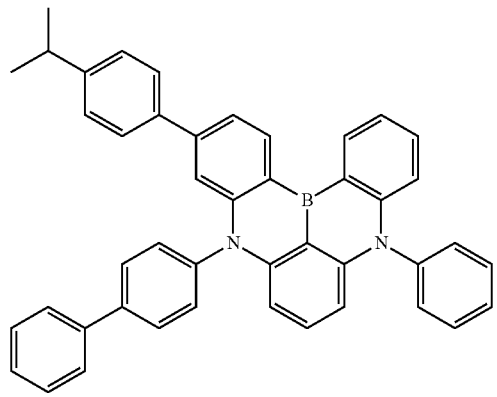
Dopant 31
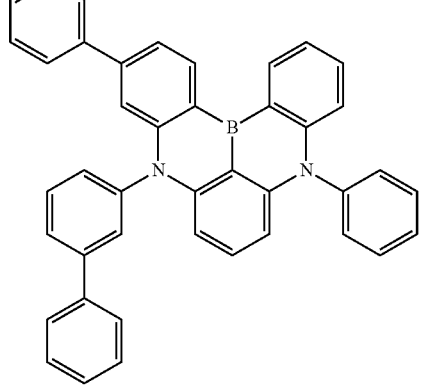
Dopant 32
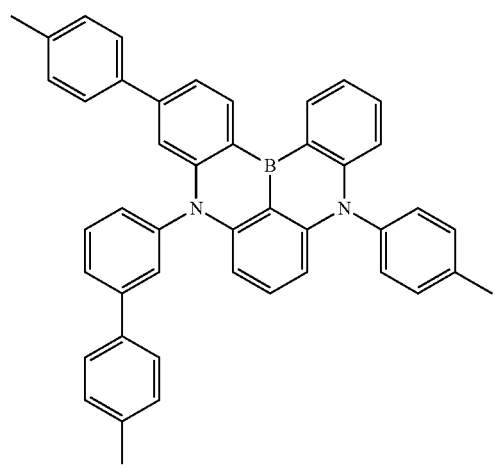

Dopant 33
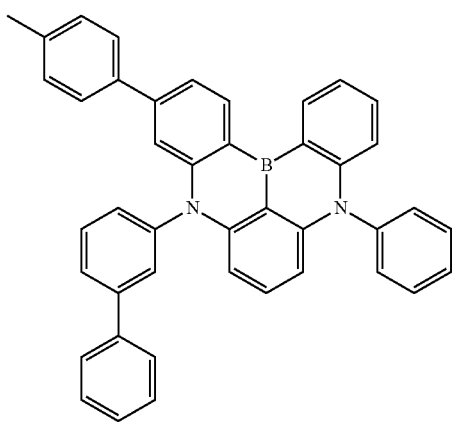
Dopant 34
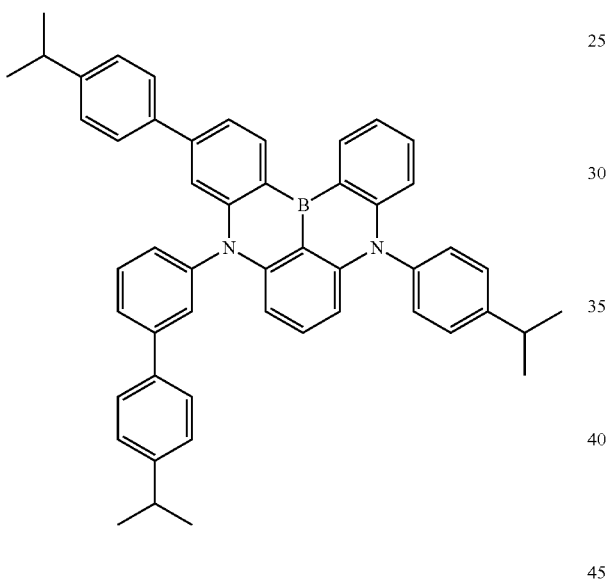
Dopant 35
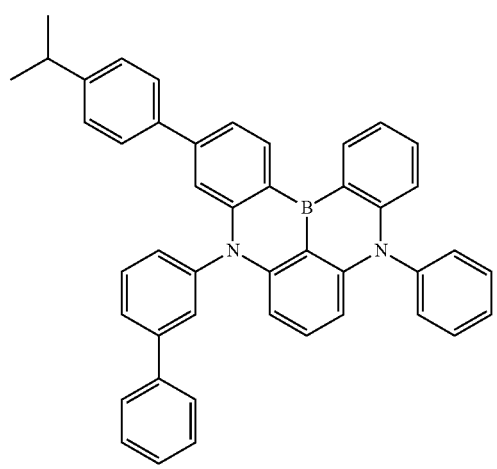
Dopant 37
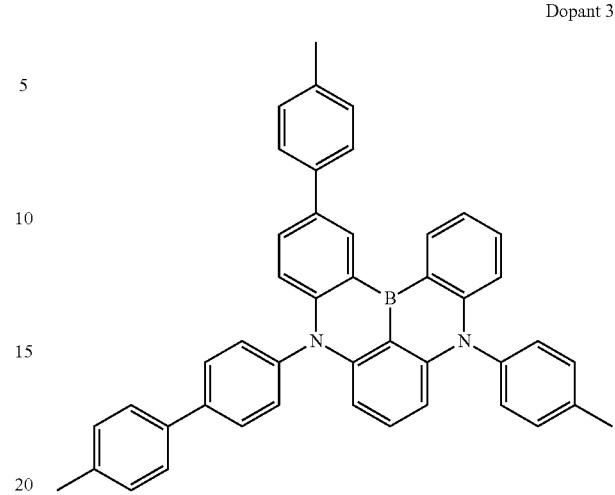
Dopant 38
Dopant 39
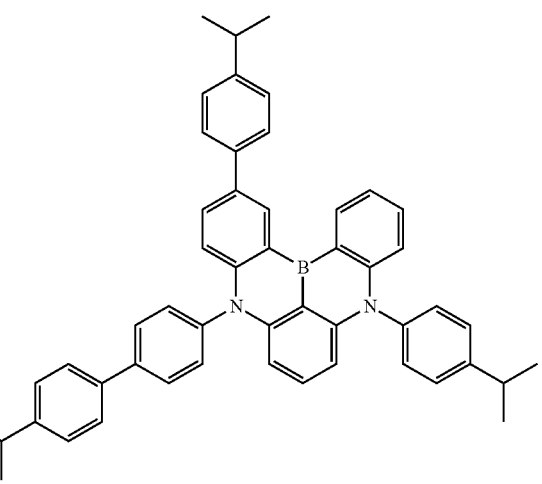

Dopant 40
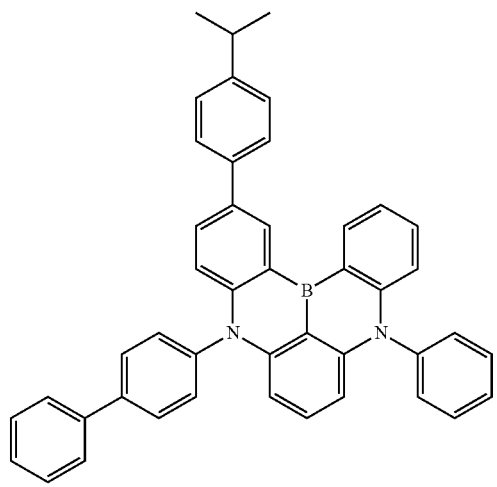
Dopant 41
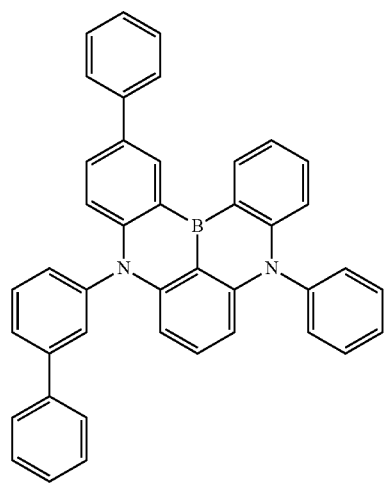
Dopant 42
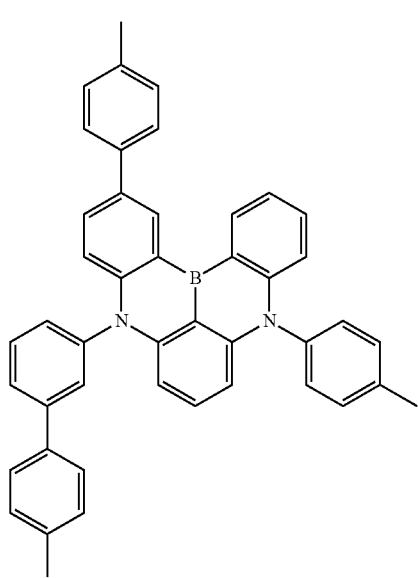
Dopant 43
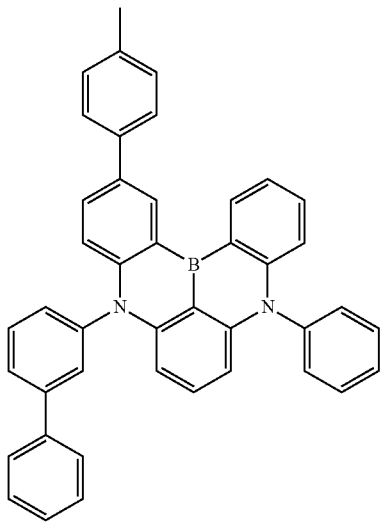
Dopant 44
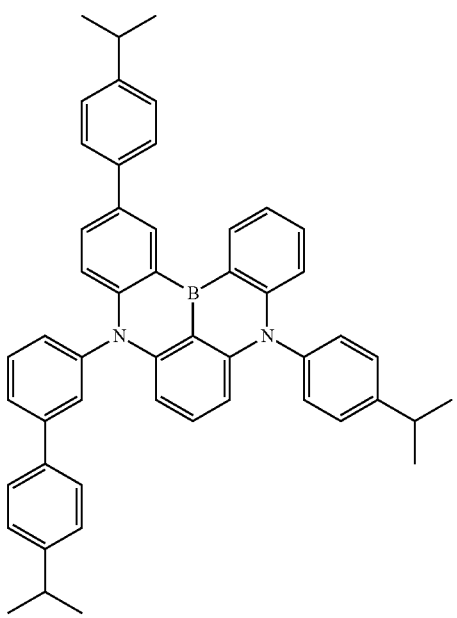

Dopant 45
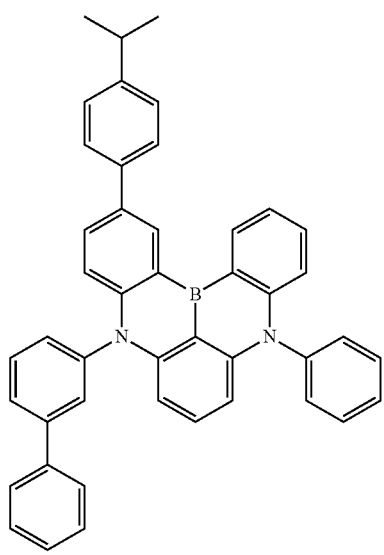
Dopant 46
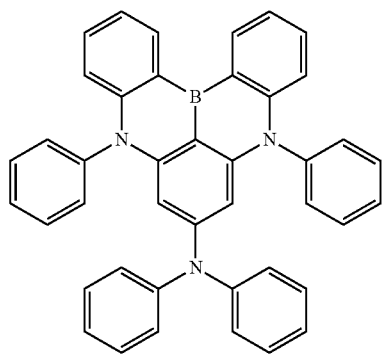
Dopant 47
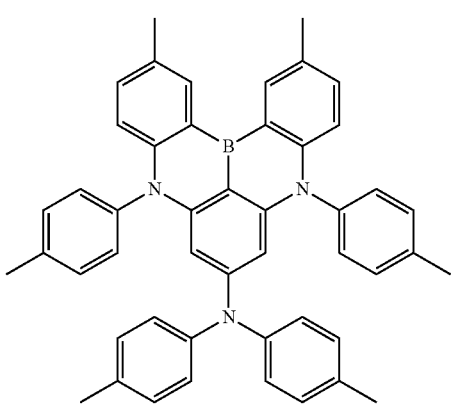
Dopant 48
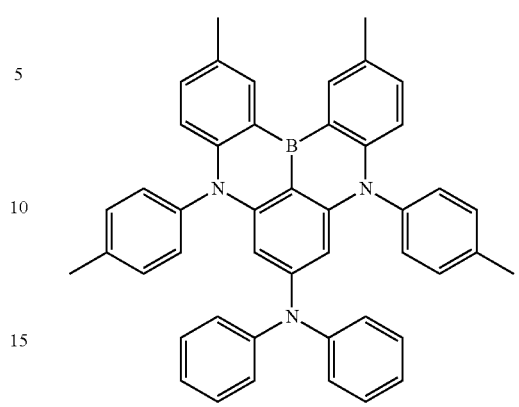
Dopant 49
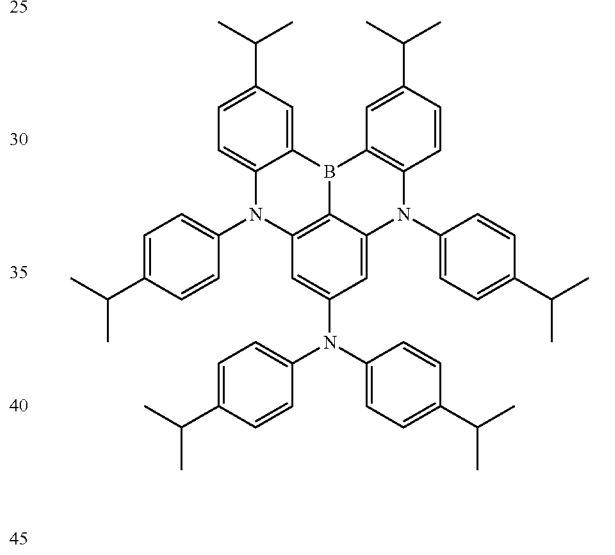
Dopant 50
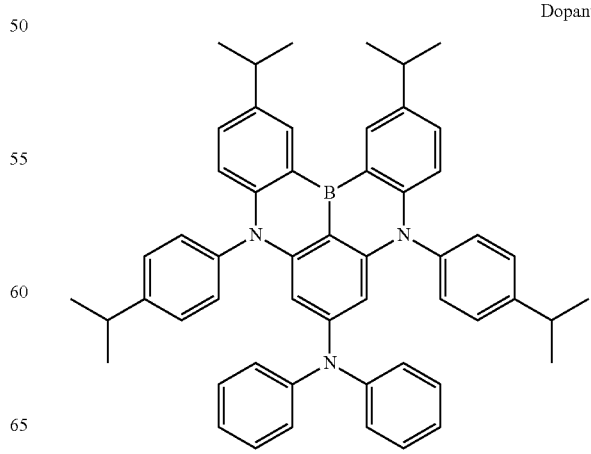

Dopant 51
Dopant 52
Dopant 53
Dopant 54
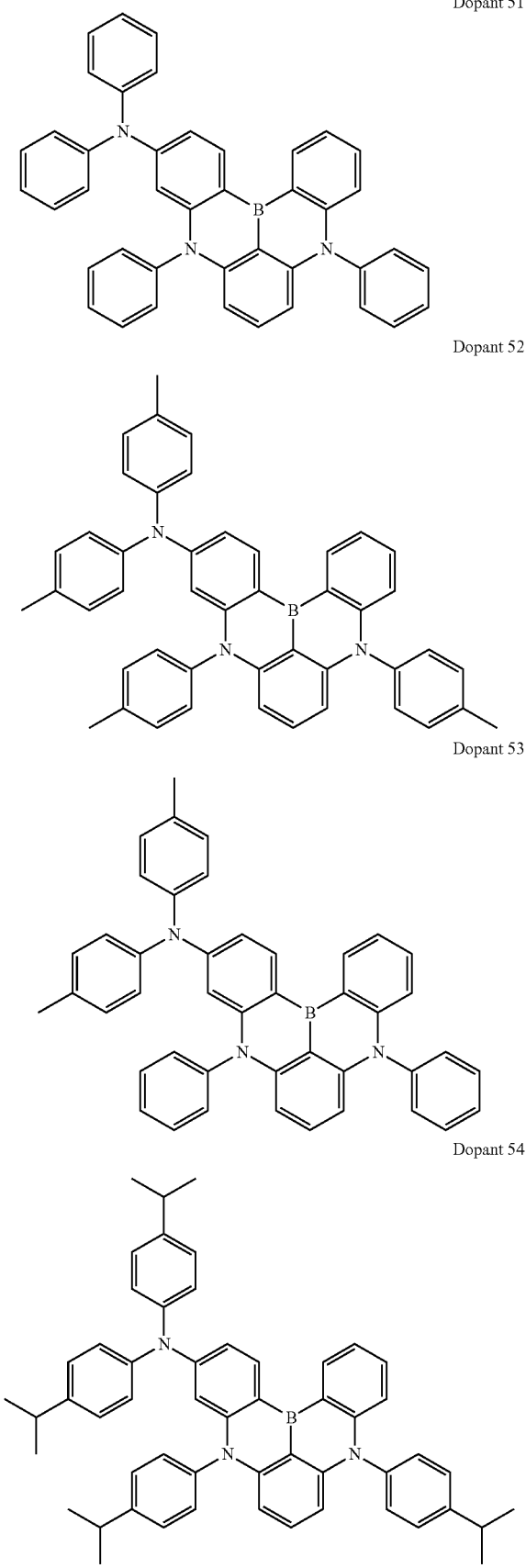
Dopant 55
Dopant 56
Dopant 57
Dopant 58
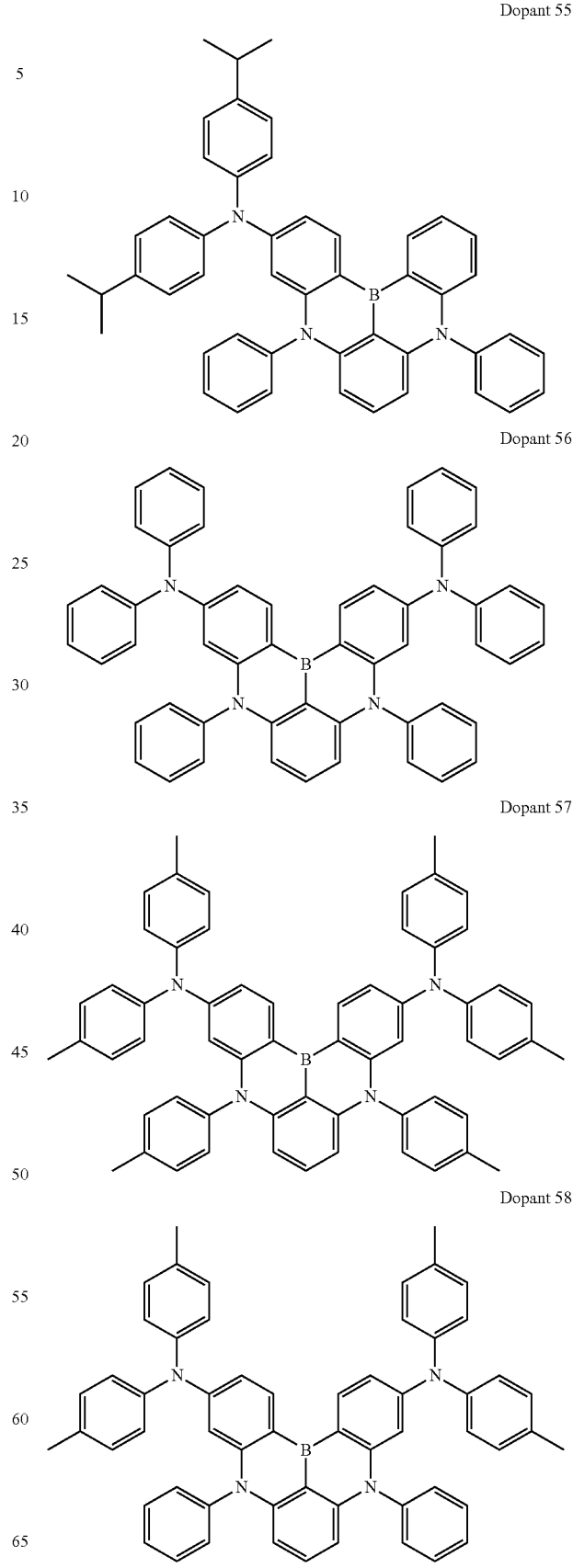

-continued
Dopant 59
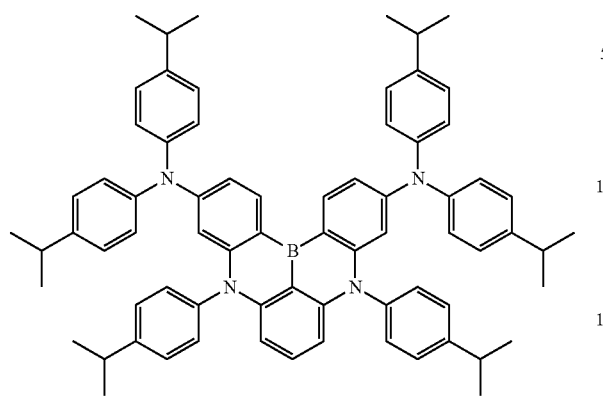
Dopant 60
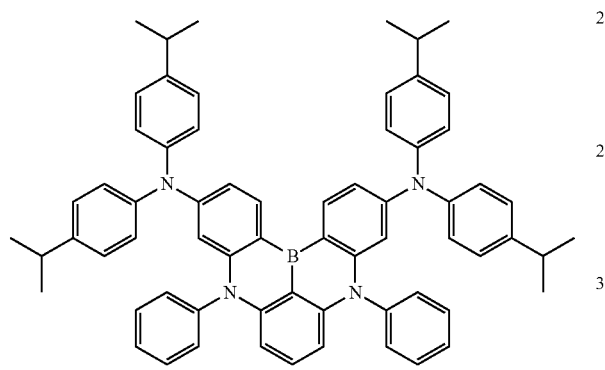
Dopant 61
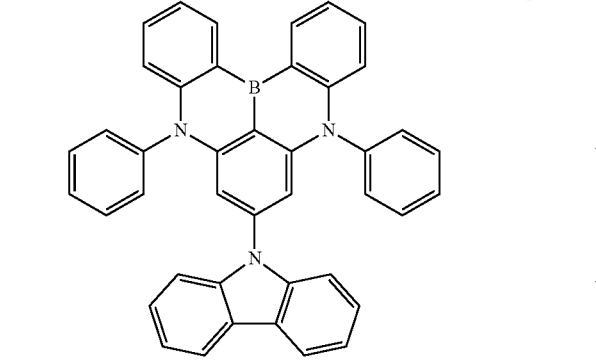
Dopant 62
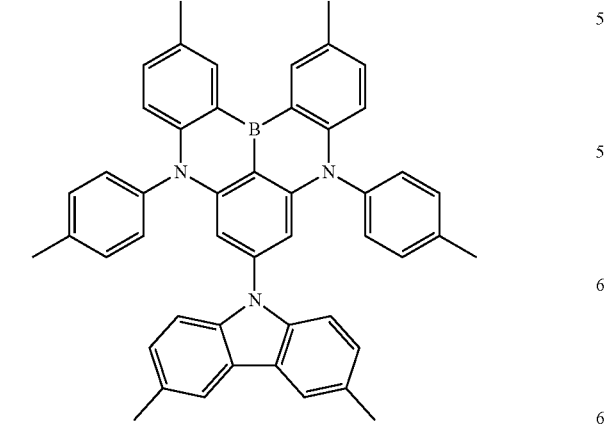
-continued
Dopant 63
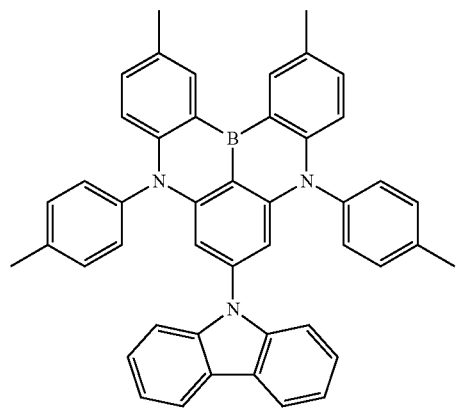
Dopant 64
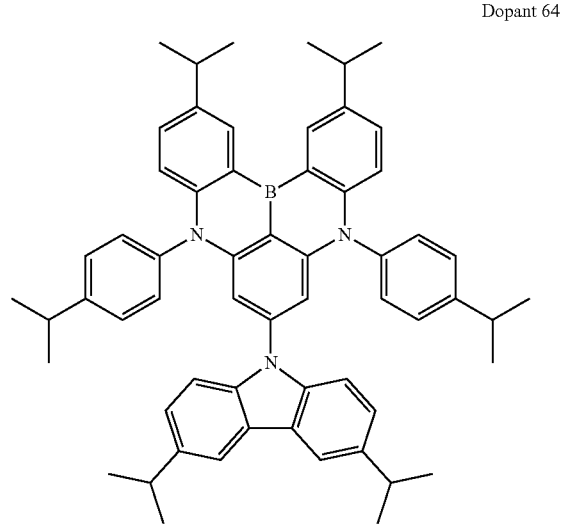
Dopant 65
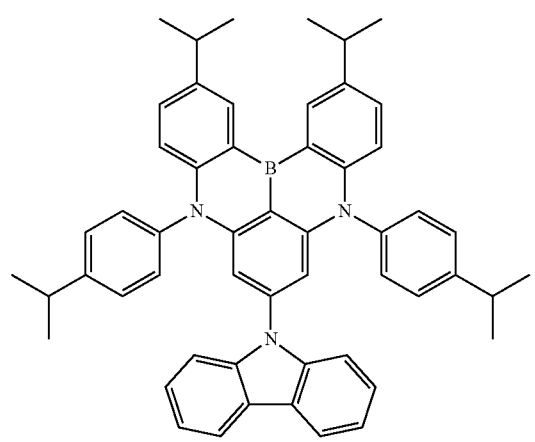

Dopant 66
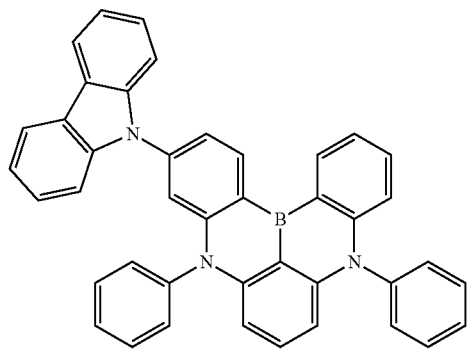
Dopant 67
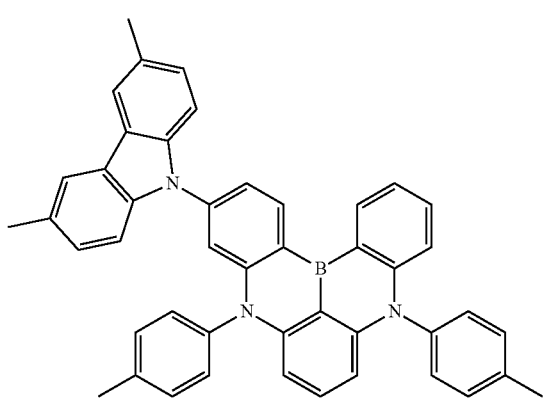
Dopant 68
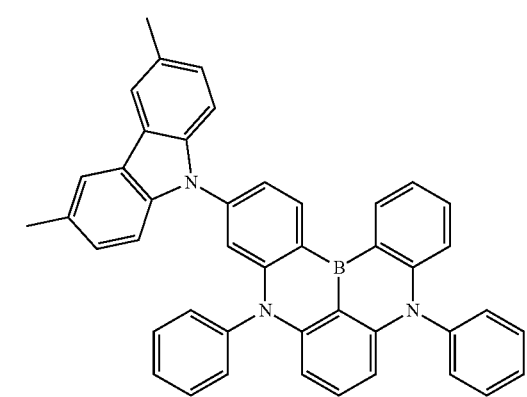
Dopant 69
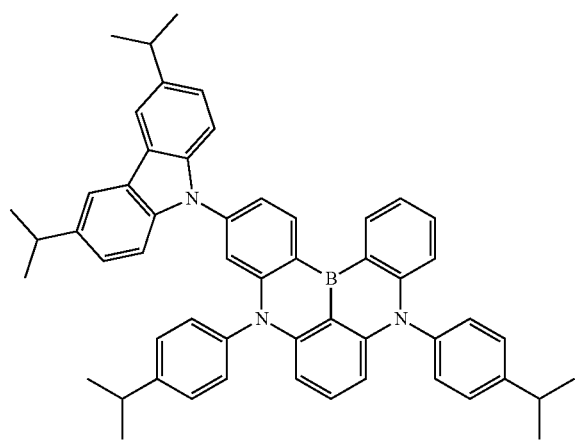
Dopant 70
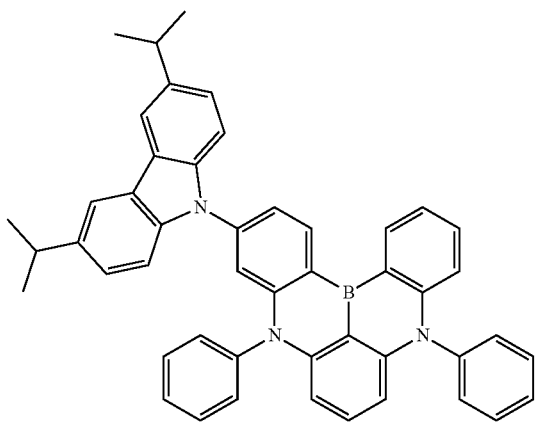
Dopant 71
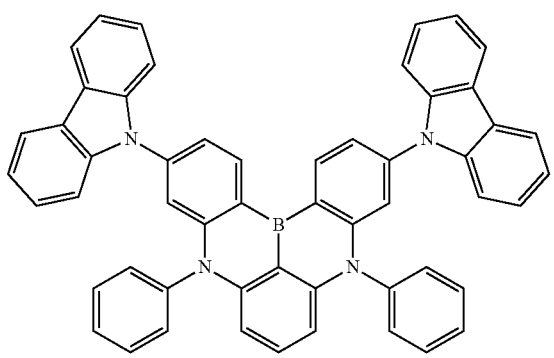
Dopant 72
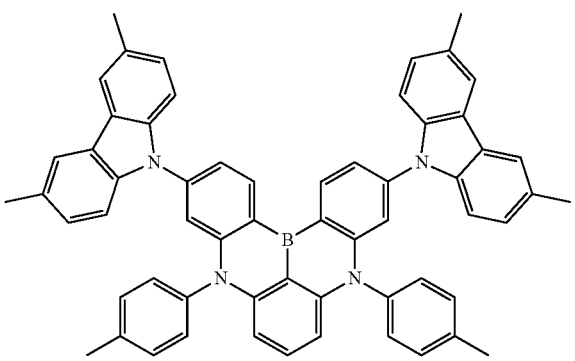
Dopant 73
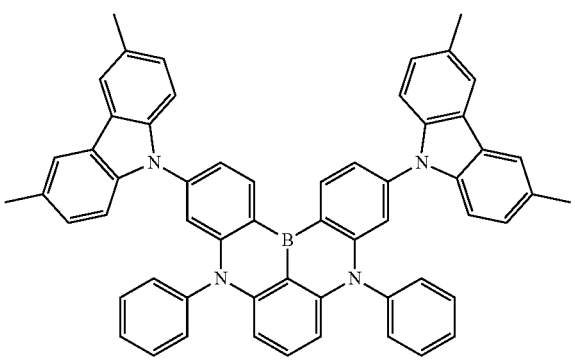

-continued
Dopant 74
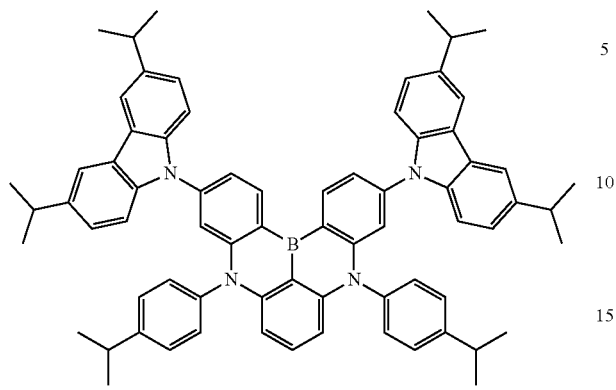
Dopant 75
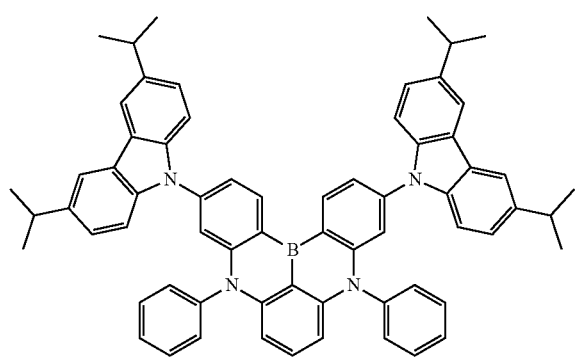
Dopant 76
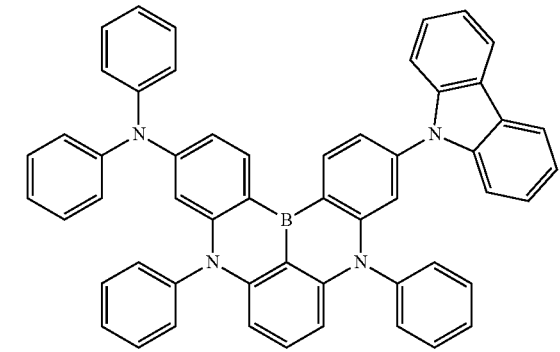
Dopant 77
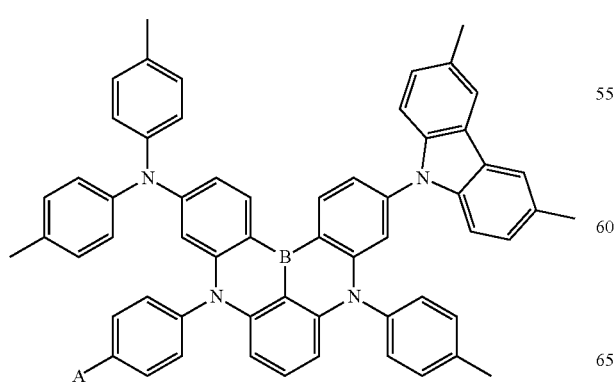
-continued
Dopant 78
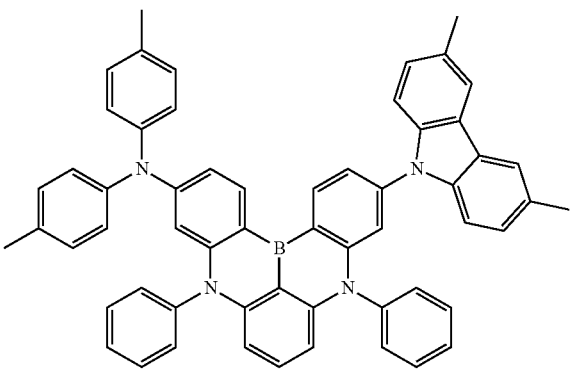
Dopant 79
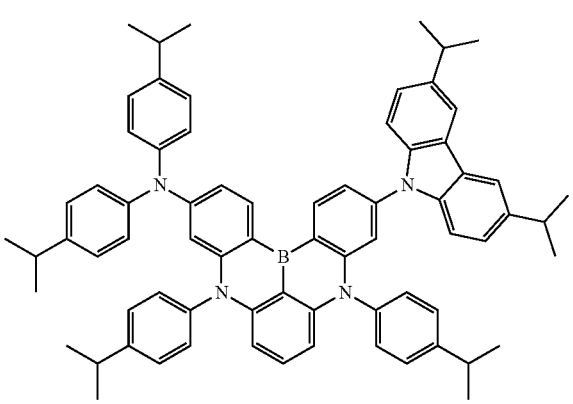
Dopant 80
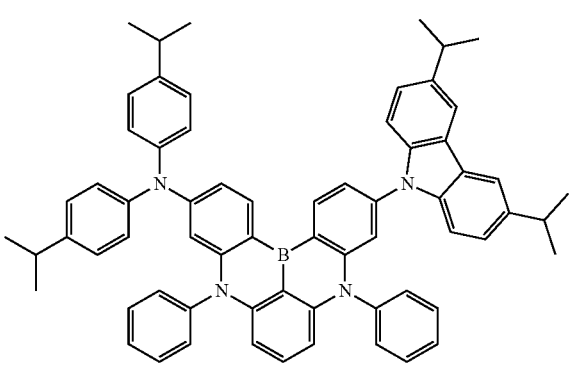
Dopant 81
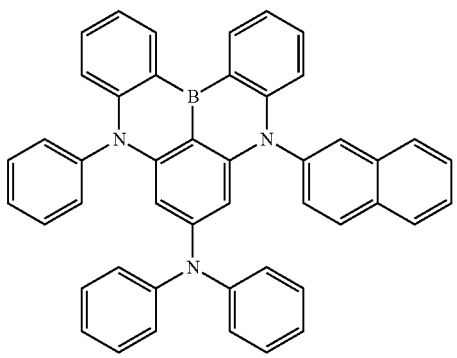

-continued
Dopant 82
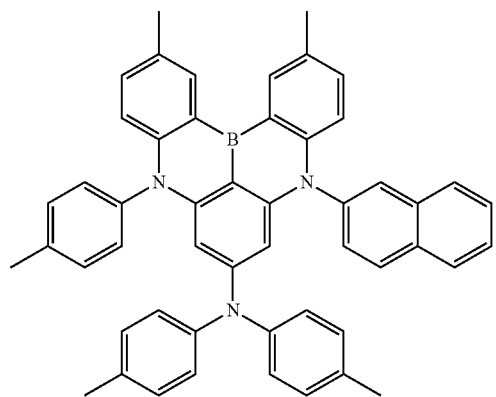
Dopant 83
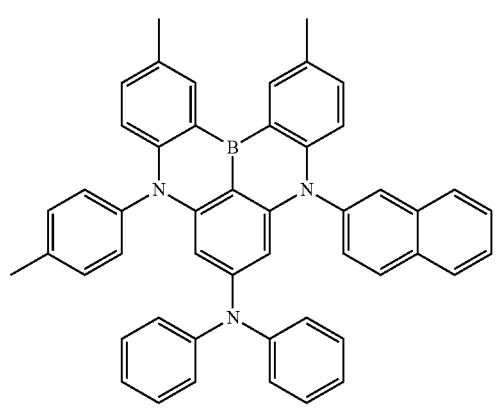
Dopant 84
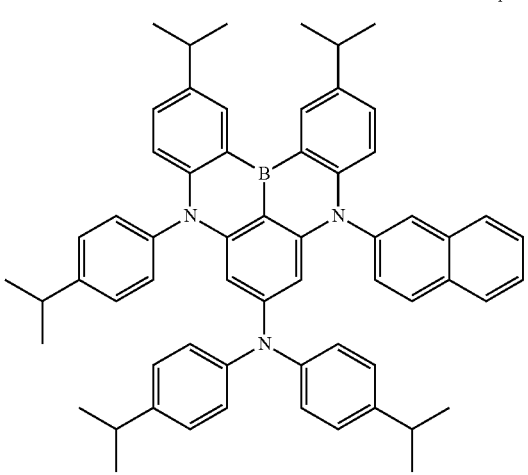
-continued
Dopant 85
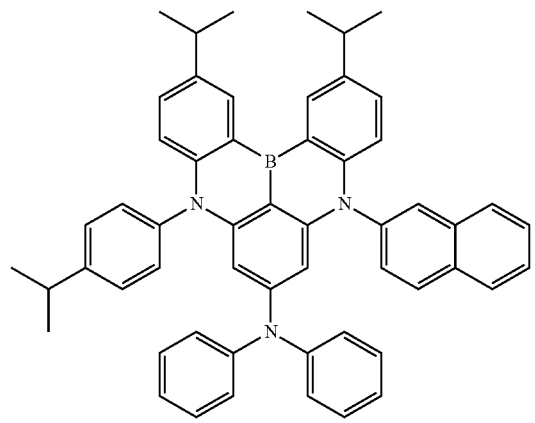
Dopant 86
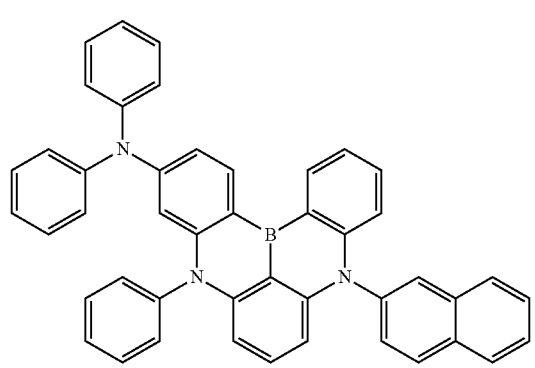
Dopant 87
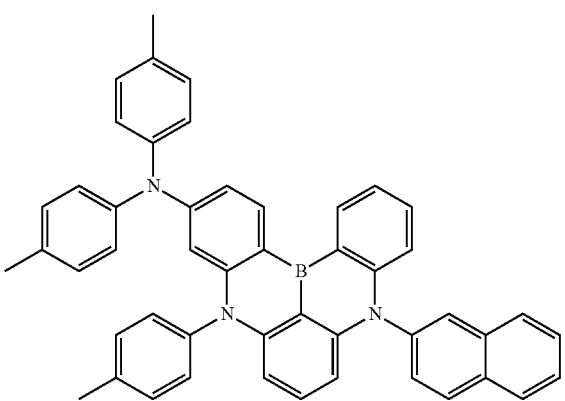
Dopant 88
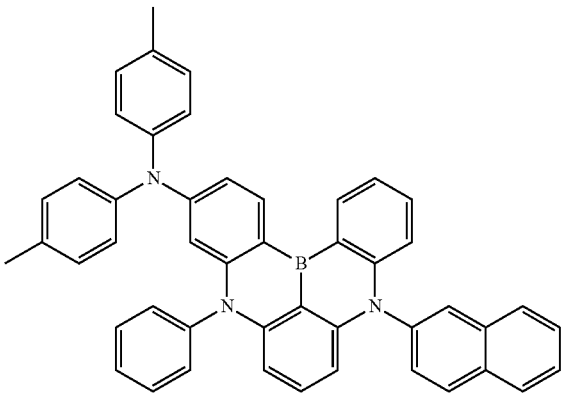

-continued
Dopant 89
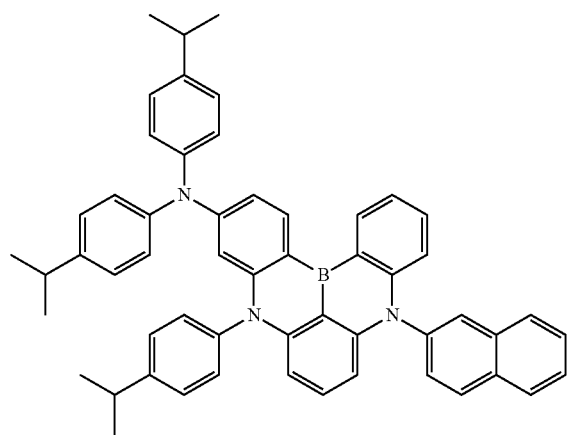
Dopant 90
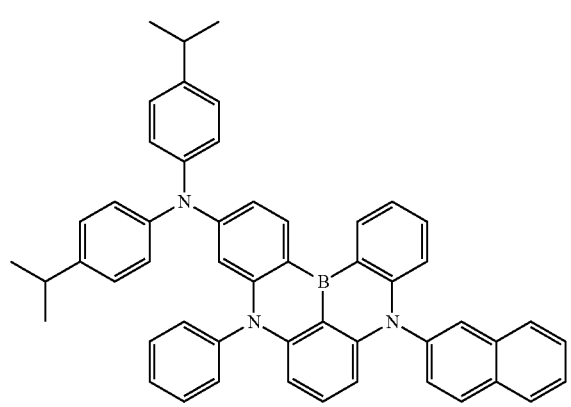
Dopant 91
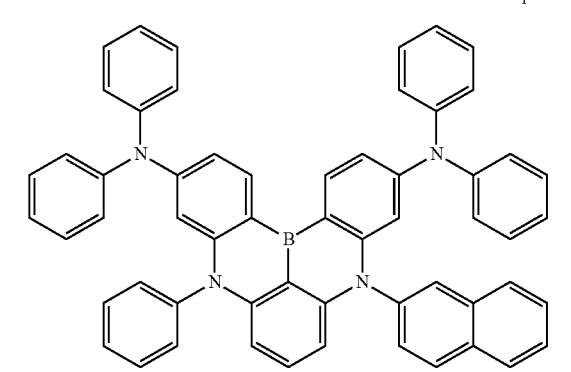
Dopant 92
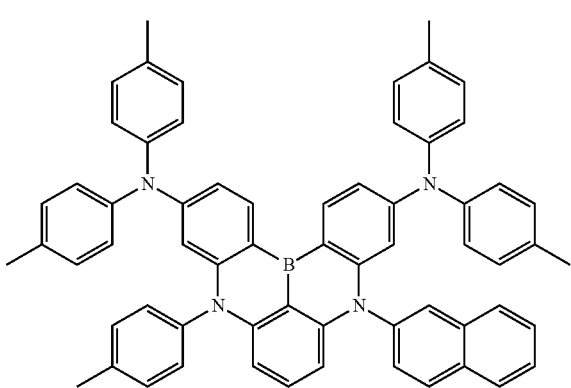
-continued
Dopant 93
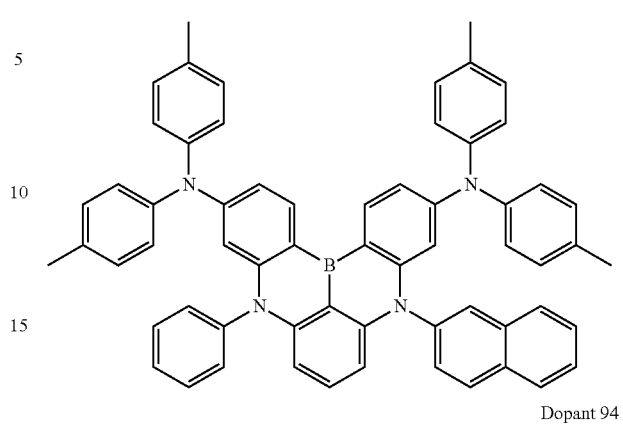
Dopant 94
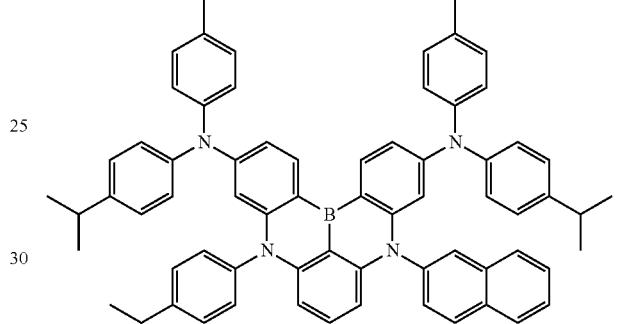
Dopant 95
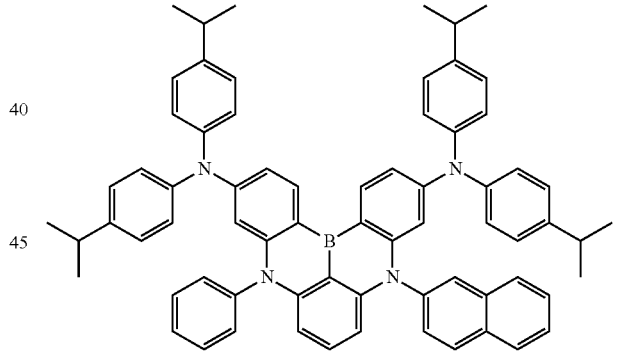
Dopant 96
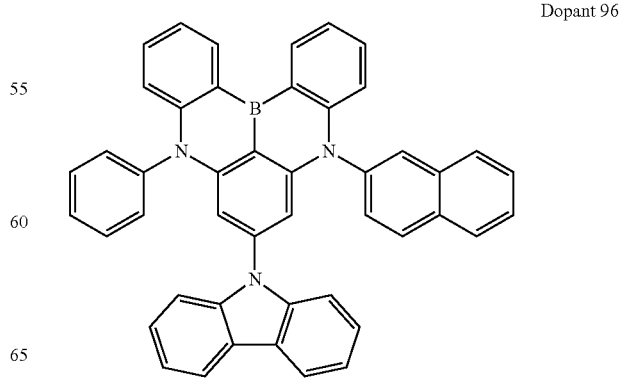

Dopant 97
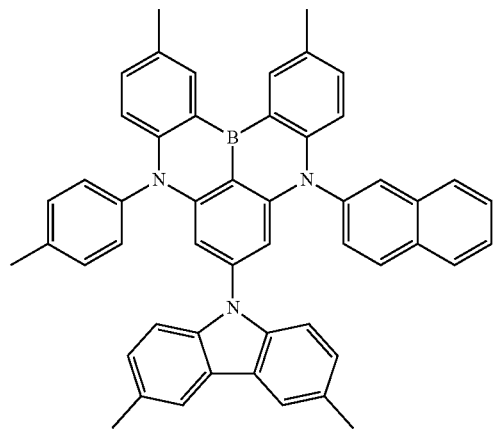
Dopant 98
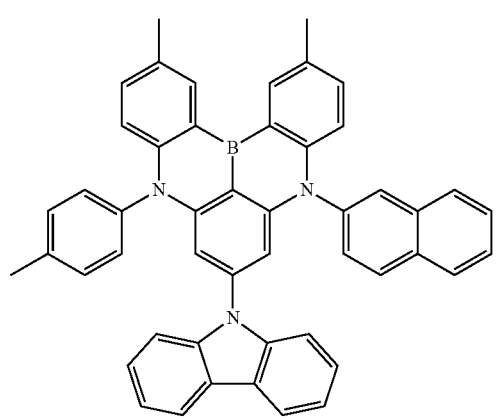
Dopant 99
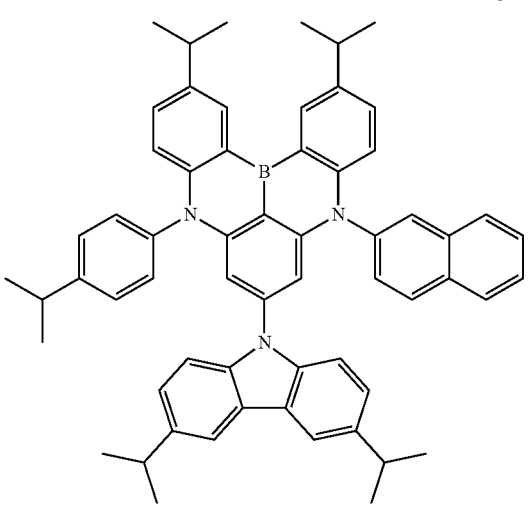
Dopant 100
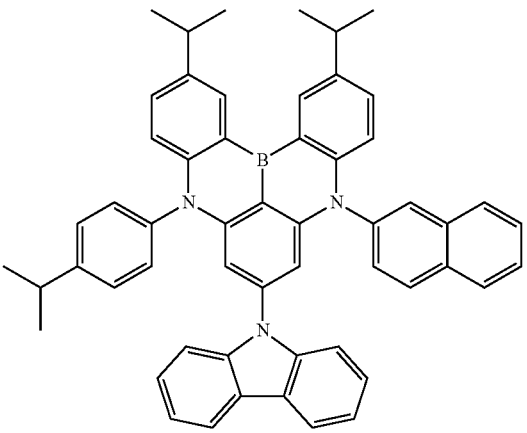
Dopant 101
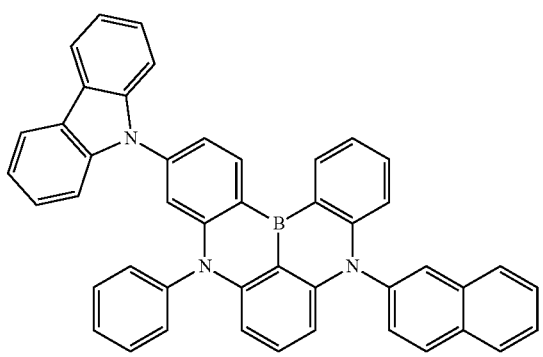
Dopant 102
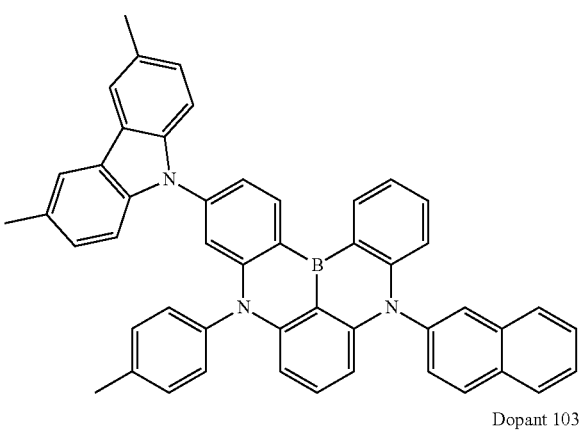
Dopant 103
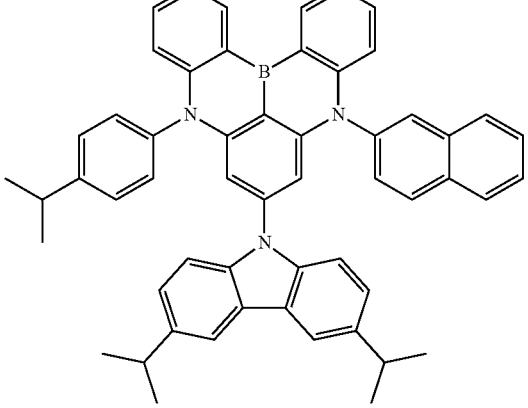

Dopant 104
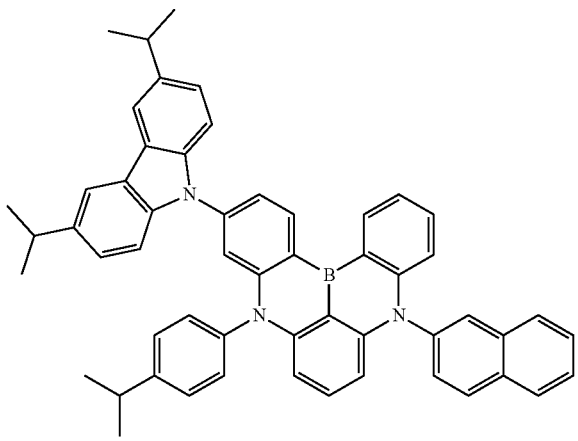
Dopant 108
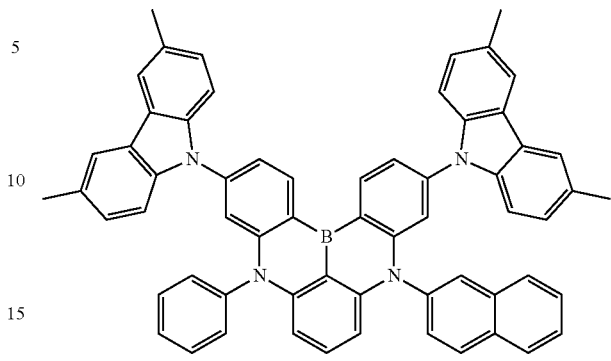
Dopant 105
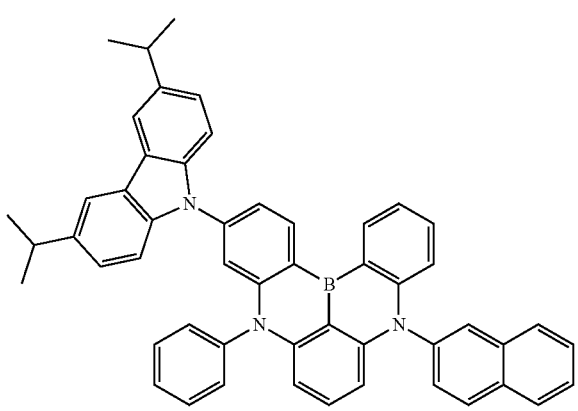
Dopant 109
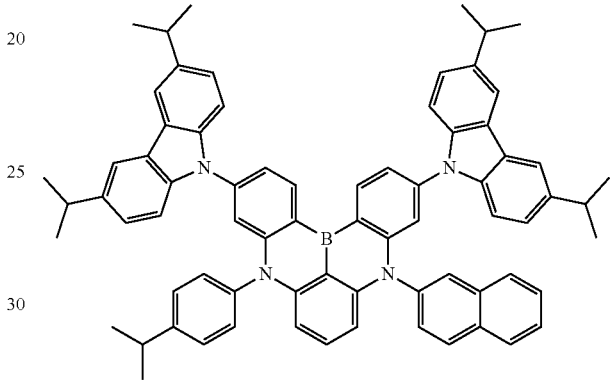
Dopant 106
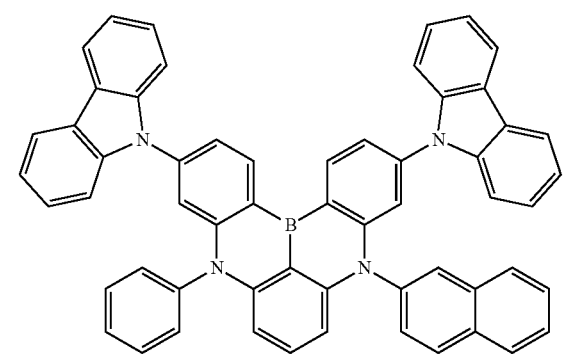
Dopant 110
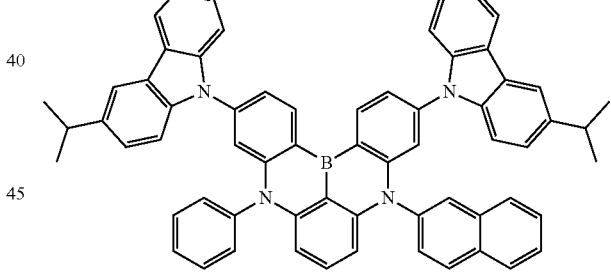
Dopant 107
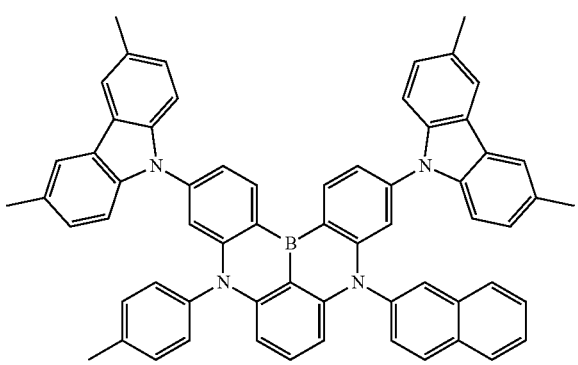
Dopant 111
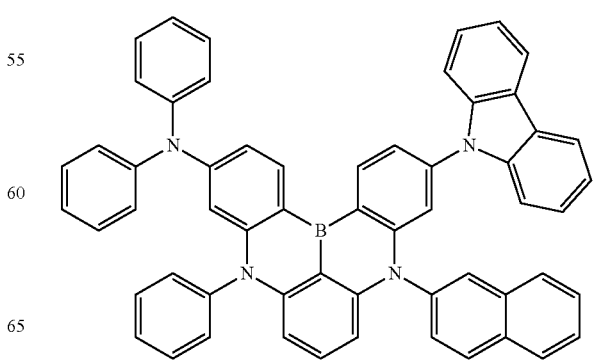

Dopant 112
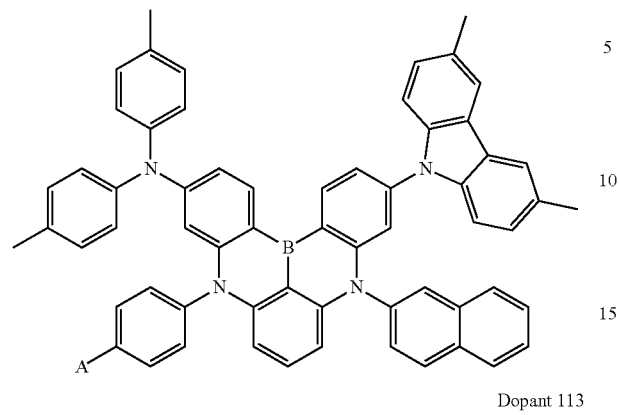
Dopant 113
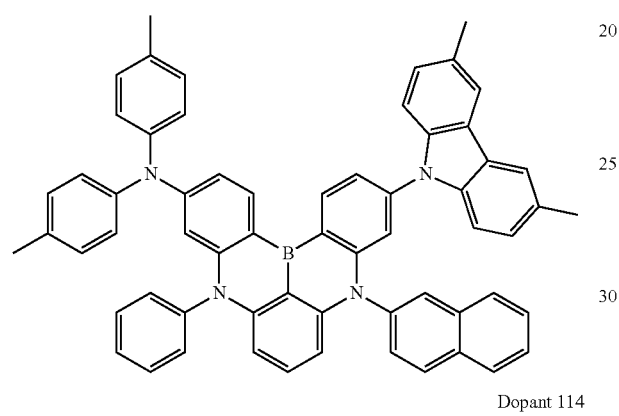
Dopant 114
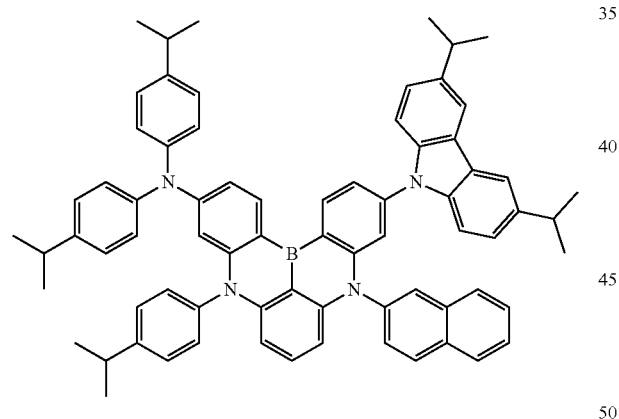
Dopant 115
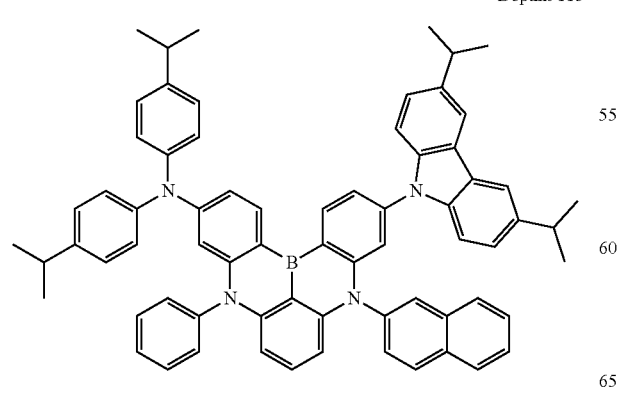
Dopant 116
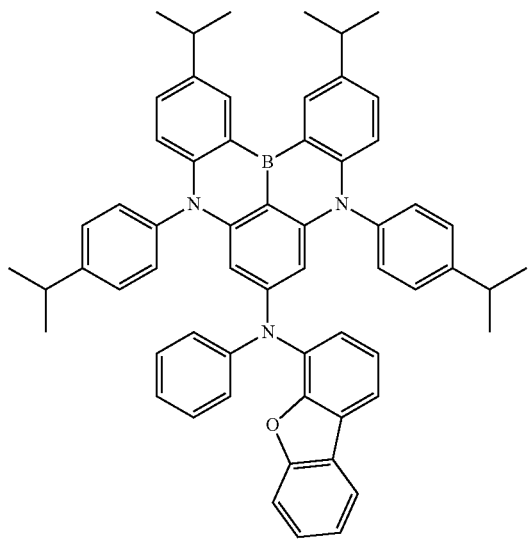
Dopant 117
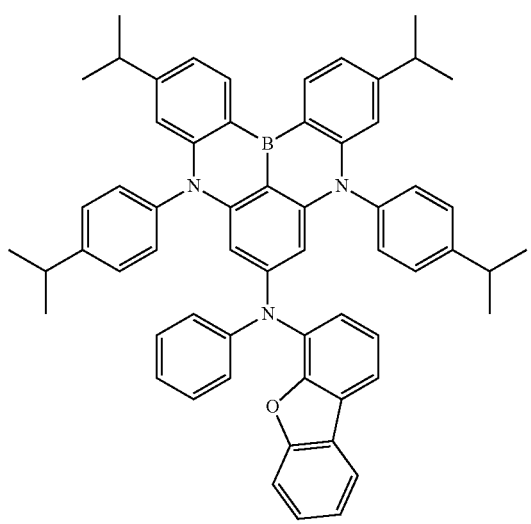
Dopant 118
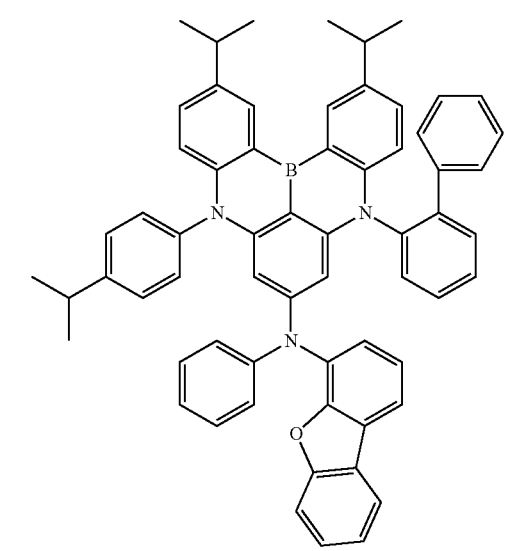

Dopant 119
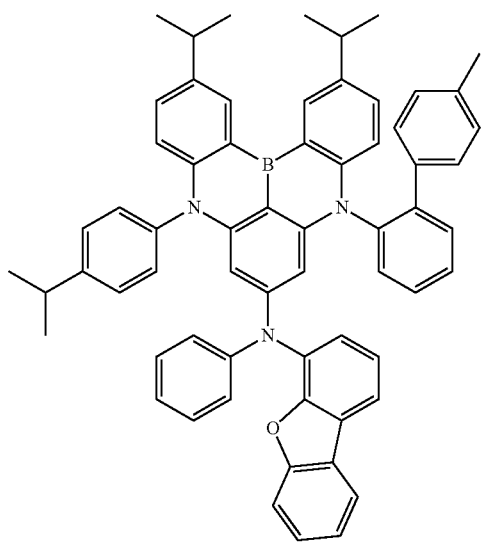
Dopant 120
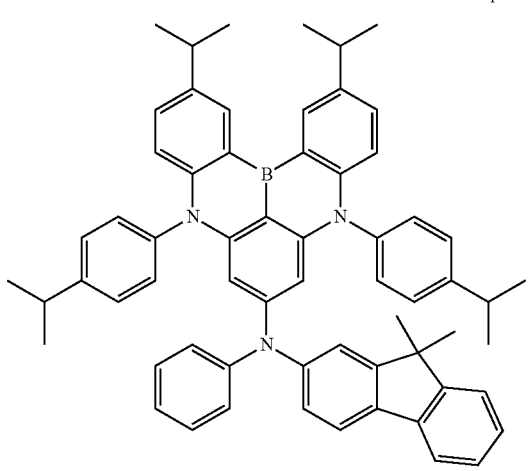
Dopant 121
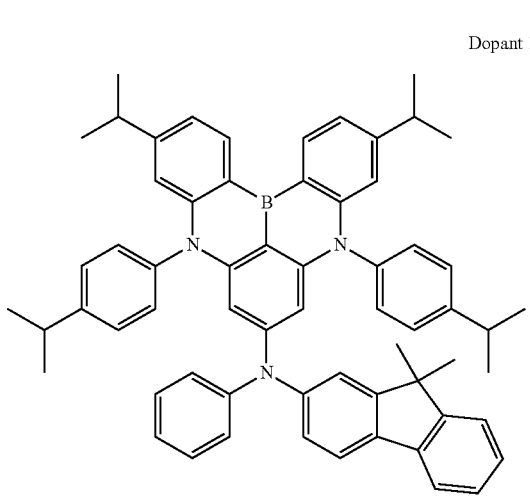
Dopant 122
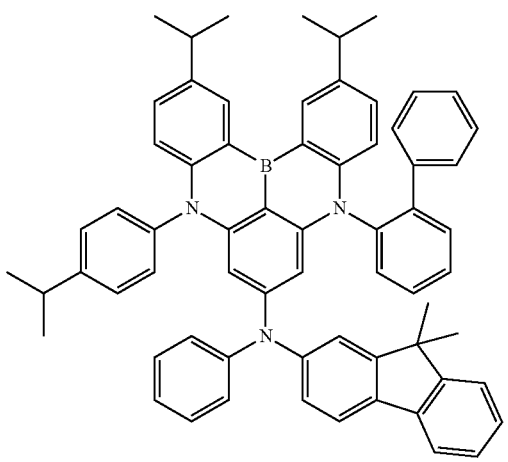
Dopant 123
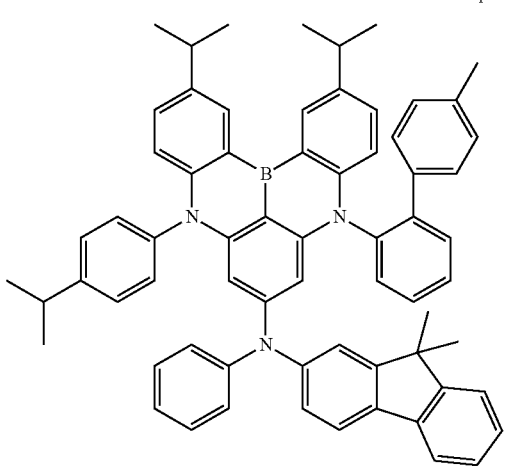
Dopant 124
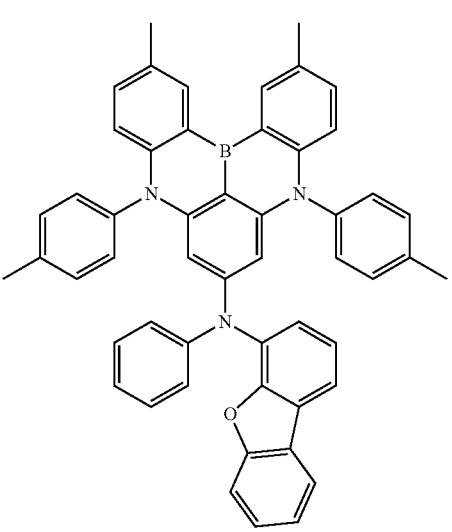

Dopant 125
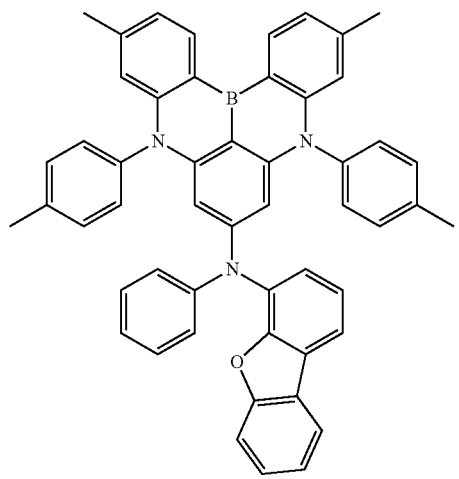
Dopant 126
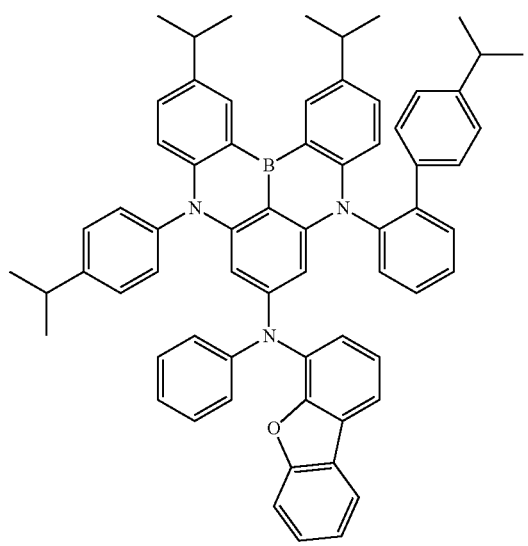
Dopant 127
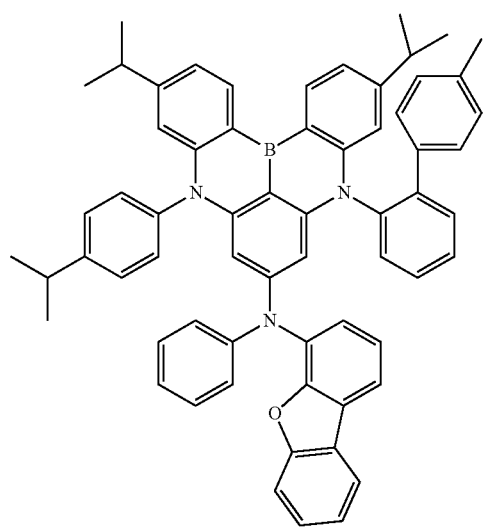
Dopant 128
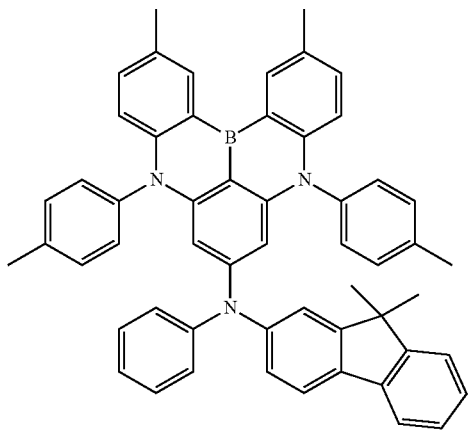
Dopant 129
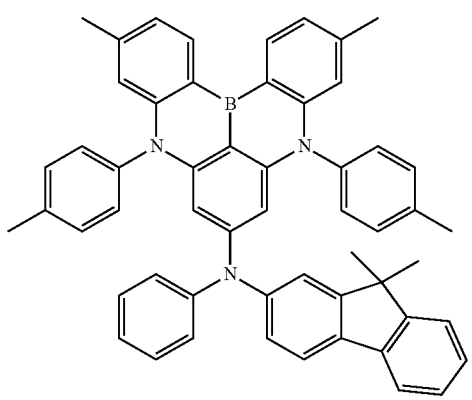
Dopant 130
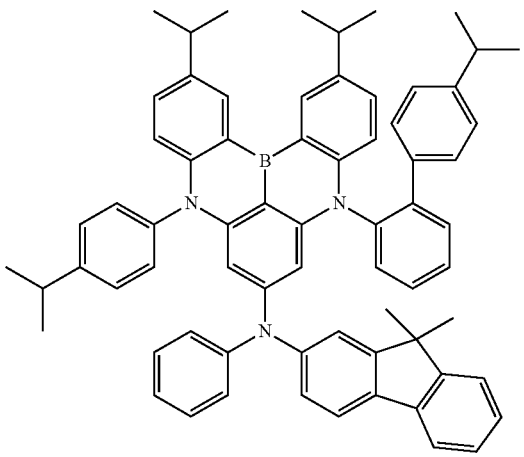

Dopant 131
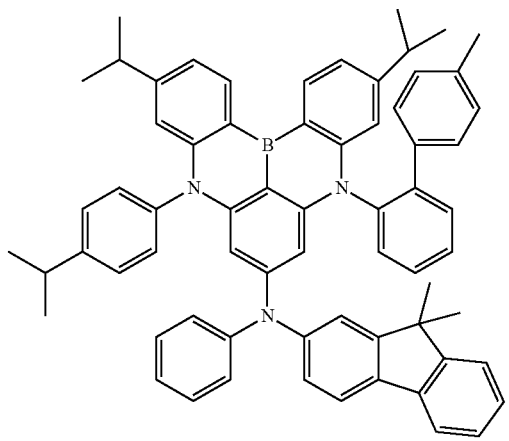
Dopant 134
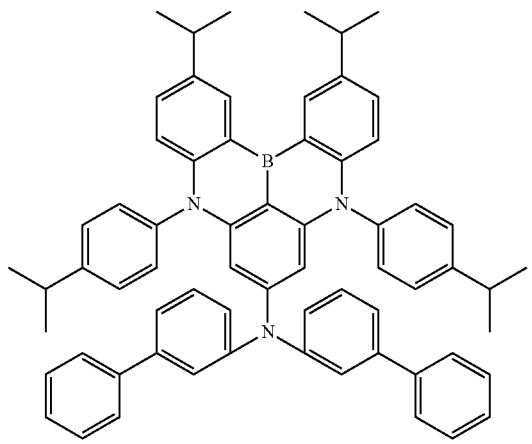
Dopant 132
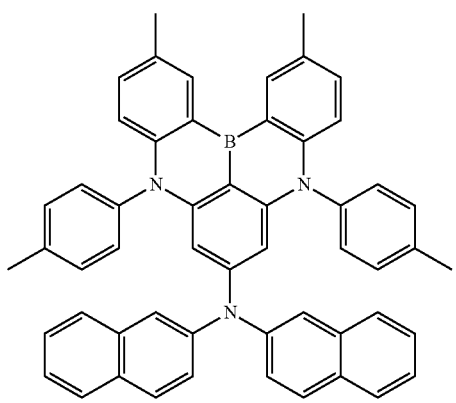
Dopant 135
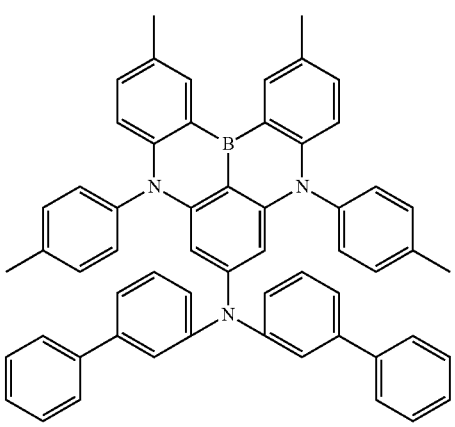
Dopant 133
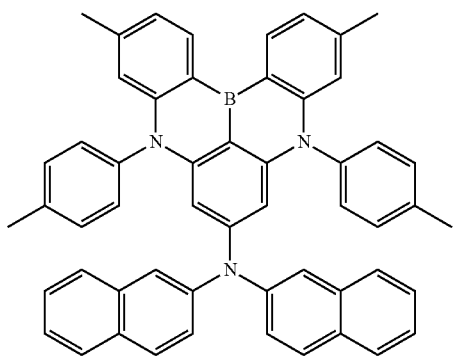
Dopant 136
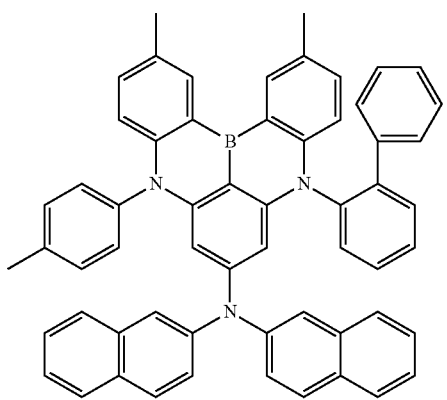

Dopant 137
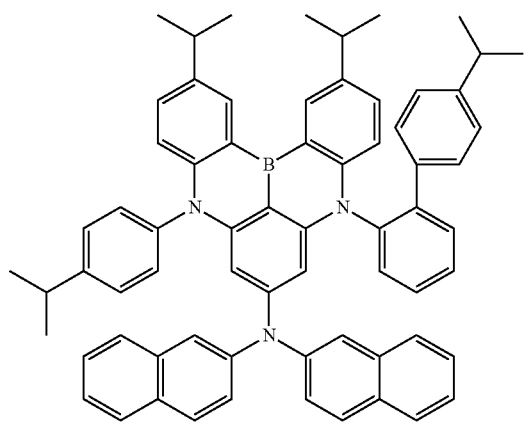
Dopant 138
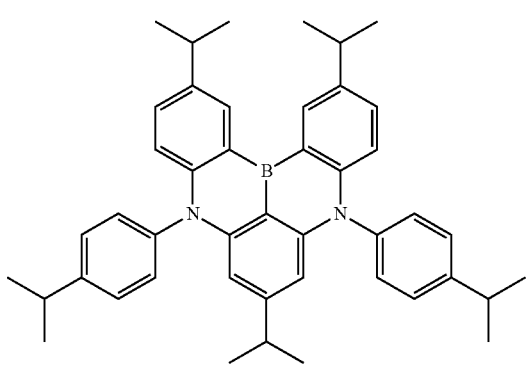
Dopant 139
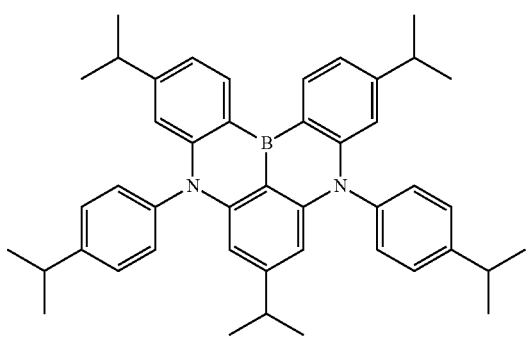
Dopant 140
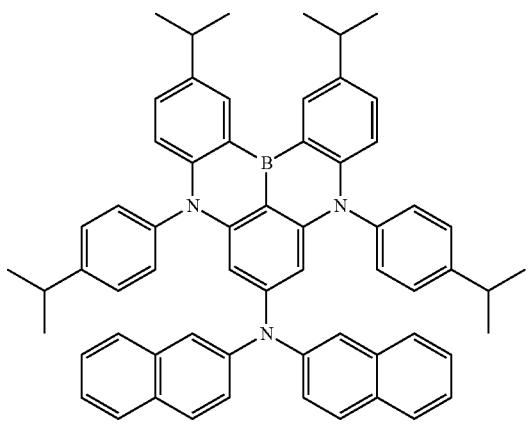
Dopant 141
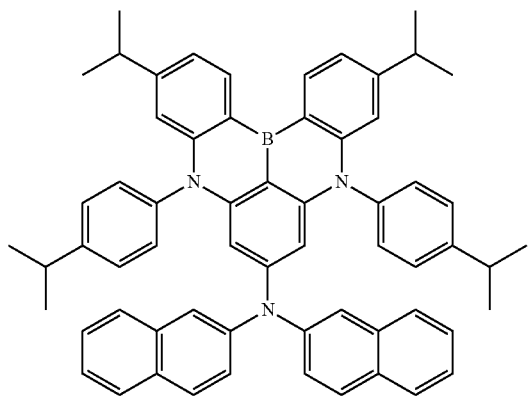
Dopant 142
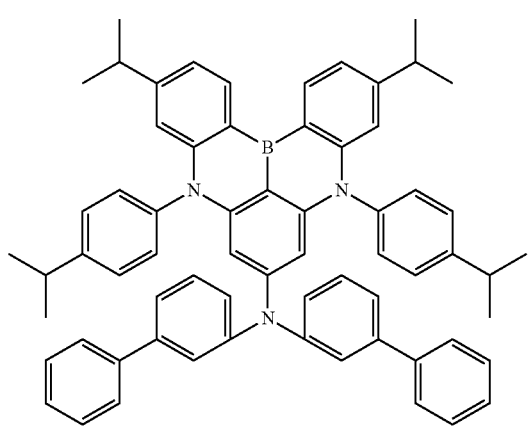
Dopant 143
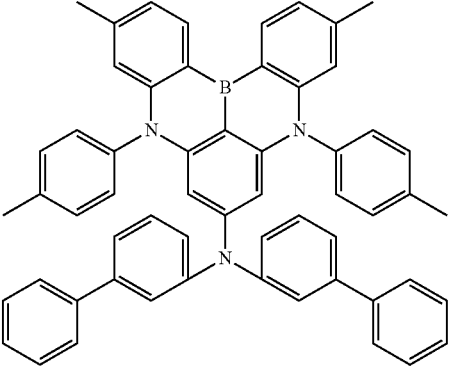
Dopant 144
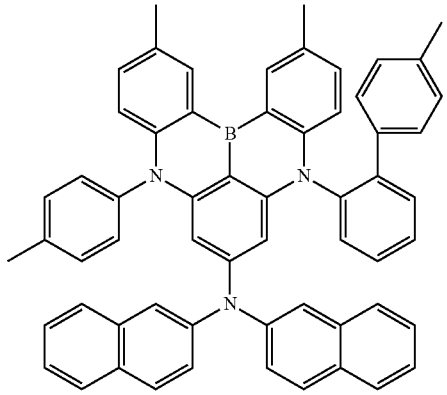

-continued
Dopant 145
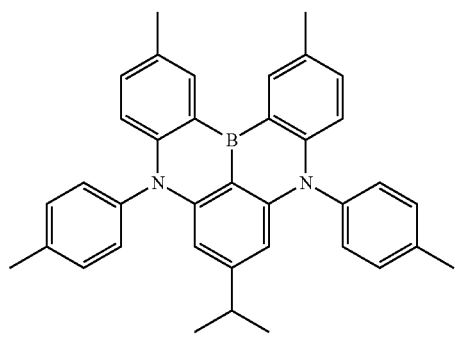
Dopant 146
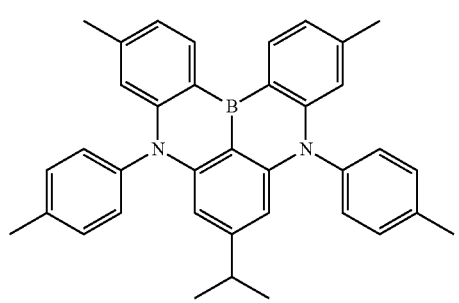
Dopant 147
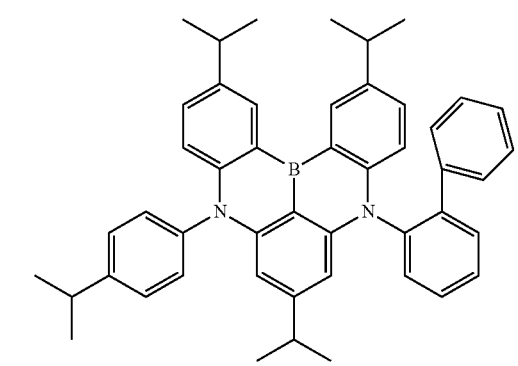
Dopant 148
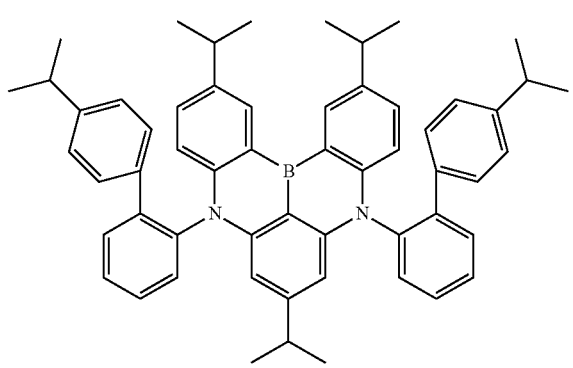
-continued
Dopant 149
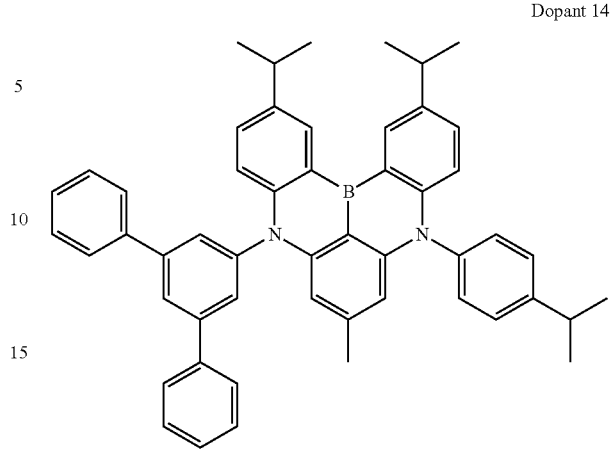
Dopant 150
Dopant 151
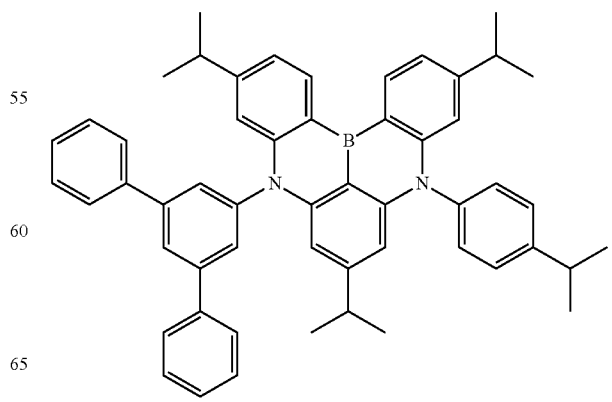

Dopant 152
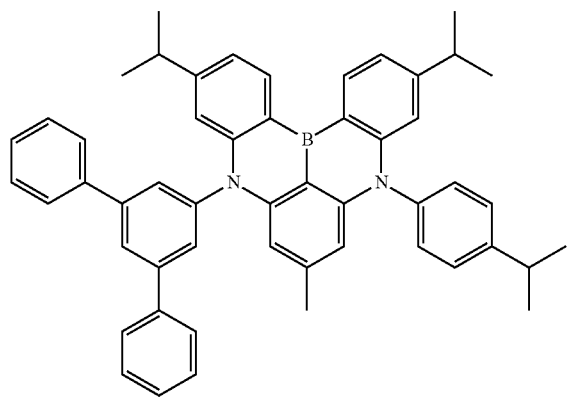
Dopant 155
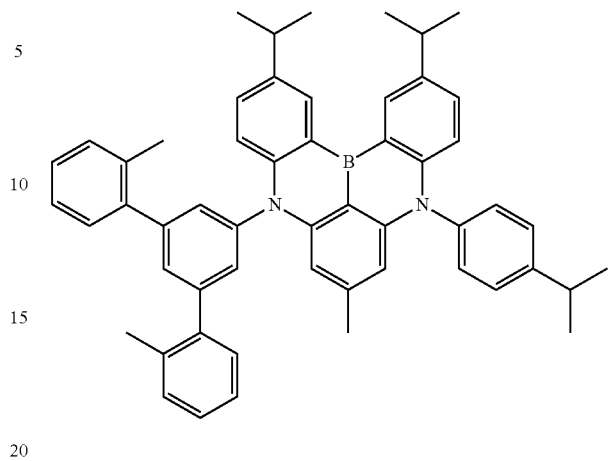
Dopant 153
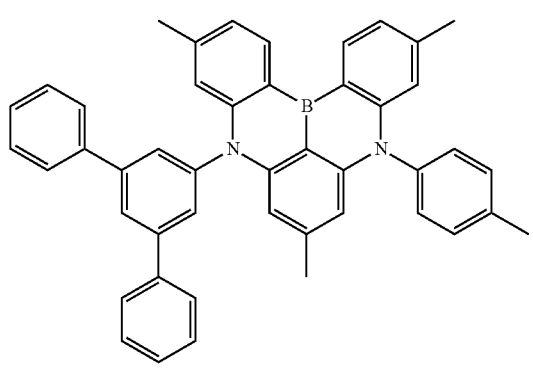
Dopant 156
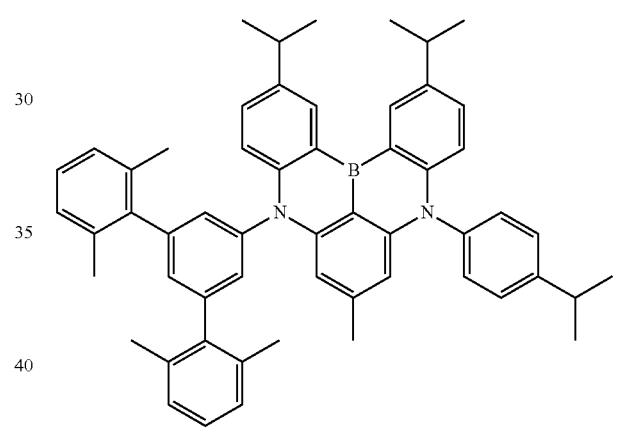
Dopant 154
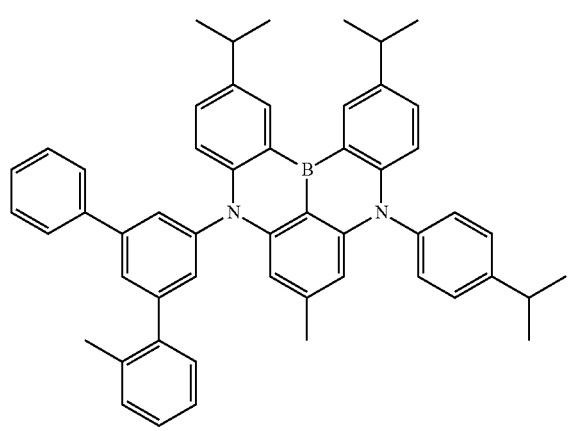
Dopant 157
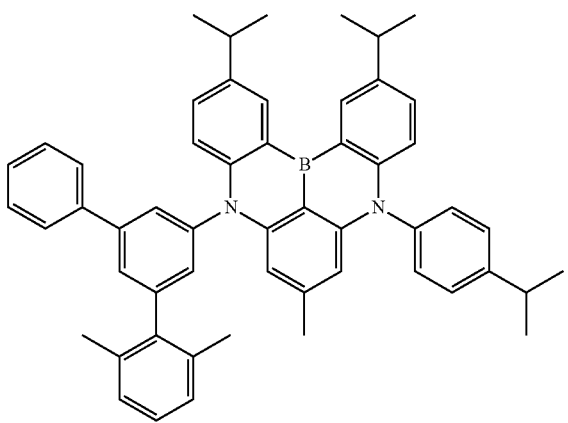

Dopant 158
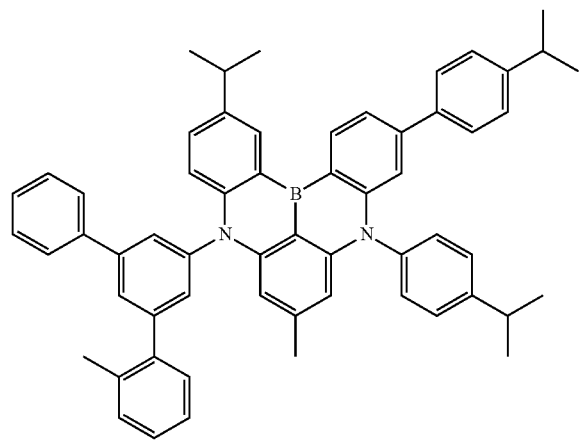
Dopant 161
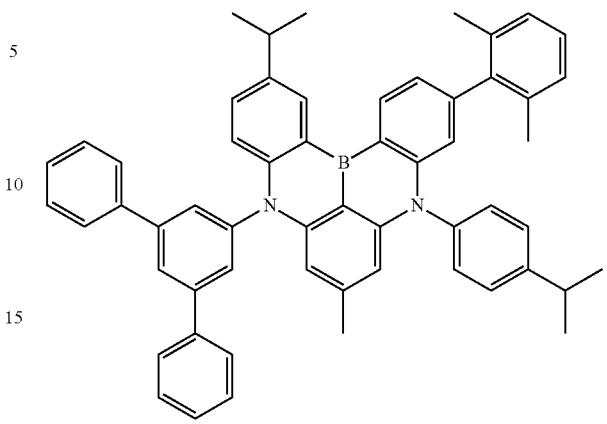
Dopant 159
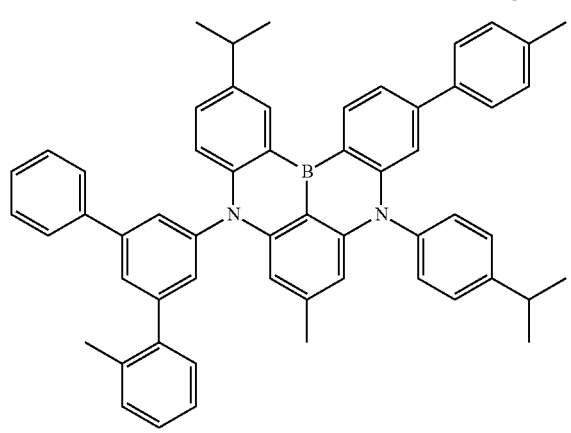
Dopant 162
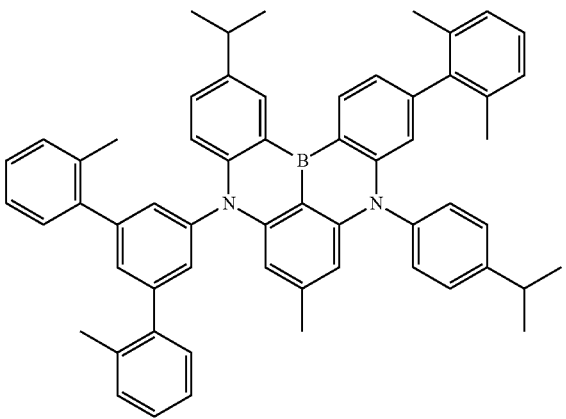
Dopant 160
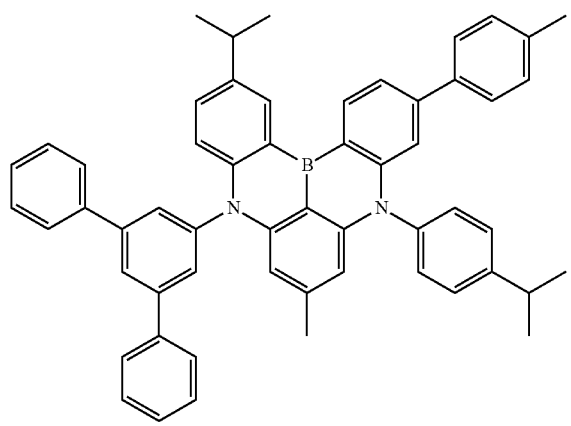
Dopant 163
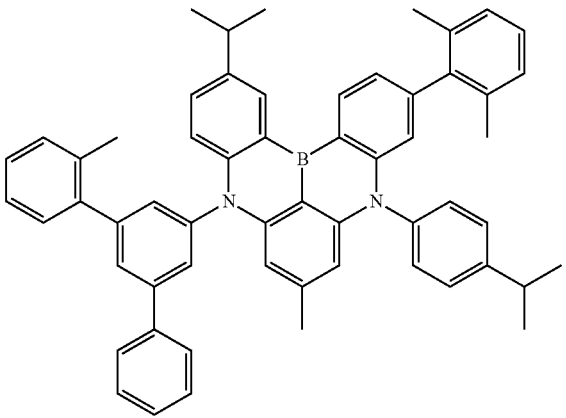

Dopant 164
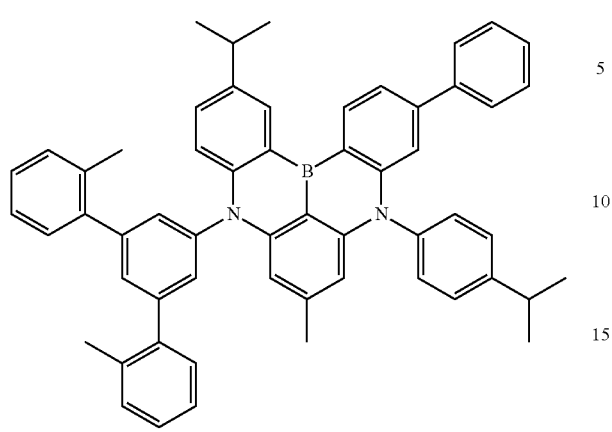
Dopant 168
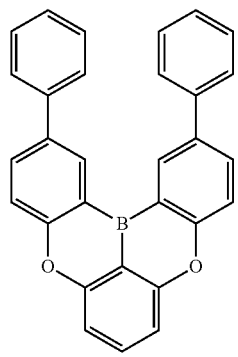
Dopant 165
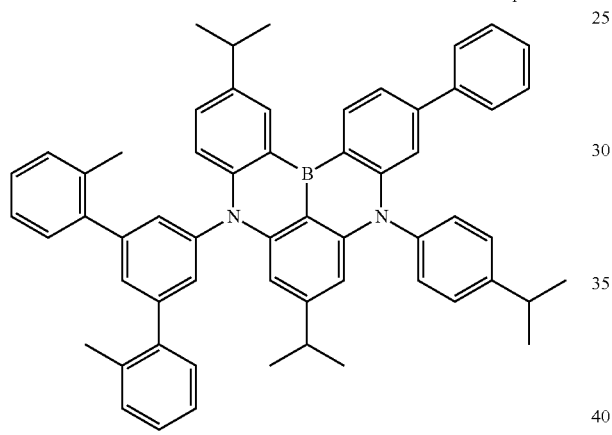
Dopant 169
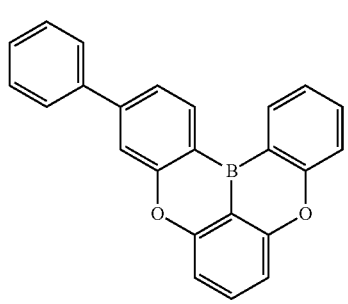
Dopant 170
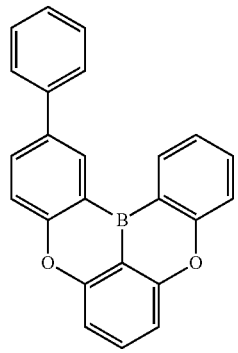
Dopant 166
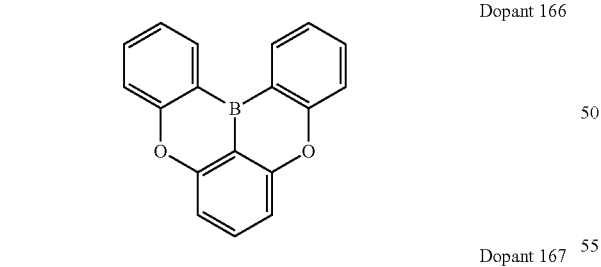
Dopant 171
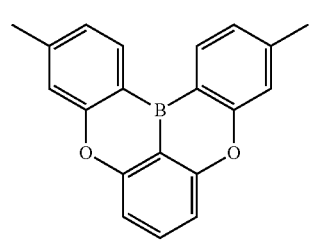
Dopant 167
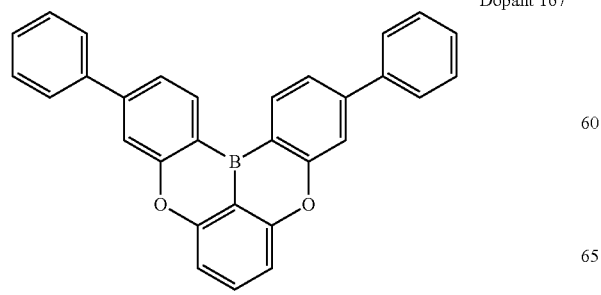
Dopant 172
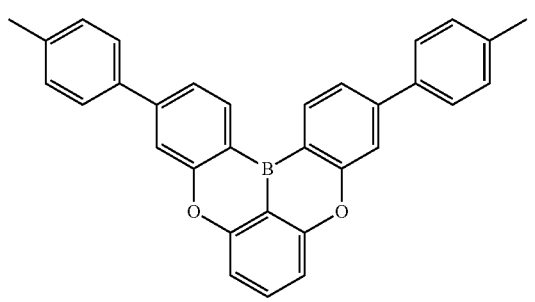

Dopant 173
Dopant 174
Dopant 175
Dopant 176
Dopant 177
Dopant 178
Dopant 179
Dopant 180
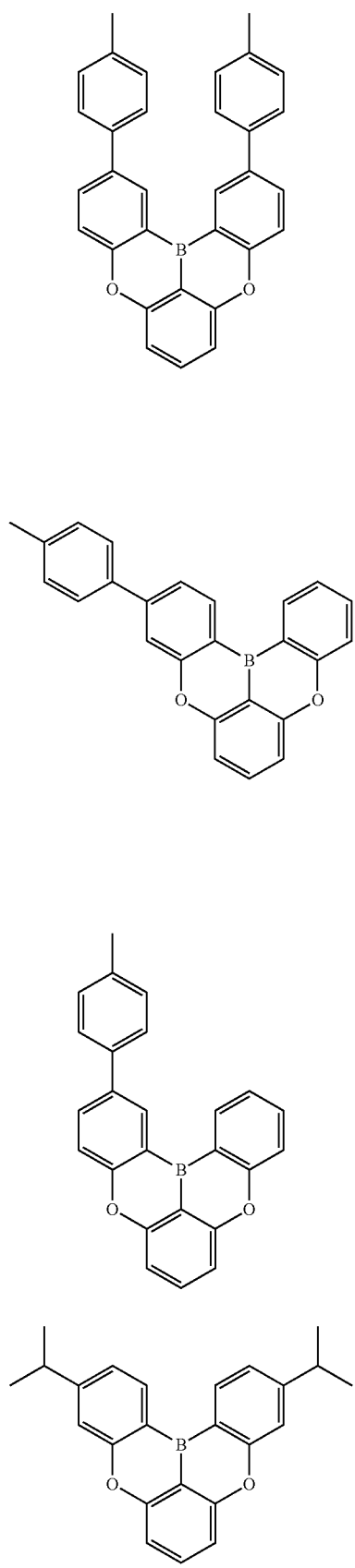

301
-continued
Dopant 181
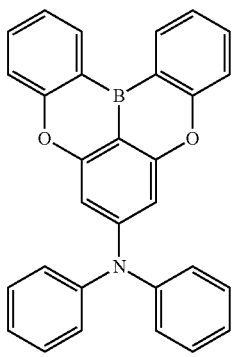
Dopant 182
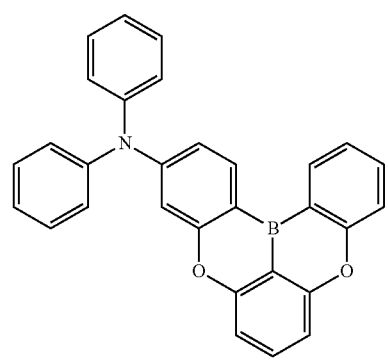
Dopant 183
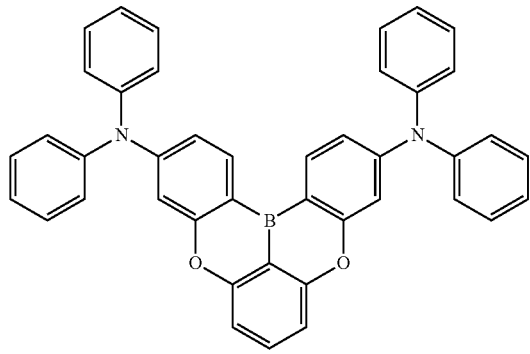
Dopant 184
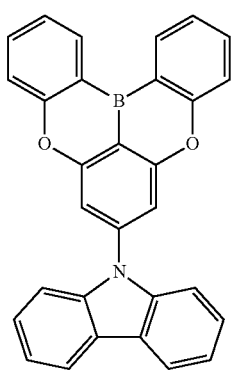
302
-continued
Dopant 185
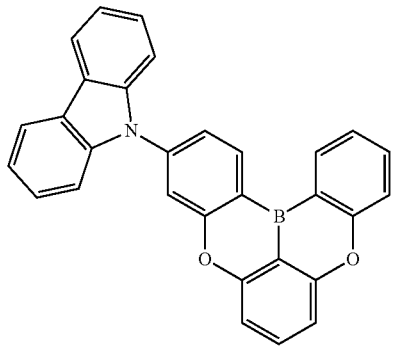
Dopant 186
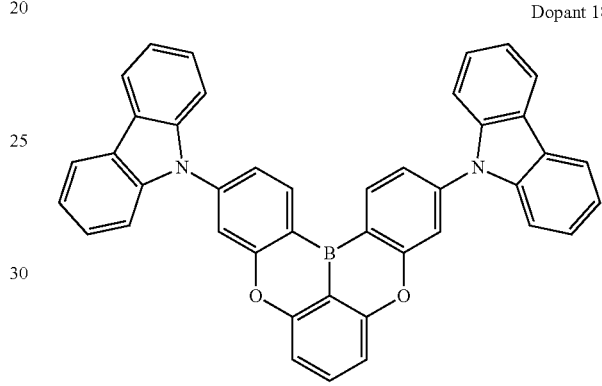
Dopant 187
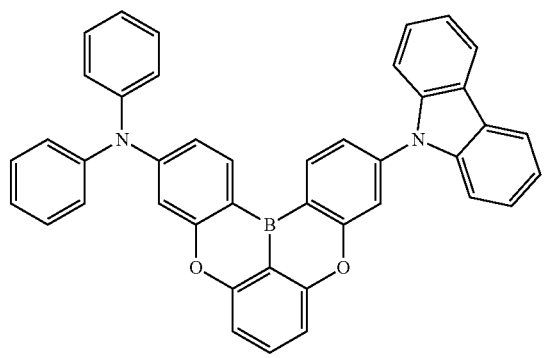
Dopant 188
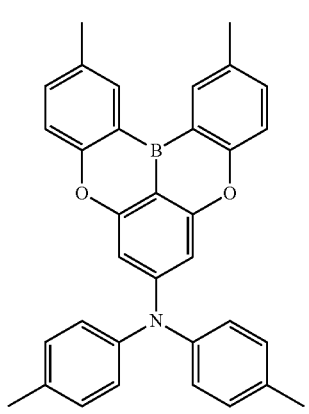

-continued
Dopant 189
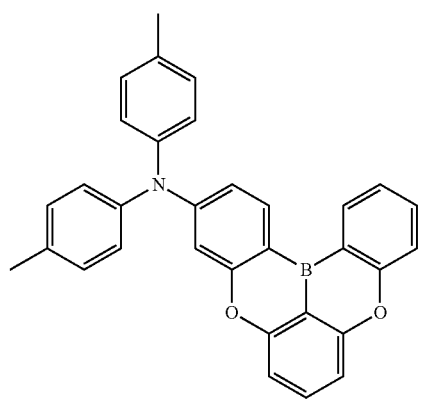
Dopant 190
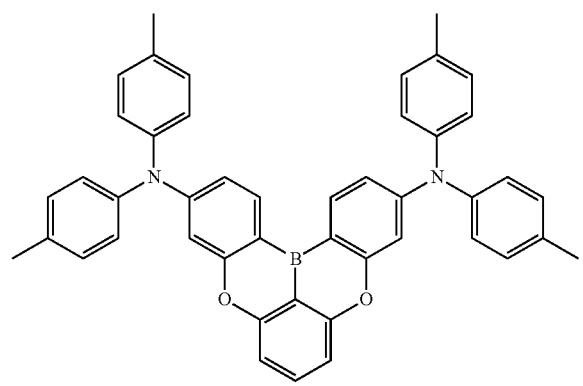
Dopant 191
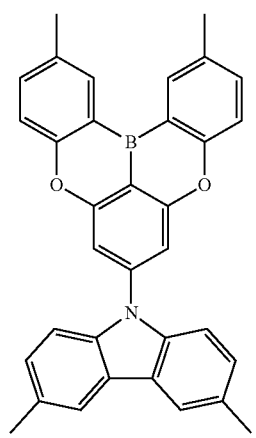
Dopant 192
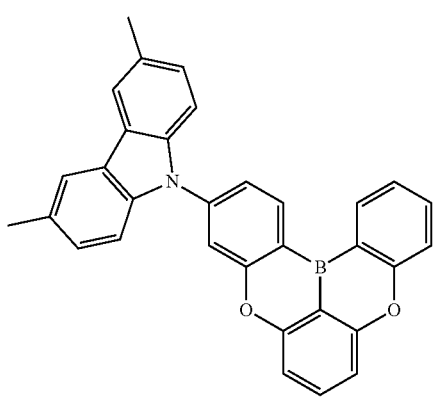
-continued
Dopant 193
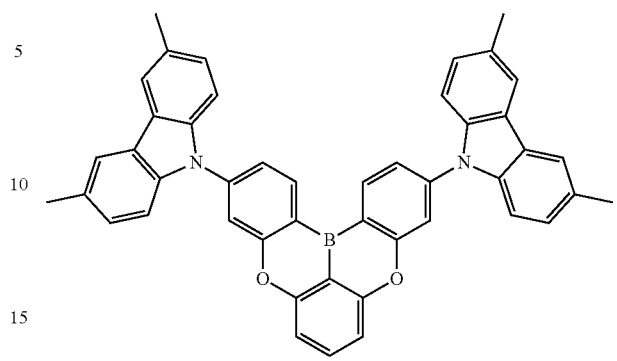
Dopant 194
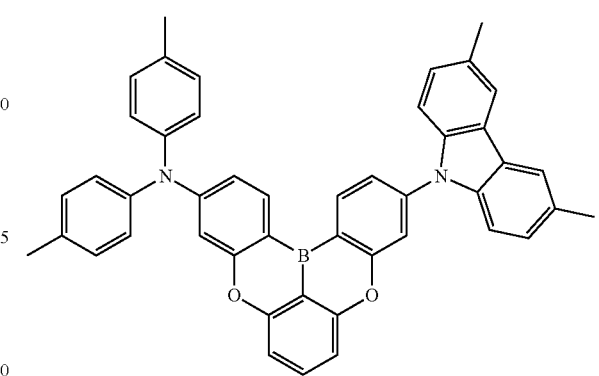
Dopant 195
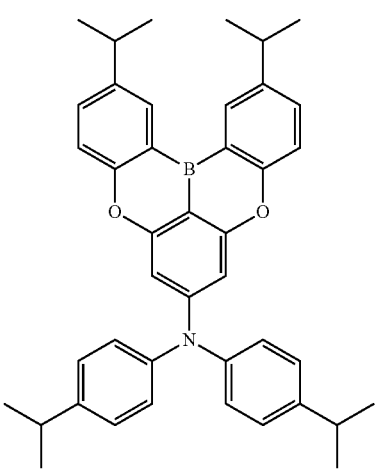

Dopant 196
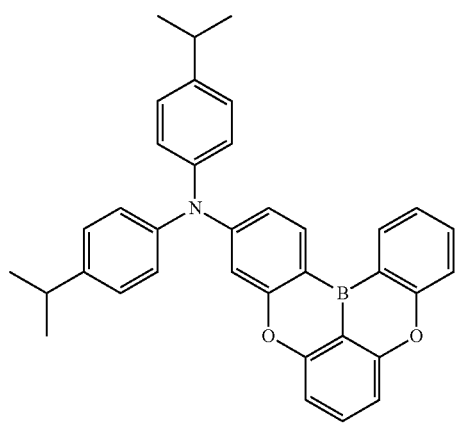
Dopant 197
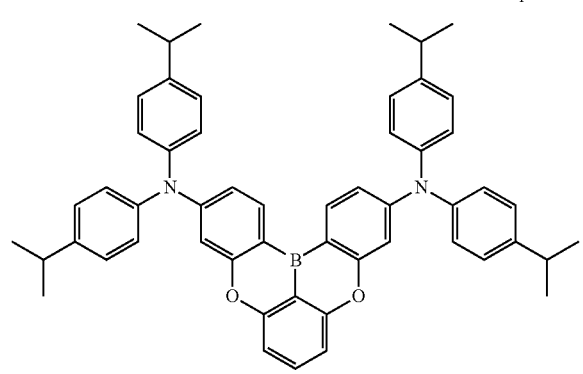
Dopant 198
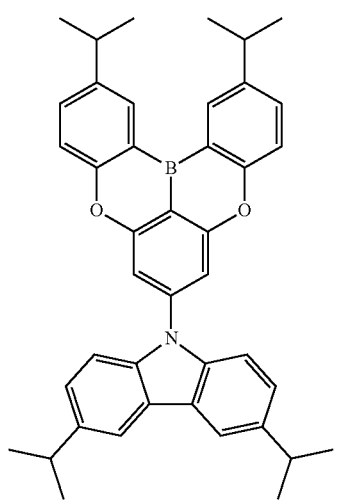
Dopant 199
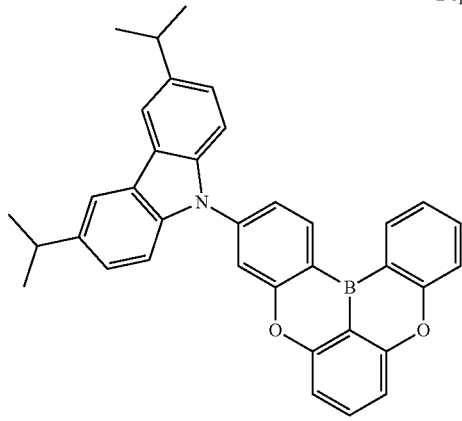
Dopant 200
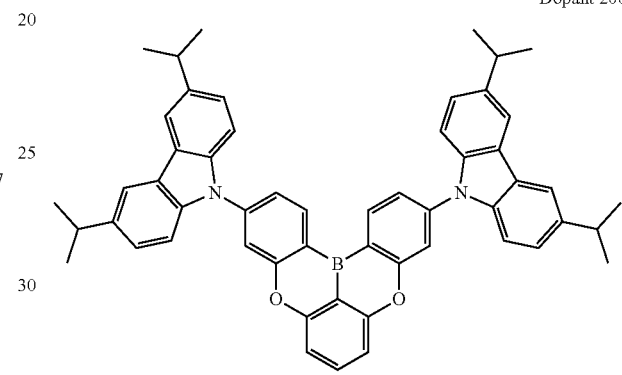
Dopant 201
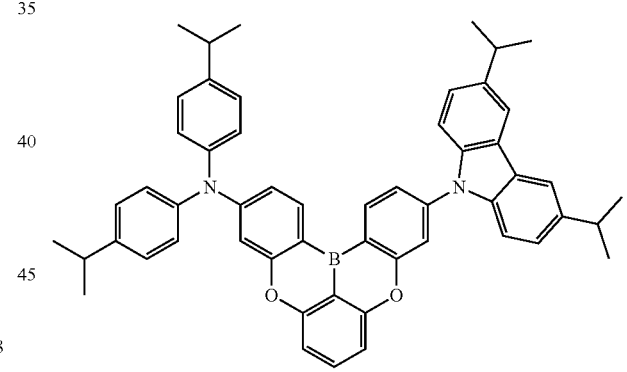
Dopant 202
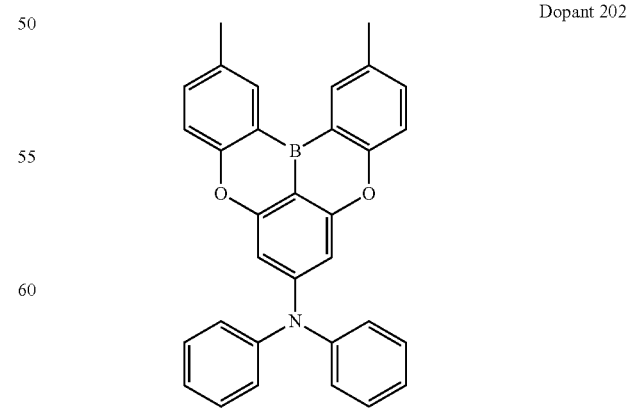

307
-continued
Dopant 203
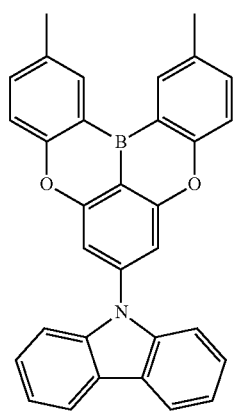
Dopant 204
Dopant 205
308
-continued
Dopant 206
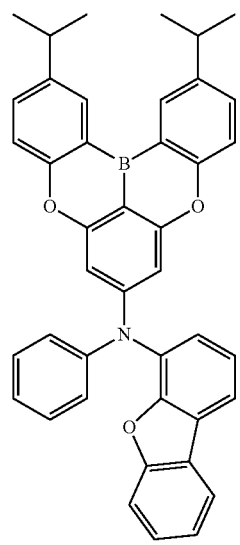
Dopant 207
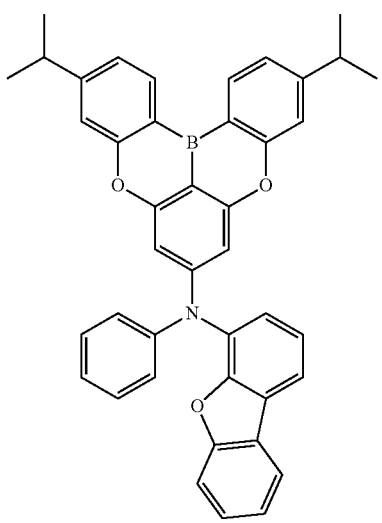
Dopant 208
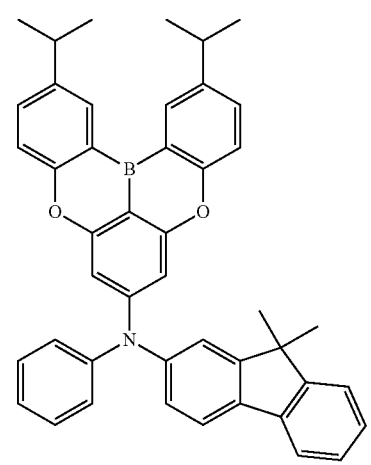

Dopant 209
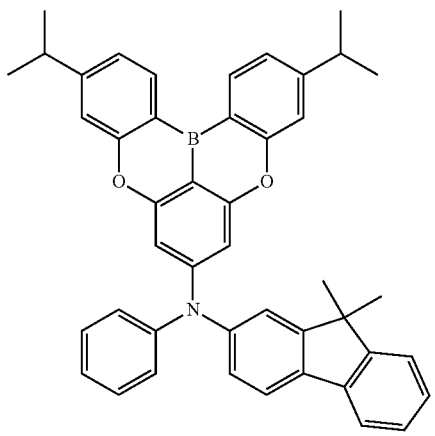
Dopant 210
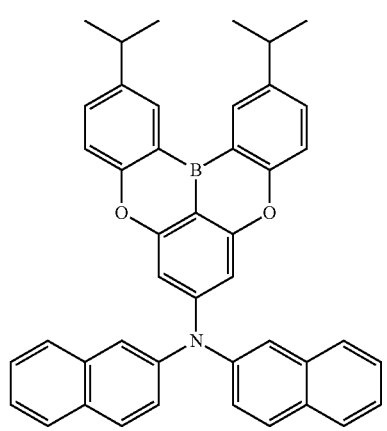
Dopant 211
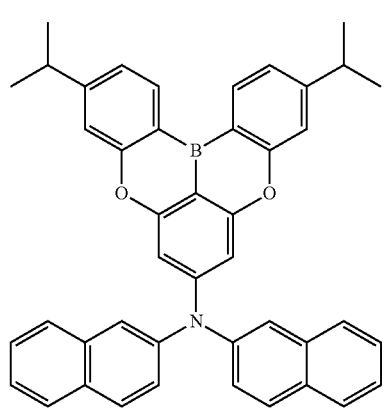
Dopant 212
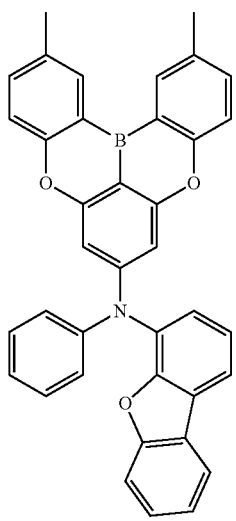
Dopant 213
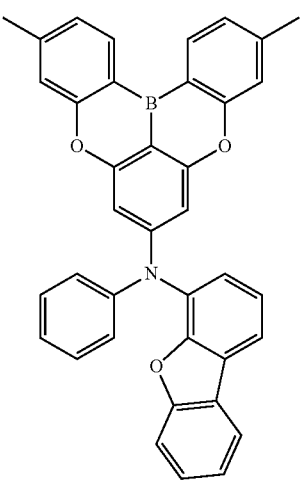
Dopant 214
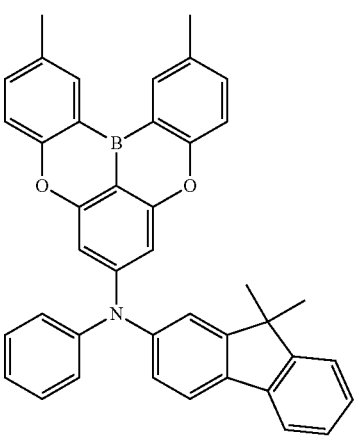

-continued
Dopant 215
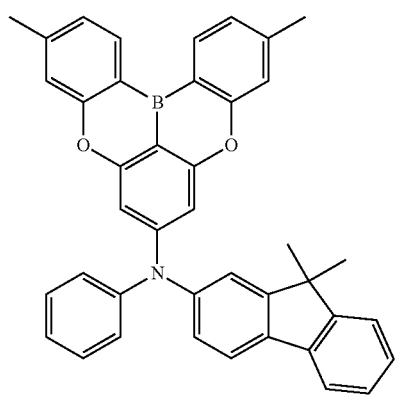
Dopant 216
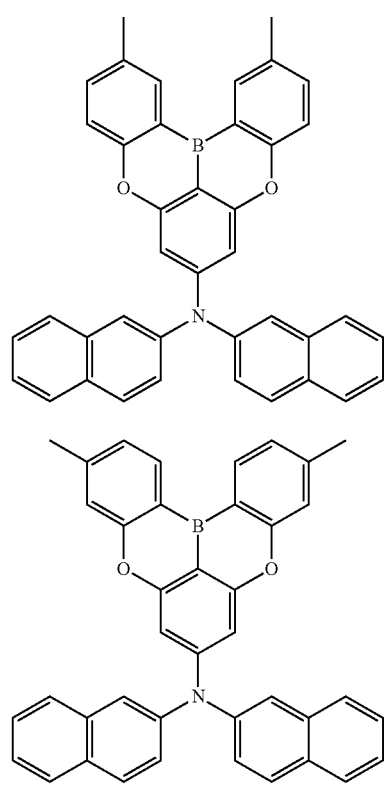
Dopant 217
Dopant 218
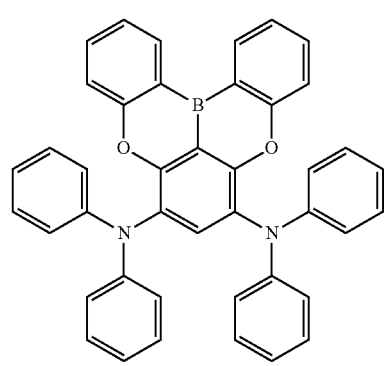
-continued
Dopant 219
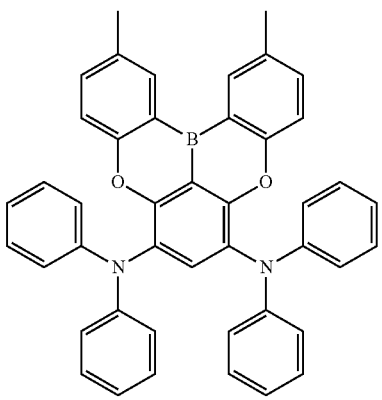
Dopant 220
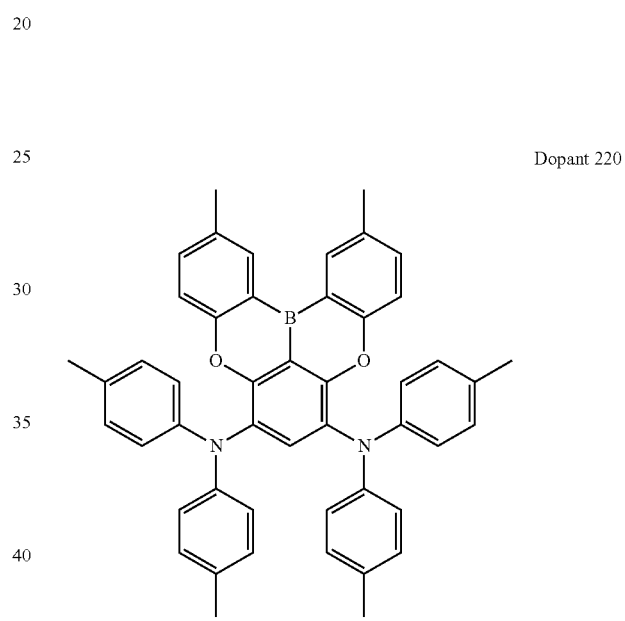
Dopant 221
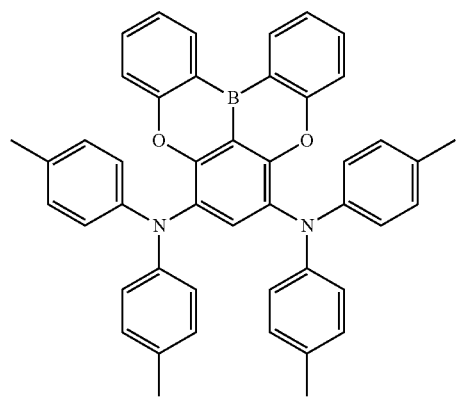

Dopant 222
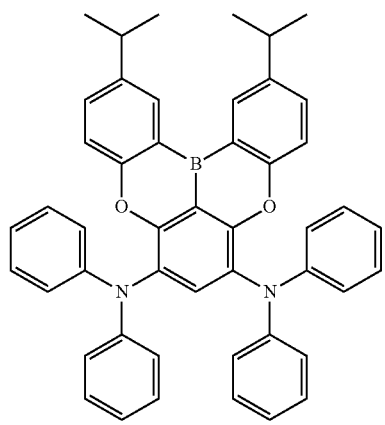
Dopant 225
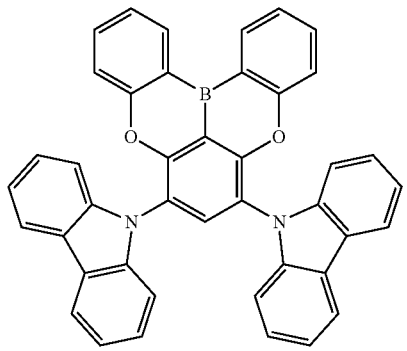
Dopant 223
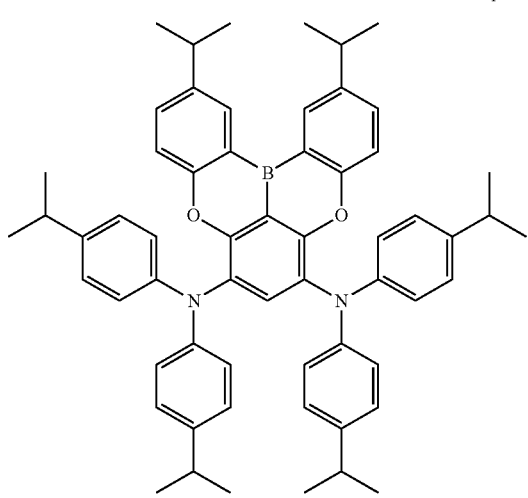
Dopant 226
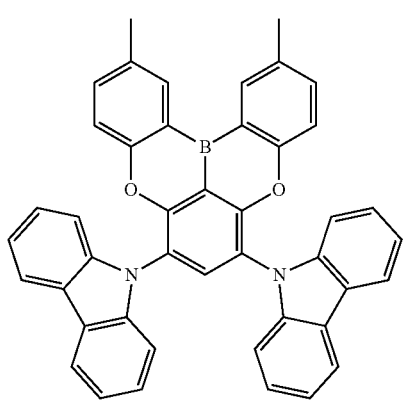
Dopant 227
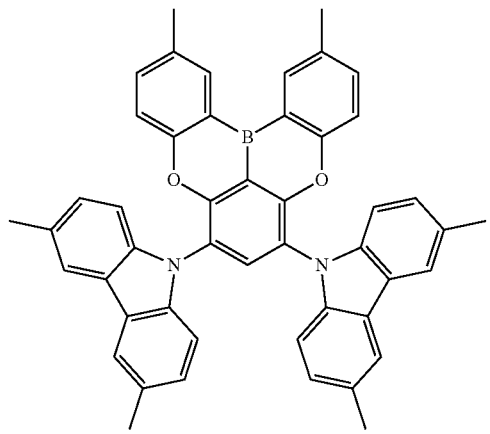
Dopant 224
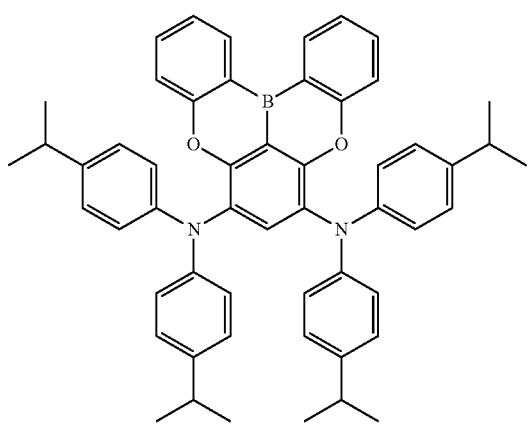
Dopant 228
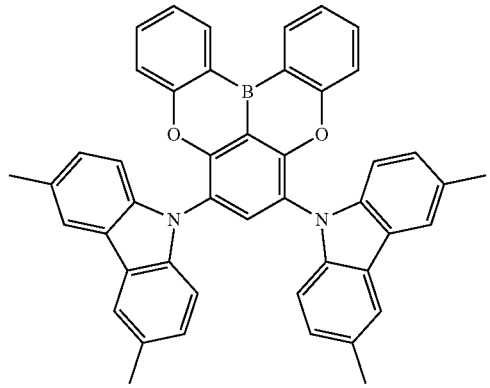

Dopant 229
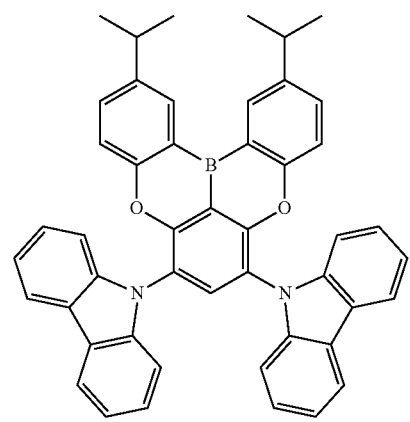
Dopant 230
Dopant 231
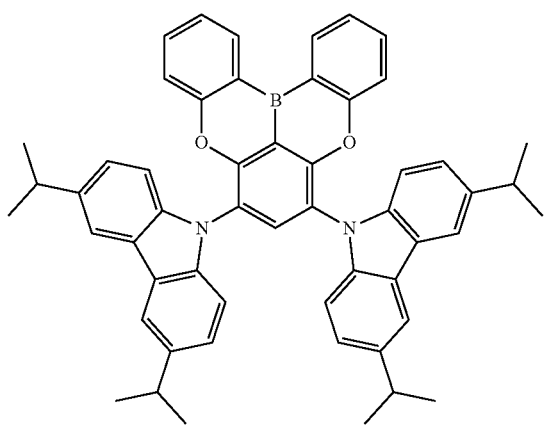
Dopant 232
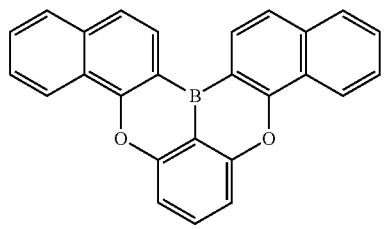
Dopant 233
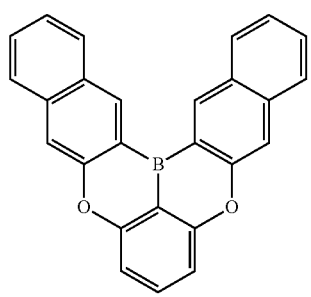
Dopant 234
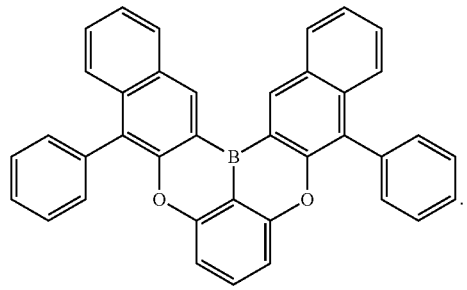
22. The organic light emitting device of claim 19, wherein the amine-based compound having the structure of Chemical Formula 5 comprises an amine-based compound selected from the following compounds:
H1
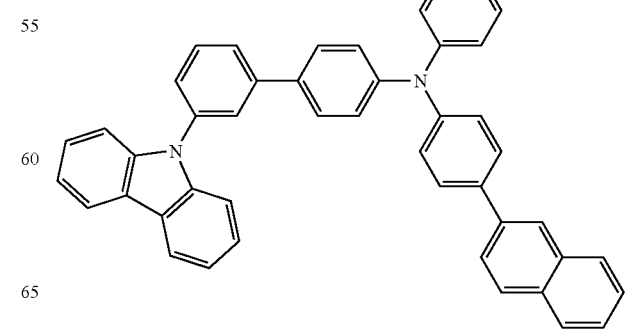

317
-continued
H3
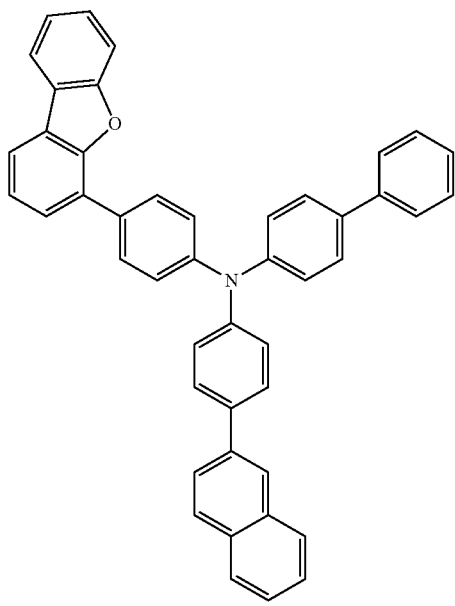
H4
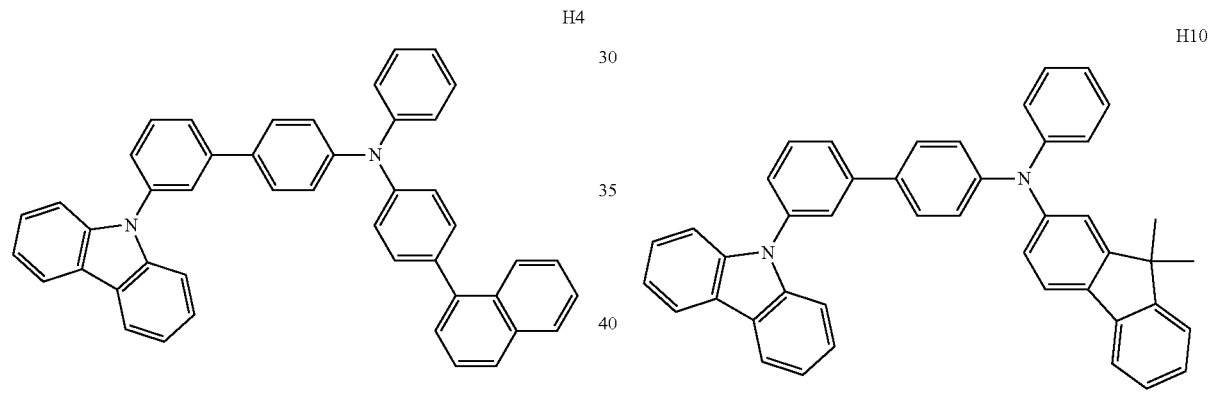
H6
318
-continued
H9
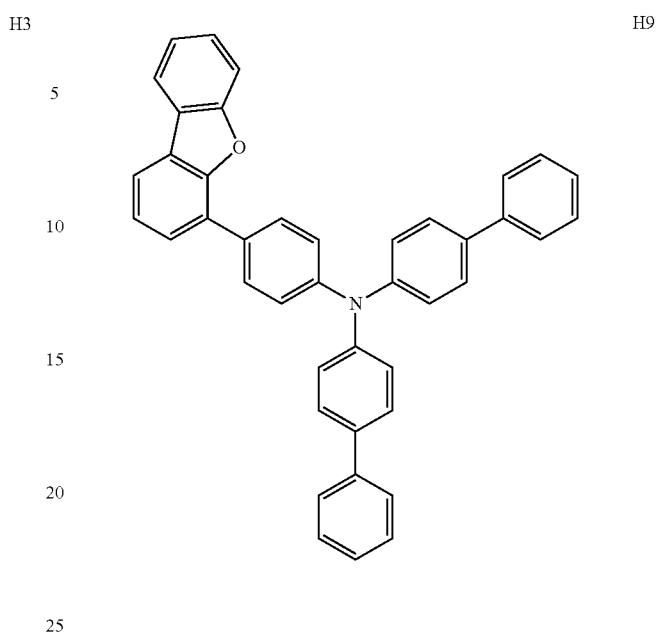
H10
H11
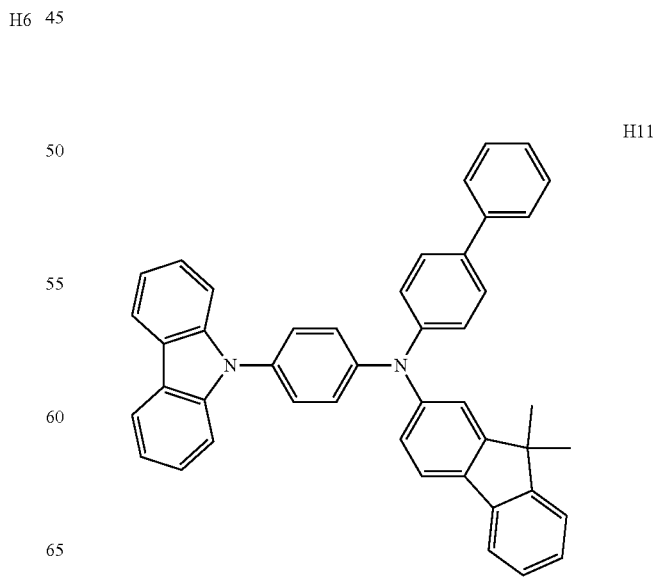
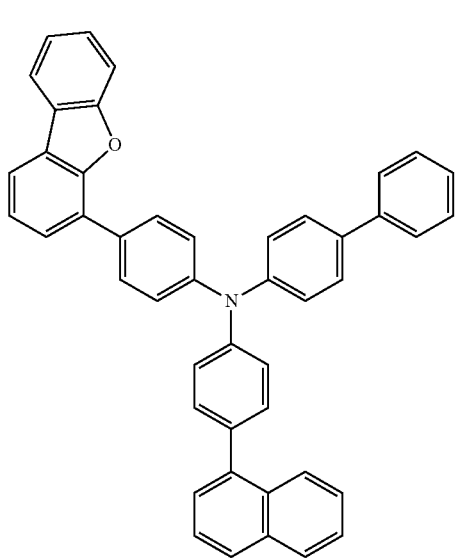

319
-continued
320
-continued
H12
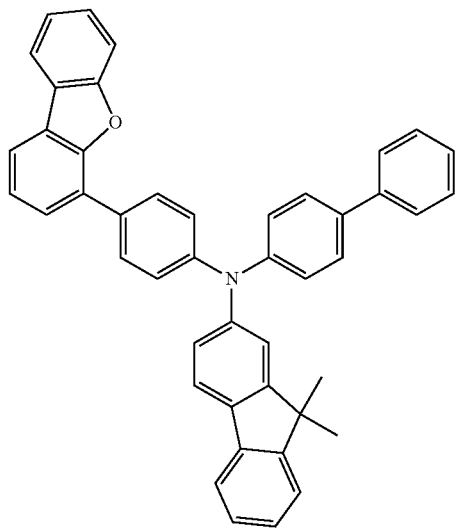
H15
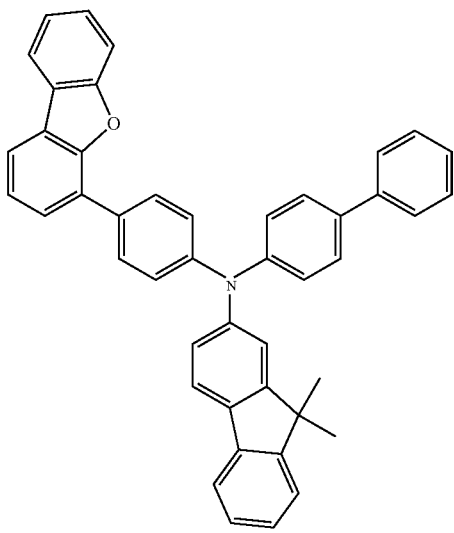
H13
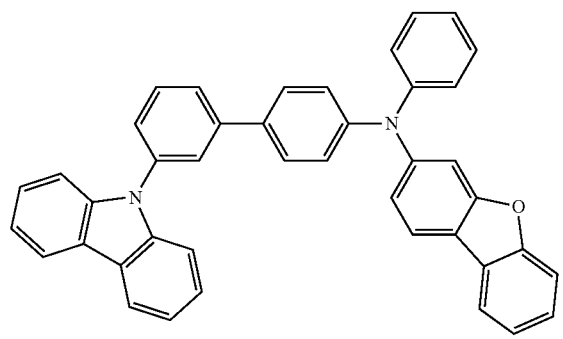
H16
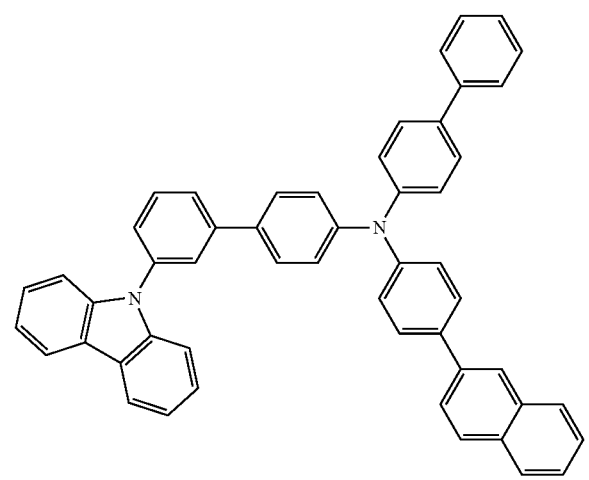
H14
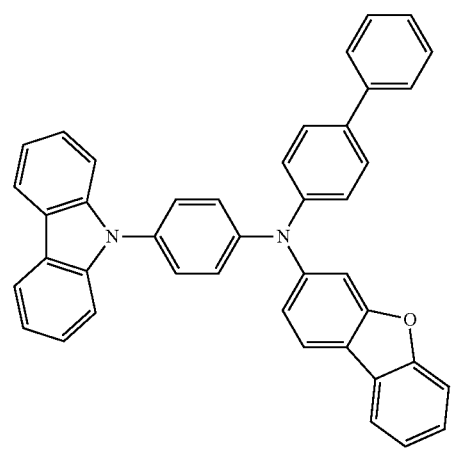
H17
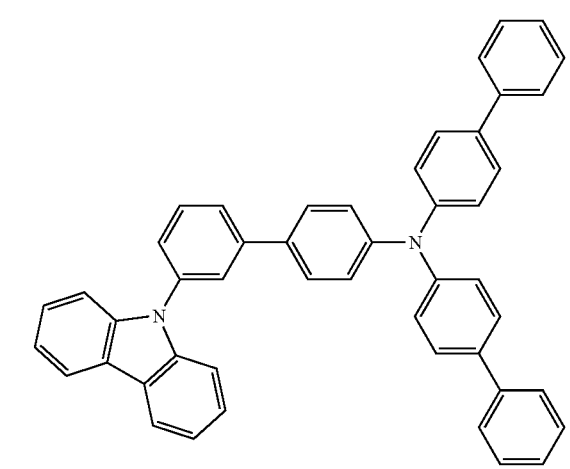

321
-continued

H18
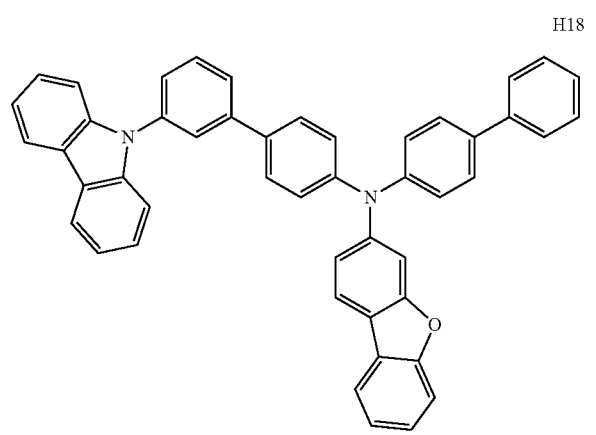

H19
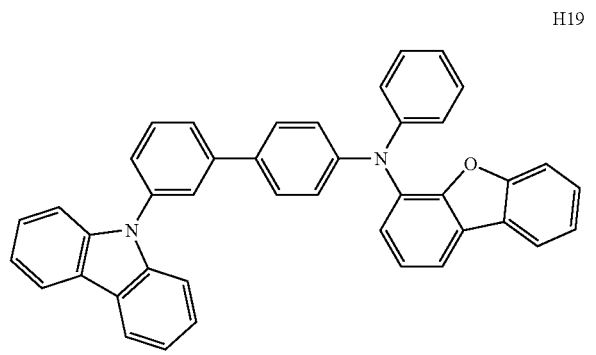

H20
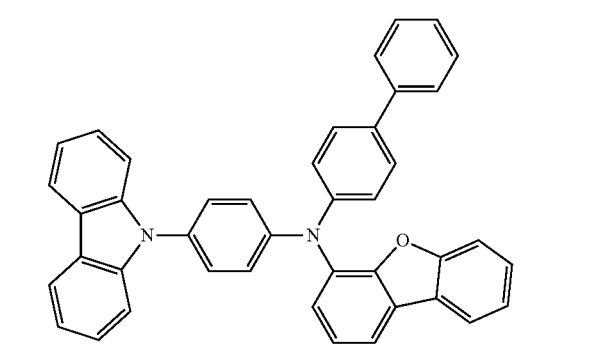

H21
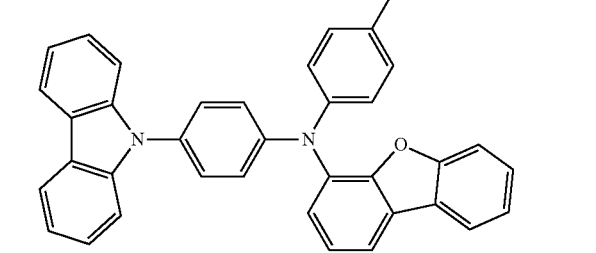

322
-continued

H22
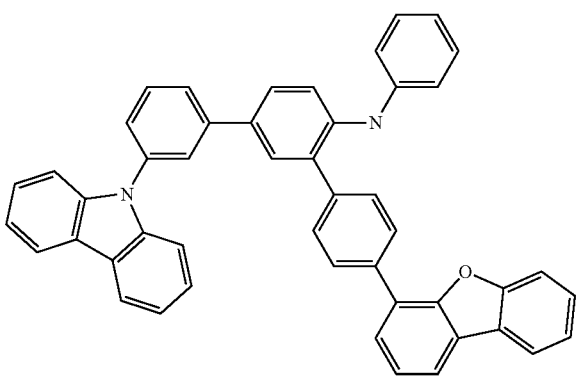

H23
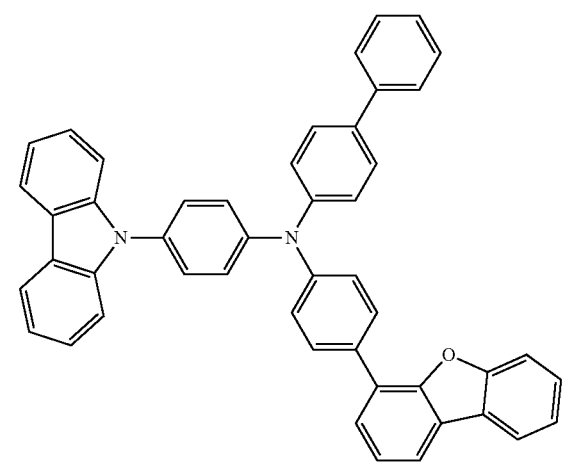

H24
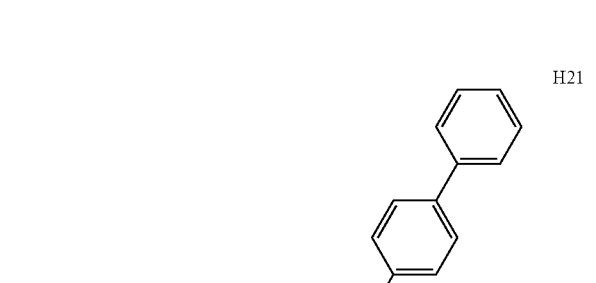

23. The organic light emitting device of claim 19, the organic light emitting diode further comprises a first blocking layer disposed between the first emitting material layer and the second electrode.

24. The organic light emitting device of claim 23, wherein the first hole blocking layer includes an azine-based compound having the following structure of Chemical Formula 7 or a benzimidazole-based compound having the following structure of Chemical Formula 9:

Chemical Formula 7

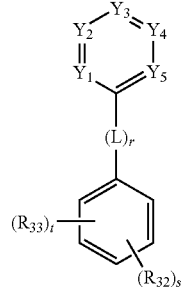

wherein each of $Y_1$ to $Y_5$ is independently $CR_{31}$ or nitrogen (N) and at least three among the Y1 to $Y_5$ is nitrogen, wherein $R_{31}$ is a $C_6$~$C_{30}$ aryl group; L is a $C_6$~$C_{30}$ arylene group; $R_{32}$ is a $C_6$~$C_{30}$ aryl group or a $C_5$~$C_{30}$ hetero aryl group; $R_{33}$ is hydrogen or two adjacent $R_{32}$ form a fused aromatic ring; r is 0 (zero) or 1, s is 1 or 2 and t is an integer of 0 (zero) to 4;

Chemical Formula 9

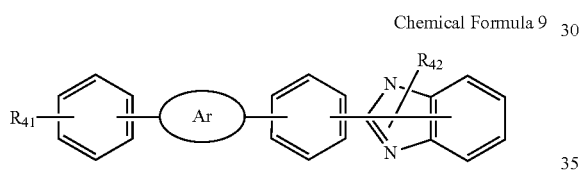

wherein Ar is a $C_{10}$~$C_{30}$ arylene group; $R_{41}$ is a $C_6$~$C_{30}$ aryl group or a $C_5$~$C_{30}$ hetero aryl group; and $R_{42}$ is a $C_1$~$C_{10}$ alkyl group or a $C_6$~$C_{30}$ aryl group.

25. The organic light emitting device of claim 24, wherein the azine-based compound comprises an azine-based compound selected from the following compounds:

E1

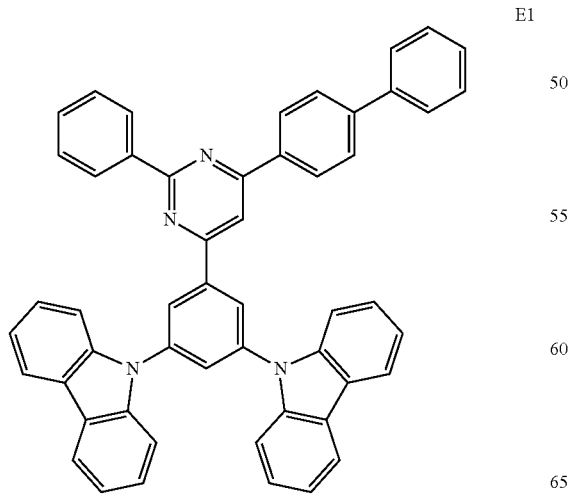

E2

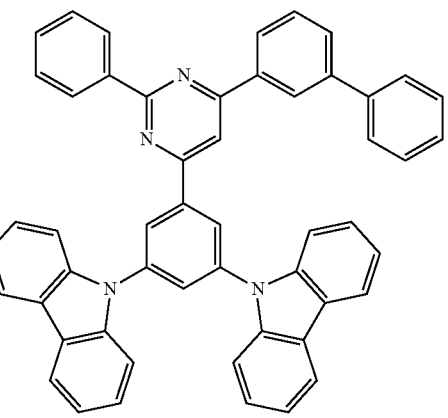

E3

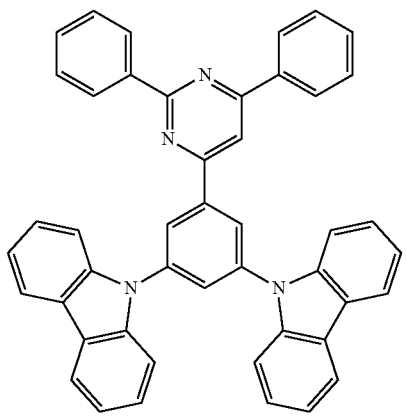

E4

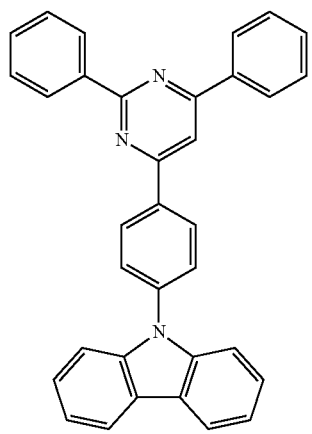

E5

E6

E7

E8

E9

E10

-continued
E11
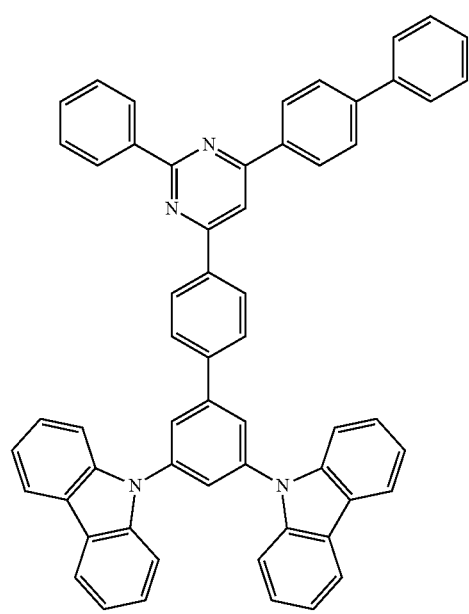
E12
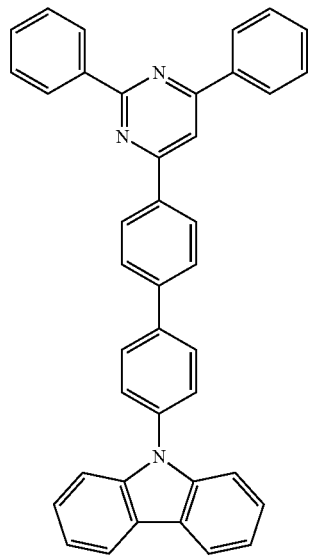
E13
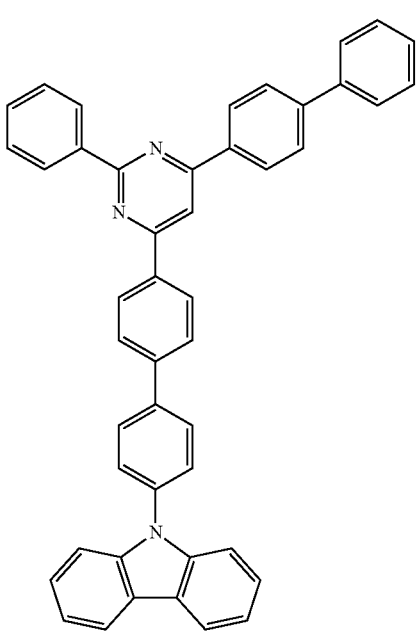
E14
E15
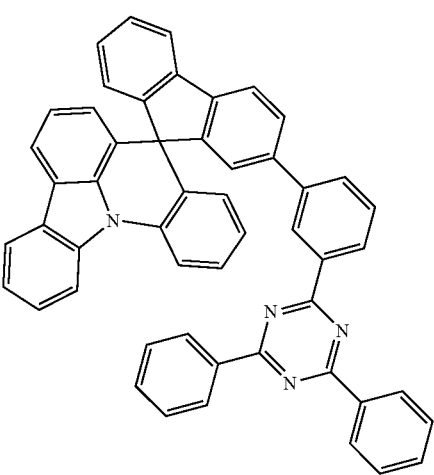

E16
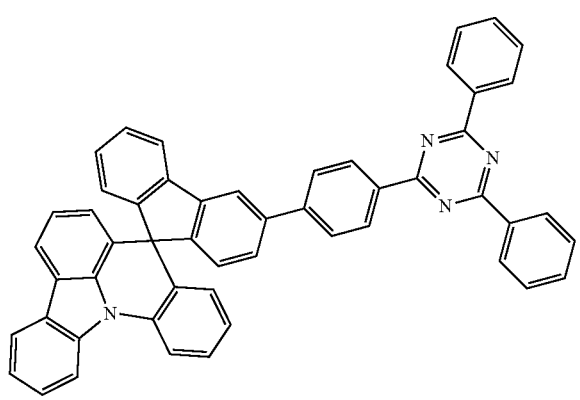
E17
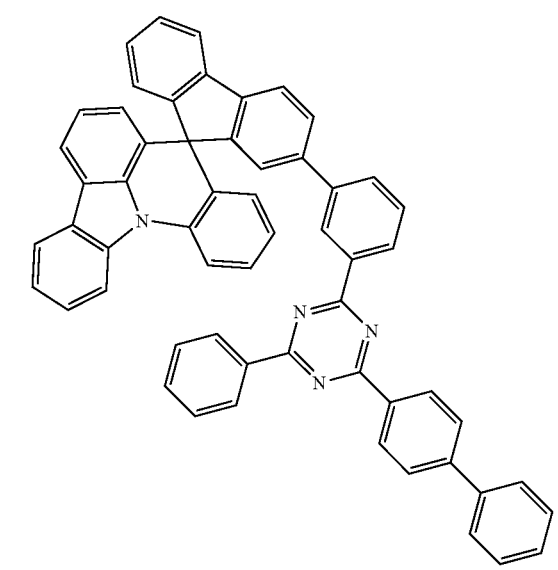
E18
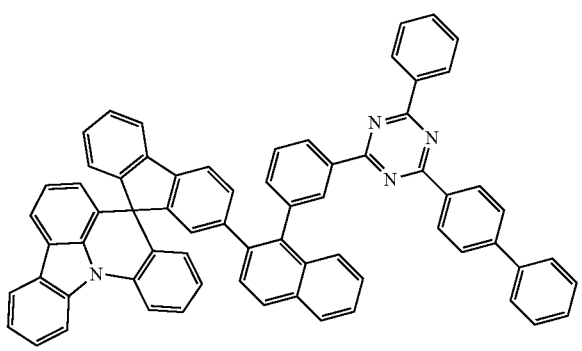
E19
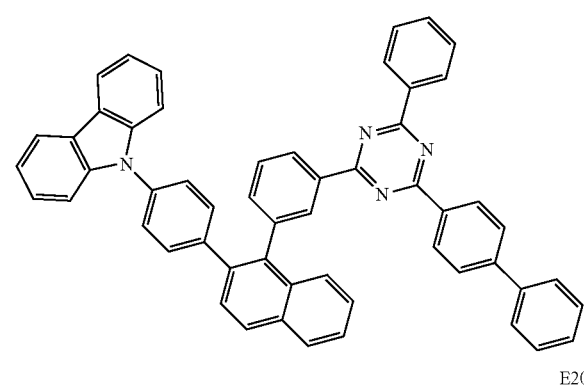
E20
E21
26. The organic light emitting device of claim 24, wherein the benzimidazole-based compound comprises a benzimidazole-based compound selected from the following compounds:
F1
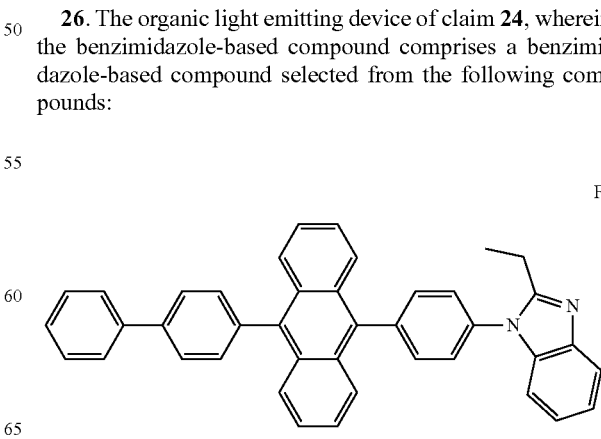

F2
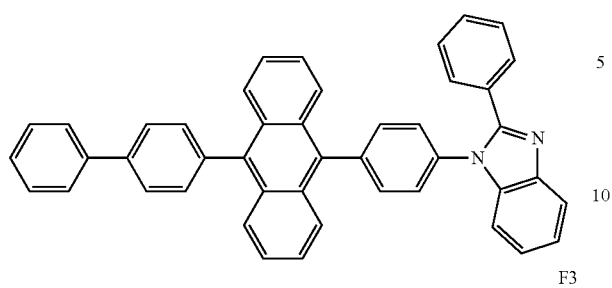

F3
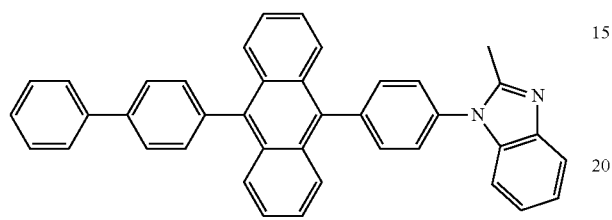

Host 2
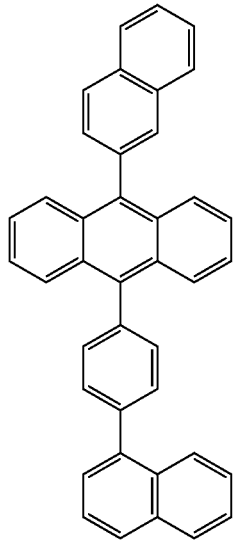

F1
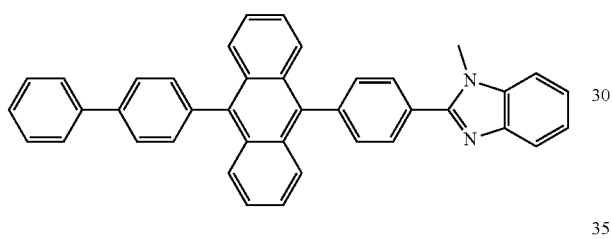

F2
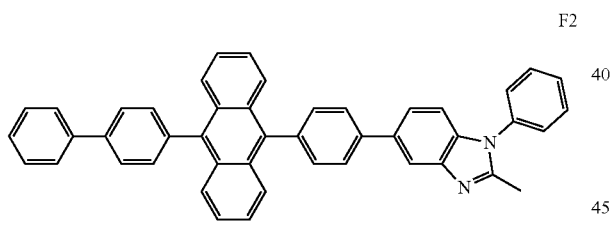

Host 3
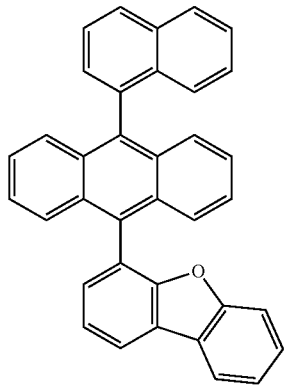

F6
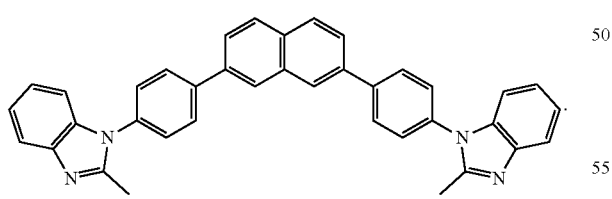

Host 4
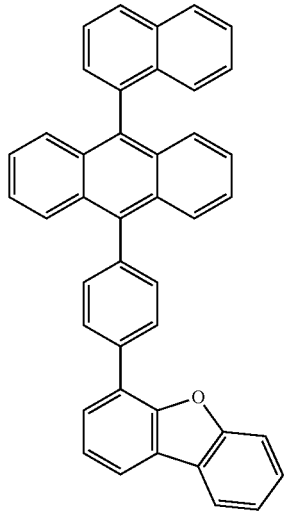

27. The organic light emitting device of claim 19, the organic light emitting diode further comprises a second emitting unit disposed between the first emitting unit and the second electrode and including a second emitting material layer, and a first charge generation layer disposed between the first and second emitting units, and wherein at least one of the first and second emitting material layers includes the host selected from one of the following compounds:

Host 5
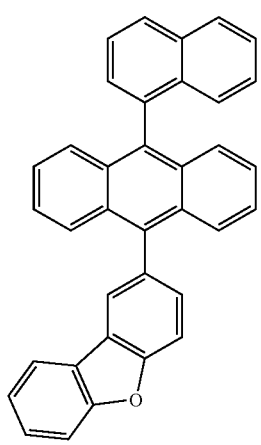
Host 6
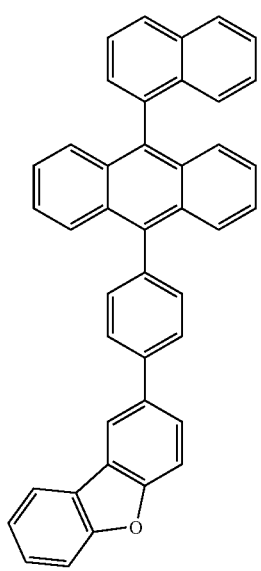
Host 7
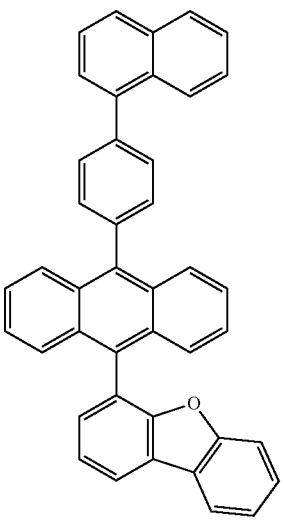
Host 8
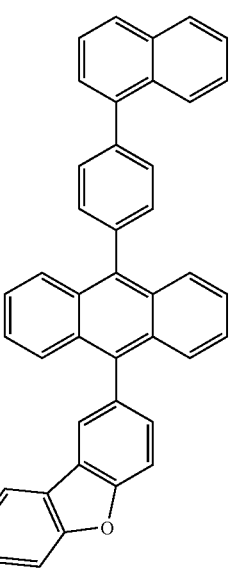
Host 9
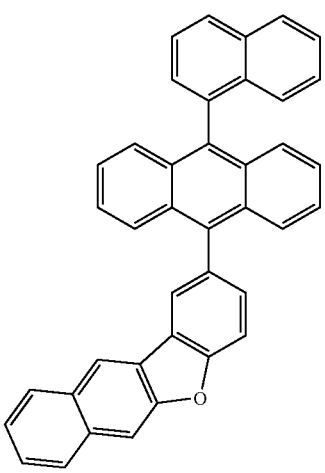
Host 10
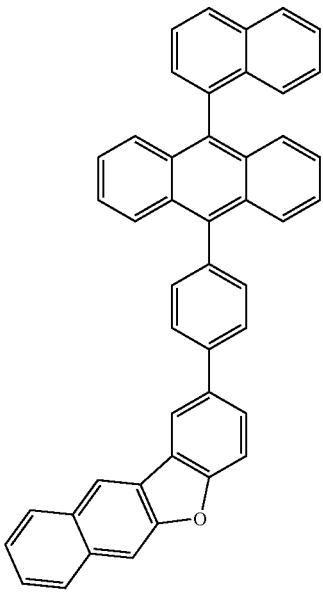

Host 13
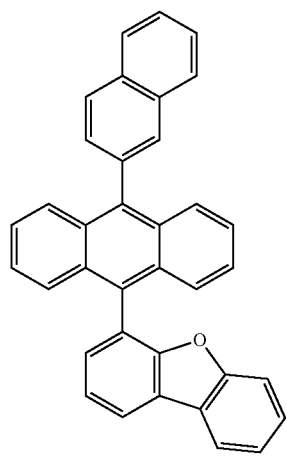
Host 14
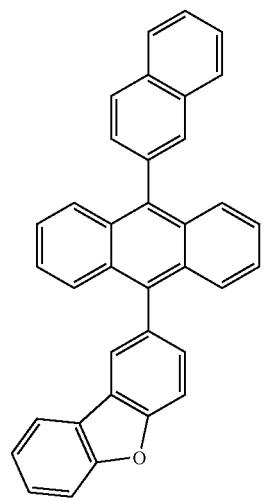
Host 15
Host 16
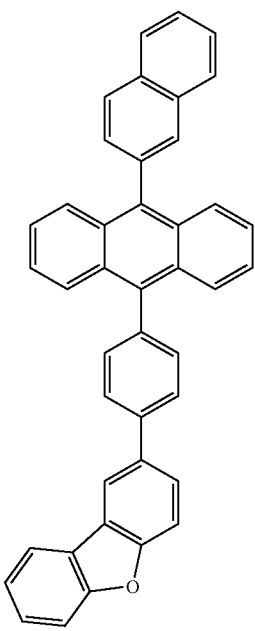
Host 17

-continued
Host 18
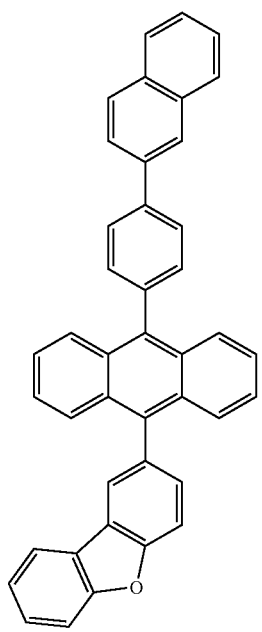
Host 19
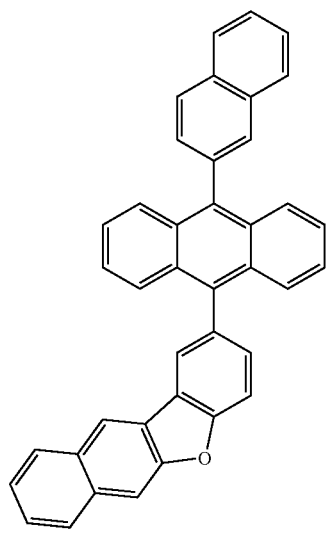
-continued
Host 20
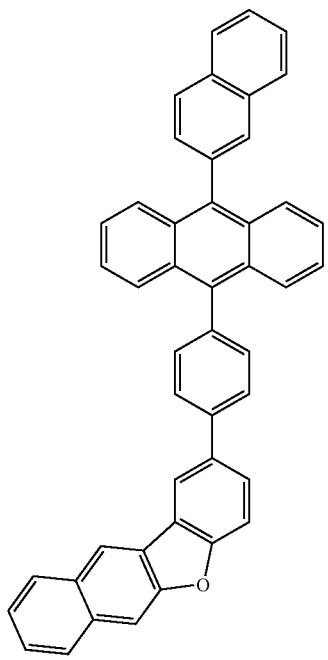
Host 21
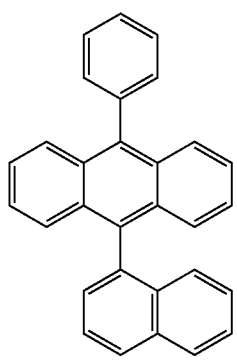
Host 22
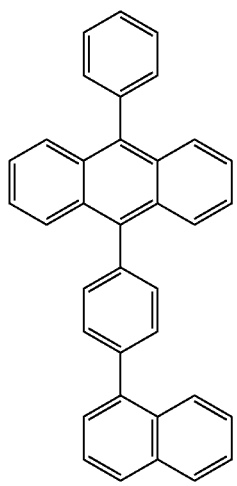

Host 23
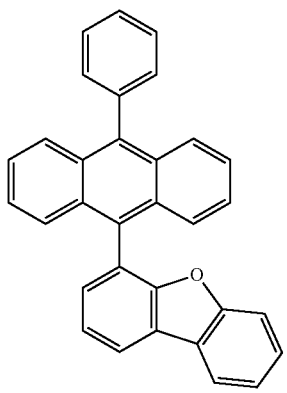
Host 24
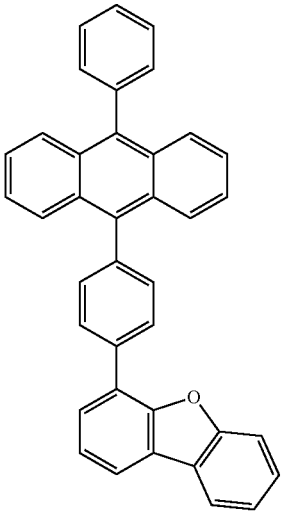
Host 25
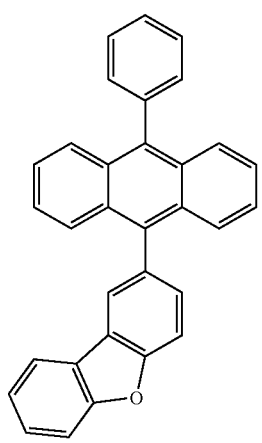
Host 26
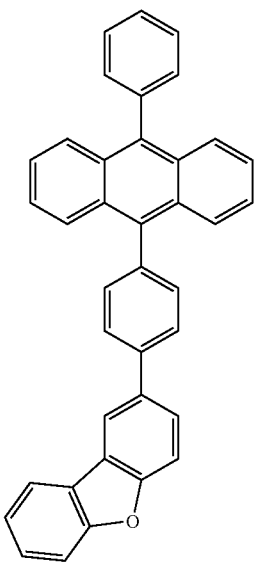
Host 27
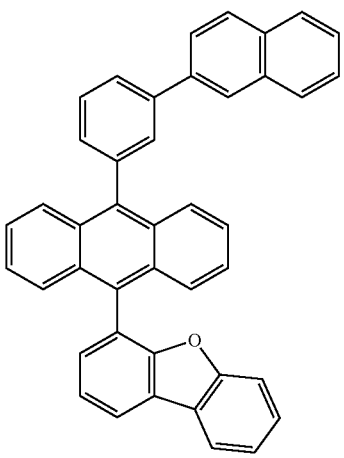
Host 28
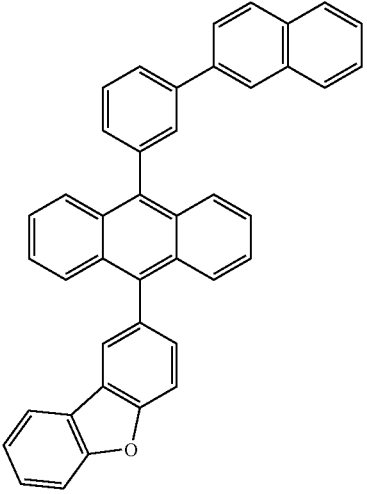

Host 29

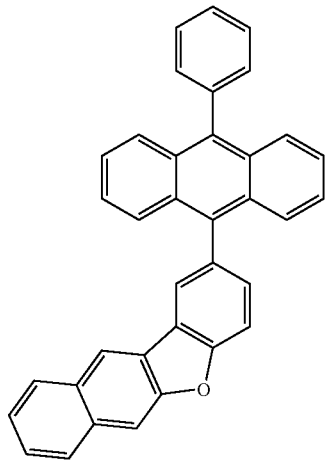

Host 30

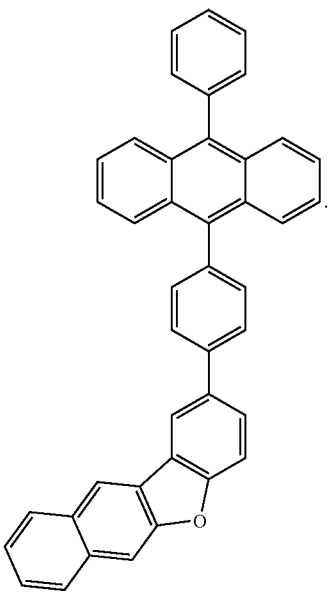

28. The organic light emitting device of claim 27, wherein the second emitting unit further comprises a second electron blocking layer disposed between the first charge generation layer and the second emitting material layer, and wherein the second electron blocking layer includes the amine-based compound having the structure of Chemical Formula 5.

29. The organic light emitting device of claim 28, the organic light emitting diode further comprises at least one hole blocking layer of a first hole blocking layer disposed between the first emitting material layer and the first charge generation layer and a second hole blocking layer disposed between the second emitting material layer and the second electrode.

30. The organic light emitting device of claim 29, wherein the hole blocking layer includes an azine-based compound having the following structure of Chemical Formula 7 or a benzimidazole-based compound having the following structure of Chemical Formula 9:

Chemical Formula 7

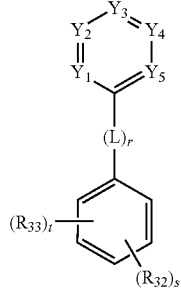

wherein each of $Y_1$ to $Y_5$ is independently $CR_{31}$ or nitrogen (N) and at least three among the Y1 to $Y_5$ is nitrogen, wherein $R_{31}$ is a $C_6$~$C_{30}$ aryl group; L is a $C_6$~$C_{30}$ arylene group; $R_{32}$ is a $C_6$~$C_{30}$ aryl group or a $C_5$~$C_{30}$ hetero aryl group; $R_{33}$ is hydrogen or two adjacent $R_{32}$ form a fused aromatic ring; r is 0 (zero) or 1, s is 1 or 2 and t is an integer of 0 (zero) to 4;

Chemical Formula 9

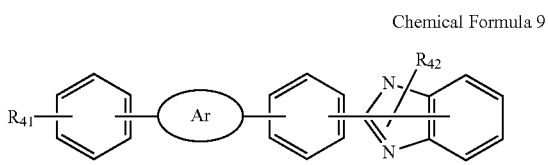

wherein Ar is a $C_{10}$~$C_{30}$ arylene group; $R_{41}$ is a $C_6$~$C_{30}$ aryl group or a $C_5$~$C_{30}$ hetero aryl group; and $R_{42}$ is a $C_1$~$C_{10}$ alkyl group or a $C_6$~$C_{30}$ aryl group.

31. The organic light emitting device of claim 27, wherein the second emitting material layer emits yellow-green color light.

32. The organic light emitting device of claim 27, wherein the second emitting material layer emits red-green color light.

33. The organic light emitting device of claim 27, the organic light emitting diode further comprises a third emitting unit disposed between the second emitting unit and the second electrode and including a third emitting material layer, and a second charge generation layer disposed between the second and third emitting units, and wherein at least one of the first to third emitting material layers includes the host having the structure of Chemical Formula 1 and the dopant having the structure of Chemical Formula 3.

34. The organic light emitting device of claim 33, the third emitting unit further comprises a third electron blocking layer disposed between the second charge generation layer and the third emitting material layer, and wherein the third electron blocking layer includes the amine-based compound having the structure of Chemical Formula 5.

35. The organic light emitting device of claim 34, the organic light emitting diode further comprises at least one hole blocking layer of a first hole blocking layer disposed between the first emitting material layer and the first charge generation layer, a second hole blocking layer disposed between the second emitting material layer and the second charge generation layer and a third hole blocking layer disposed between the third emitting material layer and the second electrode.

36. The organic light emitting device of claim 35, wherein the hole blocking layer includes an azine-based compound having the following structure of Chemical Formula 7 or a benzimidazole-based compound having the following structure of Chemical Formula 9:

Chemical Formula 7

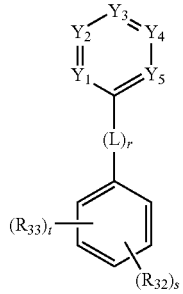

wherein each of $Y_1$ to $Y_5$ is independently $CR_{31}$ or nitrogen (N) and at least three among the Y1 to $Y_5$ is nitrogen, wherein $R_{31}$ is a $C_6$~$C_{30}$ aryl group; L is a $C_6$~$C_{30}$ arylene group; $R_{32}$ is a $C_6$~$C_{30}$ aryl group or a $C_5$~$C_{30}$ hetero aryl group; $R_{33}$ is hydrogen or two adjacent $R_{32}$ form a fused aromatic ring; r is 0 (zero) or 1, s is 1 or 2 and t is an integer of 0 (zero) to 4;

Chemical Formula 9

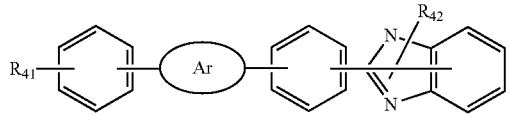

wherein Ar is a $C_{10}$~$C_{30}$ arylene group; $R_{41}$ is a $C_6$~$C_{30}$ aryl group or a $C_5$~$C_{30}$ hetero aryl group; and $R_{42}$ is a $C_1$~$C_{10}$ alkyl group or a $C_6$~$C_{30}$ aryl group.

37. The organic light emitting device of claim 19, wherein the substrate defines a red pixel, a green pixel and a blue pixel and the organic light emitting diode is located correspondingly to the red pixel, the green pixel and the blue pixel, and further comprises a color conversion layer disposed between the substrate and the organic light emitting diode or over the organic light emitting diode correspondingly to the red pixel and the green pixel.

38. The organic light emitting device of claim 32, wherein the substrate defines a red pixel, a green pixel and a blue pixel and the organic light emitting diode is located correspondingly to the red pixel, the green pixel and the blue pixel, and further comprises a color filter disposed between the substrate and the organic light emitting diode or over the organic light emitting diode correspondingly to the red pixel, the green pixel and the blue pixel.

* * * * *